US012668606B2

(12) United States Patent
Lee et al.

(10) Patent No.: US 12,668,606 B2
(45) Date of Patent: *Jun. 30, 2026

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Kum Hee Lee, Suwon-si (KR); Banglin Lee, Suwon-si (KR); Yong Joo Lee, Suwon-si (KR); Jeoungin Yi, Seoul (KR); Byoungki Choi, Hwaseong-si (KR); Sunghun Hong, Hwaseong-si (KR); Youngki Hong, Anyang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 902 days.

This patent is subject to a terminal disclaimer.

(21) Appl. No.: 17/687,932

(22) Filed: Mar. 7, 2022

(65) Prior Publication Data

US 2022/0298191 A1 Sep. 22, 2022

(30) Foreign Application Priority Data

Mar. 8, 2021 (KR) ........................ 10-2021-0030421

(51) Int. Cl.

*C07F 15/00* (2006.01)
*H10K 50/11* (2023.01)

(Continued)

(52) U.S. Cl.

CPC ....... *C07F 15/0033* (2013.01); *H10K 85/342* (2023.02); *H10K 50/11* (2023.02); *H10K 2101/30* (2023.02); *H10K 2101/40* (2023.02)

(58) Field of Classification Search

CPC ... H10K 50/12; H10K 85/342; H10K 85/6572
See application file for complete search history.

(56) References Cited

U.S. PATENT DOCUMENTS 10,211,413 B2 2/2019 Ma et al.
2013/0181190 A1* 7/2013 Ma ...................... C07F 15/0033 546/4

(Continued)

FOREIGN PATENT DOCUMENTS

EP 3001480 A1 3/2016
KR 20160037743 A 4/2016

(Continued)

OTHER PUBLICATIONS

English Translation of Office Action dated Oct. 7, 2024, issued in corresponding KR Patent Application No. 10-2021-0030421, 7 pp.

(Continued)

*Primary Examiner* — Sean M DeGuire
(74) *Attorney, Agent, or Firm* — CANTOR COLBURN LLP

(57) ABSTRACT

Provided are an organometallic compound represented by Formula 1, an organic light-emitting device including the same, and an electronic apparatus including the organic light-emitting device.

$$M(L_1)_{n1}(L_2)_{n2} \qquad \text{Formula 1}$$

M, $L_1$, $L_2$, n1, and n2 in Formula 1 are the same as described in the present specification.

14 Claims, 1 Drawing Sheet

(51) Int. Cl.

| | |
|---|---|
| ***H10K 85/30*** | (2023.01) |
| ***H10K 101/30*** | (2023.01) |
| ***H10K 101/40*** | (2023.01) |

(56) References Cited

U.S. PATENT DOCUMENTS

| | | | | |
|---|---|---|---|---|
| 2016/0093814 | A1 | 3/2016 | Hwang et al. | |
| 2016/0093816 | A1 | 3/2016 | Ma et al. | |
| 2016/0111665 | A1* | 4/2016 | Kim | H10K 85/633 257/40 |
| 2018/0013077 | A1 | 1/2018 | Boudreault et al. | |
| 2018/0130962 | A1 | 5/2018 | Ji et al. | |
| 2018/0287070 | A1 | 10/2018 | Ji et al. | |
| 2021/0083205 | A1 | 3/2021 | Hwang et al. | |
| 2021/0104691 | A1 | 4/2021 | Lee et al. | |
| 2022/0259237 | A1 | 8/2022 | Lee et al. | |

FOREIGN PATENT DOCUMENTS

| | | | |
|---|---|---|---|
| KR | 20180020878 | A | 2/2018 |
| KR | 20180033094 | A | 4/2018 |
| KR | 102645093 | B1 | 3/2024 |

OTHER PUBLICATIONS

Office Action dated Oct. 7, 2024, issued in corresponding KR Patent Application No. 10-2021-0030421, 7 pp.
English Abstract of KR 2018-0020878.

* cited by examiner

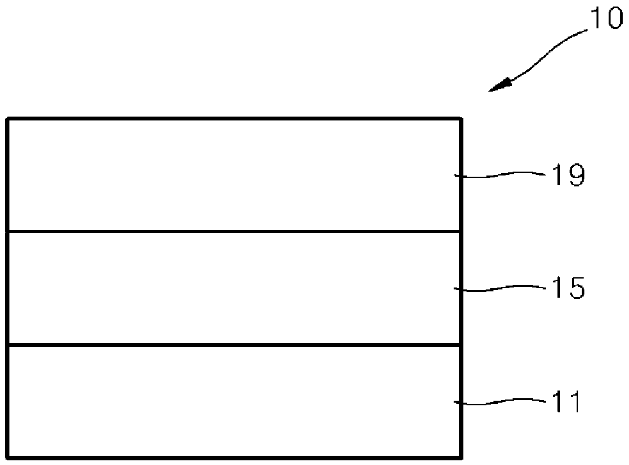
10
19
15
11

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application claims priority under 35 U.S.C. § 119 to Korean Patent Application No. 10-2021-0030421, filed on Mar. 8, 2021, in the Korean Intellectual Property Office, the content of which is incorporated by reference herein in its entirety.

BACKGROUND

1. Field

One or more embodiments relate to an organometallic compound, an organic light-emitting device including the same, and an electronic apparatus including the organic light-emitting device.

2. Description of the Related Art

Organic light-emitting devices are self-emissive devices, which have improved characteristics in terms of viewing angles, response time, brightness, driving voltage, and response speed, and produce full-color images.

In an example, an organic light-emitting device includes an anode, a cathode, and an organic layer located between the anode and the cathode, wherein the organic layer includes an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. The excitons may transition from an excited state to a ground state, thus generating light.

SUMMARY

One or more embodiments relate to an organometallic compound, an organic light-emitting device including the same, and an electronic apparatus including the organic light-emitting device.

Additional aspects will be set forth in part in the description which follows and, in part, will be apparent from the description, or may be learned by practice of the presented embodiments of the disclosure.

According to one aspect, an organometallic compound represented by Formula 1 is provided:

$M(L_1)_{n1}(L_2)_{n2}$ Formula 1 wherein, in Formula 1,

M is a transition metal, $L_1$ is a ligand represented by Formula 2-1, $L_2$ is a ligand represented by Formula 2-2, $L_1$ and $L_2$ may be different from each other, n1 is 1, 2, or 3, when n1 is 2 or more, two or more $L_1$(s) may be identical to or different from each other, n2 is 0, 1, or 2, and when n2 is 2 or more, two or more of $L_2$(s) may be identical to or different from each other, the sum of n1 and n2 is 2 or 3, Formula 2-1

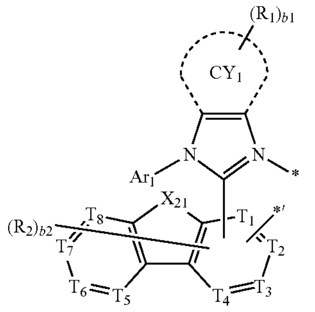

Formula 2-2

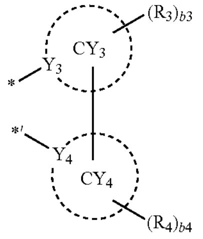

wherein, in Formulae 2-1 and 2-2, $Y_3$ and $Y_4$ are each C or N, $X_{21}$ is O, S, Se, S(=O), $N(R_{29})$, $C(R_{29})(R_{30})$, or $Si(R_{29})(R_{30})$, $T_1$ to $T_4$ are each independently C, N, carbon bonded to a neighboring atom, or carbon bonded to M in Formula 1, and one of $T_1$ to $T_4$ is carbon bonded to M in Formula 1, and the remaining one of $T_1$ to $T_4$ which are not bonded to M is carbon bonded to a neighboring atom, $T_5$ to $T_8$ are each independently C or N, ring $CY_1$, ring $CY_3$, and ring $CY_4$ are each independently a $C_5$-$C_{30}$ carbocyclic group or a $C_1$-$C_{30}$ heterocyclic group, $Ar_1$ are a polycyclic group substituted or unsubstituted with at least one $Z_0$, the polycyclic group is a condensed cycle in which three or more cyclic groups are condensed with each other, and each of the cyclic groups is a $C_5$-$C_{30}$ carbocyclic group or a $C_1$-$C_{30}$ heterocyclic group, $R_1$ to $R_4$, $R_{29}$, $R_{30}$, and $Z_0$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), b1, b3, and b4 may each independently be an integer from 0 to 20, b2 is an integer from 0 to 6, two or more of a plurality of $R_1$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_2$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_3$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_4$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is understood by referring to the description of $R_1$ provided herein,

* and *' in Formulae 2-1 and 2-2 each indicate a binding site to M in Formula 1, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(═O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(═O)($Q_{38}$)($Q_{39}$), or —P($Q_{38}$)($Q_{39}$); or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amino group; an amidino group; a hydrazine group; a hydrazone group; a carboxylic acid or a salt thereof; a sulfonic acid or a salt thereof; a phosphoric acid or a salt thereof; a $C_1$-$C_{60}$ alkyl group which is unsubstituted or substituted with deuterium, —F, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, —F, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

According to another aspect, provided is an organic light-emitting device including a first electrode, a second electrode, and an organic layer including an emission layer located between the first electrode and the second electrode, wherein the organic layer includes at least one organometallic compound represented by Formula 1.

The organometallic compound may be included in the emission layer of the organic layer, and the organometallic compound included in the emission layer may act as a dopant.

Another aspect of the present disclosure provides an electronic apparatus including the organic light-emitting device.

BRIEF DESCRIPTION OF THE DRAWING

The above and other aspects, features, and advantages of certain embodiments of the disclosure will be more apparent from the following description taken in conjunction FIGURE which is a schematic view of an organic light-emitting device.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded. Thus, the regions illustrated in the figures are schematic in nature and their shapes are not intended to illustrate the precise shape of a region and are not intended to limit the scope of the present claims.

The organometallic compound may be represented by Formula 1:

$$M(L_1)_{n1}(L_2)_{n2}. \qquad \text{Formula 1}$$

M in Formula 1 may be a transition metal.

For example, M may be a Period 1 transition metal, a Period 2 transition metal, or a Period 3 transition metal.

In one embodiment, M may be iridium (Ir), platinum (Pt), osmium (Os), titanium (Ti), zirconium (Zr), hafnium (Hf), europium (Eu), terbium (Tb), thulium (Tm)), or rhodium (Rh).

In an embodiment, M may be Ir, Pt, Os, or Rh.

In Formula 1, $L_1$ may be a ligand represented by Formula 2-1, and $L_2$ may be a ligand represented by Formula 2-2:

Formula 2-1

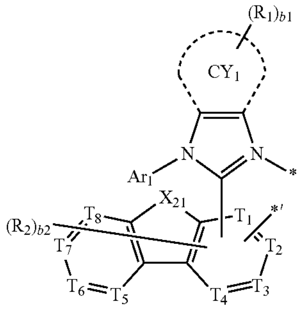

Formula 2-2

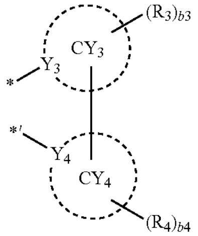

wherein, Formulae 1-1 and 1-2 are the same as described in the present specification.

$L_1$ and $L_2$ may be different from each other.

In Formula 1, n1 may be 1, 2, or 3, when n1 is 2 or more, two or more of $L_1$(s) may be identical to or different from each other and n2 may be 0, 1 or 2, and when n2 is 2 or more, two or more of $L_2$(s) may be identical to or different from each other.

The sum of n1 and n2 in Formula 1 may be 2 or 3. For example, the sum of the n1 and n2 may be 3.

In an embodiment, in Formula 1, i) M may be Ir, and the sum of n1 and n2 may be 3; or ii) M may be Pt, and the sum of n1 and n2 may be 2.

$Y_3$ and $Y_4$ in Formula 2-2 may each independently be C or N. For example, $Y_3$ may be N, and $Y_4$ may be C.

$X_{21}$ in Formula 2-1 may be O, S, Se, S(=O), N($R_{29}$), C($R_{29}$)($R_{30}$), or Si($R_{29}$)($R_{30}$). $R_{29}$ and $R_{30}$ may respectively be the same as described herein. For example, $X_{21}$ may be O or S.

$T_1$ to $T_4$ in Formula 2-1 may each independently be C, N, carbon bonded to a neighboring atom, or carbon bonded to M in Formula 1, and one of $T_1$ to $T_4$ is carbon bonded to M in Formula 1, and the remaining one of $T_1$ to $T_4$ which are not bonded to M is carbon bonded to a neighboring atom, and $T_5$ to $T_8$ may each independently be C or N.

In an embodiment, each of $T_1$ to $T_8$ may not be N.

In one or more embodiments, one or two of $T_1$ to $T_8$ may be N.

In one or more embodiments, one or two of $T_5$ to $T_8$ may be N.

Ring $CY_1$, ring $CY_3$, and ring $CY_4$ in Formulae 2-1 and 2-2 may each independently be a $C_5$-$C_{30}$ carbocyclic group or a $C_1$-$C_{30}$ heterocyclic group.

Meanwhile, Ar in Formula 2-1 is a polycyclic group unsubstituted or substituted with at least one $Z_0$, the polycyclic group may be a condensed cycle in which three or more cyclic groups are condensed with each other, and each of the cyclic groups is a $C_5$-$C_{30}$ carbocyclic group or a $C_1$-$C_{30}$ heterocyclic group.

For example, ring $CY_1$, ring $CY_3$, ring $CY_4$, a $C_5$-$C_{30}$ carbocyclic group, and a $C_1$-$C_{30}$ heterocyclic group may each independently be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a pyrrole group, a furan group, a thiophene group, a silole group, a borole group, a phosphole group, a germole group, a selenophene group, an indene group, an indole group, a benzofuran group, a benzothiophene group, a benzosilole group, a benzoborole group, a benzophosphole group, a benzogermole group, a benzoselenophene group, a fluorene group, a carbazole group, a dibenzofuran group, a dibenzothiophene group, a dibenzosilole group, a dibenzoborole group, a dibenzophosphole group, a dibenzogermole group, a dibenzoselenophene group, a benzofluorene group, a benzocarbazole group, a naphthobenzofuran group, a naphthobenzothiophene group, a naphthobenzosilole group, a naphthobenzoborole group, a naphthobenzophosphole group, a naphthobenzogermole group, a naphthobenzoselenophene group, a dibenzofluorene group, a dibenzocarbazole group, a dinaphthofuran group, a dinaphthothiophene group, a dinaphthosilole group, a dinaphthoborole group, a dinaphthophosphole group, a dinaphthogermole group, a dinaphthoselenophene group, an indenophenanthrene group, an indolophenanthrene group, a phenanthrobenzofuran group, a phenanthrobenzothiophene group, a phenanthrobenzosilole group, a phenanthrobenzoborole group, a phenanthrobenzophosphole group, a phenanthrobenzogermole group, a phenanthrobenzoselenophene group, a dibenzothiophene 5-oxide group, a 9H-fluorene-9-one group, a dibenzothiophene 5,5-dioxide group, an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthro benzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a pyrrole group, a pyrazole group, an imidazole group, a triazole group, an oxazole group, an iso-oxazole group, a thiazole group, an isothiazole group, an oxadiazole group, a thiadiazole group, an azasilole group, an azaborole group, an azaphosphole group, an azagermole group, an azaselenophene group, a benzopyrrole group, a benzopyrazole group, a benzimidazole group, a benzoxazole group, a benzisoxazole group, a benzothiazole group, a benzisothiazole group, a benzoxadiazole group, a benzothiadiazole group, a 5,6,7,8-tetrahydroisoquinoline group, a 5,6,7,8-tetrahydroquinoline group, an adamantane group, a norbornane group, a norbornene group, a benzene group condensed with a norbornane group, or a pyridine group condensed with a norbornane group.

In an embodiment, ring $CY_1$ and ring $CY_4$ may each independently be a benzene group, a naphthalene group, a 1,2,3,4-tetrahydronaphthalene group, a benzene group condensed with a norbornane group, a pyridine group, a fluorene group, a carbazole group, a dibenzofuran group, a dibenzothiophene group, a dibenzosilole group, an azafluorene group, an azacarbazole group, an azadibenzofuran group, an azadibenzothiophene group, or an azadibenzosilole group.

In one or more embodiments, ring $CY_3$ may be a pyridine group, a quinoline group, an isoquinoline group, a benzoquinoline group, a benzoisoquinoline group, a 5,6,7,8-tetrahydroisoquinoline group, a 5,6,7,8-tetrahydroquinoline group, or a pyridine group condensed with a norbornane group.

In one or more embodiments, $Ar_1$ in Formula 2-1 may be a group represented by Formula AR1(1):

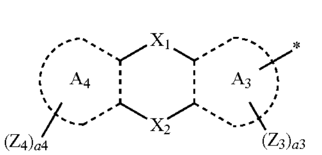

AR1(1)

wherein, in Formula AR1(1), ring $A_3$ and ring $A_4$ may each independently be a $C_5$-$C_{30}$ carbocyclic group or a $C_1$-$C_{30}$ heterocyclic group (for example, a benzene group, a naphthalene group, a pyridine group, or a pyrimidine group), $X_1$ may be a single bond, O, S, Se, S(=O), $N(Z_{11})$, $C(Z_{11})(Z_{12})$, or $Si(Z_{11})(Z_{12})$, $X_2$ may be a single bond, O, S, Se, S(=O), $N(Z_{21})$, $C(Z_{21})(Z_{22})$, or $Si(Z_{21})(Z_{22})$, not both of $X_1$ and $X_2$ are a single bond, $Z_{11}$, $Z_{12}$, $Z_{21}$, $Z_{22}$, $Z_3$, and $Z_4$ are the same as described in connection with $Z_0$, a3 and a4 may each independently be an integer from 0 to 20, two or more of a plurality of $Z_3$(s) may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $Z_4$(s) may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as described in connection with $R_1$, and

* indicates a binding site to an adjacent atom.

In one or more embodiments, $Ar_1$ in Formula 2-1 may be a group represented by one of Formulae AR1-1 to AR1-4:

AR1-1

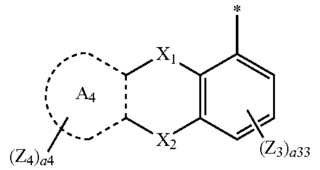

AR1-2

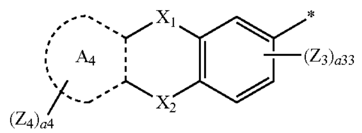

AR1-3

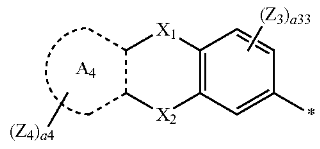

AR1-4

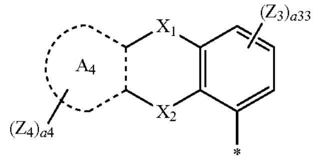

wherein, in Formulae AR1-1 to AR1-4, ring $A_4$, $X_1$, $X_2$, $Z_{11}$, $Z_{12}$, $Z_{21}$, $Z_{22}$, $Z_3$, $Z_4$, and a4 are the same as described in the present specification, a33 is an integer from 0 to 3, and

* indicates a binding site to an adjacent atom.

In one or more embodiments, $Ar_1$ may be a fluorene group, a carbazole group, a dibenzofuran group, a dibenzothiophene group, a dibenzosilole group, a benzofluorene group, a benzocarbazole group, a benzonaphthofuran group, a benzonaphthothiophene group, a benzonaphthosilole group, a dibenzofluorene group, a dibenzocarbazole group, a dinaphthofuran group, a dinaphthothiophene group, a dinaphthosilole group, an azafluorene group, an azacarbazole group, an azadibenzofuran group, an azadibenzothiophene group, an azadibenzosilole group, an azabenzofluorene group, an azabenzocarbazole group, an azabenzonaphthofuran group, an azabenzonaphthothiophene group, an azabenzonaphthosilole group, an azadibenzofluorene group, an azadibenzocarbazole group, an azadinaphthofuran group, an azadinaphthothiophene group, or azadinaphthosilole group, each substituted or unsubstituted at least one $Z_0$.

$R_1$ to $R_4$, $R_{29}$, $R_{30}$, and $Z_0$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$. $Q_1$ to $Q_9$ may each be the same as described herein.

In an embodiment, $R_1$ to $R_4$, $R_{29}$, $R_{30}$, and $Z_0$ may each independently be:

hydrogen, deuterium, —F, or a cyano group;

a $C_1$-$C_{20}$ alkyl group, unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl) a phenyl group, a biphenyl group, a deuterated biphenyl group, a fluorinated biphenyl group, a ($C_1$-$C_{20}$ alkyl) a biphenyl group, or any combination thereof;

a $C_3$-$C_{10}$ cycloalkyl group, a $C_1$-$C_{10}$ heterocycloalkyl group, a phenyl group, or a biphenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl) a phenyl group, a biphenyl group, a deuterated biphenyl group, a fluorinated biphenyl group, a ($C_1$-$C_{20}$ alkyl) biphenyl group, or any combination thereof; or —$Si(Q_3)(Q_4)(Q_5)$ or —$Ge(Q_3)(Q_4)(Q_5)$.

In one or more embodiments, $R_1$ to $R_4$, $R_{29}$, $R_{30}$ and $Z_0$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_1$-$C_{20}$ alkoxy group, or a $C_1$-$C_{20}$ alkylthio group;

a $C_1$-$C_{20}$ alkyl group, a $C_1$-$C_{20}$ alkoxy group, or a $C_1$-$C_{20}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl) phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a (phenyl)$C_1$-$C_{10}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or $—N(Q_1)(Q_2)$, $—Ge(Q_3)(Q_4)(Q_5)$, $—B(Q_6)(Q_7)$, $—P(=O)(Q_8)(Q_9)$ or $—P(Q_8)(Q_9)$, wherein $Q_1$ to $Q_9$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

b1 to b4 in Formulae 2-1 and 2-2 indicate the number of $R_1$ to $R_4$, and b1, b3 and b4, respectively, and b1, b3, and b4 may each independently be 0 to 20, and b2 may be an integer from 0 to 6. When b1 is 2 or more, two or more of $R_1$(s) may be identical to or different from each other, when b2 is 2 or more, two or more of $R_2$(s) may be identical to or different from each other, when b3 is 2 or more, two or more of $R_3$(s) may be identical to or different from each other, and when b4 is 2 or more, two or more of $R_4$(s) may be identical to or different from each other. For example, b1, b3, and b4 may each independently be an integer from 0 to 8, and b2 may be an integer from 0 to 3.

In an embodiment, when, in Formula 1, i) at least one of $T_1$ to $T_8$ of Formula 2-1 is N, ii) n2 of Formula 1 is 1 or 2, iii) $Y_3$ of Formula 2-2 is N, and iv) ring $CY_3$ of Formula 2-2 is a pyridine group, a) b3 of Formula 2-2 may be an integer from 1 to 4, and b) at least one of $R_3$(s) in the number of b3 in Formula 2-2 may be $—Si(Q_3)(Q_4)(Q_5)$ or $—Ge(Q_3)(Q_4)(Q_5)$.

For example, $Q_3$ to $Q_5$ may each independently be:

a $C_1$-$C_{60}$ alkyl group unsubstituted or substituted with deuterium, a $C_1$-$C_{60}$ alkyl group, a $C_6$-$C_{60}$ aryl group, or any combination thereof; or a $C_6$-$C_{60}$ aryl group unsubstituted or substituted with deuterium, a $C_1$-$C_{60}$ alkyl group, a $C_6$-$C_{60}$ aryl group, or any combination thereof.

In an embodiment, $Q_3$ to $Q_5$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

In an embodiment, $Q_3$ to $Q_5$ may be identical to each other.

In one or more embodiments, two or more of $Q_3$ to $Q_5$ may be different from each other.

In one or more embodiments, n1 and n2 may each independently be 1 or 2, and $Y_3$ of Formula 2-2 is N, i) each of $T_1$ to $T_8$ of Formula 2-1 is not N, b3 of Formula 2-2 is an integer from 1 to 4, and at least one of $R_3$(s) in the number of b3 in Formula 2-2 may be $—Si(Q_3)(Q_4)(Q_5)$ or $—Ge(Q_3)(Q_4)(Q_5)$;

ii) each of $T_1$ to $T_8$ of Formula 2-1 is not N, and $R_3$ of Formula 2-2 is not $—Si(Q_3)(Q_4)(Q_5)$ and $—Ge(Q_3)(Q_4)(Q_5)$; or iii) at least one of $T_1$ to $T_8$ of Formula 2-1 may be N, b3 of Formula 2-2 may be an integer from 1 to 4, and at least one of $R_3$(s) in the number of b3 in Formula 2-2 may be $—Si(Q_3)(Q_4)(Q_5)$ or $—Ge(Q_3)(Q_4)(Q_5)$.

In one or more embodiments, b3 of Formula 2-2 is not 0, and at least one of $R_3$(s) in the number of b3 may be $—Si(Q_3)(Q_4)(Q_5)$ or $—Ge(Q_3)(Q_4)(Q_5)$.

In one or more embodiments, the organometallic compound represented by Formula 1 may include deuterium, —F, a group represented by $—Si(Q_3)(Q_4)(Q_5)$, a group represented by $—Ge(Q_3)(Q_4)(Q_5)$, or any combination thereof.

In an embodiment, the organometallic compound represented by Formula 1 may satisfy at least one of Condition (1) to Condition (5):

Condition (1)

b1 in Formula 2-1 is not 0, and at least one of $R_1$(s) in the number of b1 includes deuterium.

Condition (2)

At least one of $Ar_1$(s) in Formula 2-1 includes deuterium

Condition (3)

b2 in Formula 2-1 is not 0, and at least one of $R_2$(s) in the number of b2 includes deuterium.

Condition (4)

b3 in Formula 2-2 is not 0, at least one of $R_3$(s) in the number of b3 includes deuterium.

Condition (5)

b4 in Formula 2-2 is not 0, and at least one of $R_4$(s) in the number of b4 includes deuterium.

In one or more embodiments, $R_1$ to $R_4$, $R_{29}$, $R_{30}$, and $Z_0$ in Formulae 2-1 and 2-2 may each independently be hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, $—OCH_3$, $—OCDH_2$, $—OCD_2H$, $—OCD_3$, $—SCH_3$, $—SCDH_2$, $—SCD_2H$, $—SCD_3$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-230, a group represented by one of Formulae 9-201 to 9-230 in which at least one hydrogen is substituted with deuterium, a group represented by one of Formulae 9-201 to 9-230 in which at least one hydrogen is substituted with —F, a group represented by one of Formulae 10-1 to 10-145, a group represented by one of Formulae 10-1 to 10-145 in which at least one hydrogen is substituted with deuterium, a group represented by one of Formulae 10-1 to 10-145 in which at least one hydrogen is substituted with —F, a group represented by one of Formula 10-201 to 10-354, a group represented by one of Formula 10-201 to 10-354 in which at least one hydrogen is substituted with deuterium, a group represented by one of Formula 10-201 to 10-354 in which at least one hydrogen is substituted with —F, —Si($Q_3$)($Q_4$)($Q_5$), or —Ge($Q_3$)($Q_4$)($Q_5$) (where $Q_3$ to $Q_5$ are the same as described in the present specification):

9-1

9-2

9-3
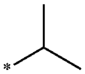

9-4

9-5
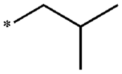

9-6
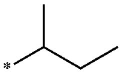

9-7
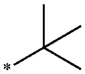

9-8

9-9
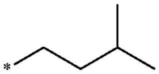

9-10
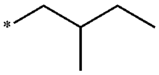

9-11
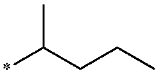

9-12
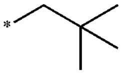

9-13
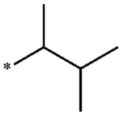

9-14
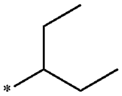

9-15
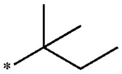

9-16
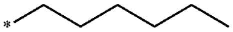

-continued 9-17
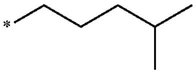

9-18
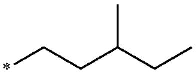

9-19
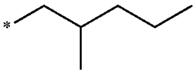

9-20
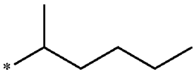

9-21
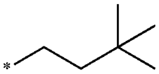

9-22
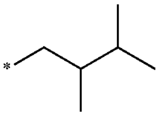

9-23
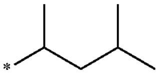

9-24
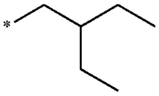

9-25
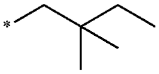

9-26
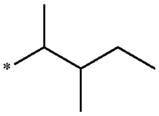

9-27
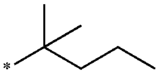

9-28
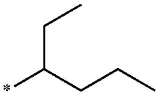

9-29
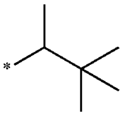

9-30
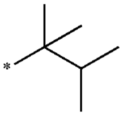

9-31
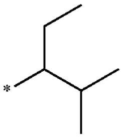

-continued
9-32
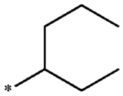
9-33
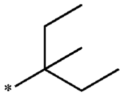
9-34
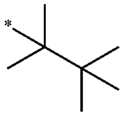
9-35
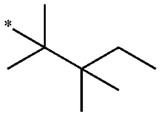
9-36
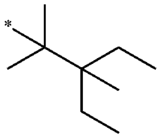
9-37
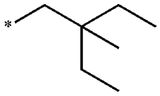
9-38
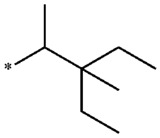
9-39
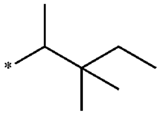
9-201
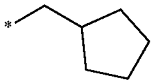
9-202
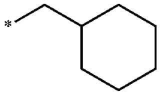
9-203
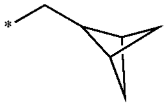
9-204
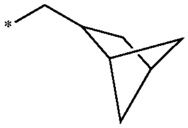
9-205
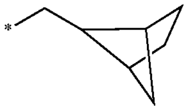
-continued
9-206
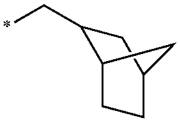
9-207
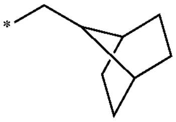
9-208
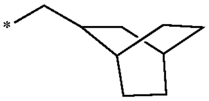
9-209
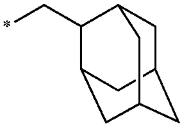
9-210
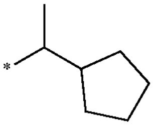
9-211
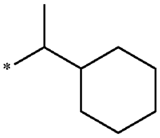
9-212
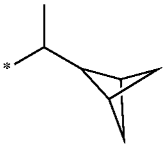
9-213
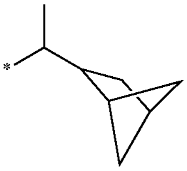
9-214
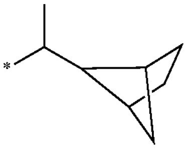
9-215
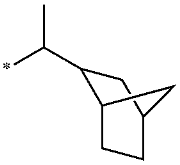

-continued
9-216
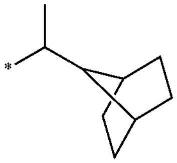
9-217
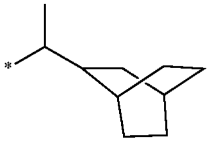
9-218
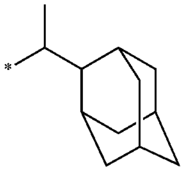
9-219
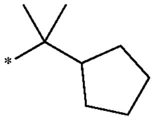
9-220
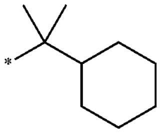
9-221
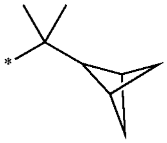
9-222
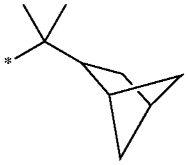
9-223
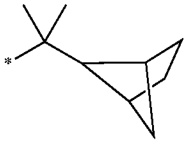
9-224
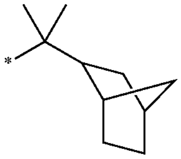
9-225
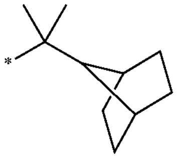
-continued
9-226
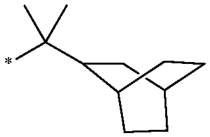
9-227
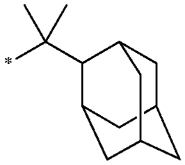
9-228
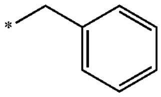
9-229
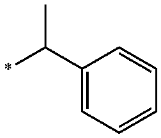
9-230
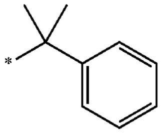
10-1
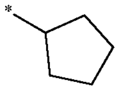
10-2
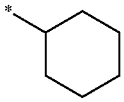
10-3
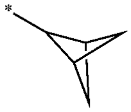
10-4
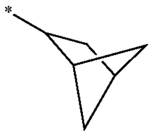
10-5
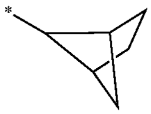
10-6
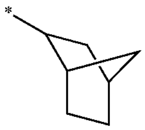
10-7
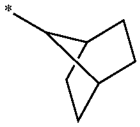

-continued
10-8
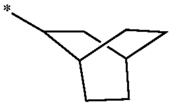
10-9
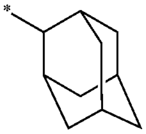
10-10
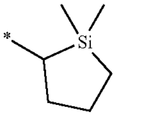
10-11
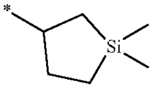
10-12
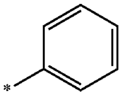
10-13
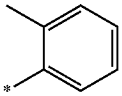
10-14
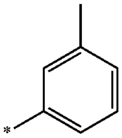
10-15
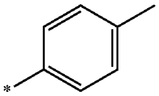
10-16
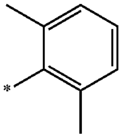
10-17
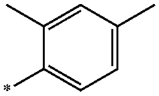
10-18
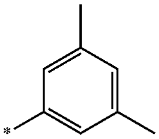
10-19
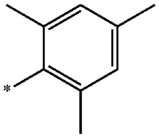
-continued
10-20
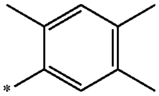
10-21
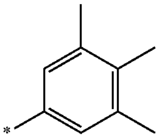
10-22
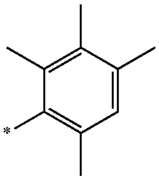
10-23
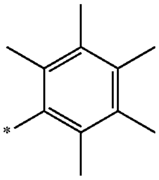
10-24
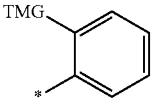
10-25
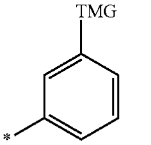
10-26
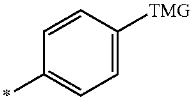
10-27
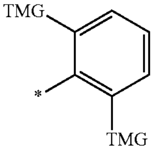
10-28
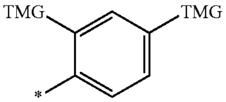
10-29
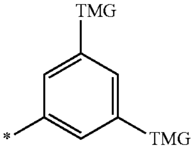
10-30
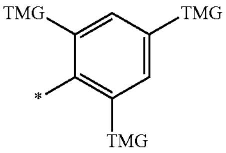

-continued
10-31
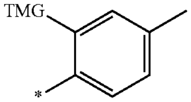
10-32
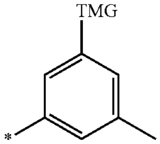
10-33
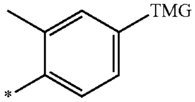
10-34
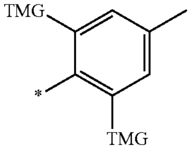
10-35
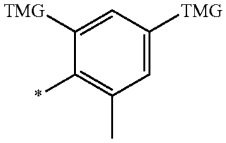
10-36
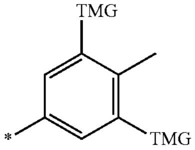
10-37
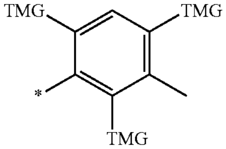
10-38
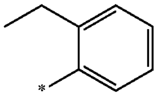
10-39
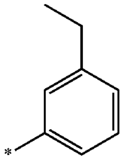
10-40
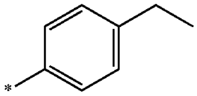
10-41
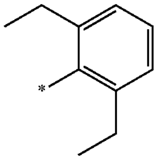
-continued
10-42
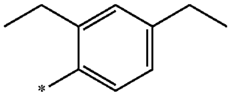
10-43
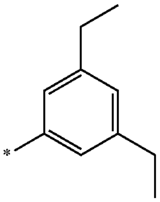
10-44
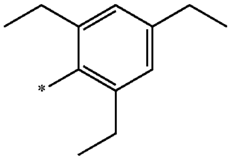
10-45
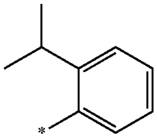
10-46
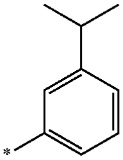
10-47
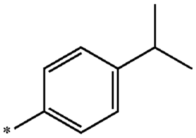
10-48
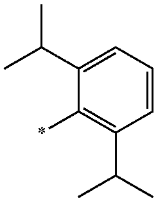
10-49
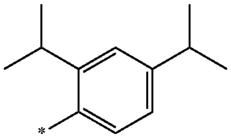
10-50
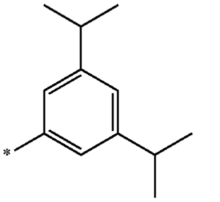

-continued
10-51
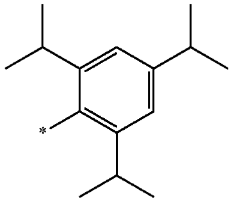
10-52
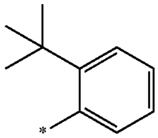
10-53
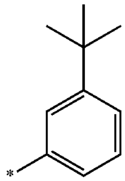
10-54
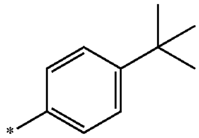
10-55
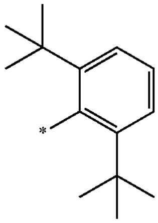
10-56
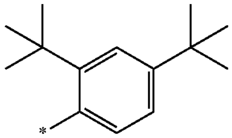
10-57
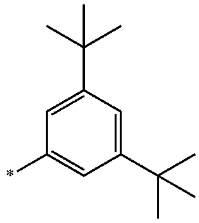
10-58
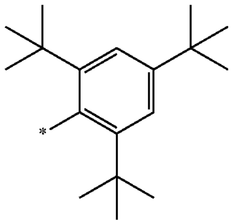
-continued
10-59
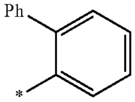
10-60
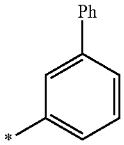
10-61
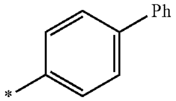
10-62
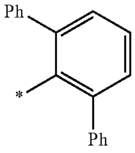
10-63
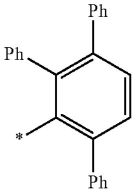
10-64
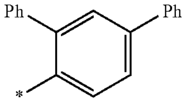
10-65
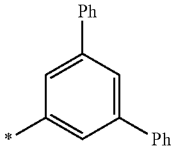
10-66
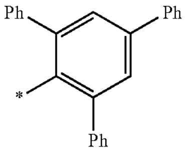
10-67
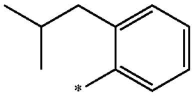
10-68
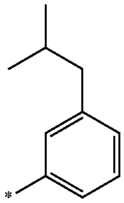

-continued
10-69
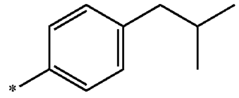
10-70
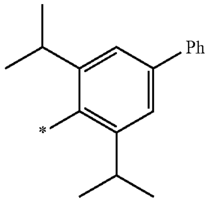
10-71
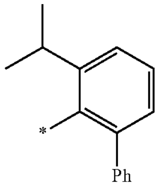
10-72
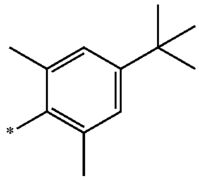
10-73
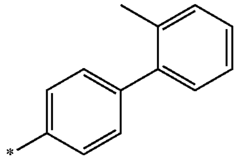
10-74
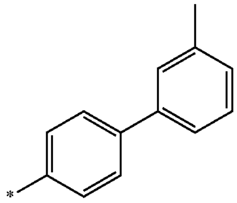
10-75
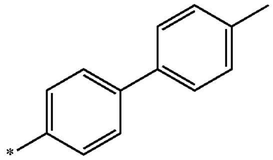
10-76
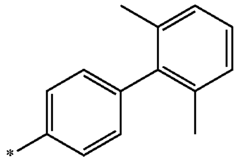
10-77
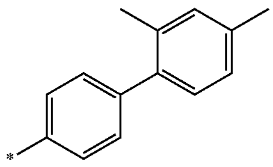
-continued
10-78
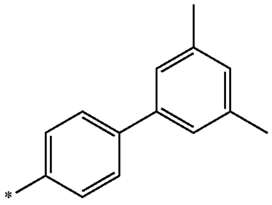
10-79
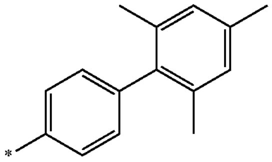
10-80
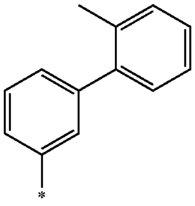
10-81
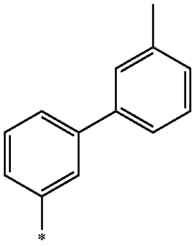
10-82
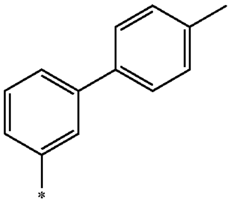
10-83
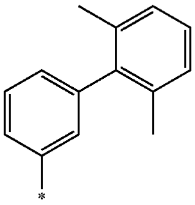
10-84
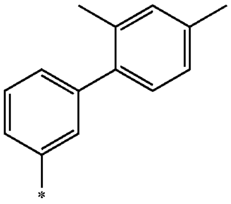

-continued
10-85
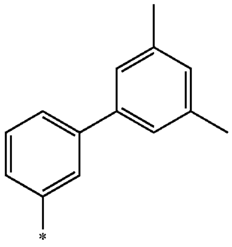
10-86
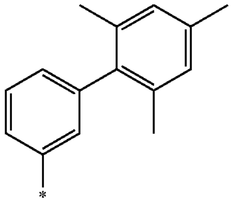
10-87
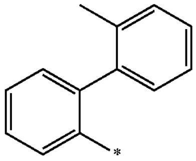
10-88
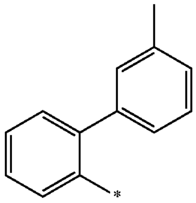
10-89
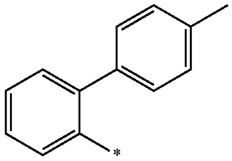
10-90
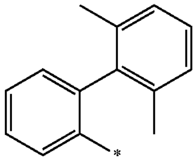
10-91
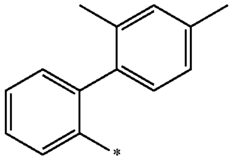
10-92
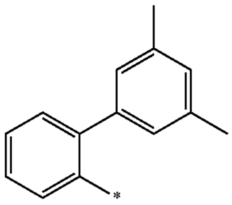
-continued
10-93
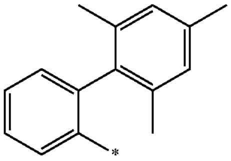
10-94
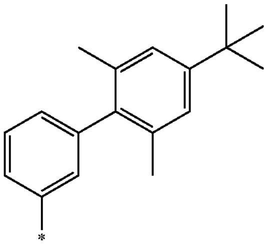
10-95
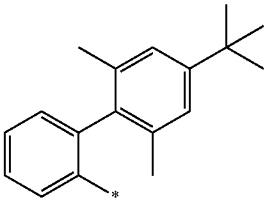
10-96
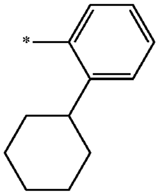
10-97
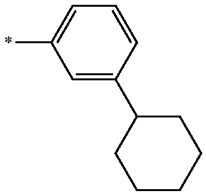
10-98
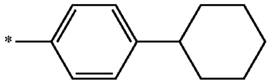
10-99
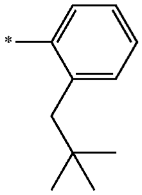
10-100
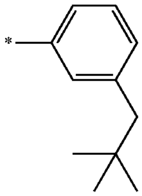

-continued
10-101
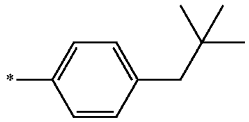
10-102
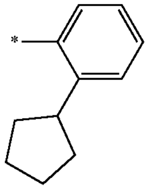
10-103
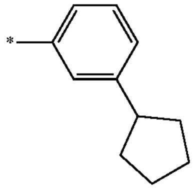
10-104
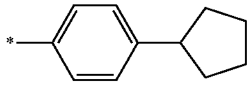
10-105
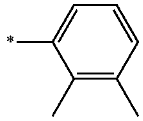
10-106
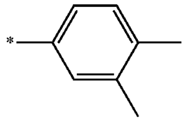
10-107
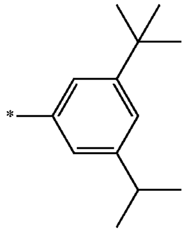
10-108
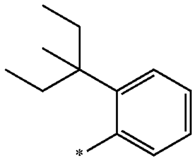
10-109
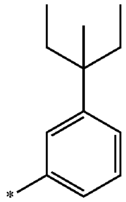
-continued
10-110
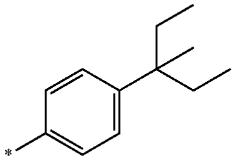
10-111
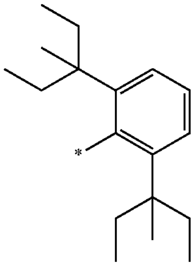
10-112
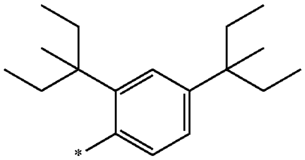
10-113
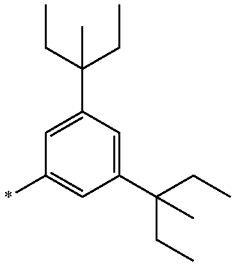
10-114
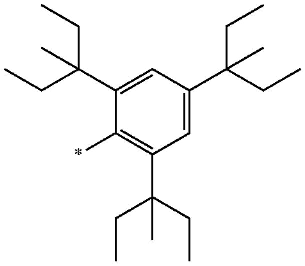
10-115
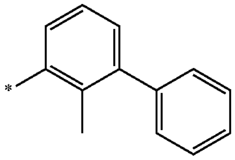
10-116
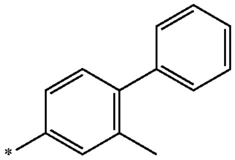

-continued
10-117
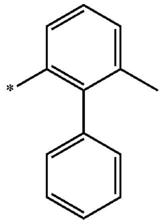
10-118
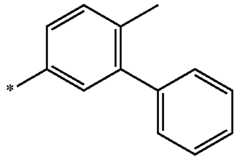
10-119
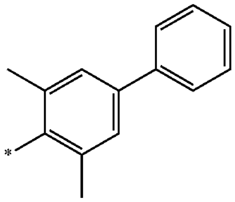
10-120
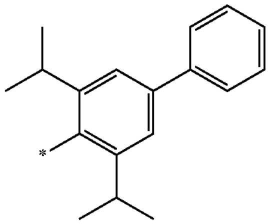
10-121
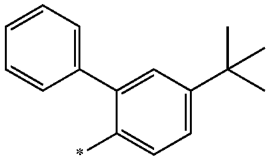
10-122
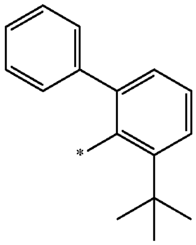
10-123
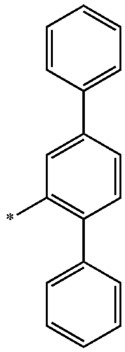
-continued
10-124
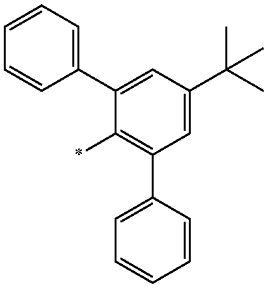
10-125
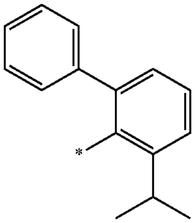
10-126
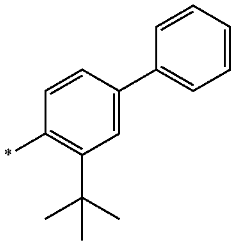
10-127
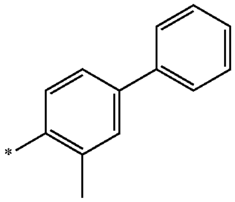
10-128
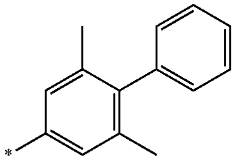
10-129
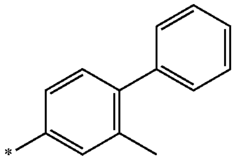
10-130
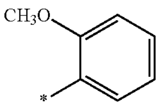
10-131
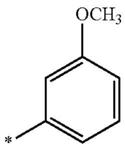

-continued
10-132
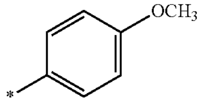
10-133
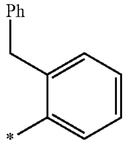
10-134
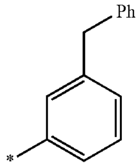
10-135
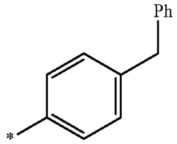
10-136
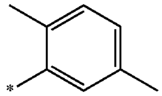
10-137
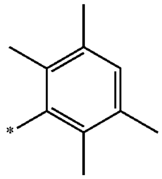
10-138
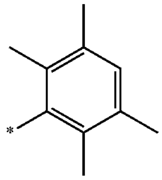
10-139
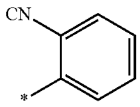
10-140
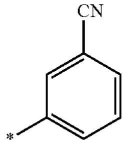
10-141
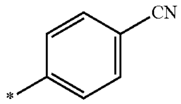
-continued
10-142
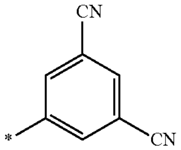
10-143
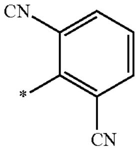
10-144
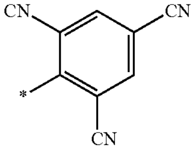
10-145
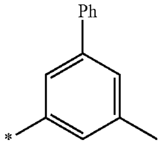
10-201
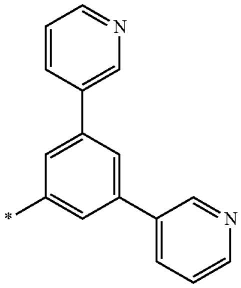
10-202
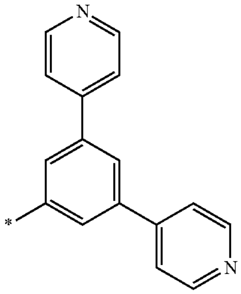
10-203
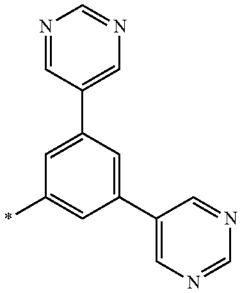

-continued
10-204
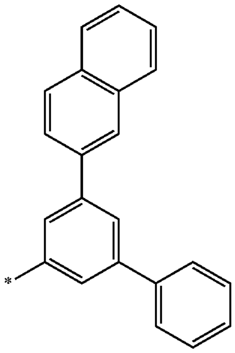
10-205
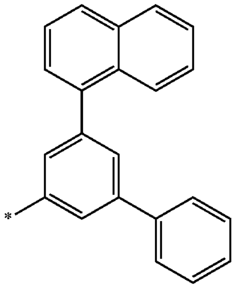
10-206
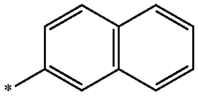
10-207
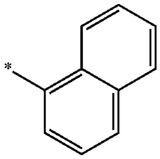
10-208
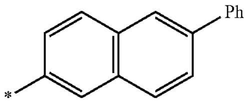
10-209
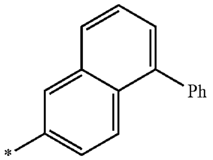
10-210
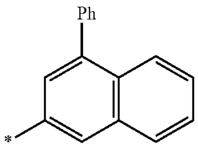
10-211
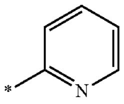
10-212
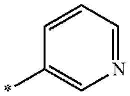
-continued
10-213
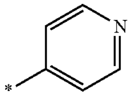
10-214
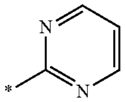
10-215
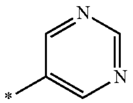
10-216
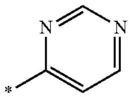
10-217
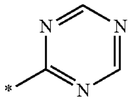
10-218
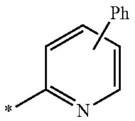
10-219
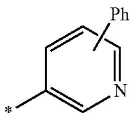
10-220
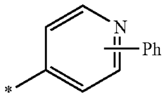
10-221
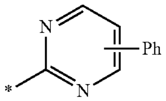
10-222
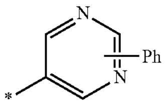
10-223
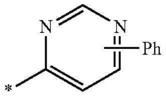
10-224
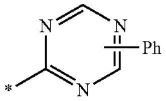
10-225
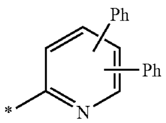

-continued
10-226
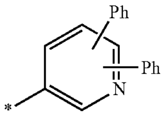
10-227
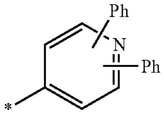
10-228
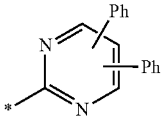
10-229
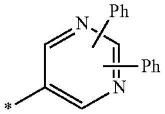
10-230
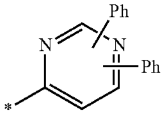
10-231
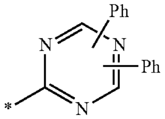
10-232
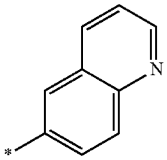
10-233
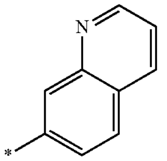
10-234
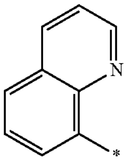
10-235
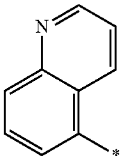
-continued
10-236
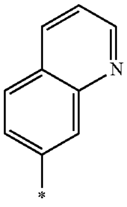
10-237
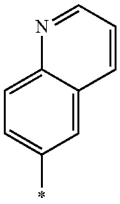
10-238
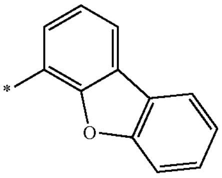
10-239
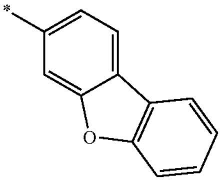
10-240
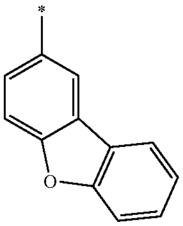
10-241
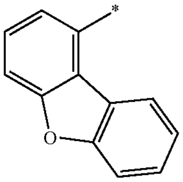
10-242
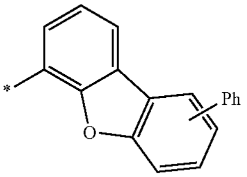
10-243
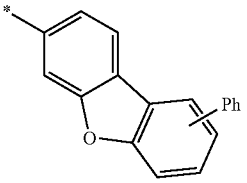

-continued
10-244
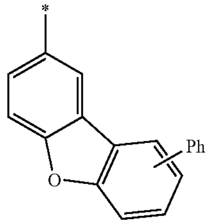
10-245
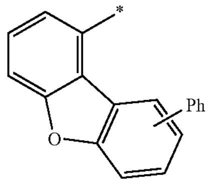
10-246
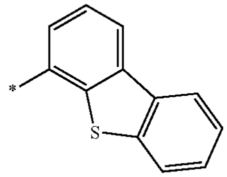
10-247
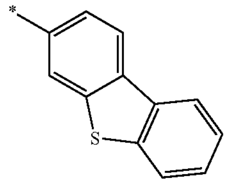
10-248
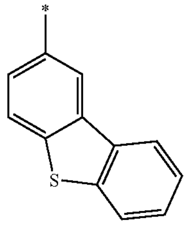
10-249
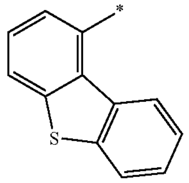
10-250
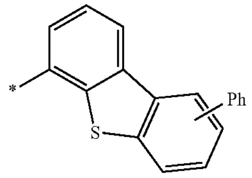
10-251
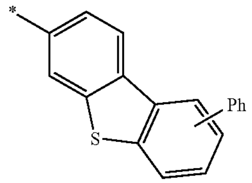
-continued
10-252
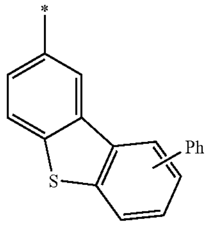
10-253
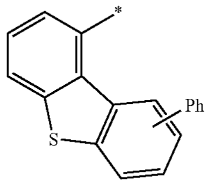
10-254
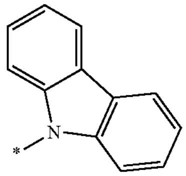
10-255
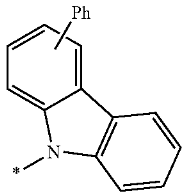
10-256
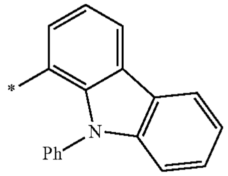
10-257
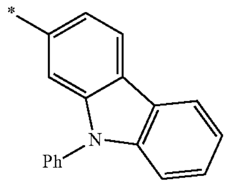
10-258
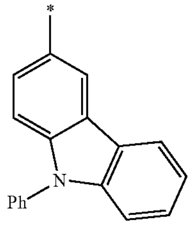
10-259
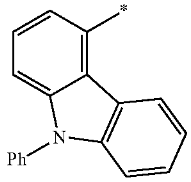

-continued
10-260
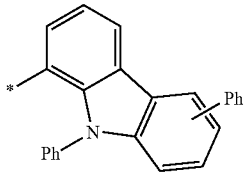
10-261
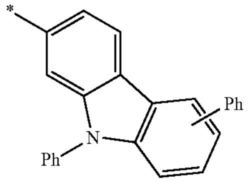
10-262
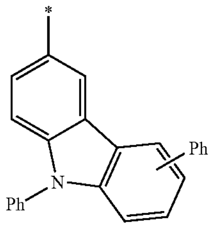
10-263
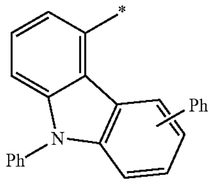
10-264
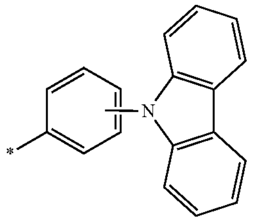
10-265
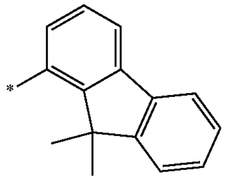
10-266
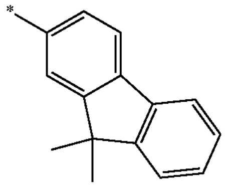
-continued
10-267
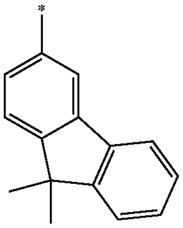
10-268
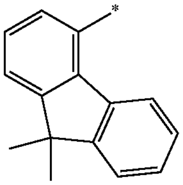
10-269
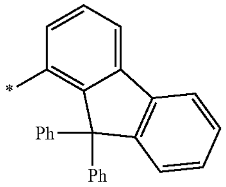
10-270
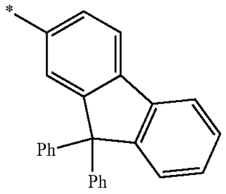
10-271
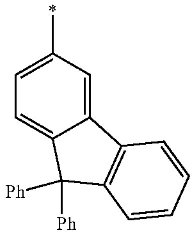
10-272
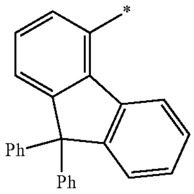
10-273
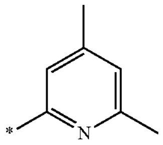

-continued
10-274
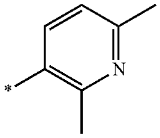
10-275
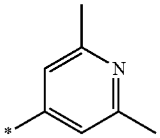
10-276
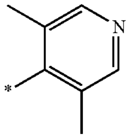
10-277
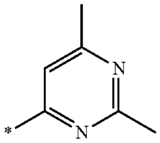
10-278
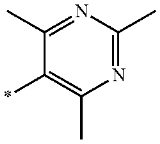
10-279
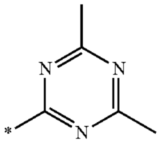
10-280
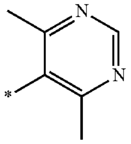
10-281
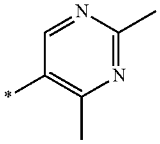
10-282
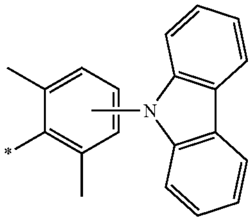
10-283
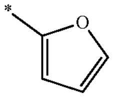
-continued
10-284
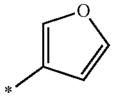
10-285
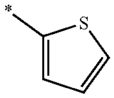
10-286
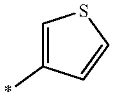
10-287
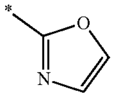
10-288
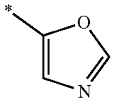
10-289
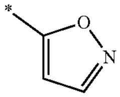
10-290
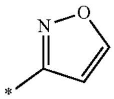
10-291
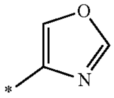
10-292
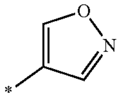
10-293
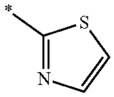
10-294
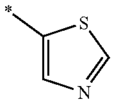
10-295
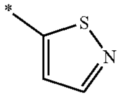
10-296
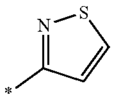
10-297
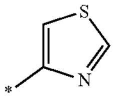

-continued
10-298
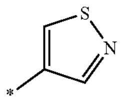
10-299
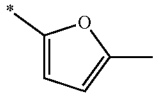
10-300
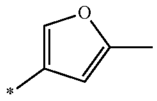
10-301
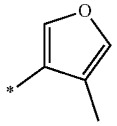
10-302
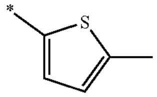
10-303
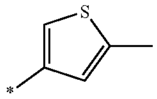
10-304
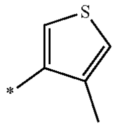
10-305
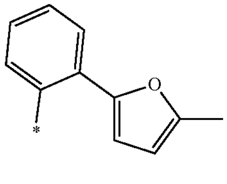
10-306
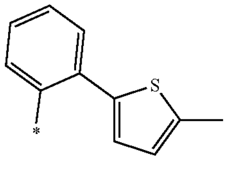
10-307
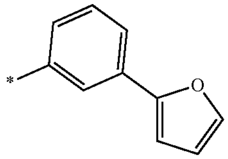
10-308
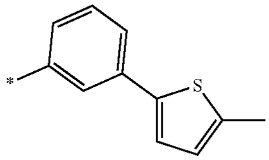
-continued
10-309
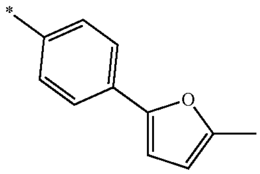
10-310
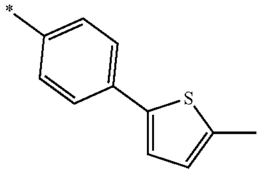
10-311
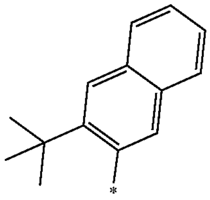
10-312
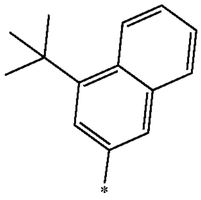
10-313
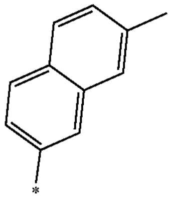
10-314
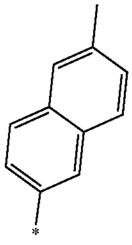
10-315
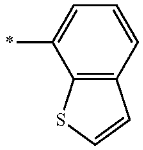
10-316
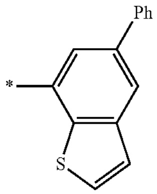

-continued
10-317
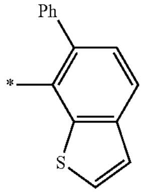
10-318
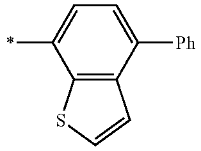
10-319
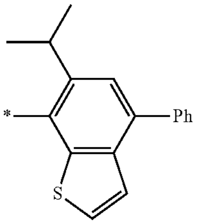
10-320
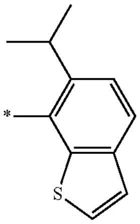
10-321
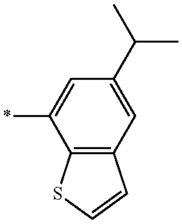
10-322
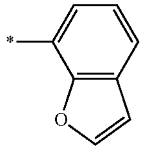
10-323
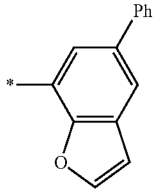
10-324
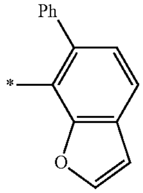
-continued
10-325
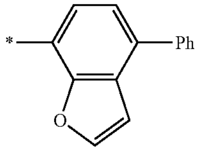
10-326
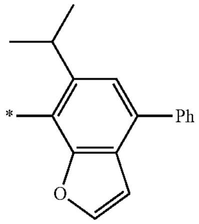
10-327
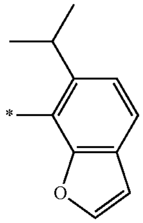
10-328
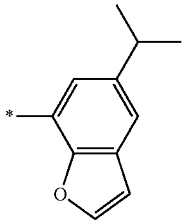
10-329
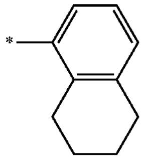
10-330
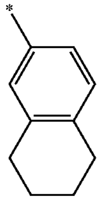
10-331
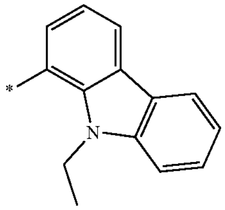

-continued
10-332
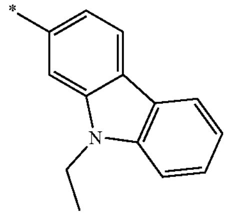
10-333
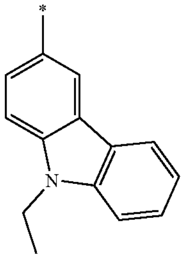
10-334
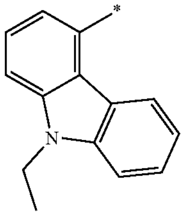
10-335
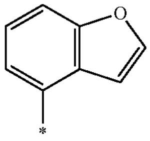
10-336
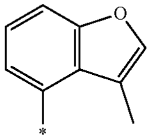
10-337
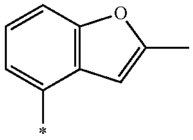
10-338
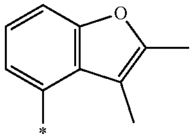
10-339
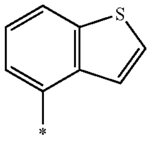
10-340
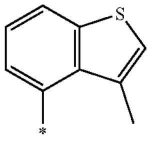
-continued
10-341
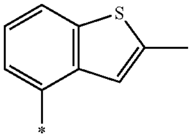
10-342
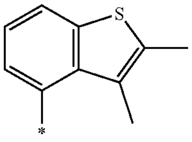
10-343
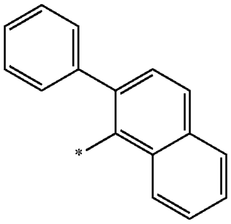
10-344
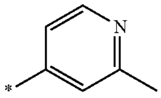
10-345
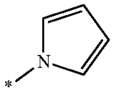
10-346
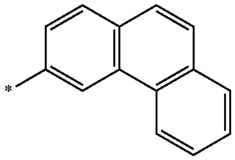
10-347
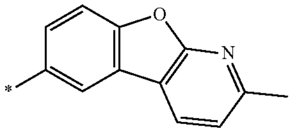
10-348
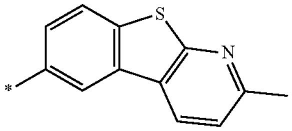
10-349
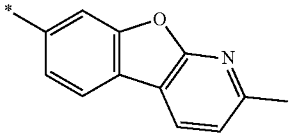
10-350
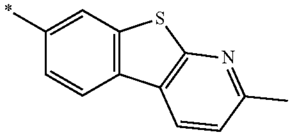
10-351
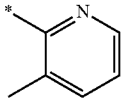

-continued 10-352

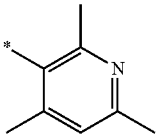

10-353

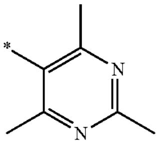

10-354

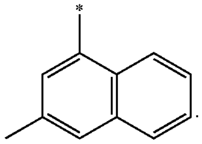

In Formulae 9-1 to 9-39, 9-201 to 9-230, 10-1 to 10-145 and 10-201 to 10-354, * indicates a binding site to a neighboring atom, Ph is a phenyl group, TMS is a trimethylsilyl group, TMG is a trimethylgermyl group, and OMe is a methoxy group.

The "group represented by one of Formulae 9-1 to 9-39 in which at least one hydrogen is substituted with deuterium" and the "group represented by one of Formulae 9-201 to 9-230 in which at least one hydrogen is substituted with deuterium" may be, for example, a group represented by one of Formulae 9-501 to 9-514 and 9-601 to 9-637:

9-501

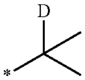

9-502

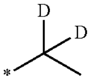

9-503

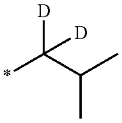

9-504

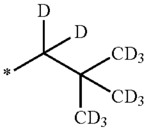

9-505

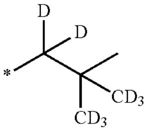

9-506

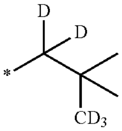

-continued 9-507

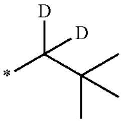

9-508

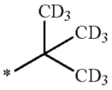

9-509

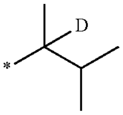

9-510

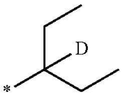

9-511

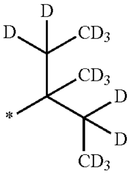

9-521

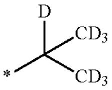

9-513

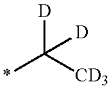

9-514

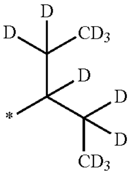

9-601

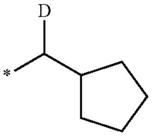

9-602

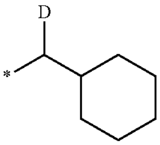

9-603

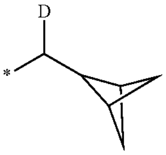

-continued
9-604
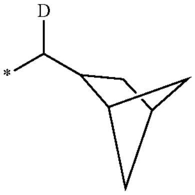
9-605
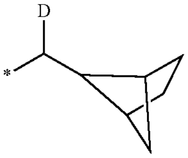
9-606
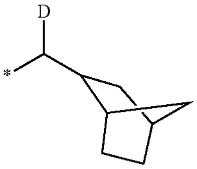
9-607
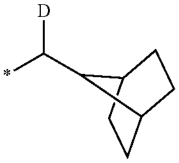
9-608
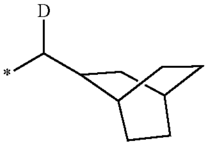
9-609
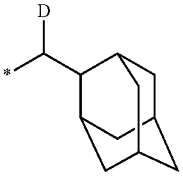
9-610
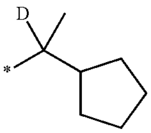
9-611
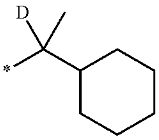
9-612
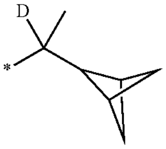
-continued
9-613
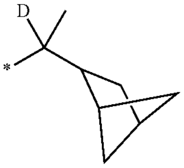
9-614
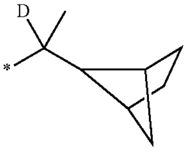
9-615
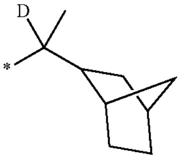
9-616
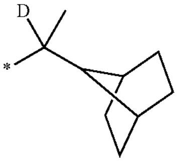
9-617
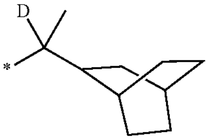
9-618
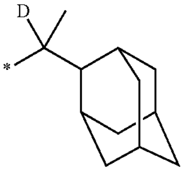
9-619
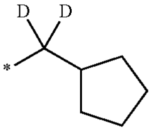
9-620
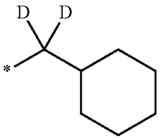
9-621
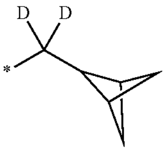

-continued
9-622
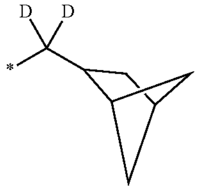
9-623
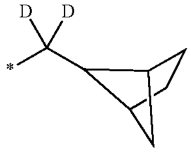
9-624
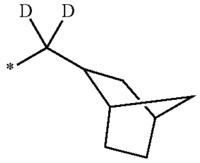
9-625
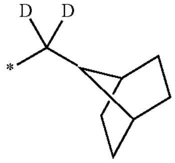
9-626
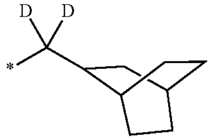
9-627
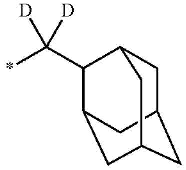
9-628
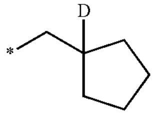
9-629
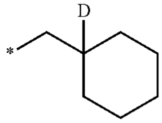
9-630
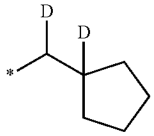
9-631
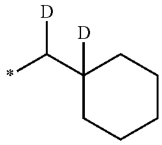
-continued
9-632
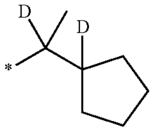
9-633
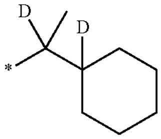
9-634
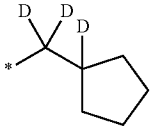
9-635
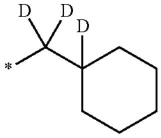
9-636
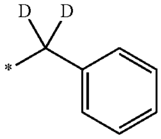
9-637
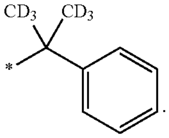
The "group represented by one of Formulae 9-1 to 9-39 in which at least one hydrogen is substituted with —F" and the "group represented by one of Formulae 9-201 to 9-230 in which at least one hydrogen is substituted with —F" may be, for example, a group represented by one of Formulae 9-701 to 9-710:
9-701
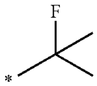
9-702
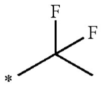
9-703
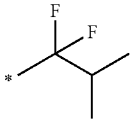
9-704
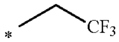

-continued
9-705
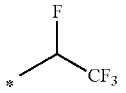
9-706
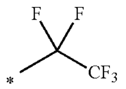
9-707
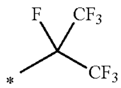
9-708
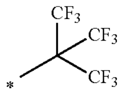
9-709
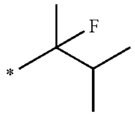
9-710
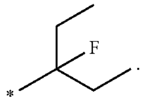
The “group represented by one of Formulae 10-1 to 10-145 in which at least one hydrogen is substituted with deuterium” and the “group represented by one of Formulae 10-201 to 10-354 in which at least one hydrogen is substituted with deuterium” may be, for example, a group represented by one of Formulae 10-501 to 10-553;
10-501
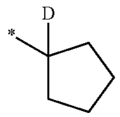
10-502
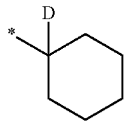
10-503
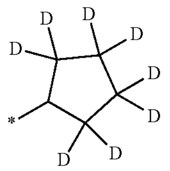
10-504
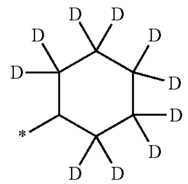
-continued
10-505
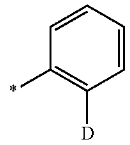
10-506
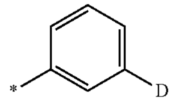
10-507
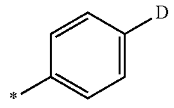
10-508
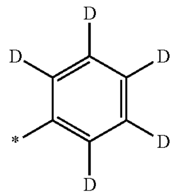
10-509
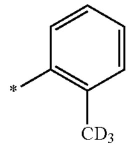
10-510
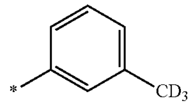
10-511
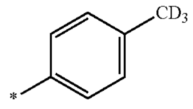
10-512
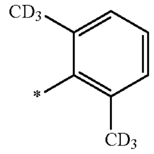
10-513
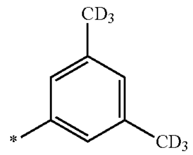
10-514
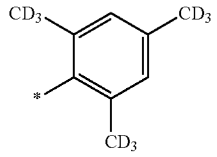

-continued
10-515
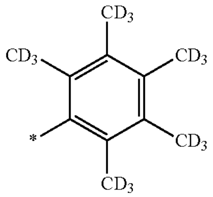
10-516
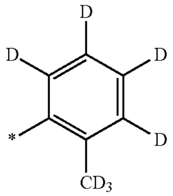
10-517
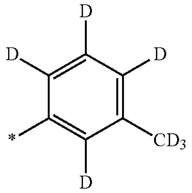
10-518
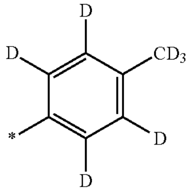
10-519
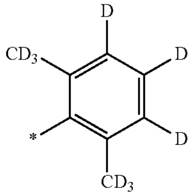
10-520
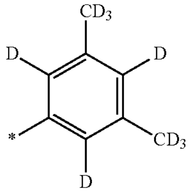
10-521
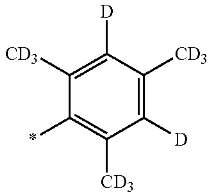
10-522
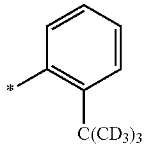
-continued
10-523
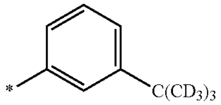
10-524
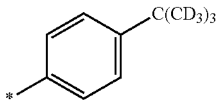
10-525
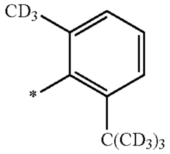
10-526
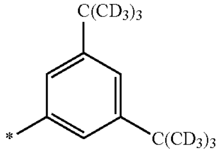
10-527
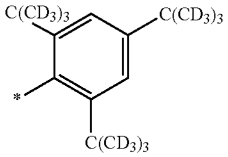
10-528
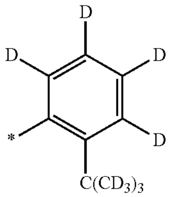
10-529
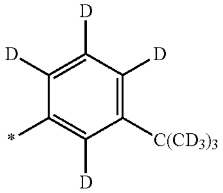
10-530
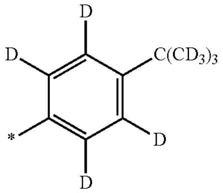
10-531
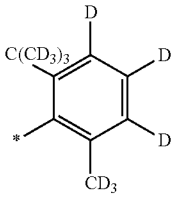

-continued
10-532
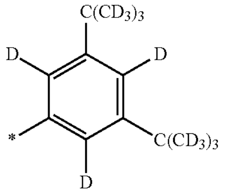
10-533
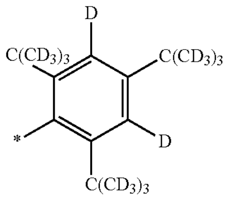
10-534
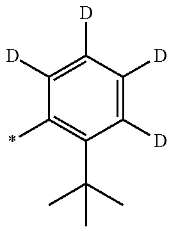
10-535
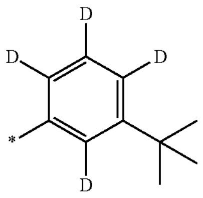
10-536
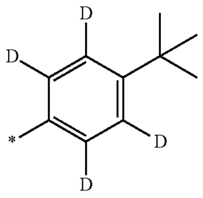
10-537
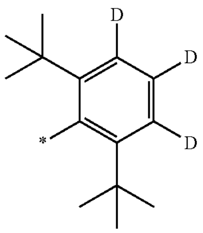
10-538
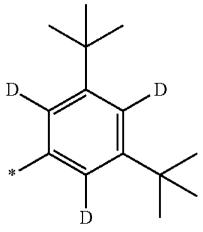
-continued
10-540
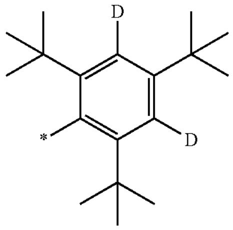
10-541
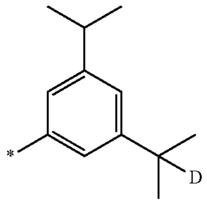
10-542
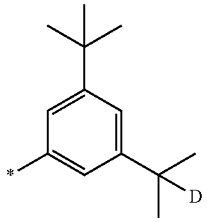
10-543
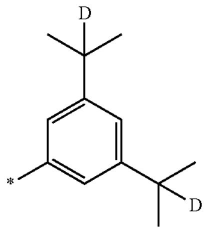
10-544
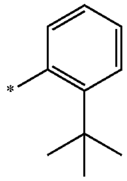
10-545
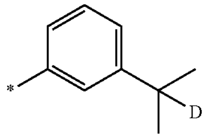
10-546
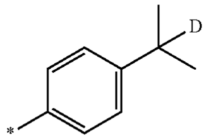
10-547
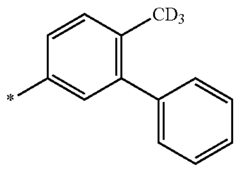

-continued
10-548
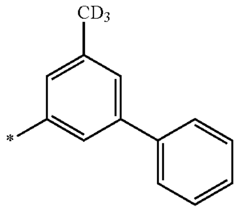
10-549
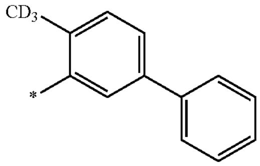
10-550
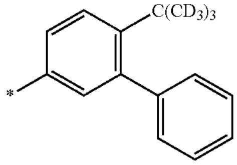
10-551
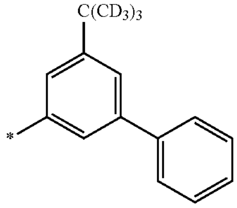
10-552
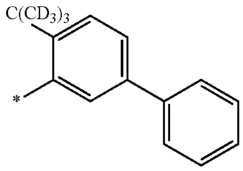
10-553
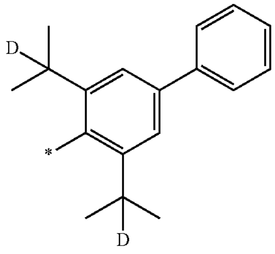
The "group represented by one of Formulae 10-1 to 10-145 in which at least one hydrogen is substituted with —F" and the "group represented by Formulae 10-201 to 10-354 in which at least one hydrogen is substituted with —F" may be, for example, a group represented by one of Formulae 10-601 to 10-636:
10-601
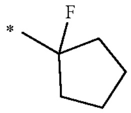
-continued
10-602
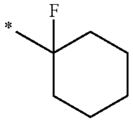
10-603
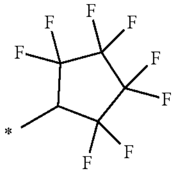
10-604
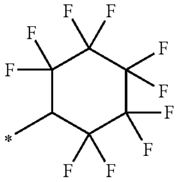
10-605
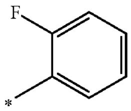
10-606
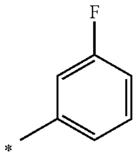
10-607
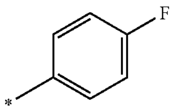
10-608
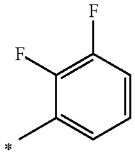
10-609
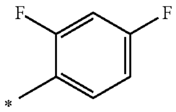
10-610
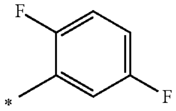
10-611
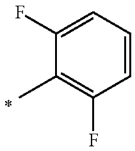

-continued
10-612
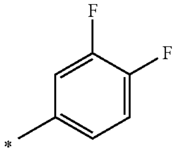
10-613
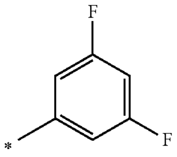
10-614
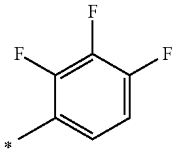
10-615
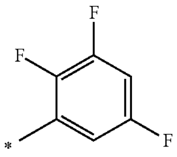
10-616
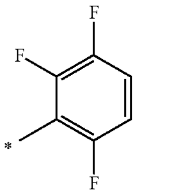
10-617
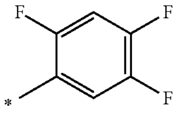
10-618
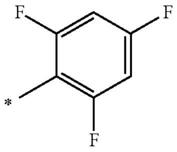
10-619
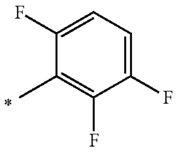
10-620
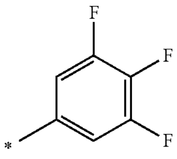
-continued
10-621
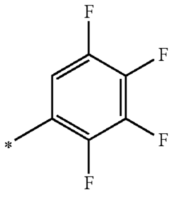
10-622
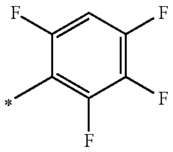
10-623
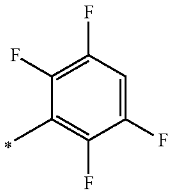
10-624
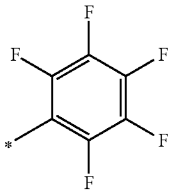
10-625
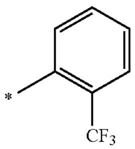
10-626
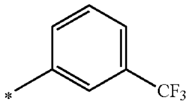
10-627
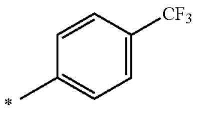
10-628
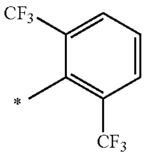
10-629
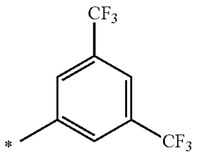

-continued 10-630

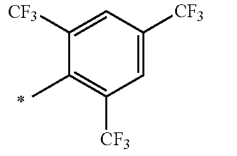

10-631

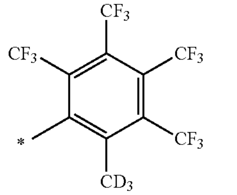

10-632

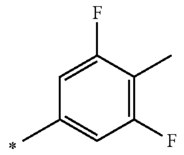

10-633

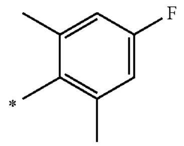

10-634

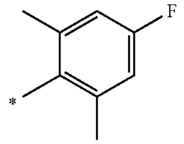

10-635

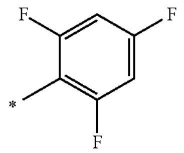

10-636

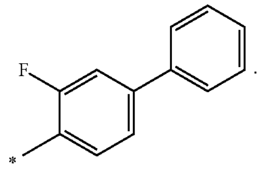

In Formulae 2-1 and 2-2, i) two or more of a plurality of $R_1$(s) may be optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, ii) two or more of a plurality of $R_2$(s) may be optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, iii) two or more of a plurality of $R_3$(s) may be optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, iv) two or more of a plurality of $R_4$(s) may be optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$. $R_{10a}$ may be the same as described in connection with $R_1$.

* and *' in Formulae 2-1 and 2-2 each indicate a binding site to M in Formula 1.

In an embodiment, a group represented by

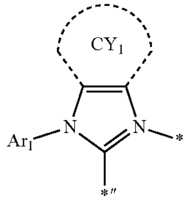

in Formula 2-1 may be a group represented by one of Formulae CY1(1) to CY1(26):

CY(1)

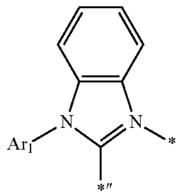

CY(2)

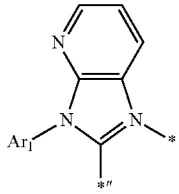

CY(3)

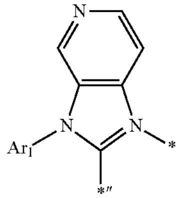

CY(4)

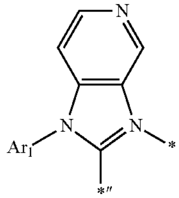

CY(5)

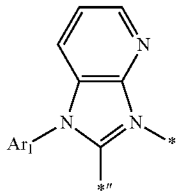

-continued
CY(6)
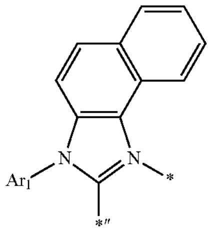
CY(7)
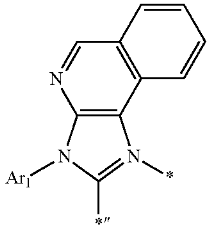
CY(8)
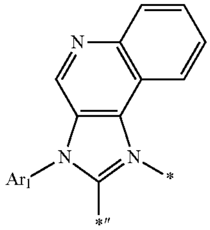
CY(9)
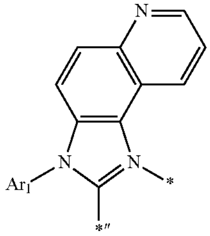
CY(10)
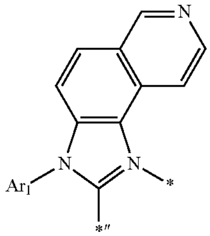
CY(11)
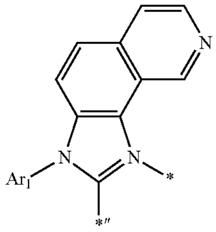
-continued
CY(12)
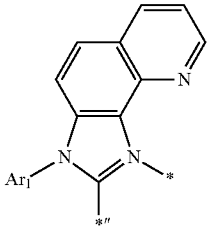
CY(13)
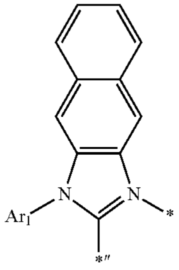
CY(14)
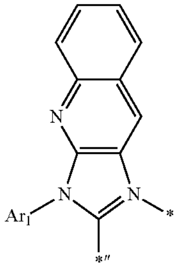
CY(15)
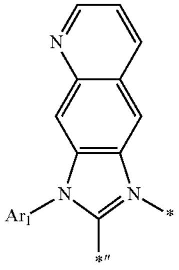
CY(16)
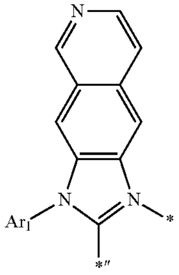
CY(17)
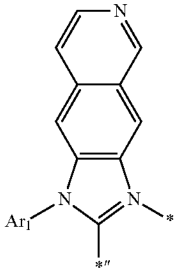

-continued
CY(18)
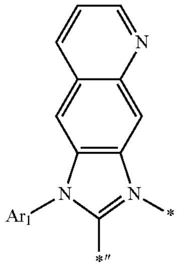
CY(19)
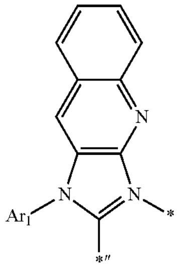
CY(20)
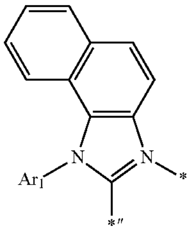
CY(21)
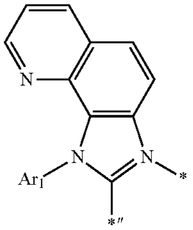
CY(22)
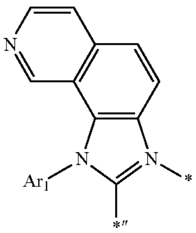
CY(23)
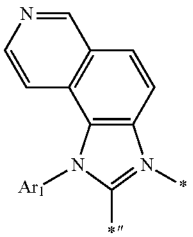
-continued
CY(24)
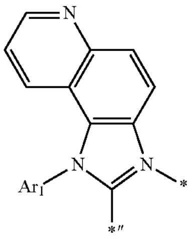
CY(25)
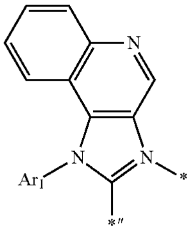
CY(26)
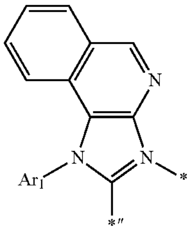
In Formulae CY1(1) to CY1(26), * indicates a binding site to M in Formula 1, and *" indicates a binding site to a neighboring carbon atom in Formula 2-1.
In one or more embodiments, a group represented by
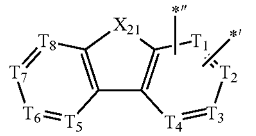
in Formula 2-1 may be a group represented by one of Formulae CY2-1 to CY2-6:
CY2-1
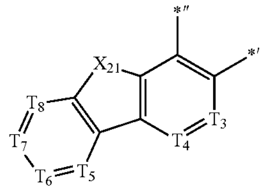
CY2-2
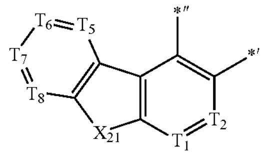

-continued
CY2-3
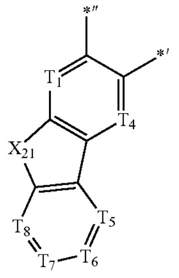
CY2-4
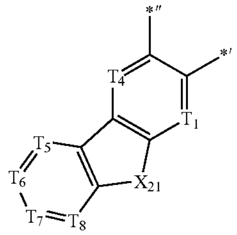
CY2-5
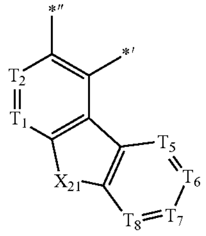
CY2-6
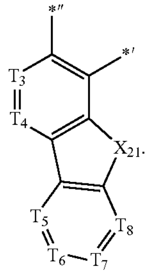
In Formulae CY2-1 to CY2-6, *' indicates a binding site to M in Formula 1, and *" indicates a binding site to a neighboring carbon atom in Formula 2-1.
In one or more embodiments, a group represented by
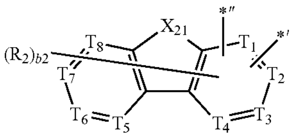
in Formula 2-1 may be a group represented by one of Formulae CY2-1-1 to CY2-1-22:
CY2-1-1
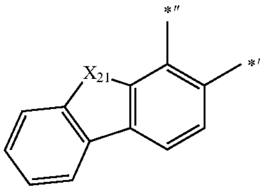
CY2-1-2
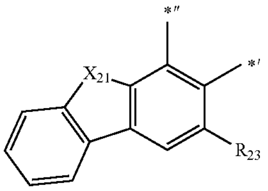
CY2-1-3
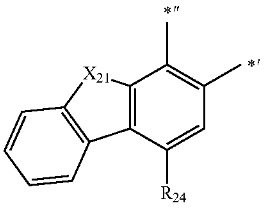
CY2-1-4
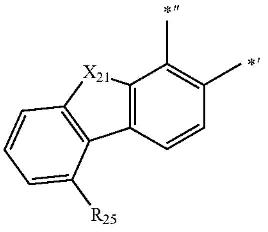
CY2-1-5
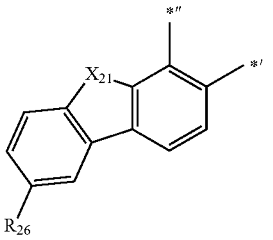
CY2-1-6
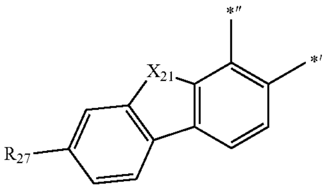
CY2-1-7
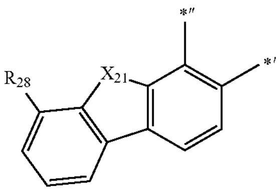

-continued
CY2-1-8
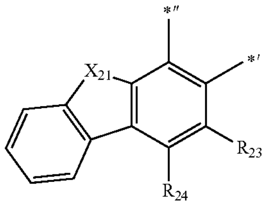
CY2-1-9
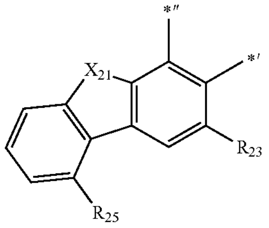
CY2-1-10
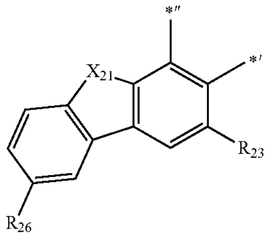
CY2-1-11
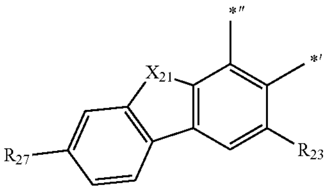
CY2-1-12
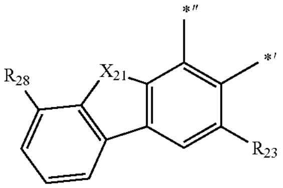
CY2-1-13
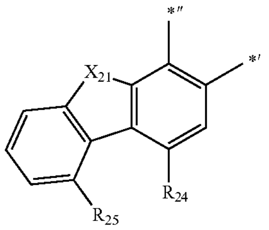
CY2-1-14
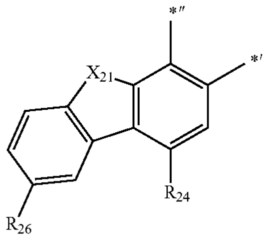
-continued
CY2-1-15
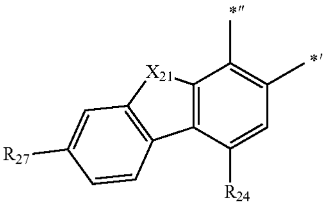
CY2-1-16
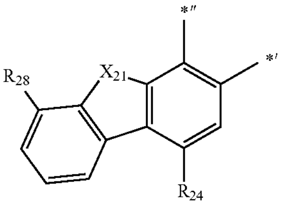
CY2-1-17
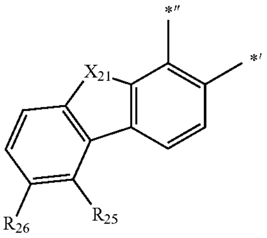
CY2-1-18
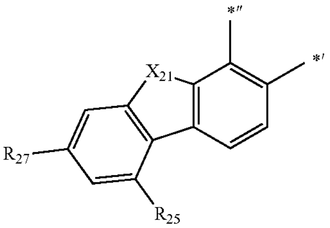
CY2-1-19
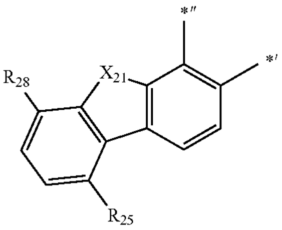
CY2-1-20
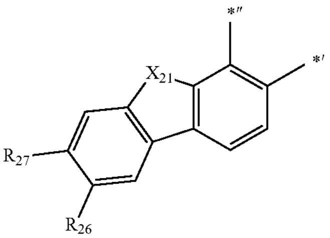

-continued

CY2-1-21

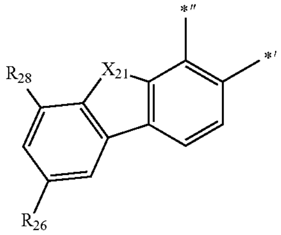

CY2-1-22

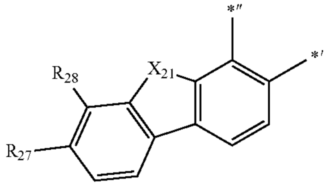

wherein, in Formulae CY2-1-1 to CY2-1-22, $R_{21}$ to $R_{28}$ are the same as described in connection with $R_2$, and each of $R_{21}$ to $R_{28}$ may not be hydrogen,

*' indicates a binding site to M in Formula 1, and

*" indicates a binding site to a neighboring carbon atom in Formula 2-1.

In an embodiment, a group represented by

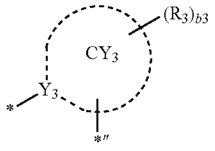

in Formula 2-2 may be a group represented by Formula CY3(1):

CY3(1)

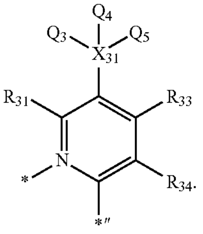

In Formula CY3(1), $X_{31}$ may be Si or Ge, and $Q_3$ to $Q_5$ are the same as described in the present specification, $R_{31}$, $R_{33}$, and $R_{34}$ may be the same as described in connection with $R_3$, $R_{33}$ and $R_{34}$ may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$ (for example, a cyclohexane group, a norbornane group, a benzene group, a pyridine group, a naphthalene group, a quinoline group, or an isoquinoline group, each unsubstituted or substituted with at least one $R_{10a}$),

* indicates a binding site to M in Formula 1, and

*" indicates a binding site to ring $CY_4$ in Formula 2-2.

For example, $R_{33}$ in Formula CY3(1) may include two or more carbons.

In one or more embodiments, a group represented by

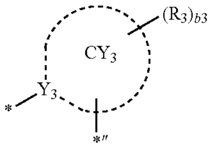

in Formula 2-2 may be a group represented by one of Formulae CY3-1 to CY3-16:

CY3-1

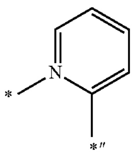

CY3-2

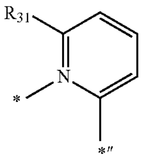

CY3-3

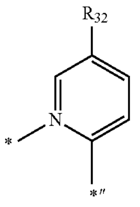

CY3-4

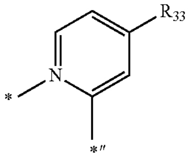

CY3-5

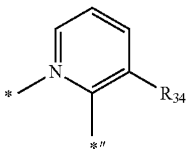

CY3-6

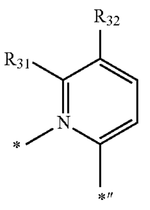

-continued

CY3-7

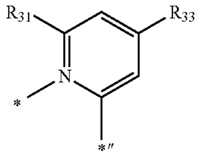

CY3-8

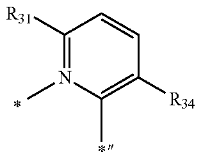

CY3-9

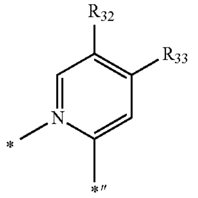

CY3-10

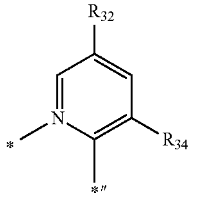

CY3-11

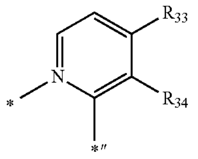

CY3-12

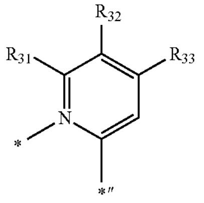

CY3-13

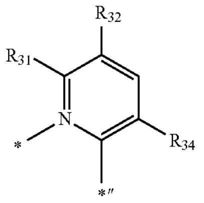

CY3-14

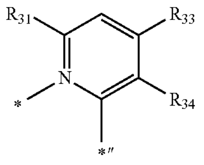

-continued

CY3-15

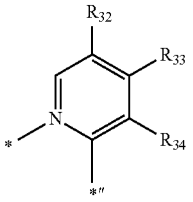

CY3-16

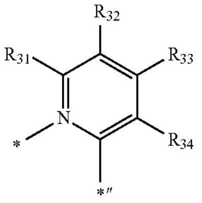

wherein, in Formulae CY3-1 to CY3-16, $R_{31}$ to $R_{34}$ are the same as described in connection with $R_3$, and each of $R_{31}$ to $R_{34}$ is not hydrogen,

* indicates a binding site to M in Formula 1, and

*" indicates a binding site to ring $CY_4$ in Formula 2-2.

In one or more embodiments, a group represented by

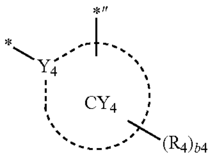

in Formula 2-2 may be a group represented by one of Formulae CY4-1 to CY4-16:

CY4-1

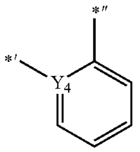

CY4-2

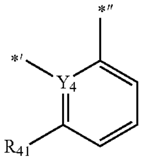

CY4-3

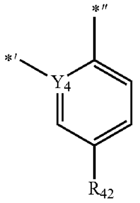

-continued

CY4-4

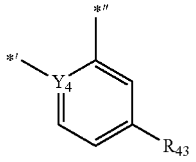

CY4-5

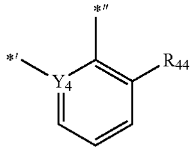

CY4-6

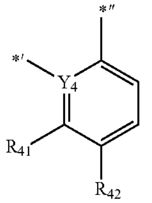

CY4-7

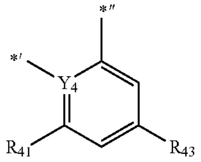

CY4-8

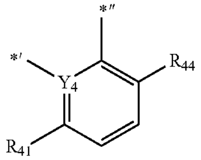

CY4-9

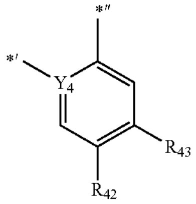

CY4-10

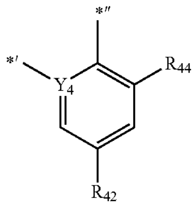

CY4-11

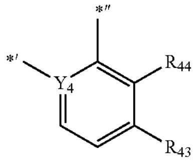

-continued

CY4-12

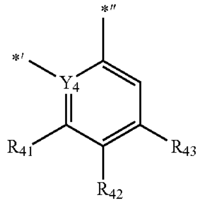

CY4-13

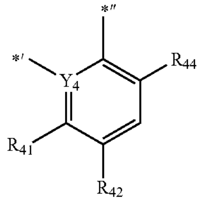

CY4-14

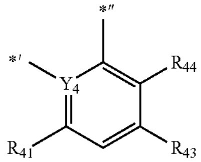

CY4-15

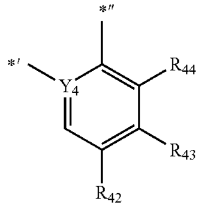

CY4-16

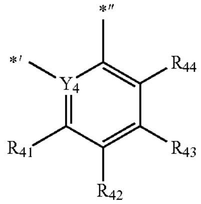

wherein, in Formulae CY4-1 to CY4-16, $R_{41}$ to $R_{44}$ are the same as described in connection with $R_4$, and each of $R_{41}$ to $R_{44}$ is not hydrogen,

*' indicates a binding site to M in Formula 1, and

*" indicates a binding site to ring $CY_3$ in Formula 2-2.

In one or more embodiments, $L_1$ in Formula 1 may be a ligand represented by one of Formulae B1 to B360:

B1

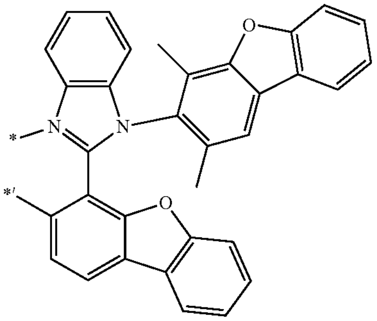

-continued
B2
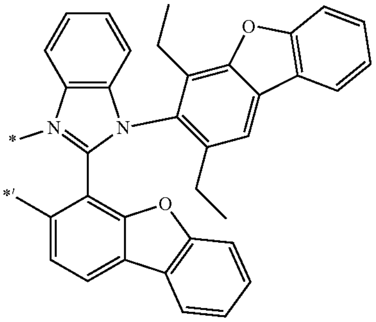
B3
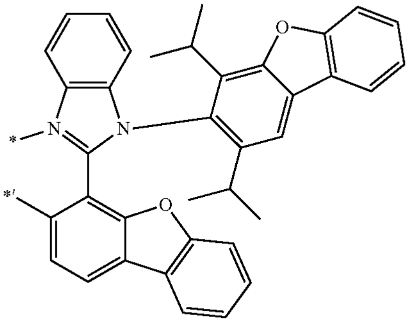
B4
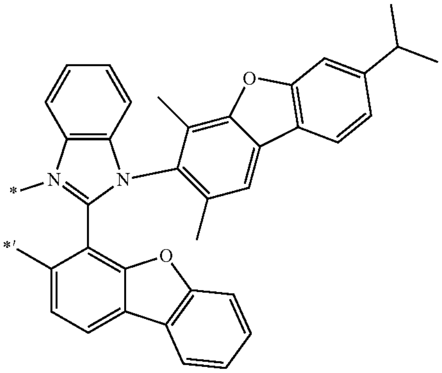
B5
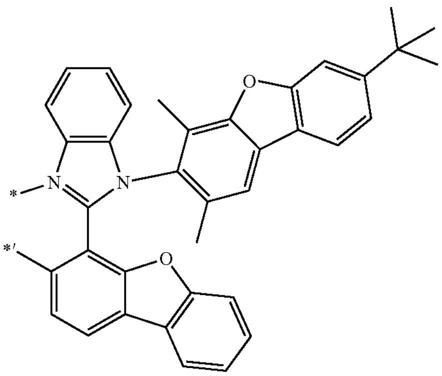
-continued
B6
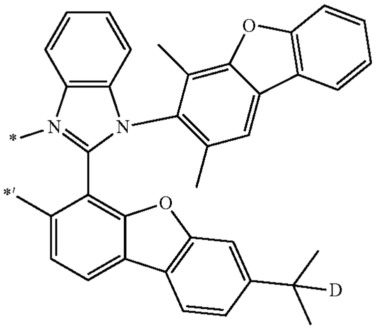
B7
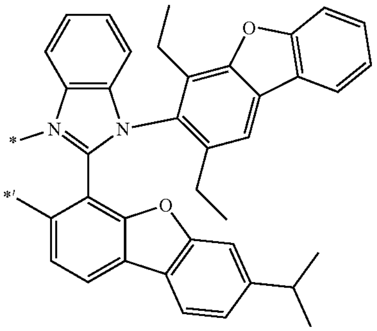
B8
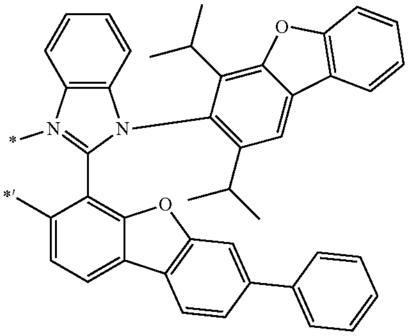
B9
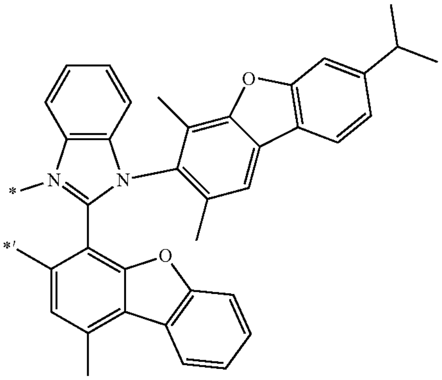

-continued
B10
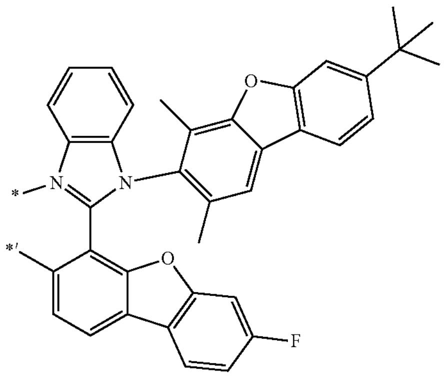
B11
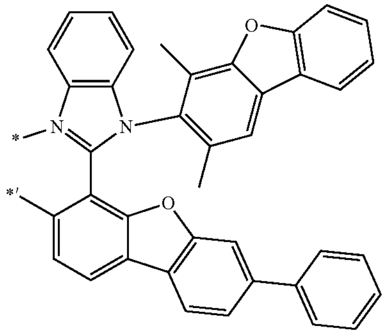
B12
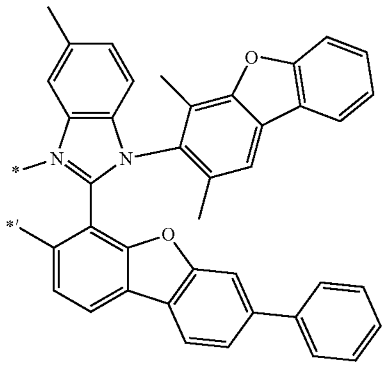
B13
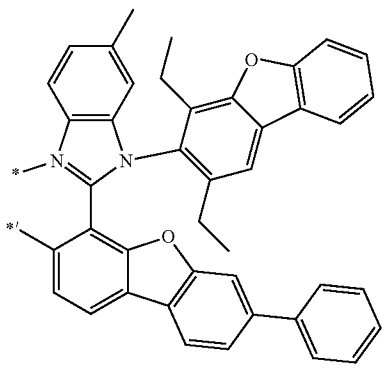
-continued
B14
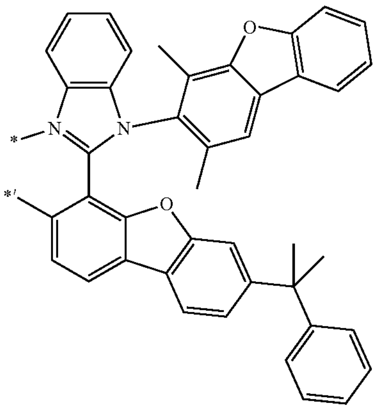
B15
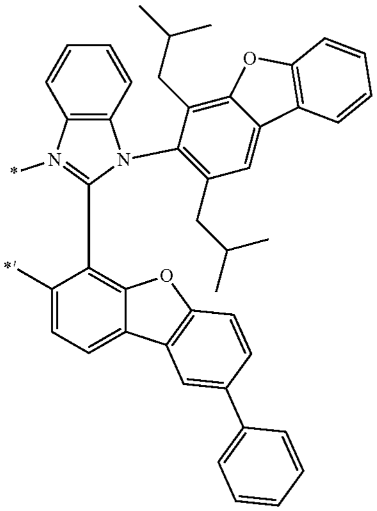
B16
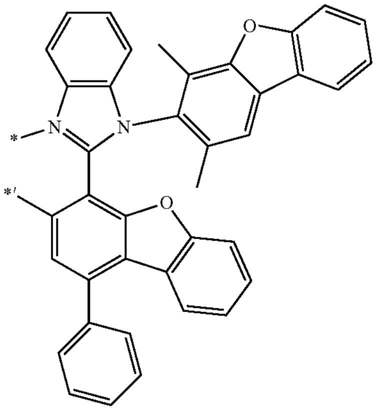

-continued
B17
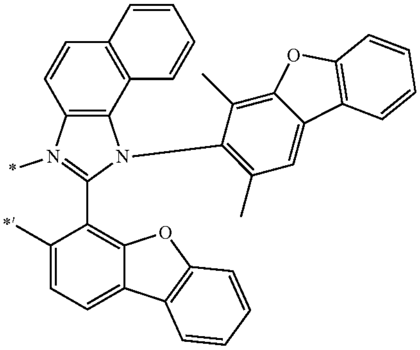
B18
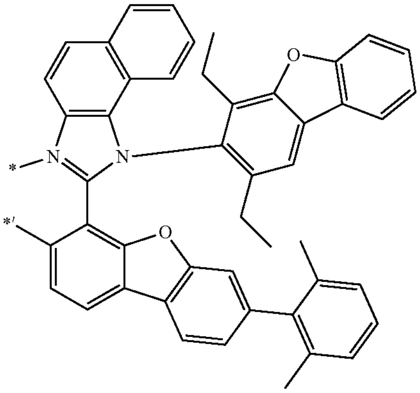
B19
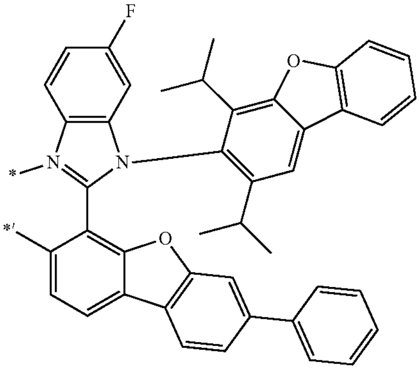
B20
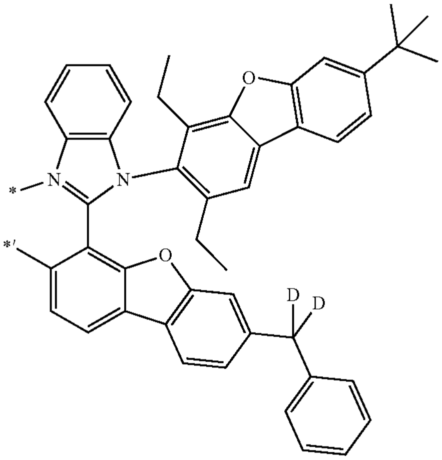
-continued
B21
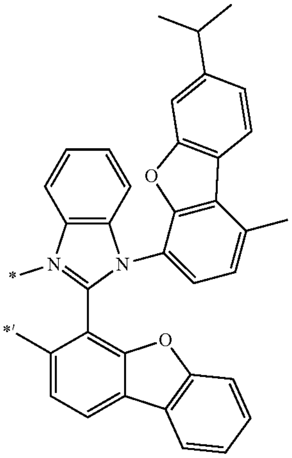
B22
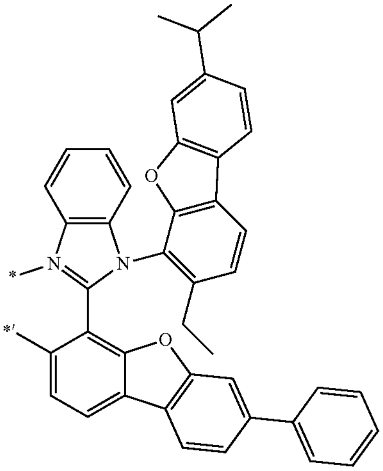
B23
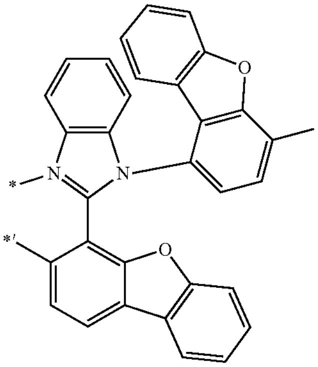

-continued
B24
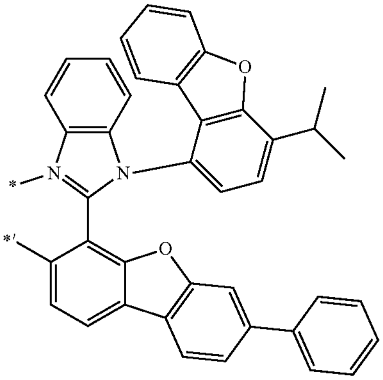
B25
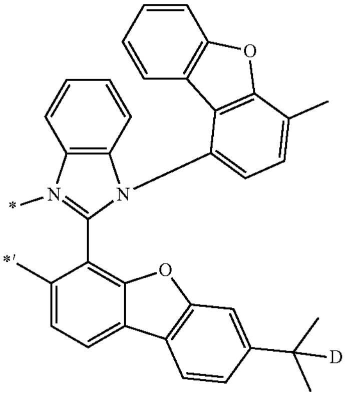
B26
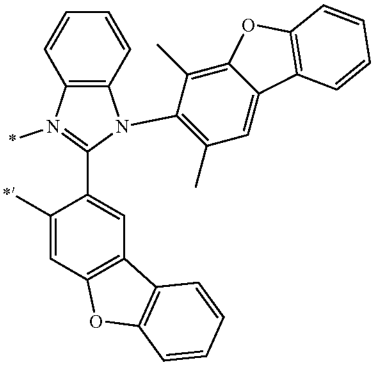
B27
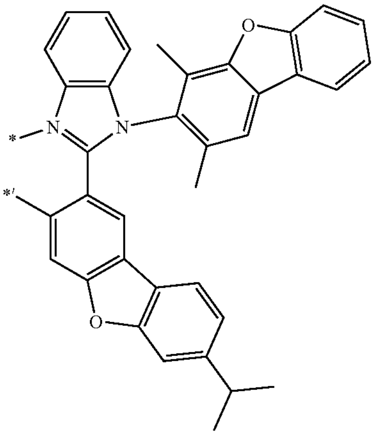
-continued
B28
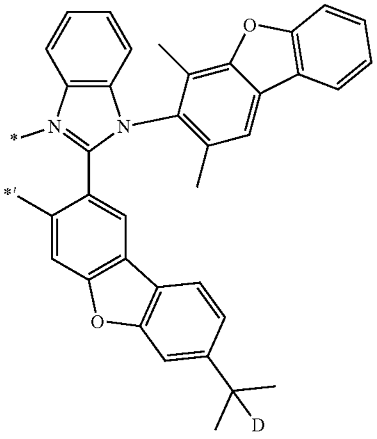
B29
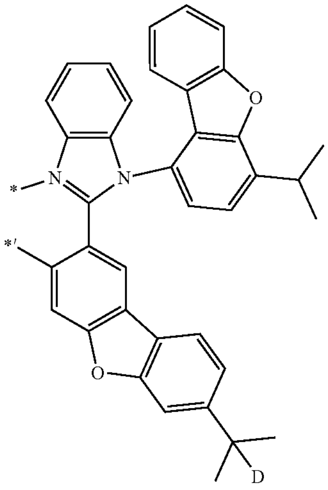
B30
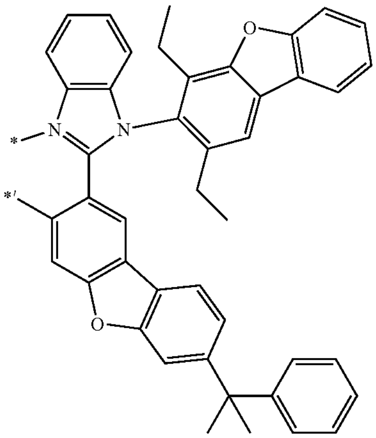

-continued
B31
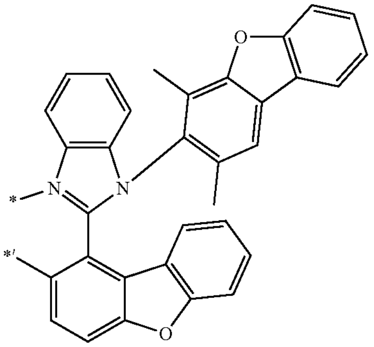
B32
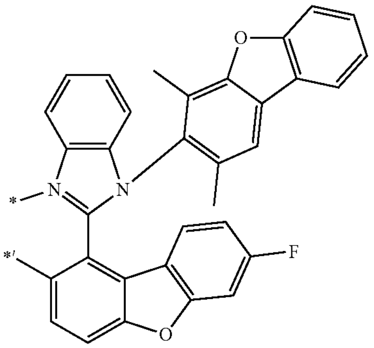
B33
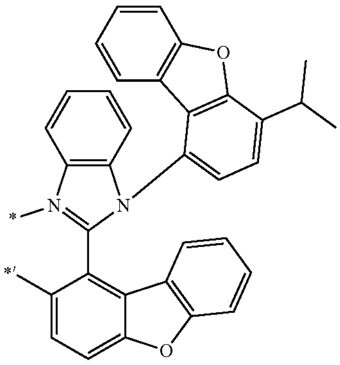
B34
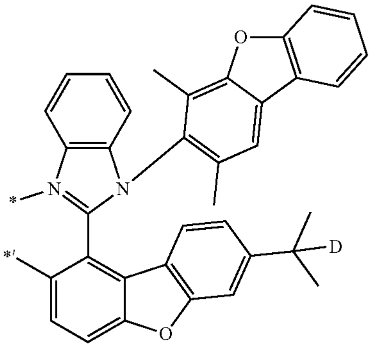
-continued
B35
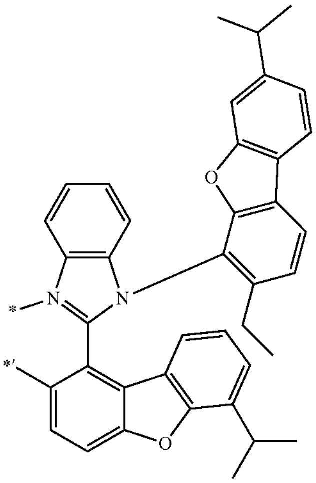
B36
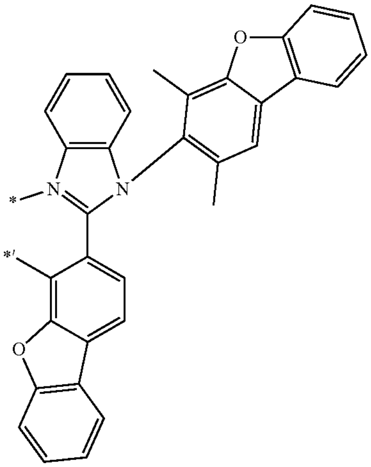
B37
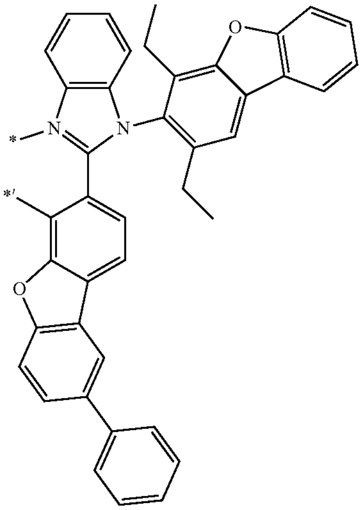

-continued
B38
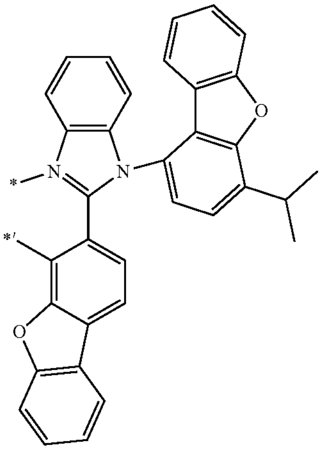
B39
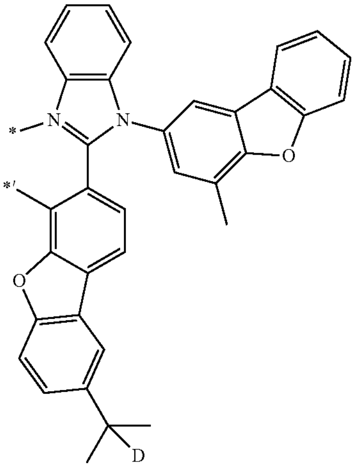
B40
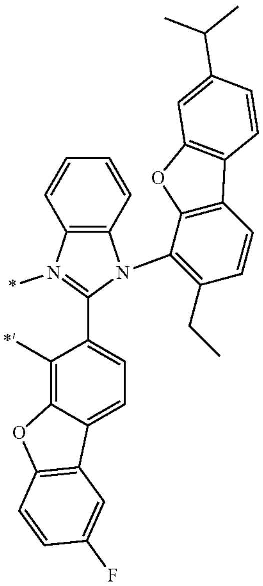
-continued
B41
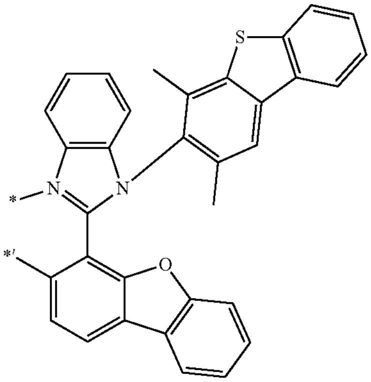
B42
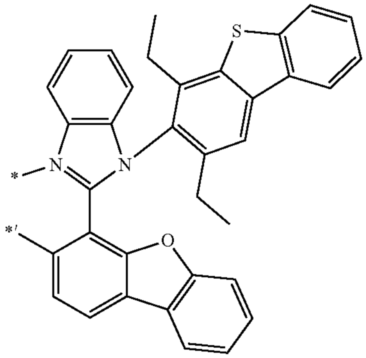
B43
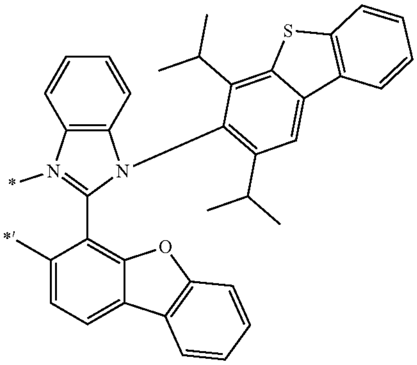
B44
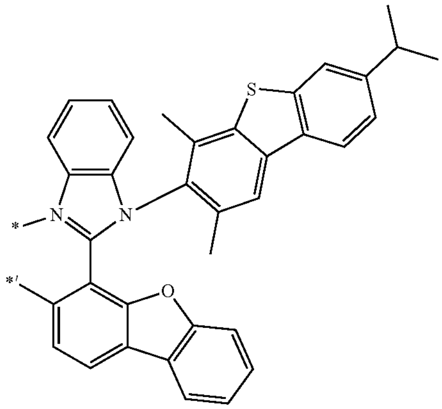

-continued
B45
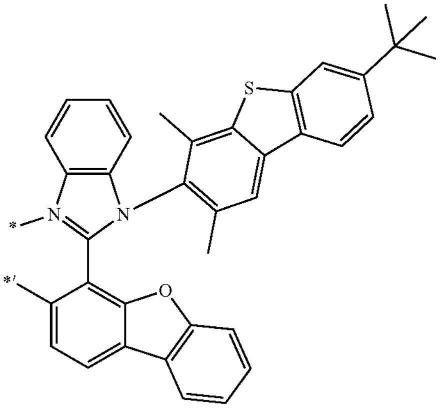
B46
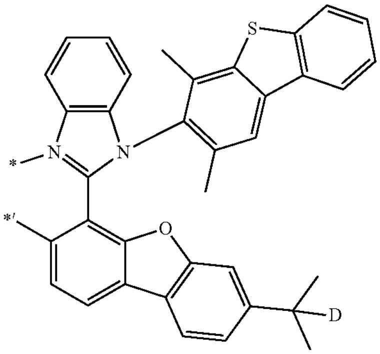
B47
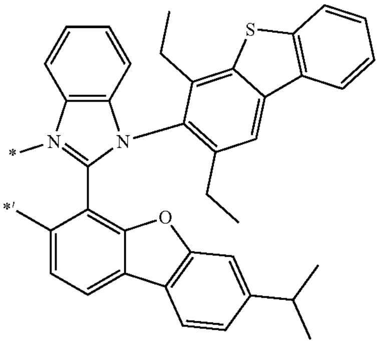
B48
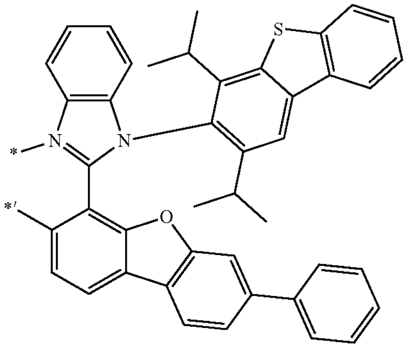
-continued
B49
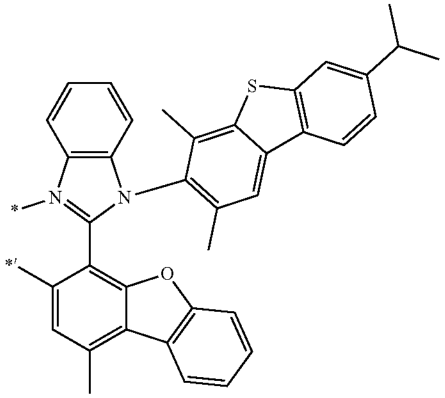
B50
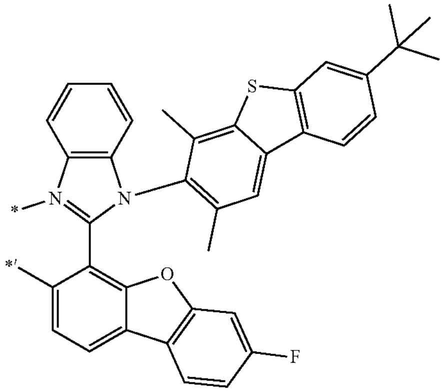
B51
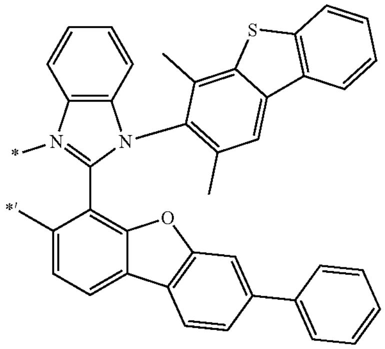
B52
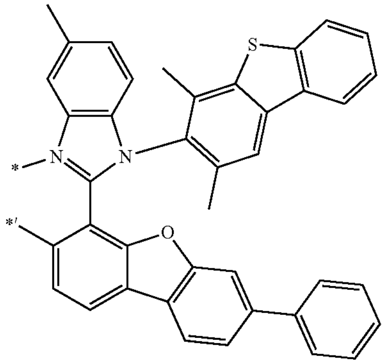

-continued
B53
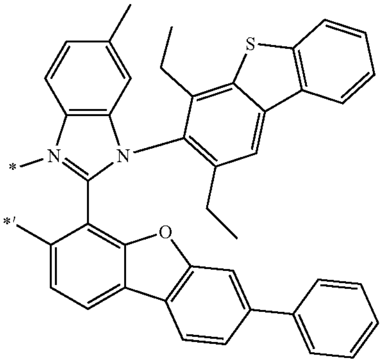
B54
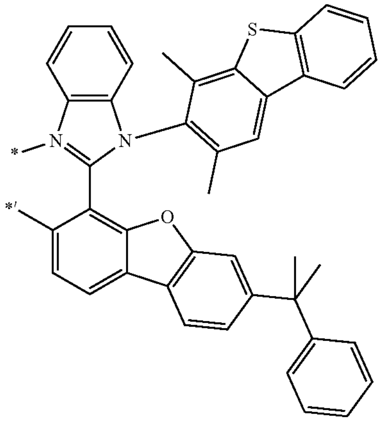
B55
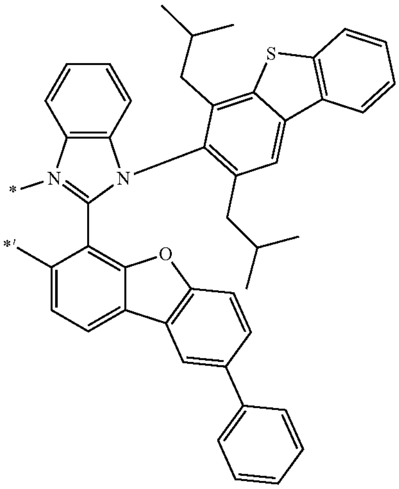
-continued
B56
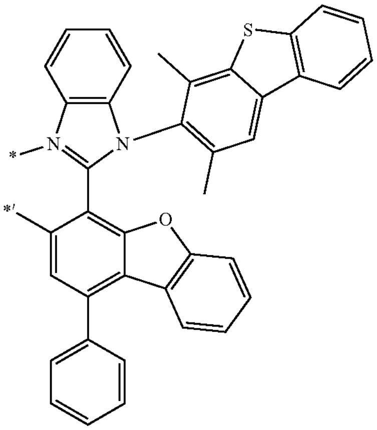
B57
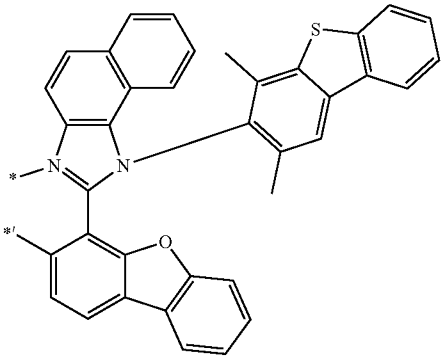
B58
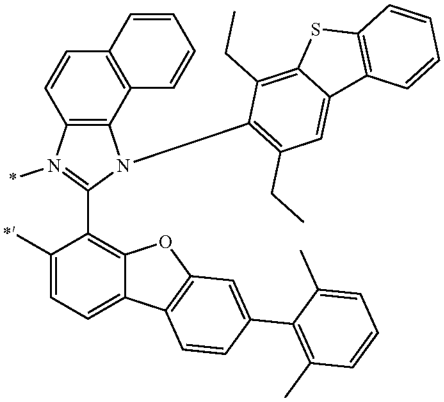
B59
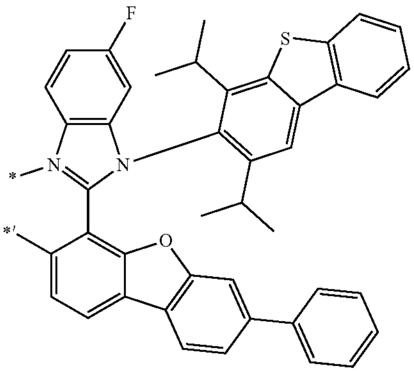

-continued
B60
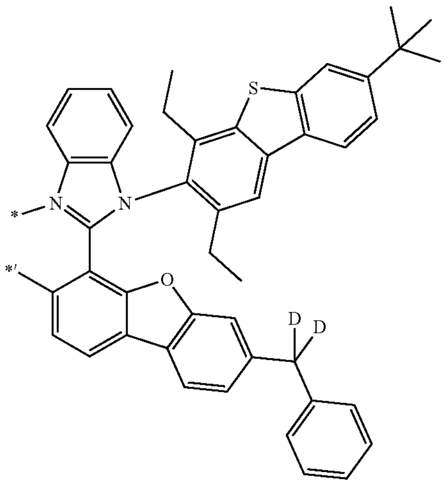
B61
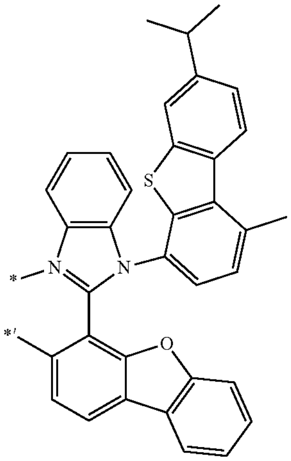
B62
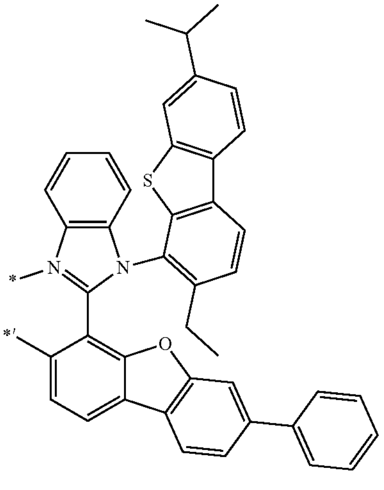
-continued
B63
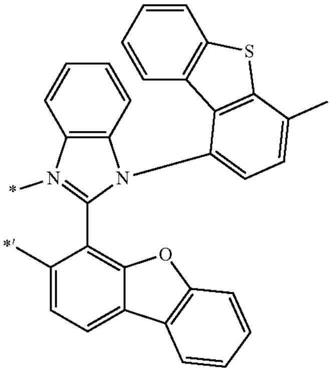
B64
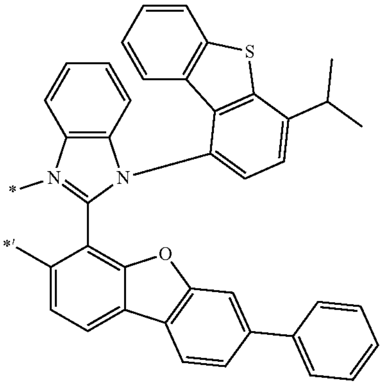
B65
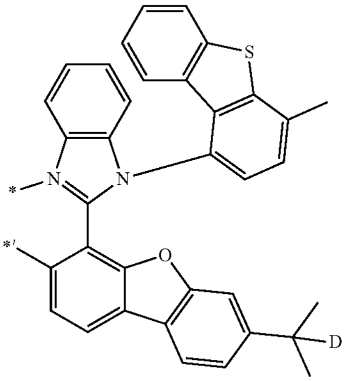
B66
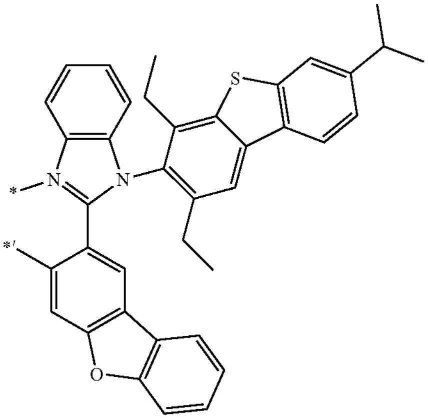

B67
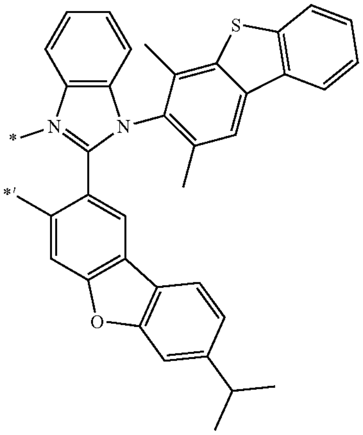
B68
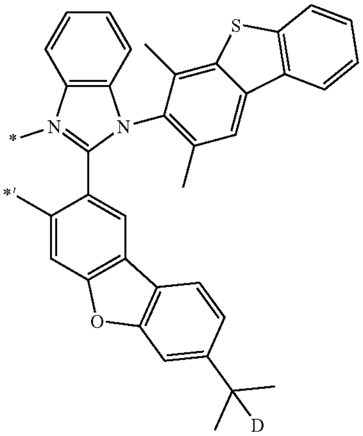
B69
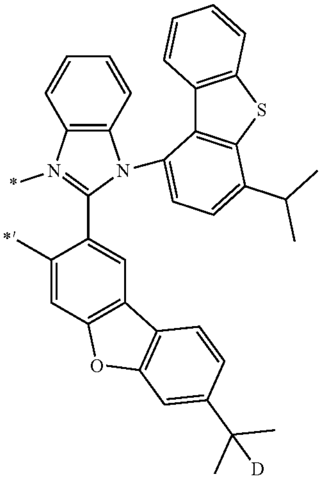
B70
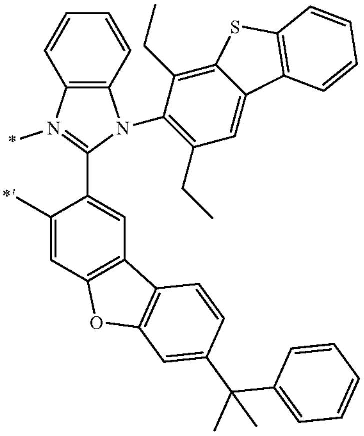
B71
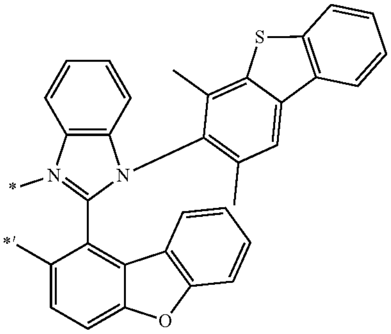
B72
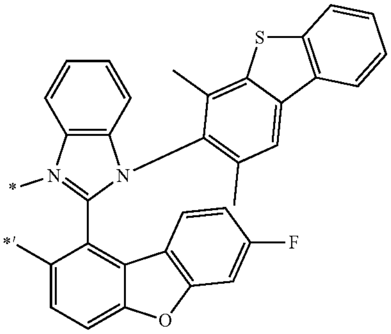
B73
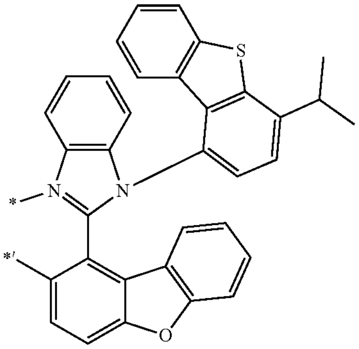

-continued
B74
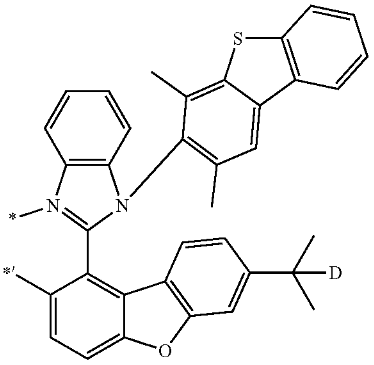
B75
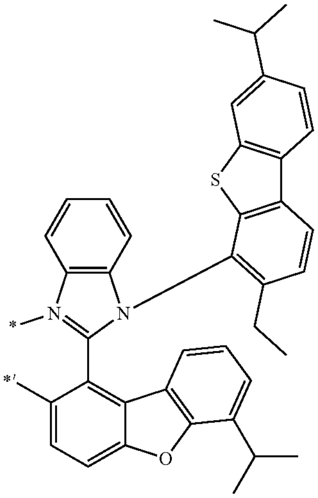
B76
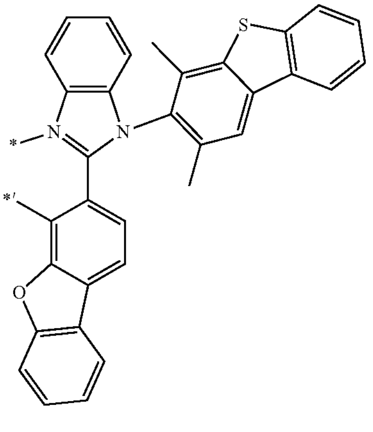
-continued
B77
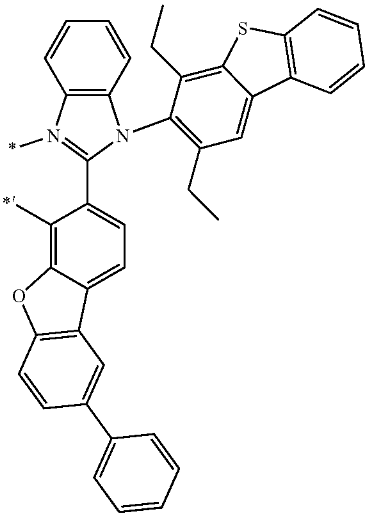
B78
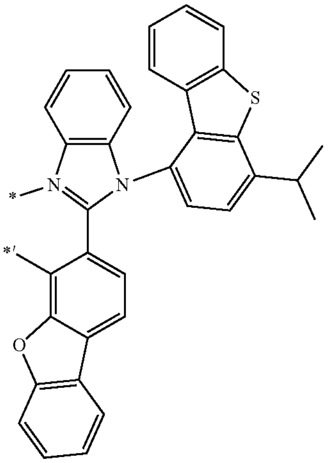
B79
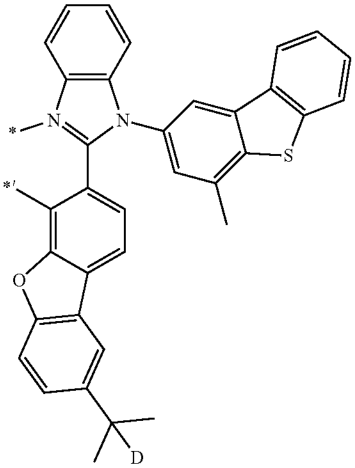

B80
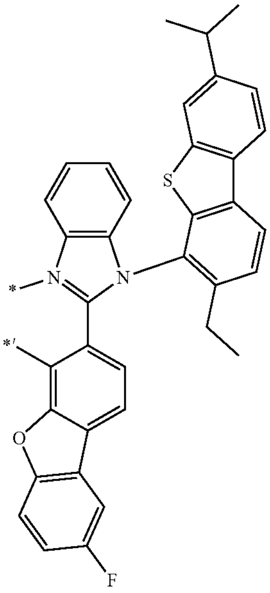
B81
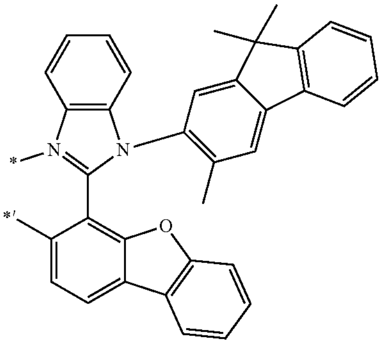
B82
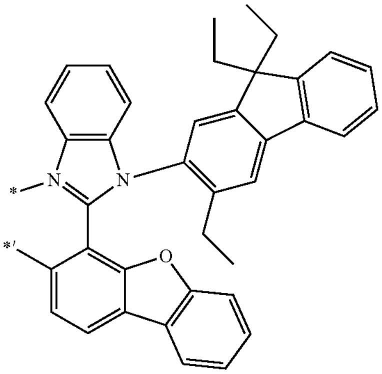
B83
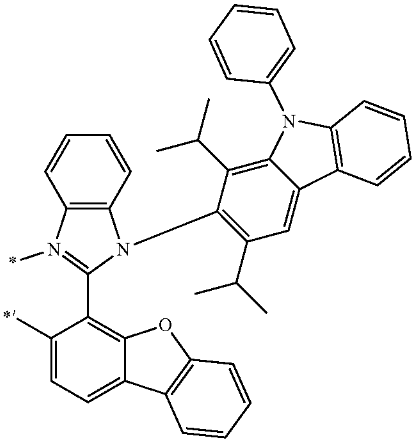
B84
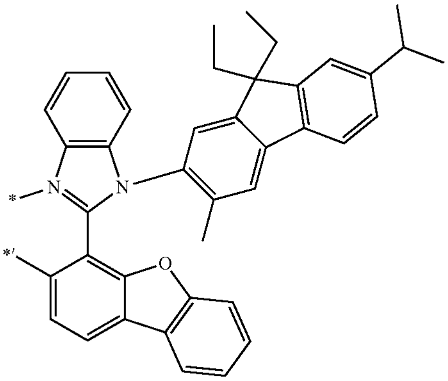
B85
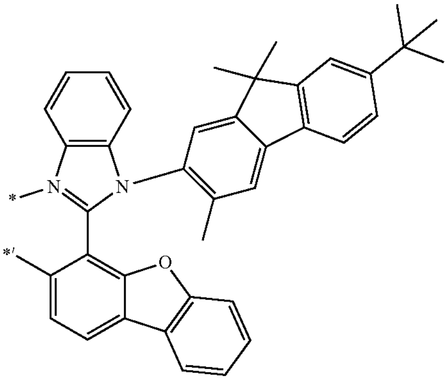
B86
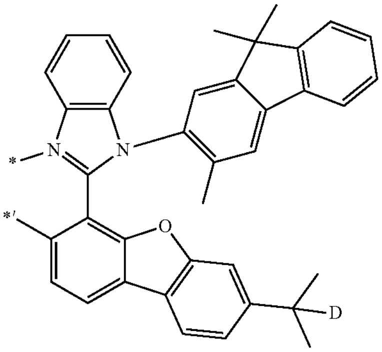

-continued
B87
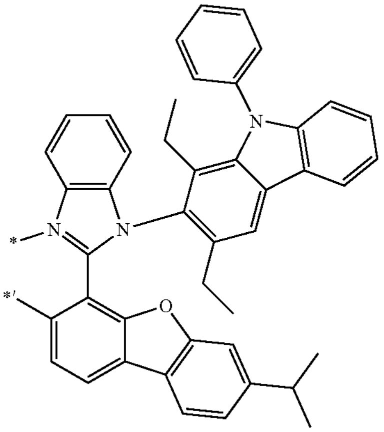
B88
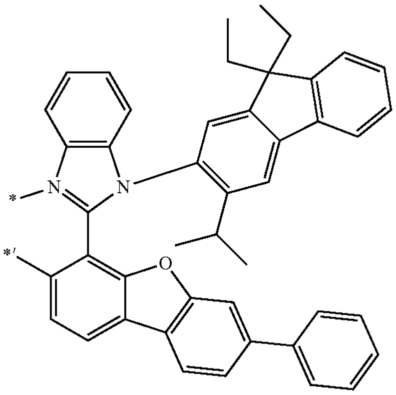
B89
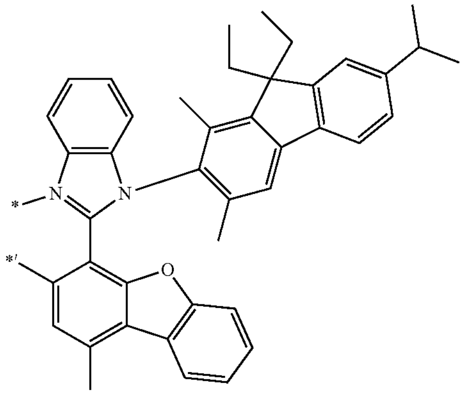
B90
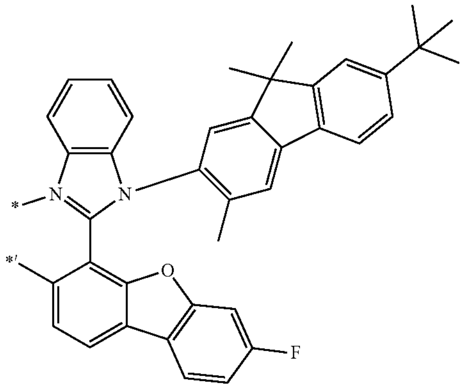
-continued
B91
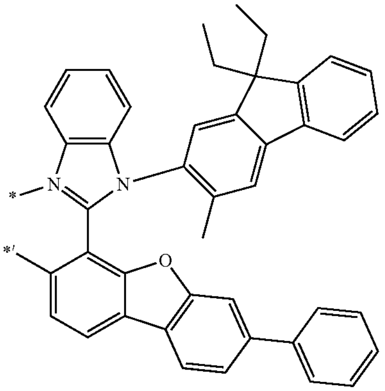
B92
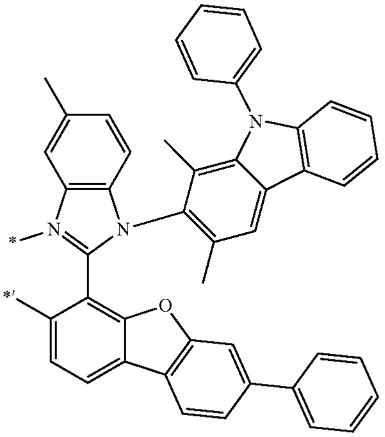
B93
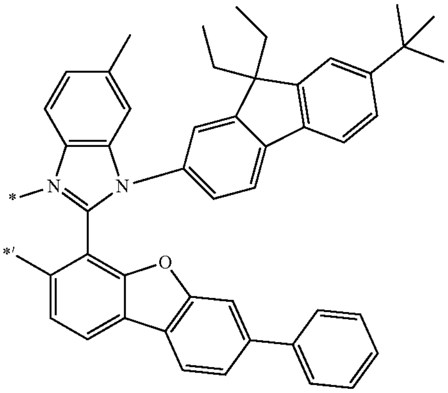

-continued
B94
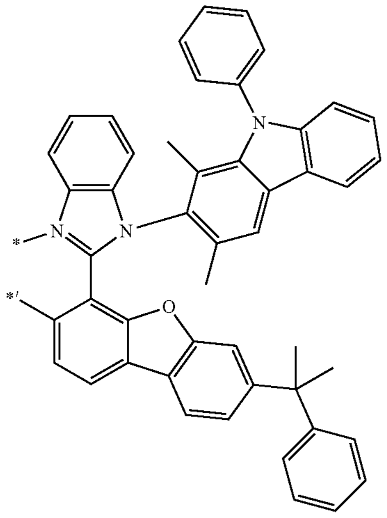
B95
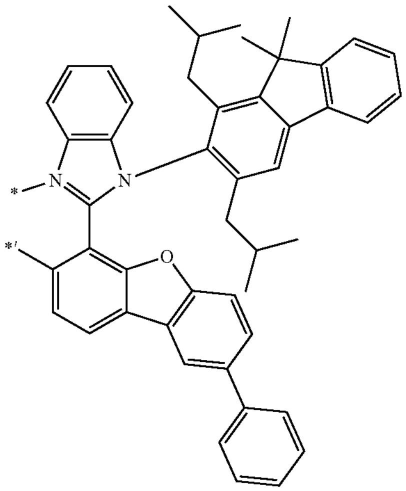
B96
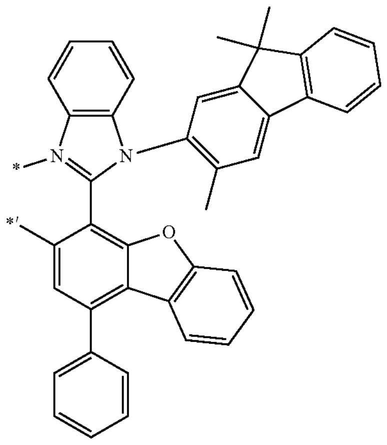
-continued
B97
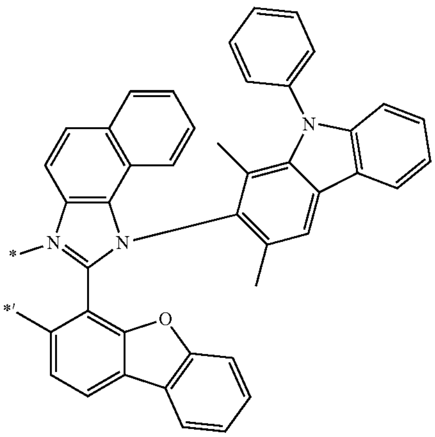
B98
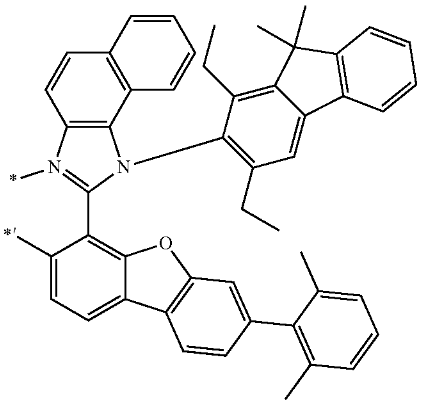
B99
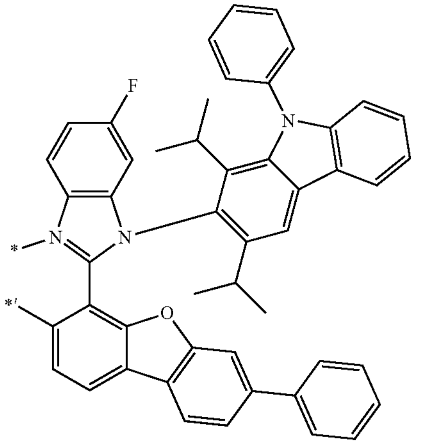

B100
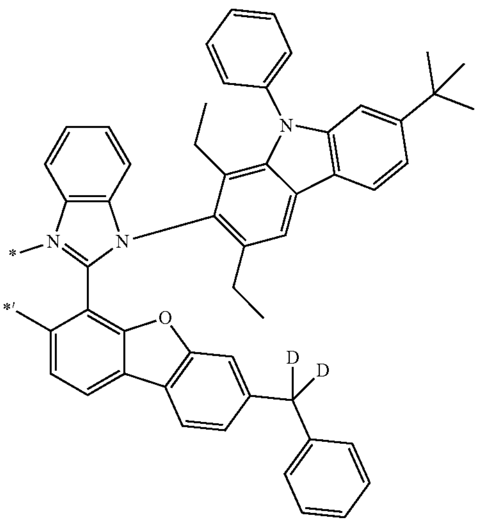
B101
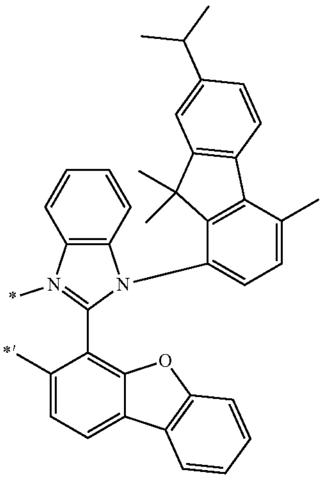
B102
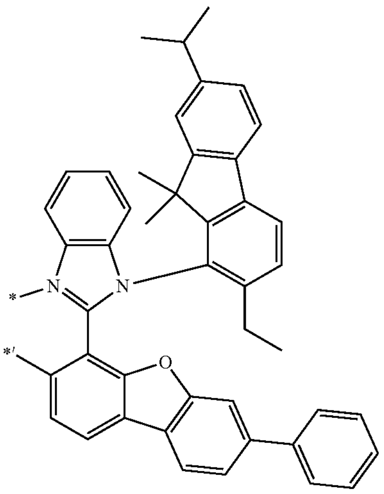
B103
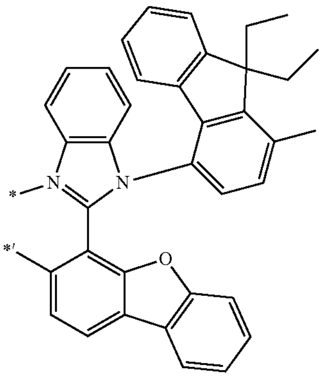
B104
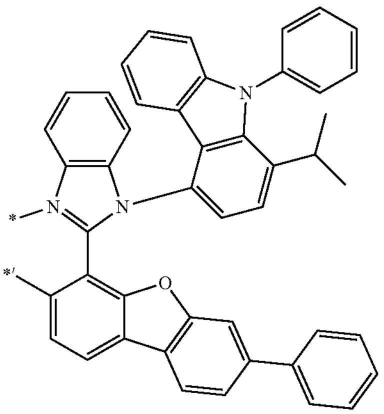
B105
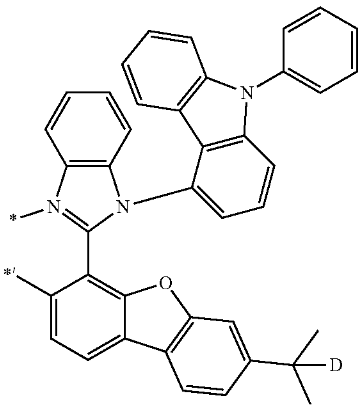
B106
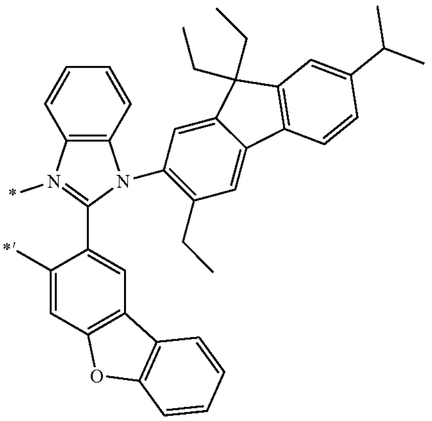

-continued
B107
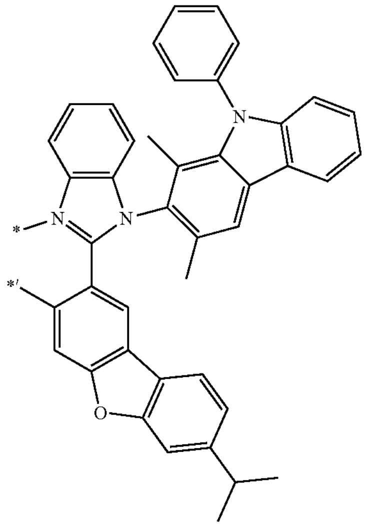
B108
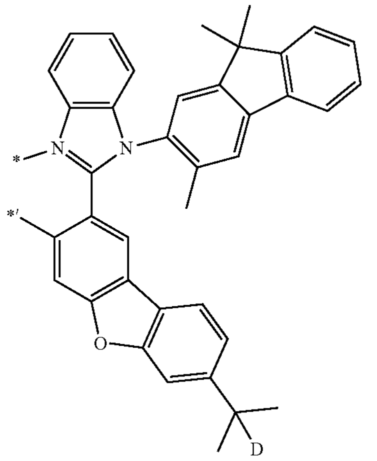
B109
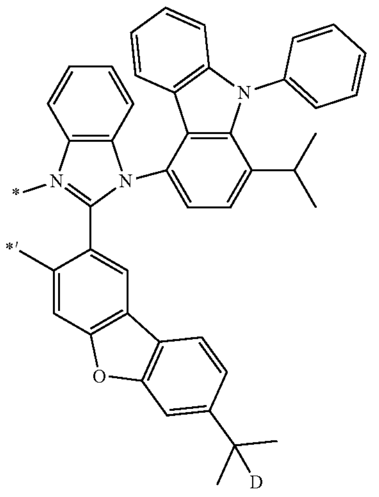
-continued
B110
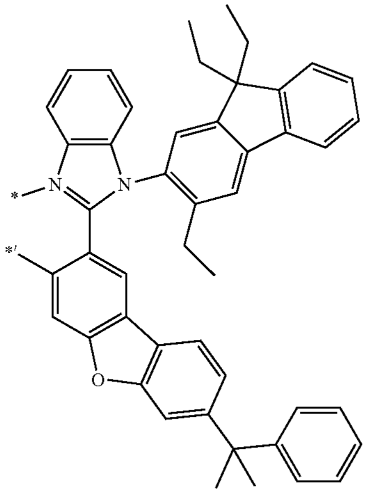
B111
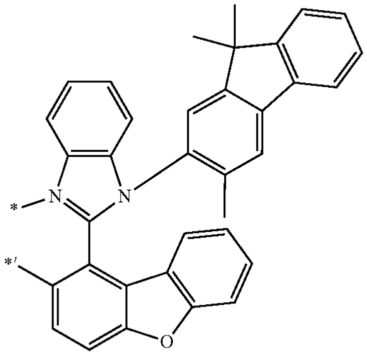
B112
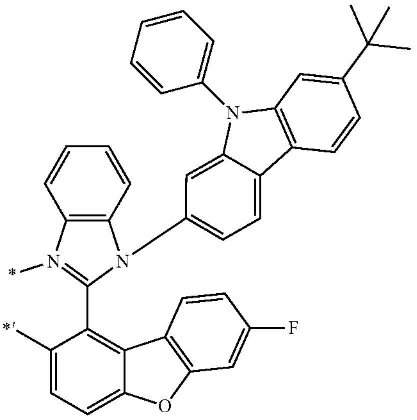

-continued
B113
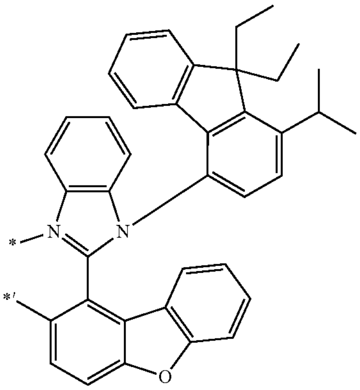
B114
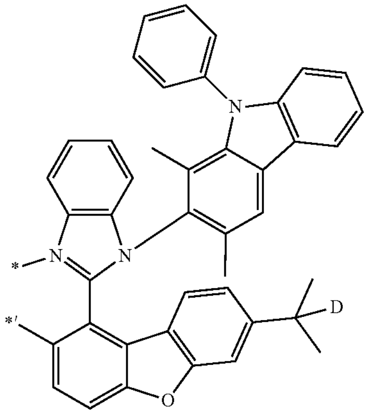
B115
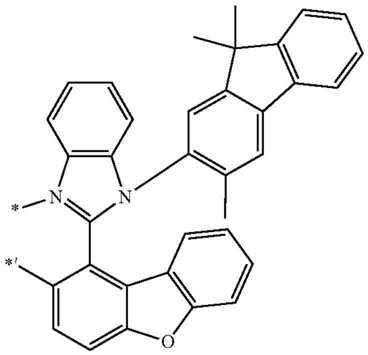
B116
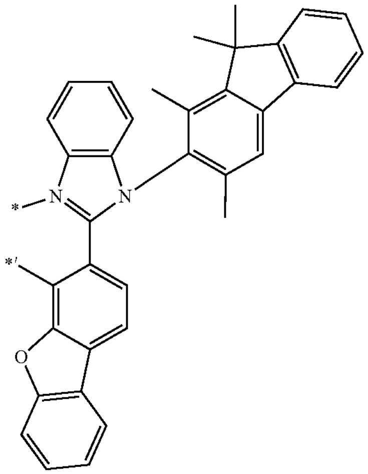
-continued
B117
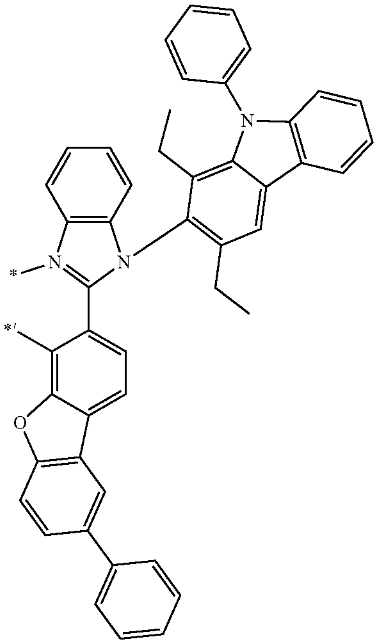
B118
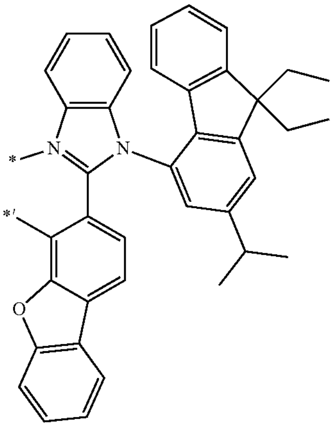
B119
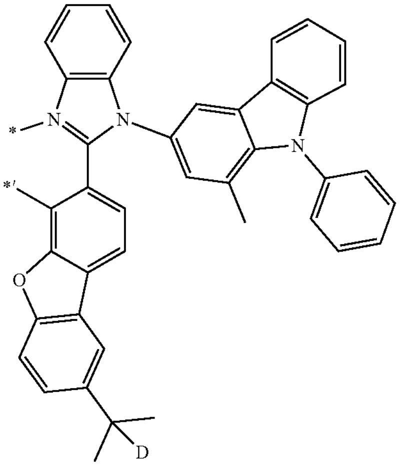

-continued
B120
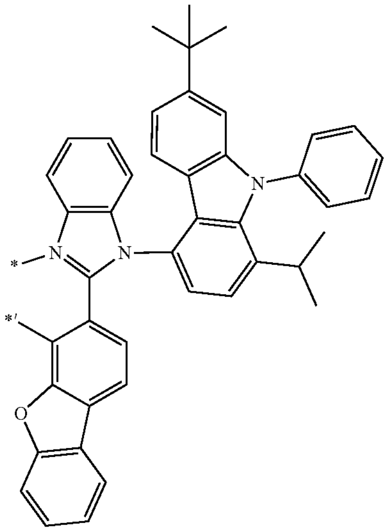
B121
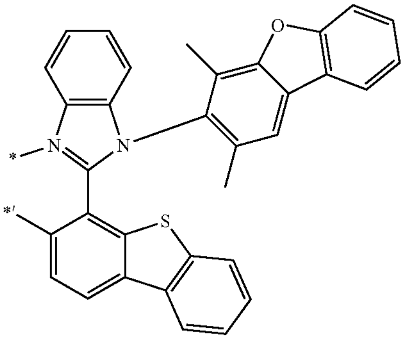
B122
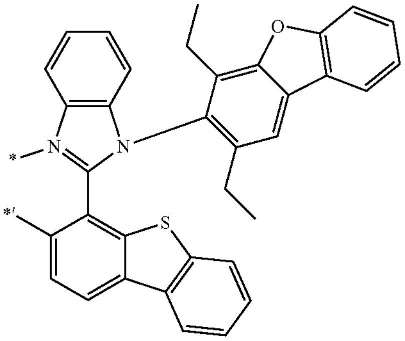
B123
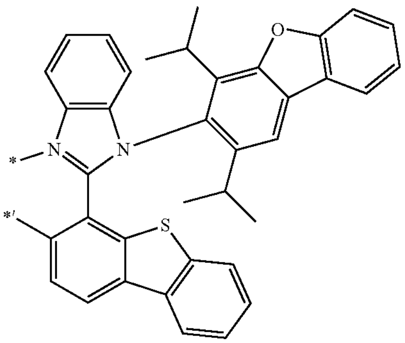
-continued
B124
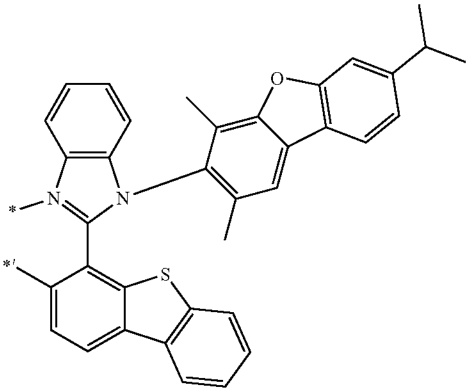
B125
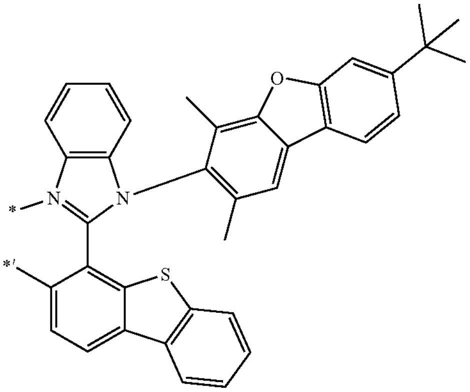
B126
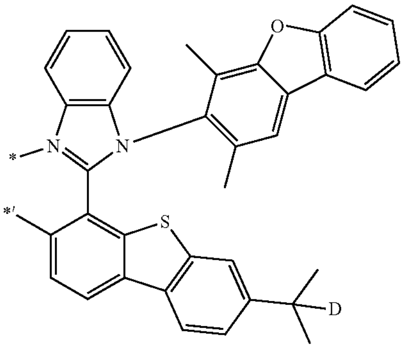
B127
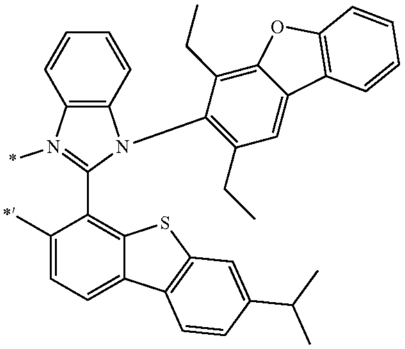

-continued
B128
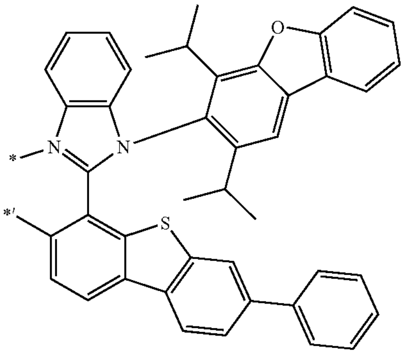
B129
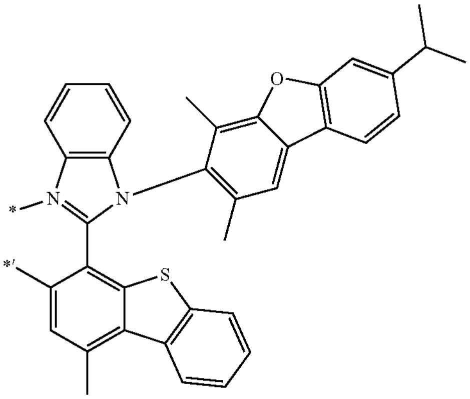
B130
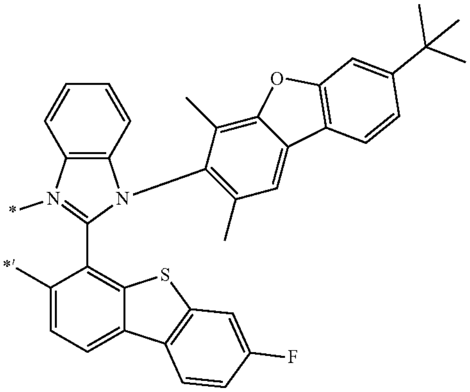
B131
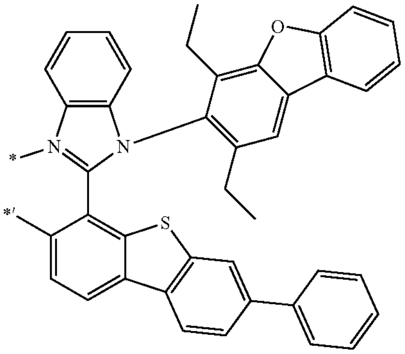
-continued
B132
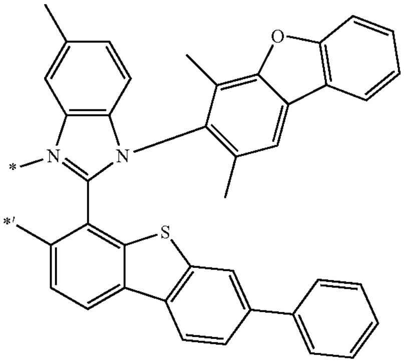
B133
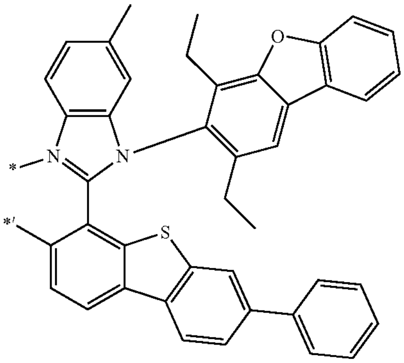
B134
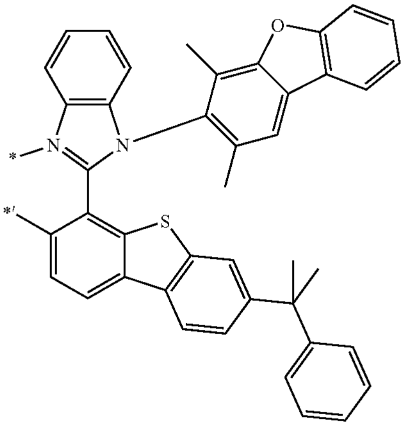
B135
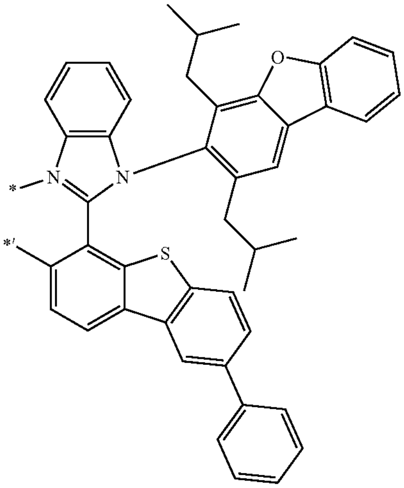

-continued
B136
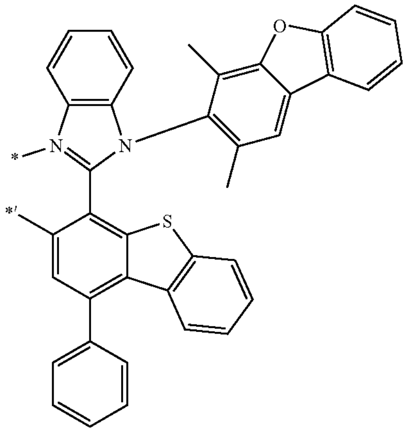
B137
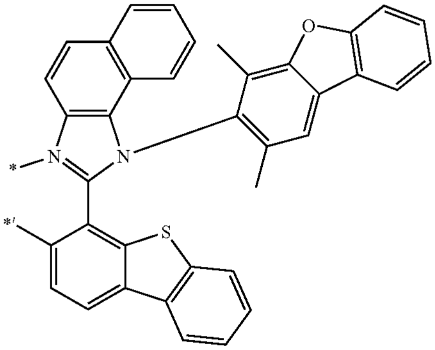
B138
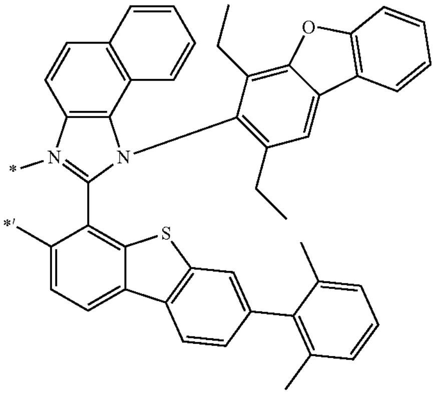
B139
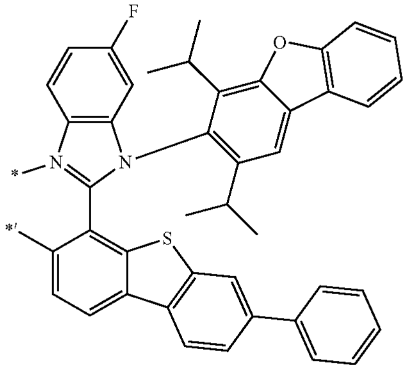
-continued
B140
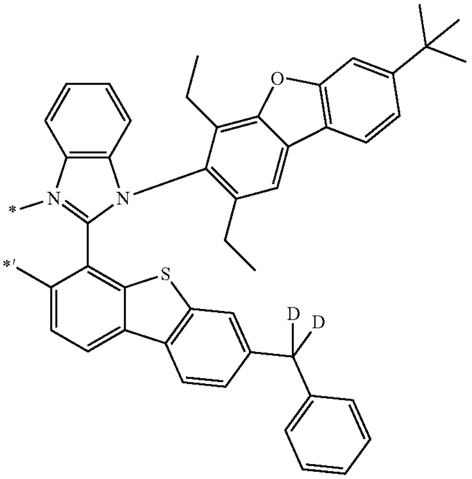
B141
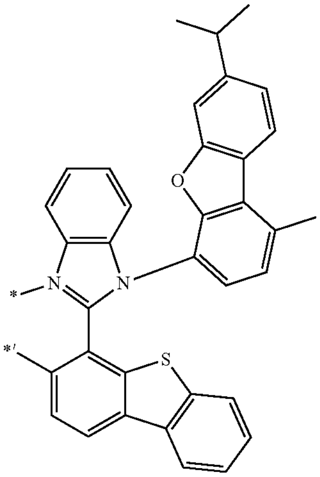
B142
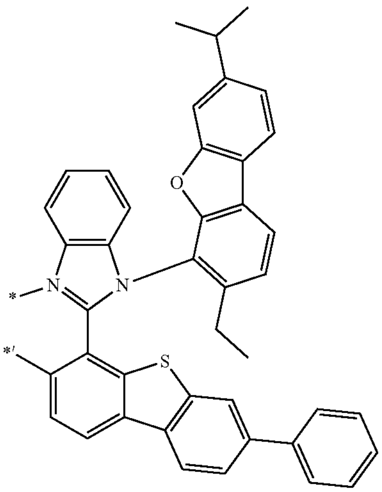

-continued
B143
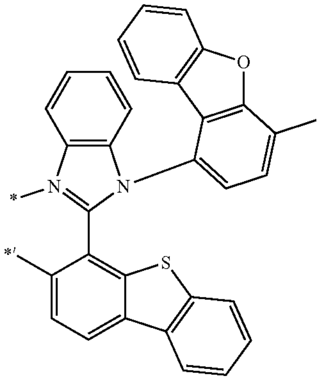
B144
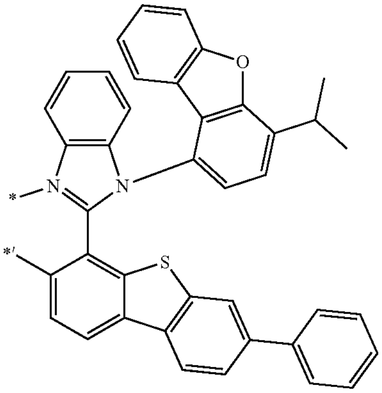
B145
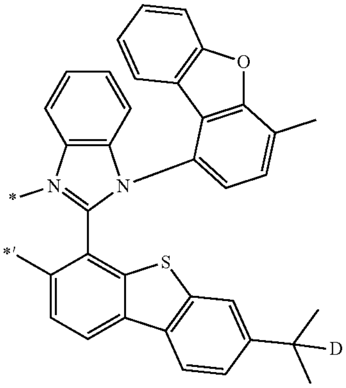
B146
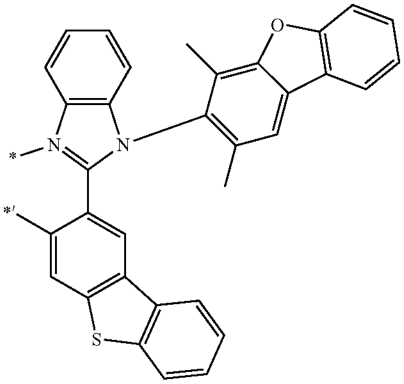
-continued
B147
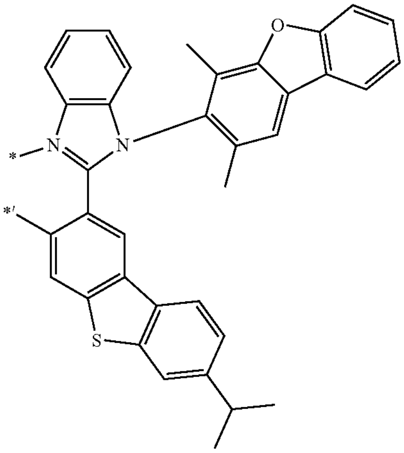
B148
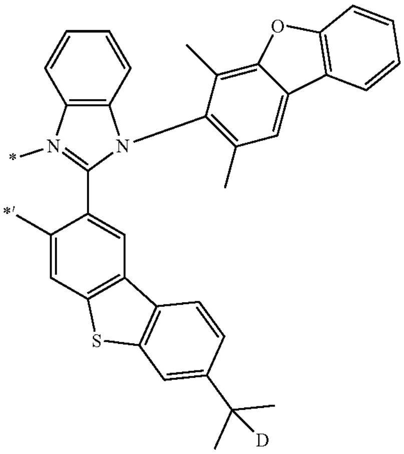
B149
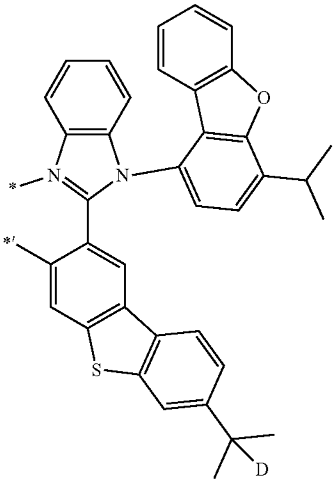

-continued
B150
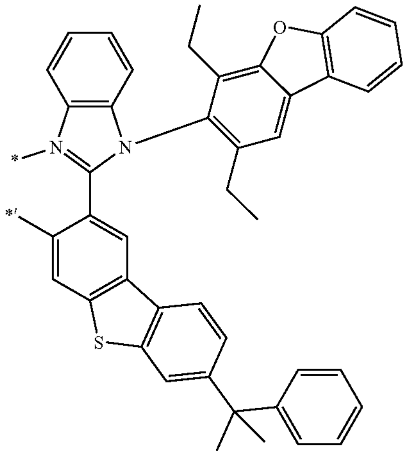
B151
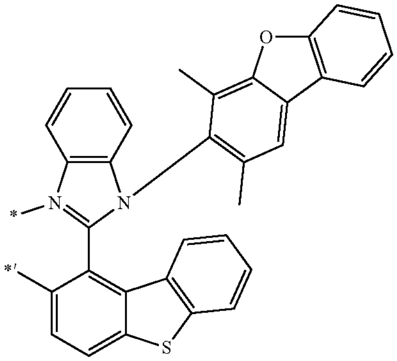
B152
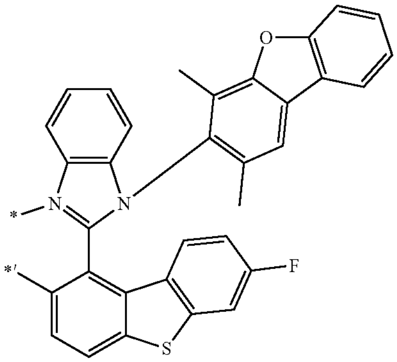
B153
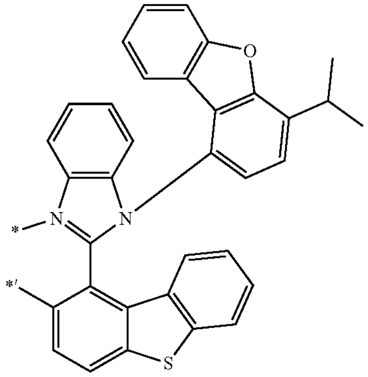
-continued
B154
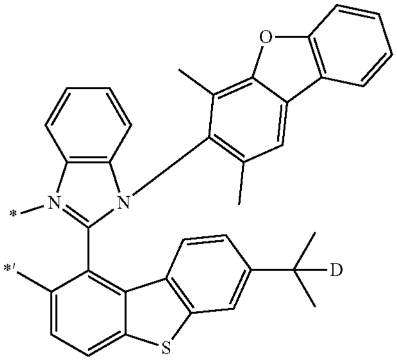
B155
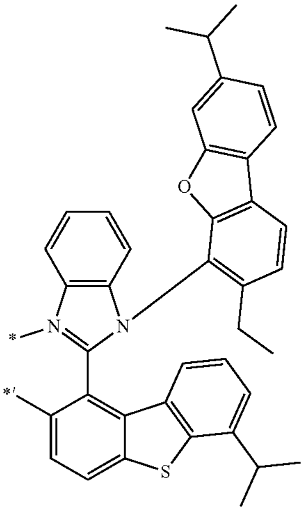
B156
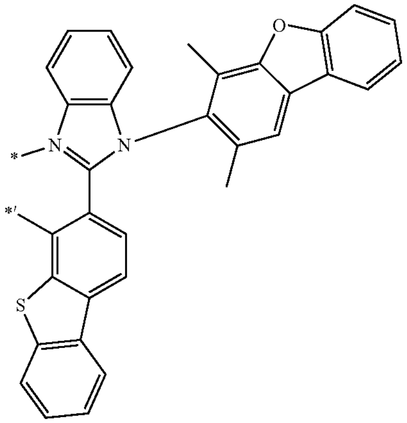

-continued
B157
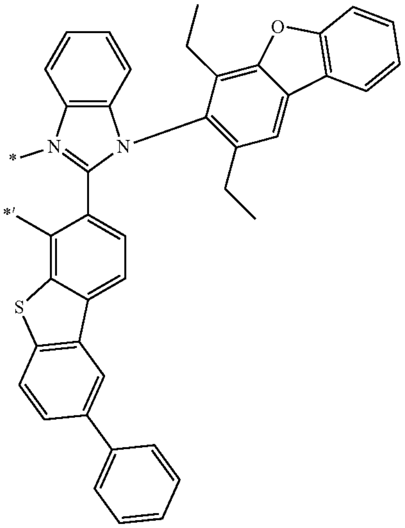
B158
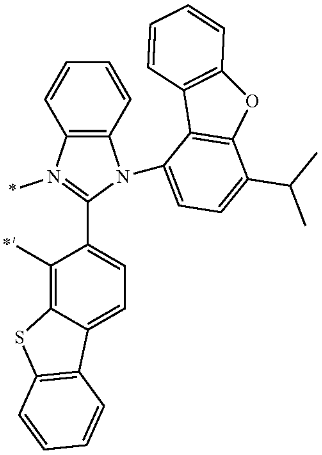
B159
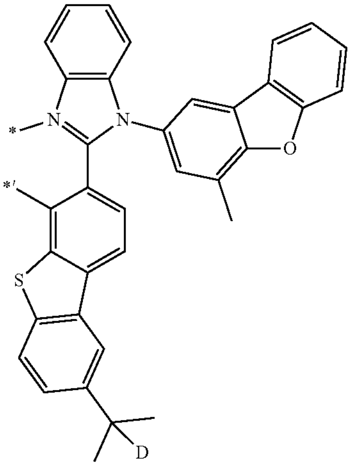
-continued
B160
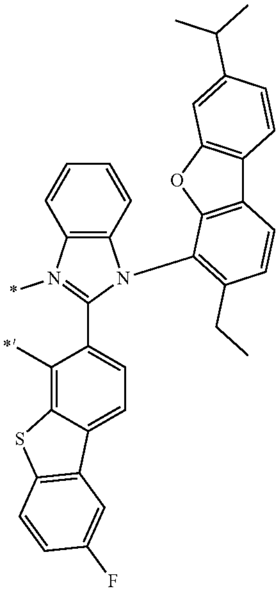
B161
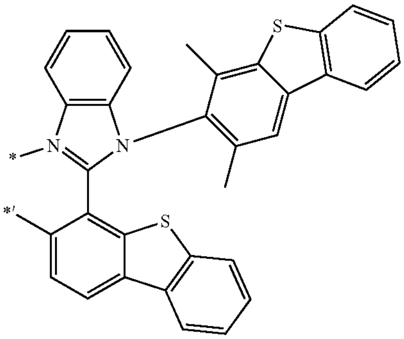
B162
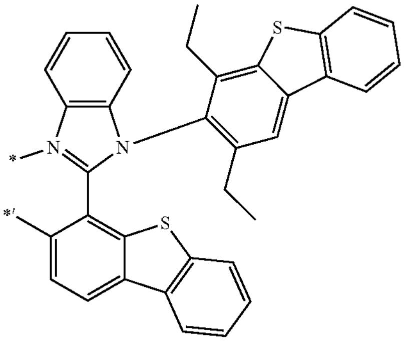
B163
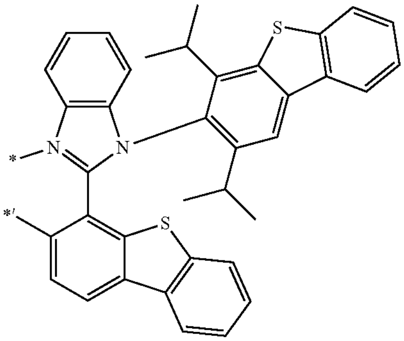

-continued
B164
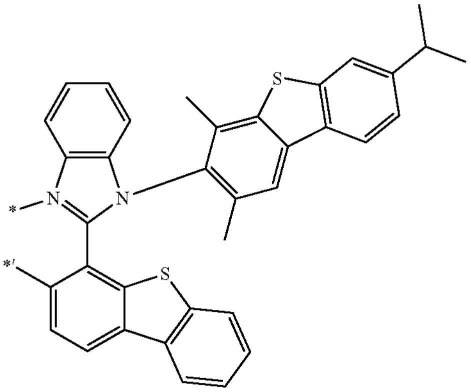
B165
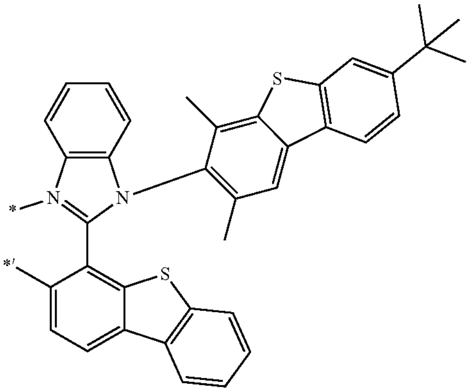
B166
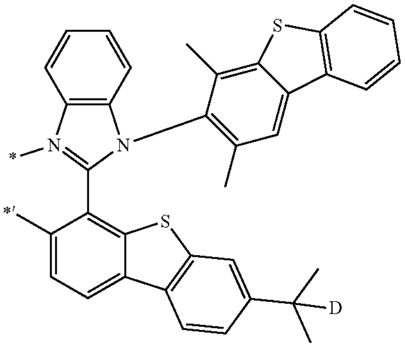
B167
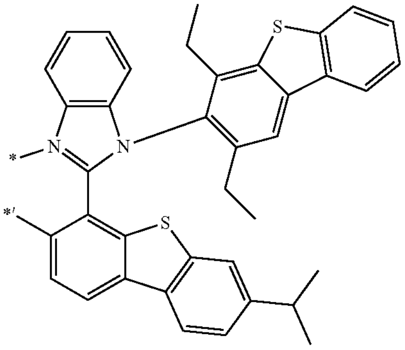
-continued
B168
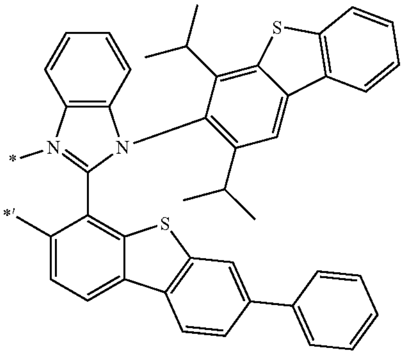
B169
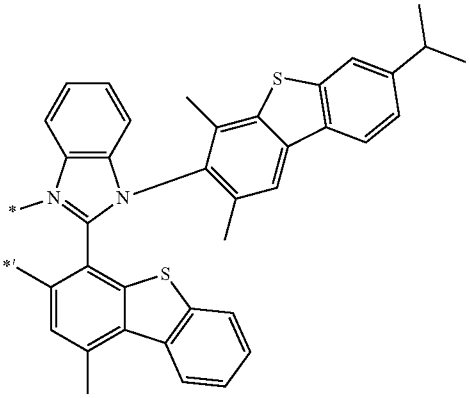
B170
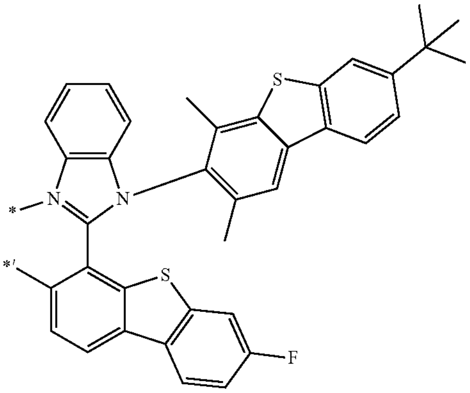
B171
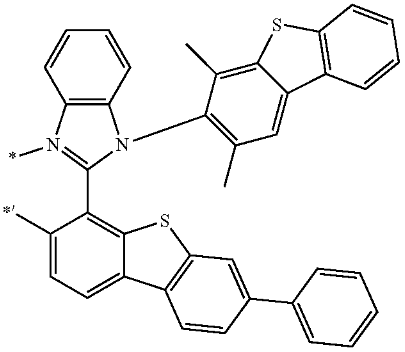

-continued
B172
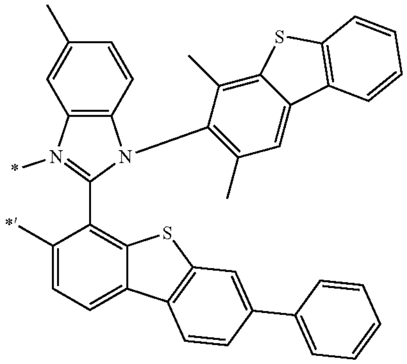
B173
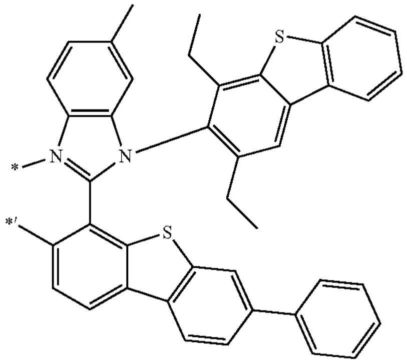
B174
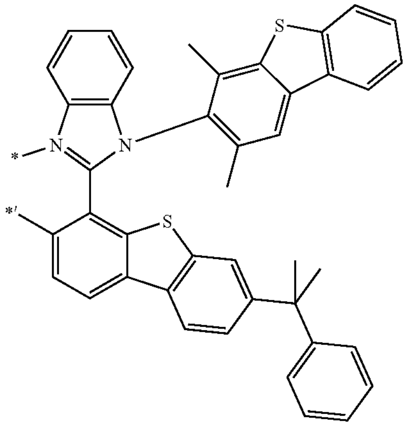
B175
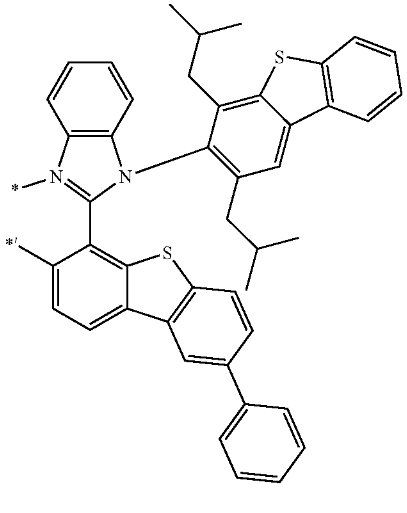
-continued
B176
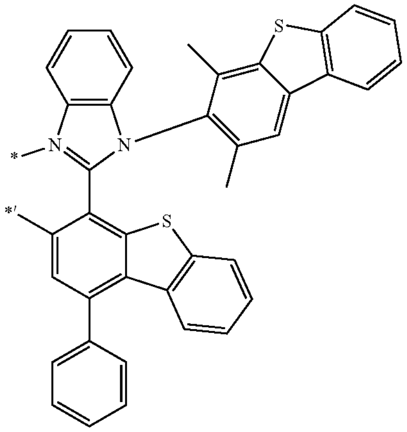
B177
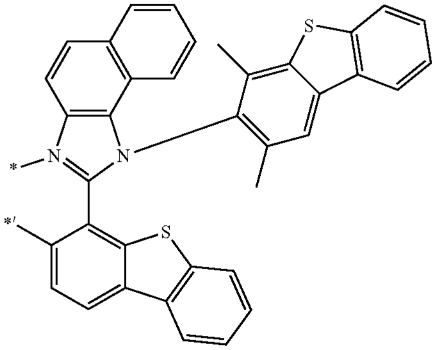
B178
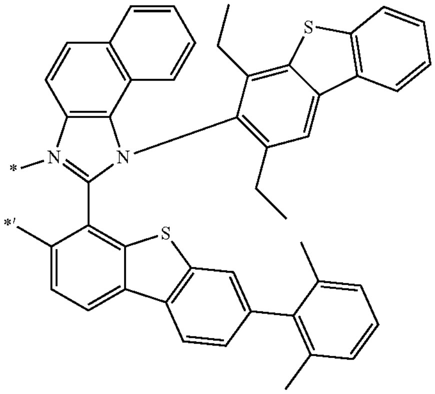
B179
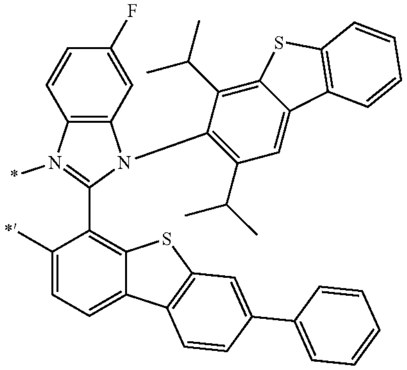

-continued
B180
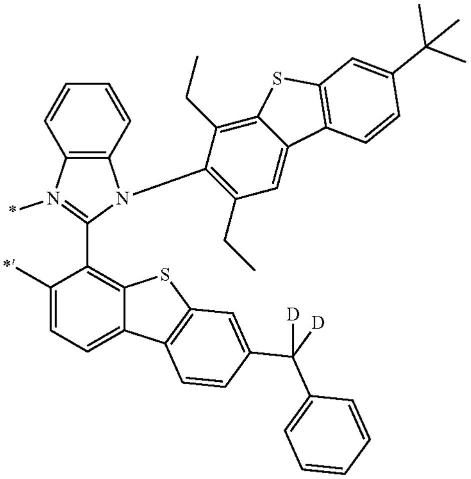
B181
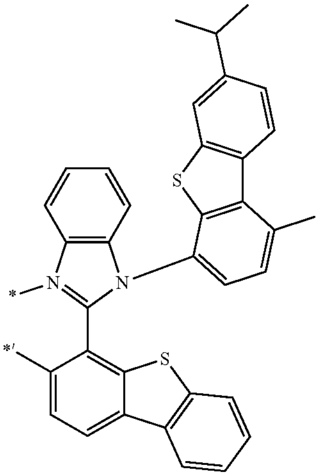
B182
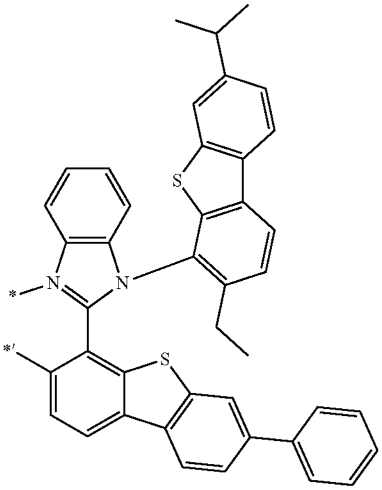
-continued
B183
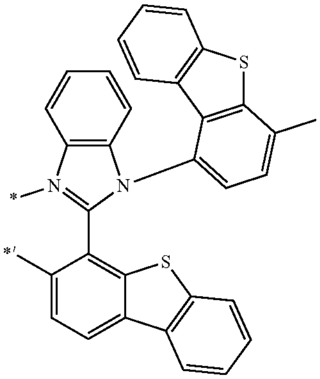
B184
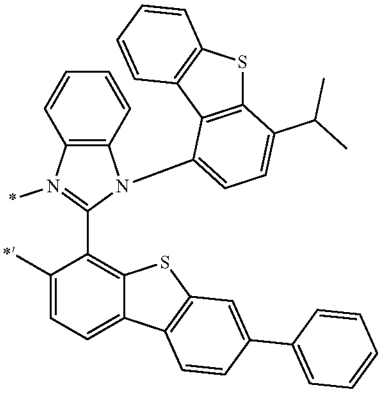
B185
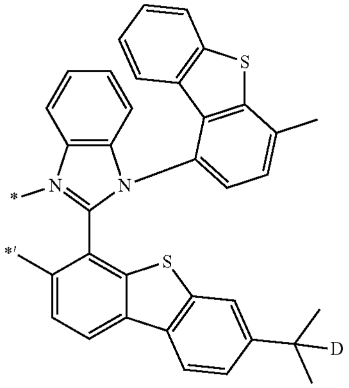
B186
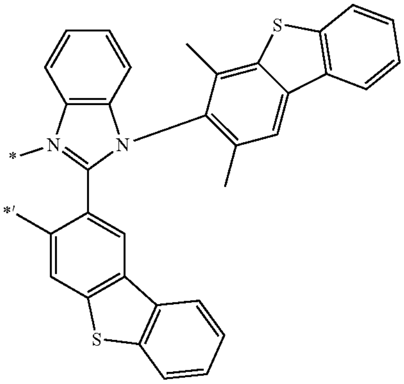

B187
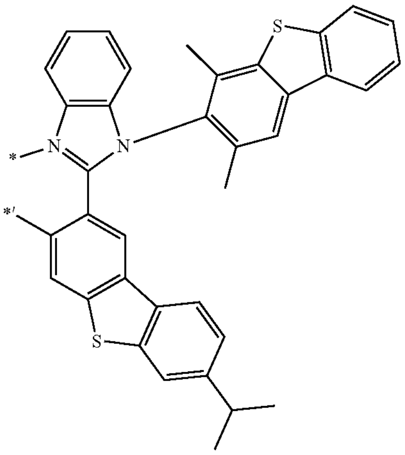
B188
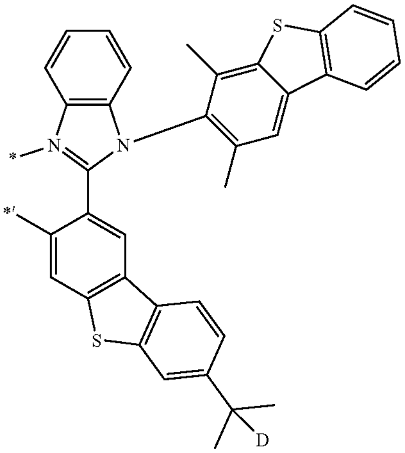
B189
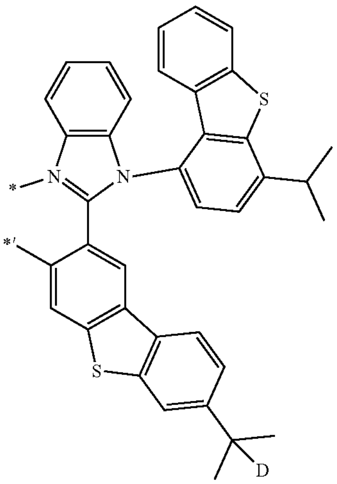
B190
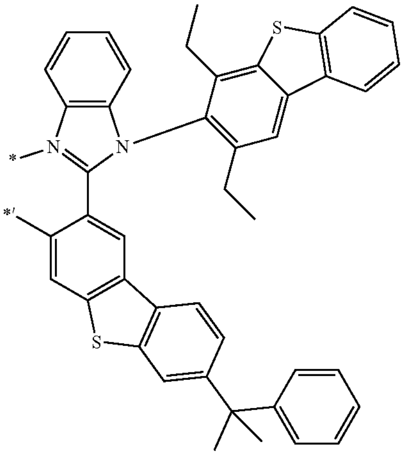
B191
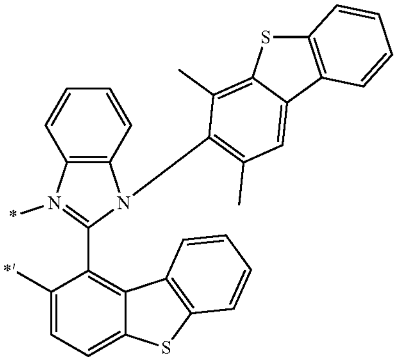
B192
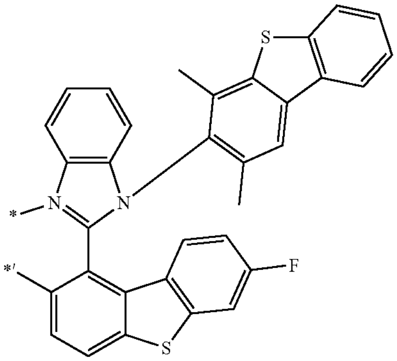
B193
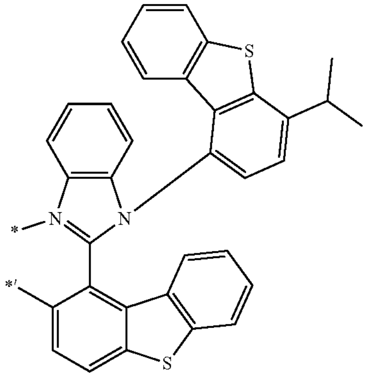

-continued
B194
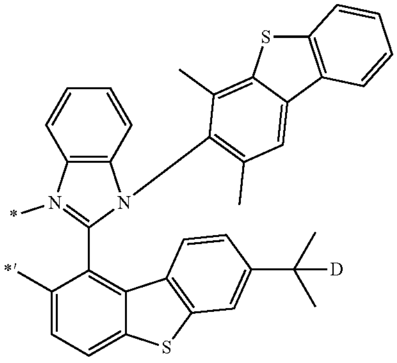
B195
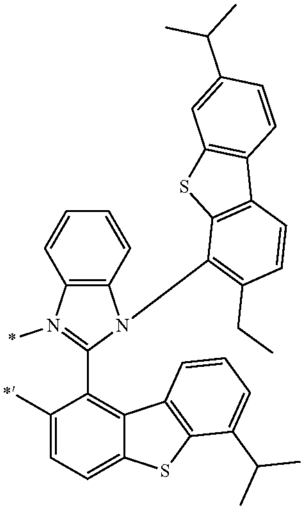
B196
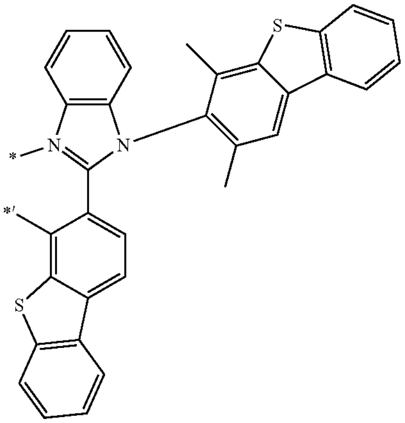
-continued
B197
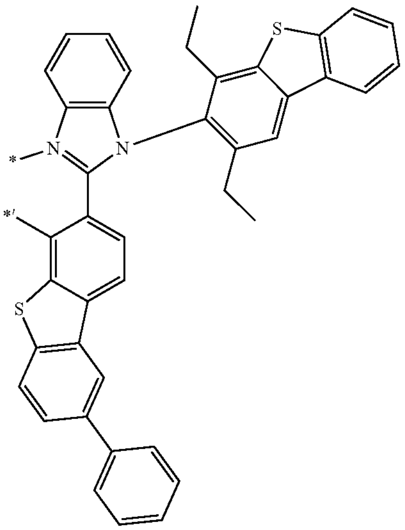
B198
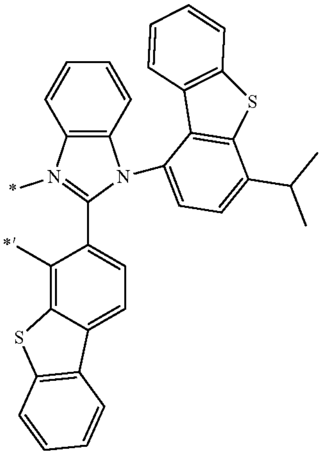
B199
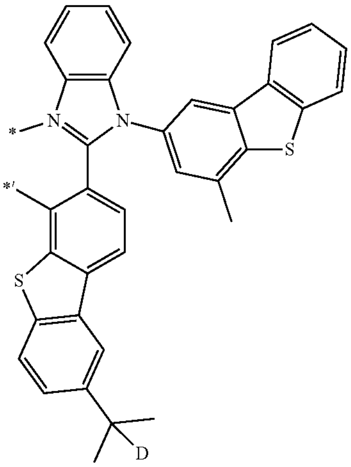

-continued
B200
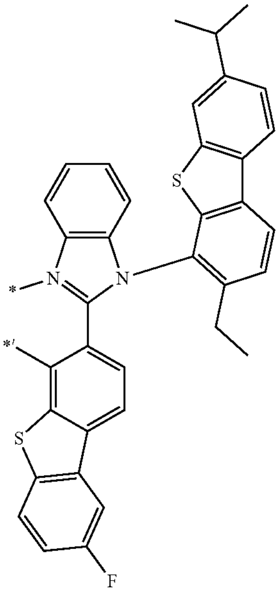
B201
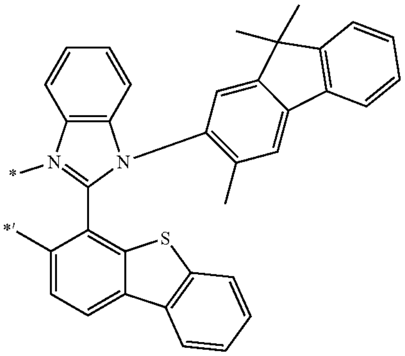
B202
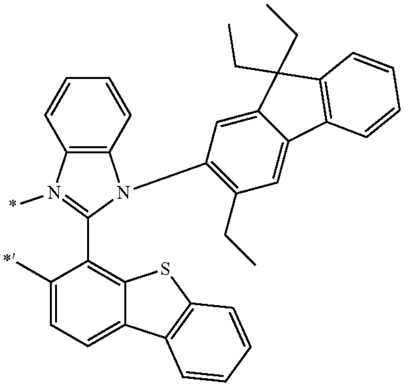
-continued
B203
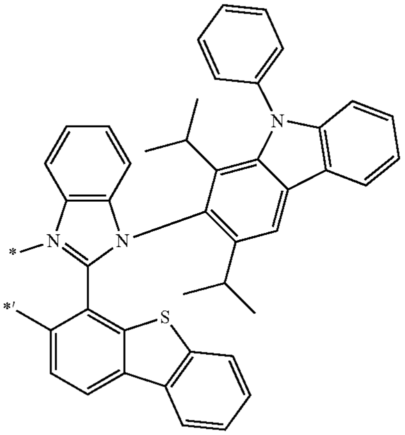
B204
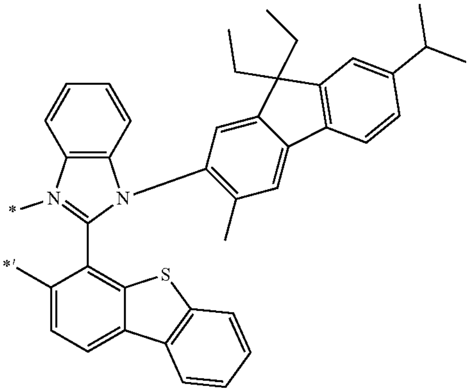
B205
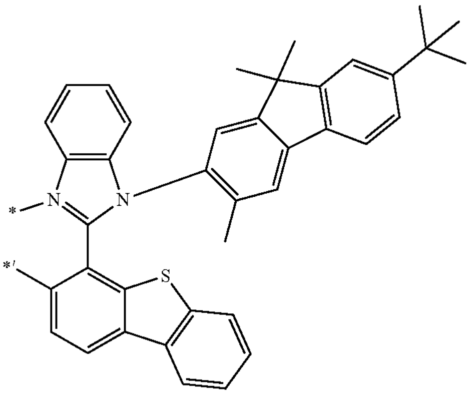
B206
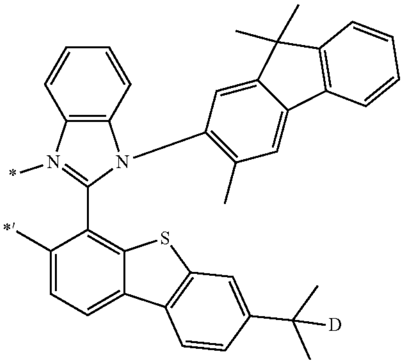

-continued
B207
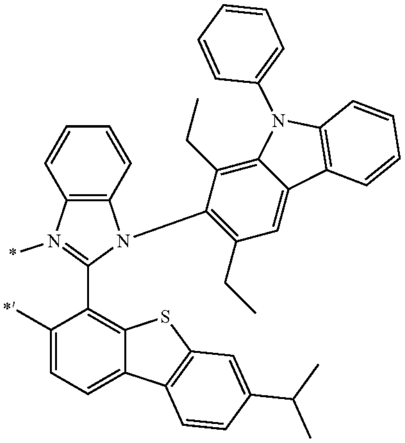
B208
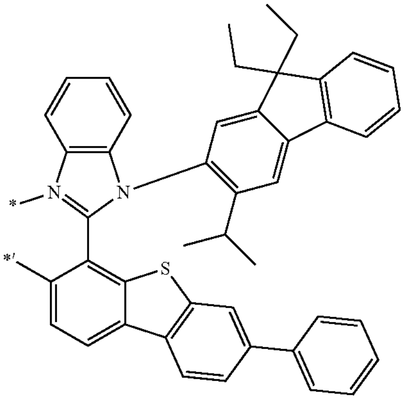
B209
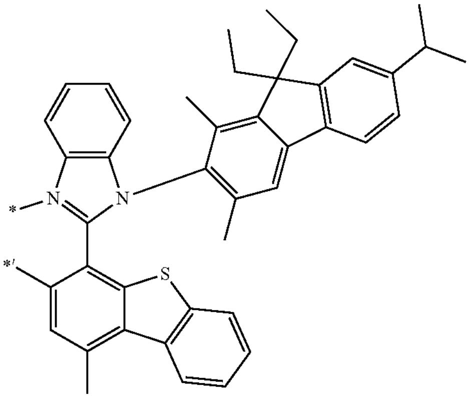
B210
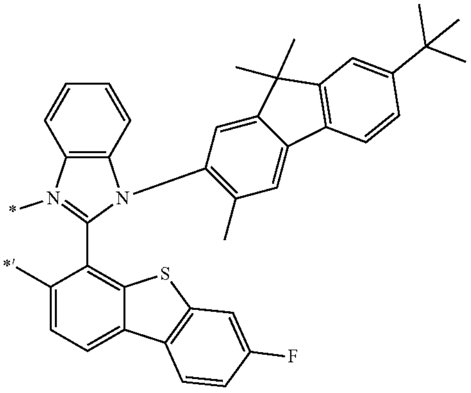
-continued
B211
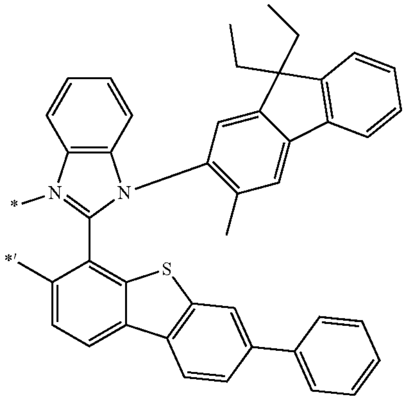
B212
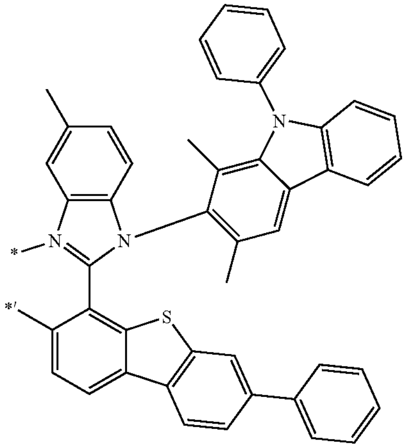
B213
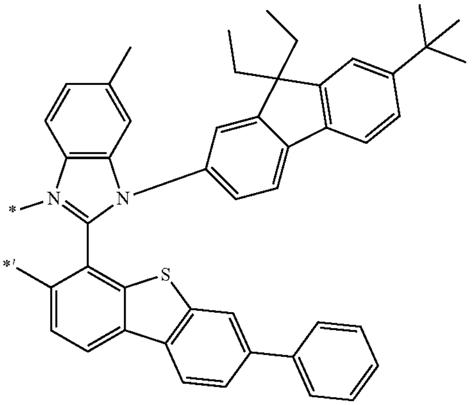

-continued
B214
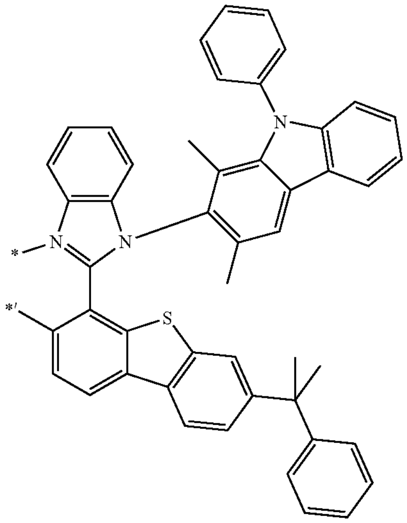
B215
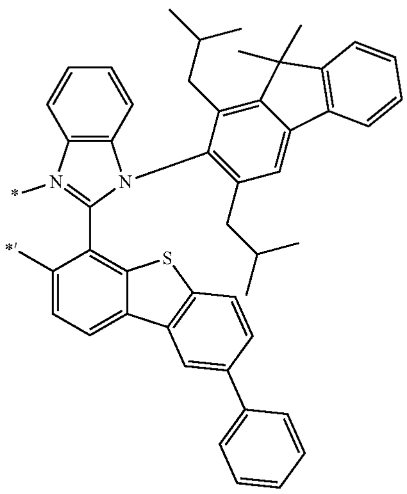
B216
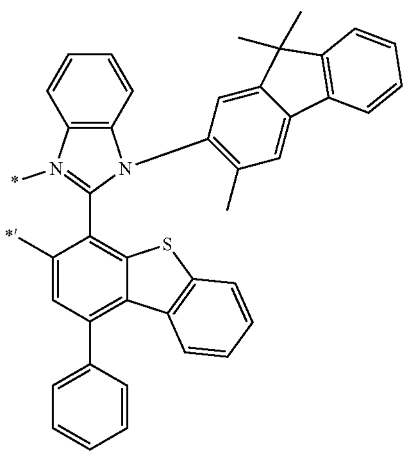
-continued
B217
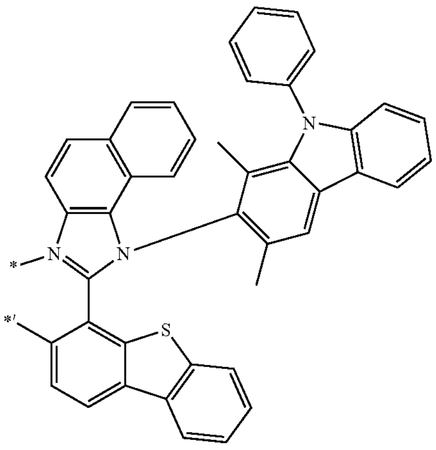
B218
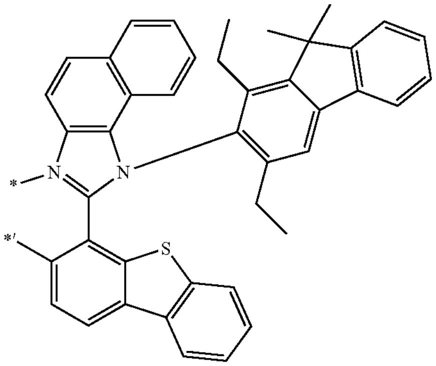
B219
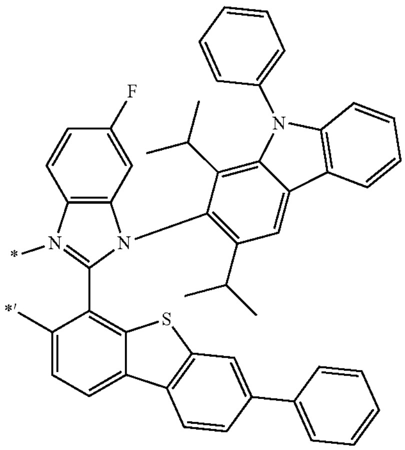

-continued
B220
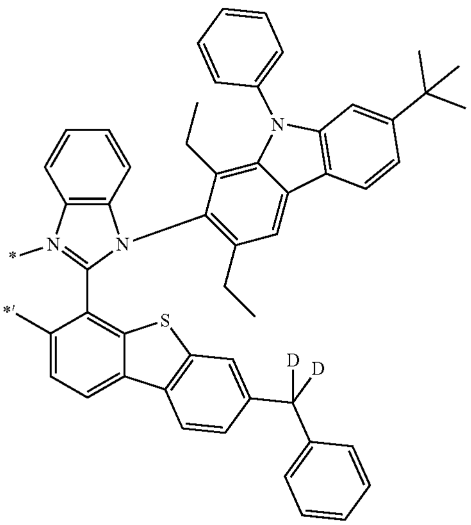
B221
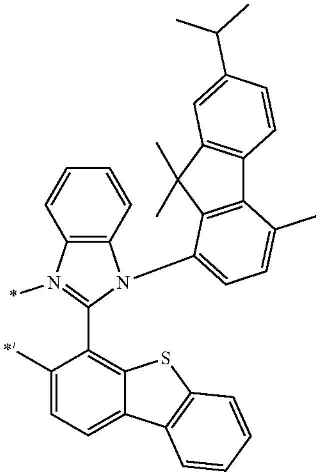
B222
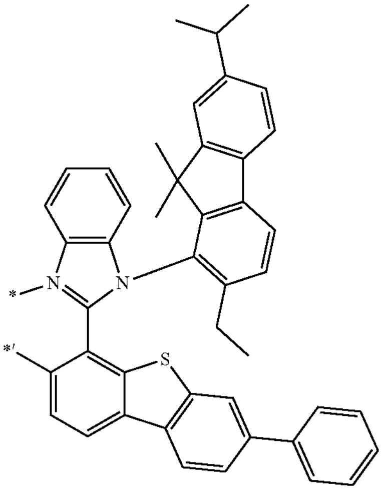
-continued
B223
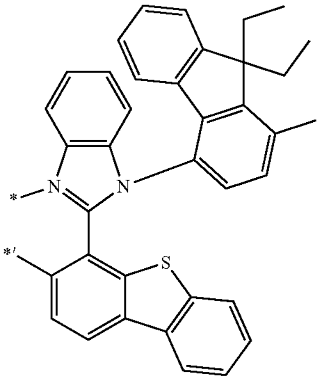
B224
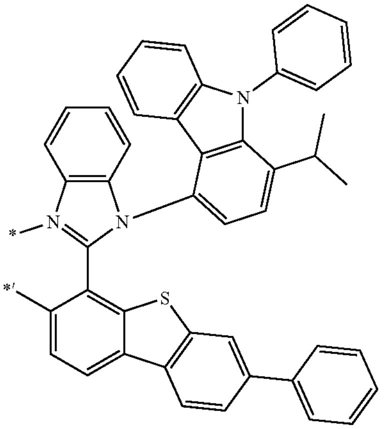
B225
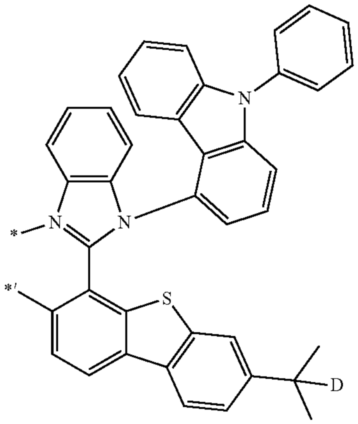

-continued
B226
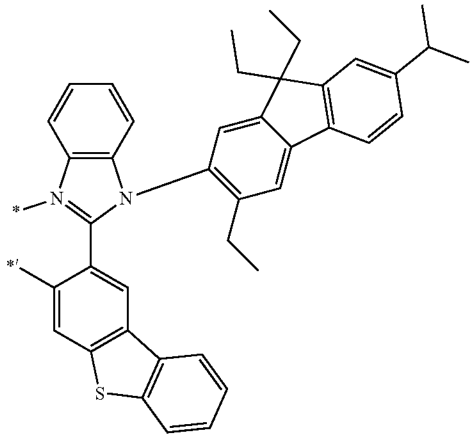
B227
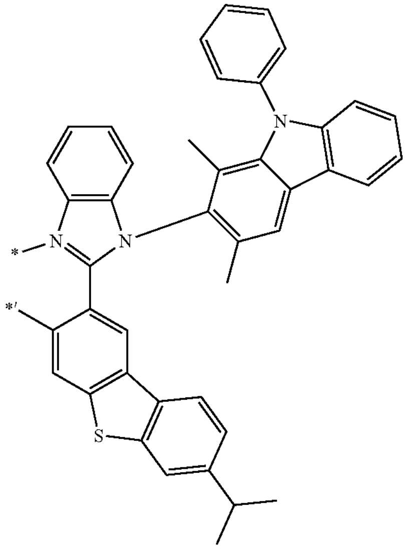
B228
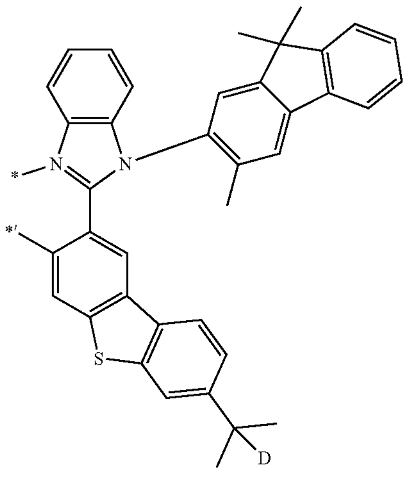
-continued
B229
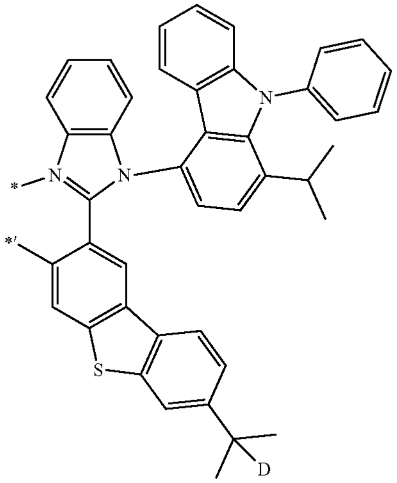
B230
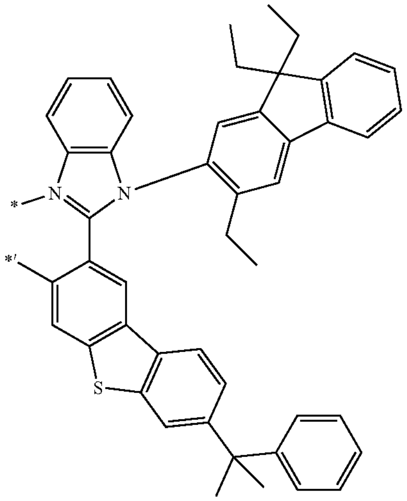
B231
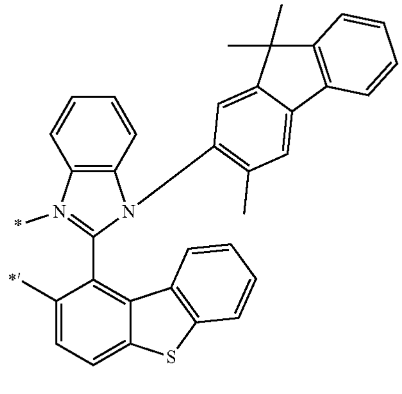

-continued
B232
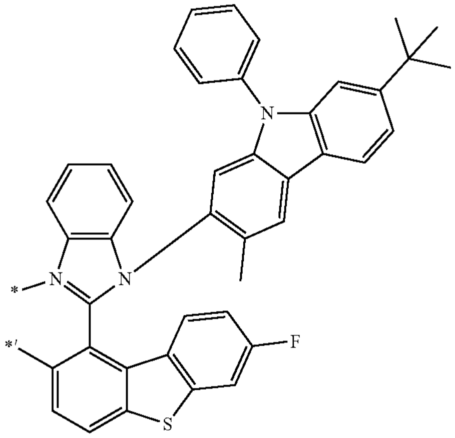
B233
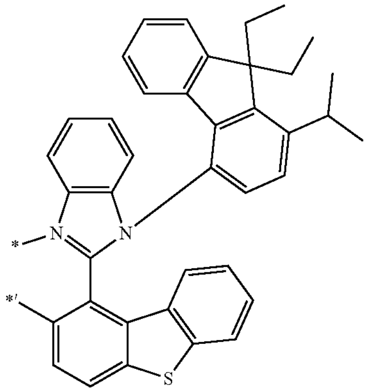
B234
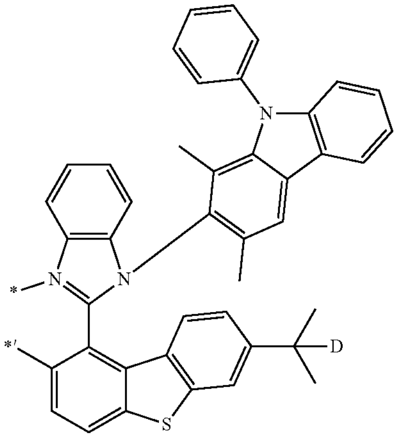
B235
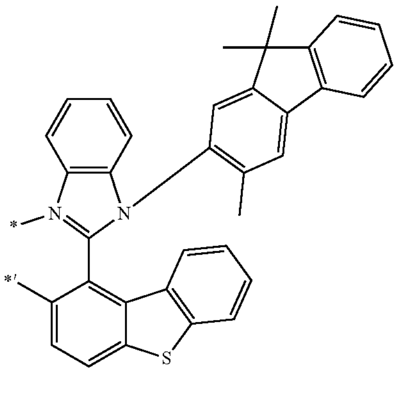
-continued
B236
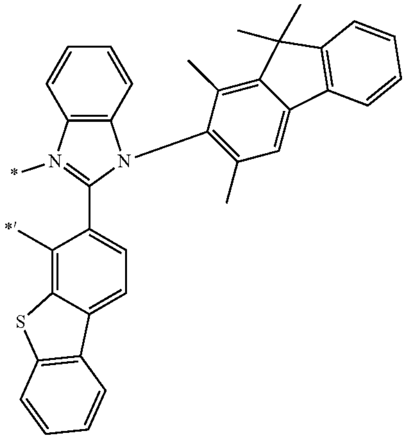
B237
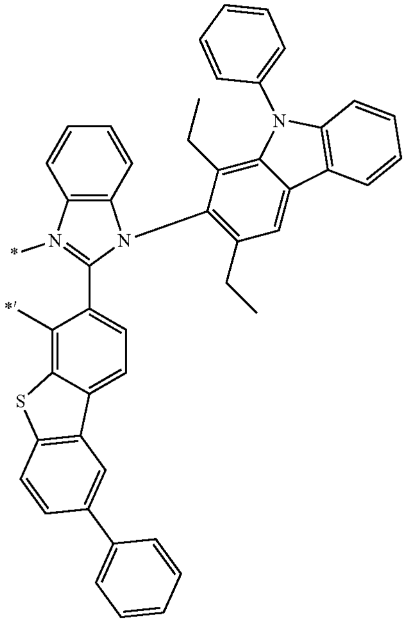
B238
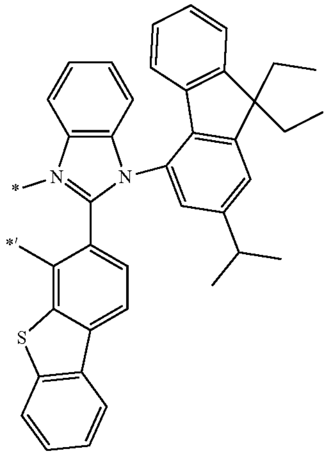

-continued
B239
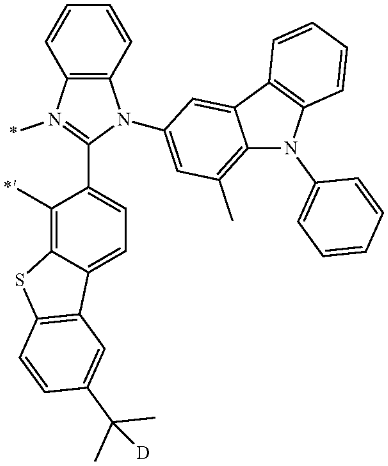
B240
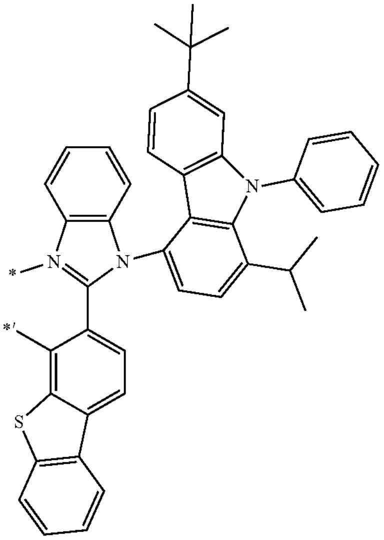
B241
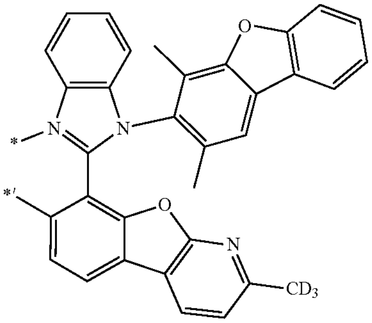
-continued
B242
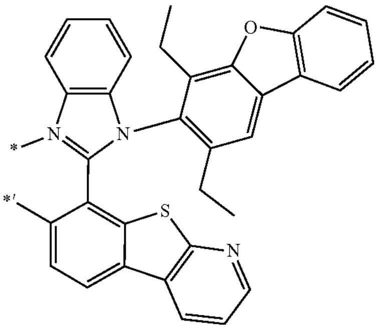
B243
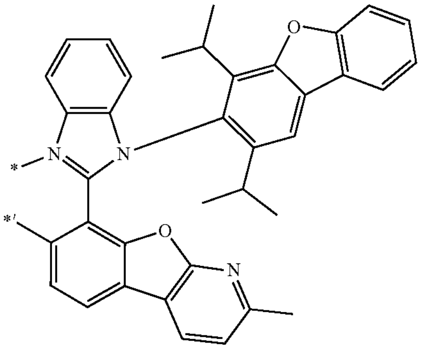
B244
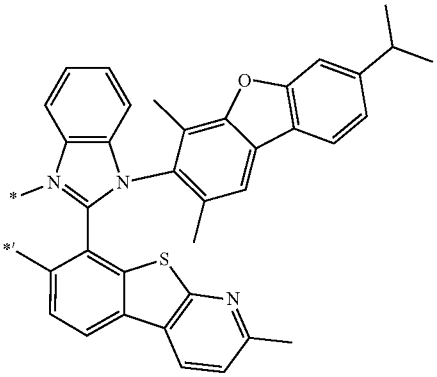
B245
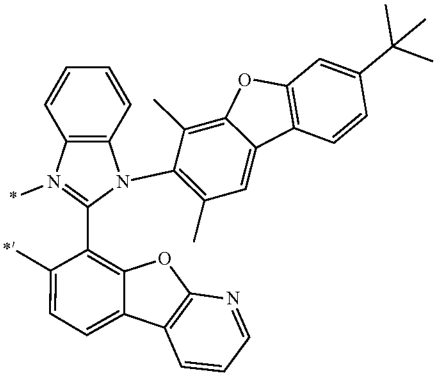

-continued
B246
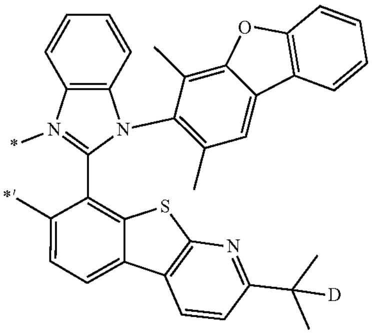
B247
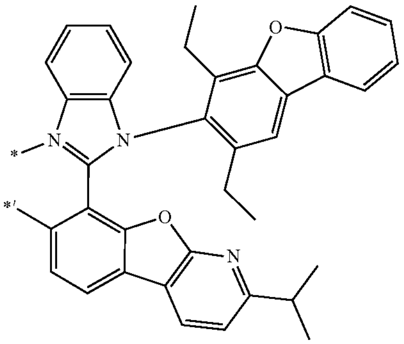
B248
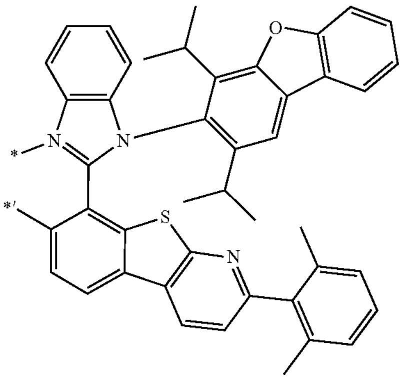
B249
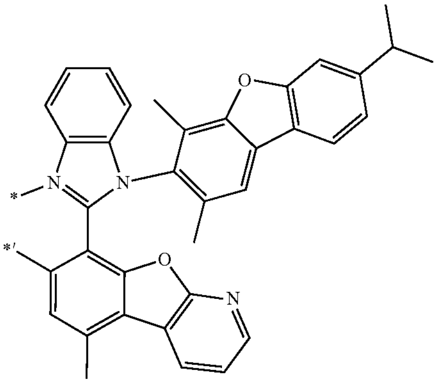
-continued
B250
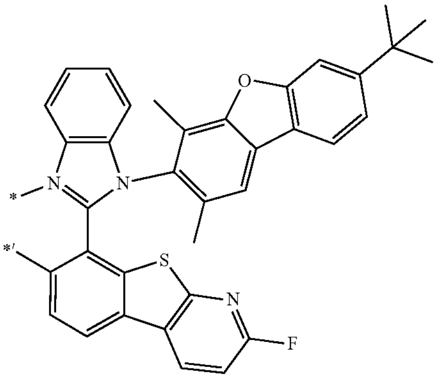
B251
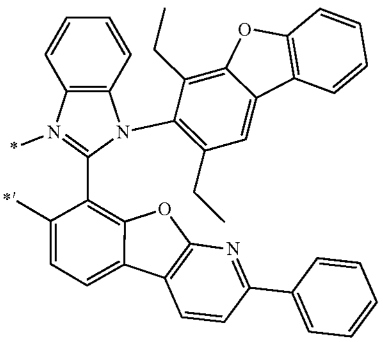
B252
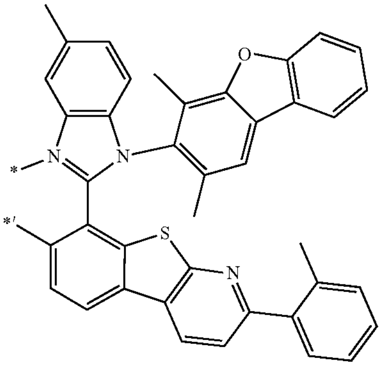
B253
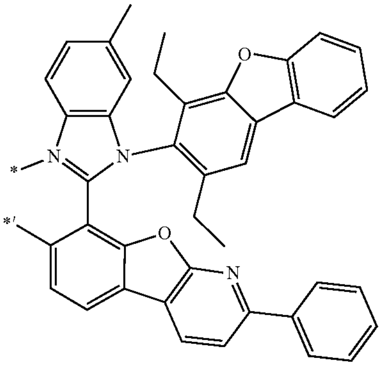

-continued
B254
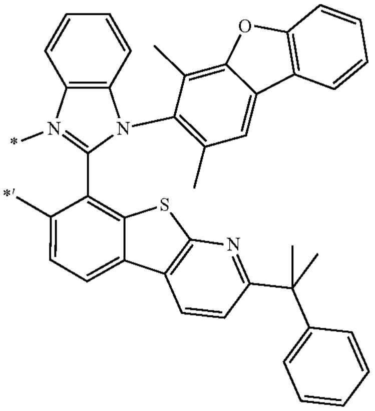
B255
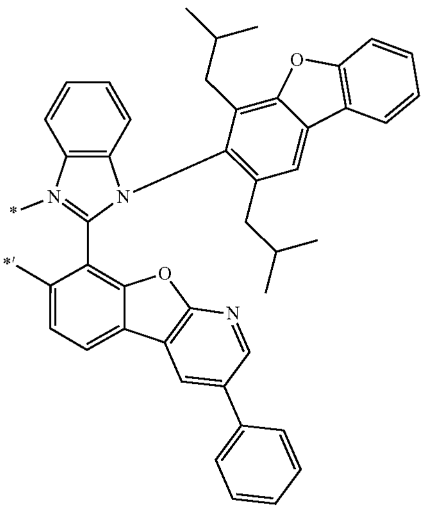
B256
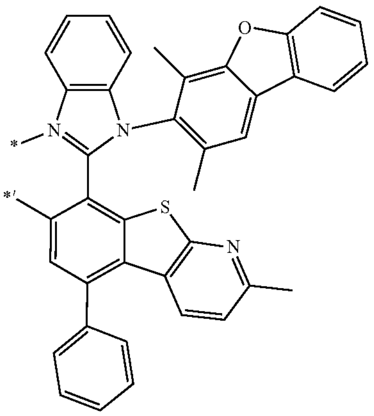
-continued
B257
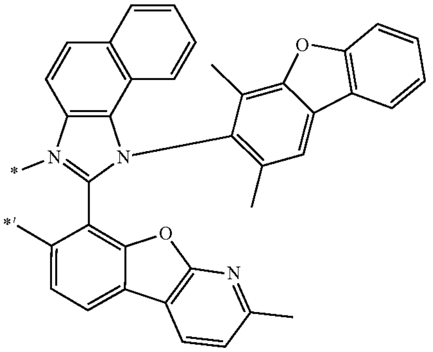
B258
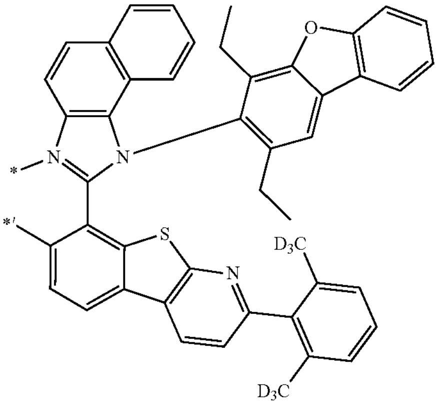
B259
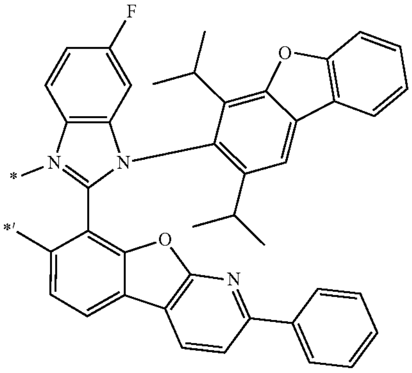
B260
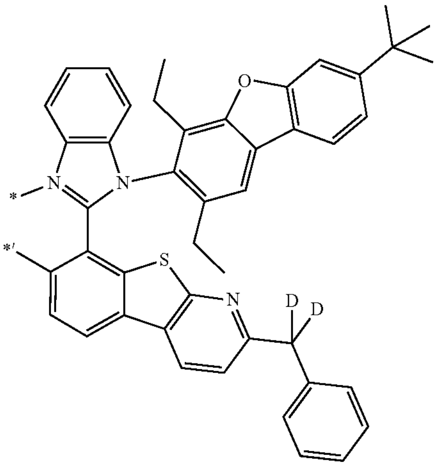

-continued
B261
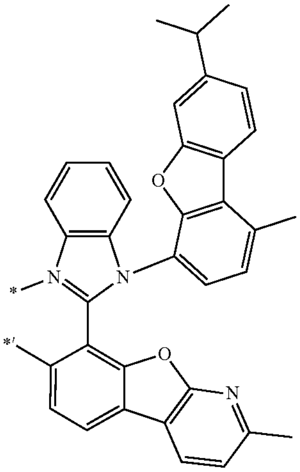
B262
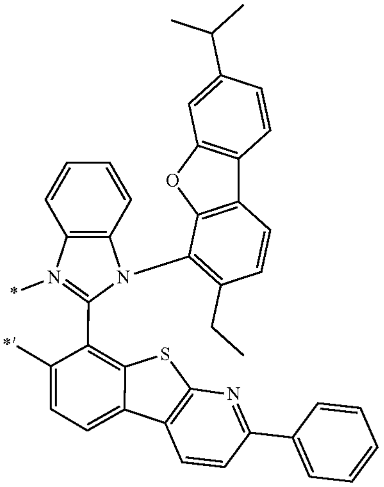
B263
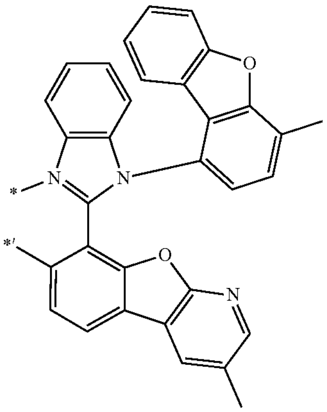
-continued
B264
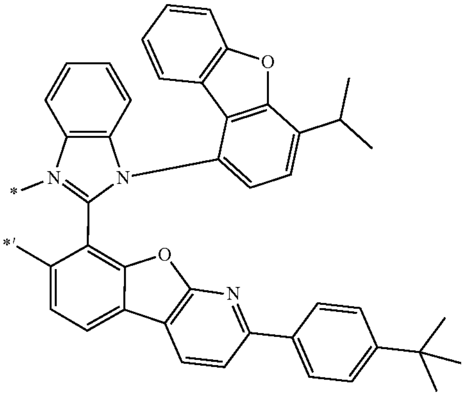
B265
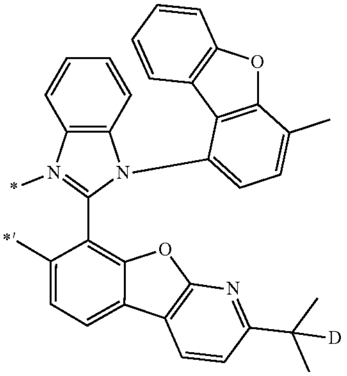
B266
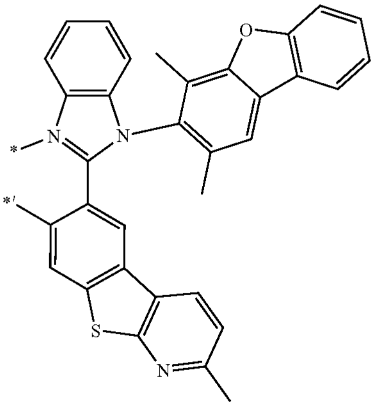
B267
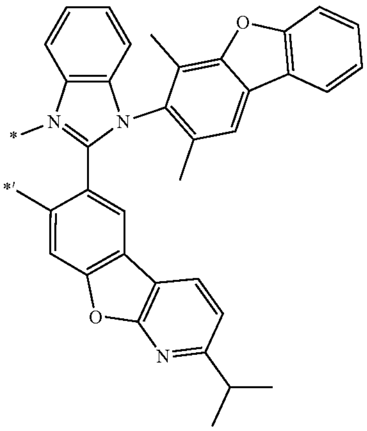

-continued
B268
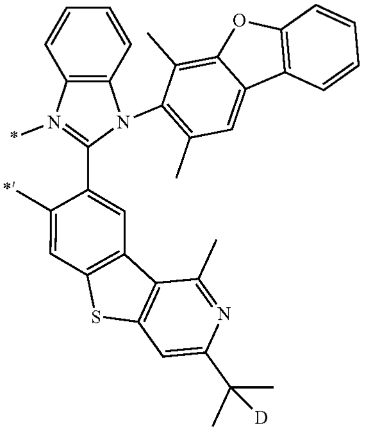
B269
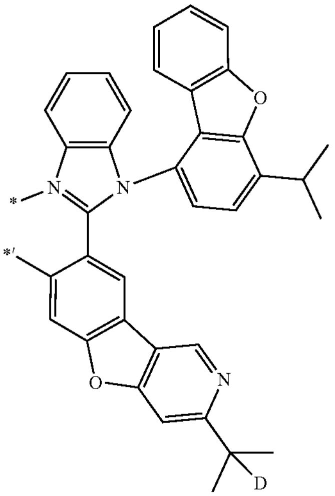
B270
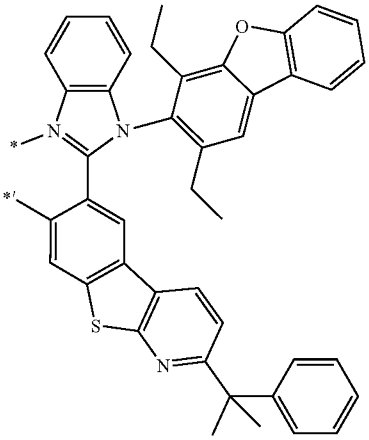
-continued
B271
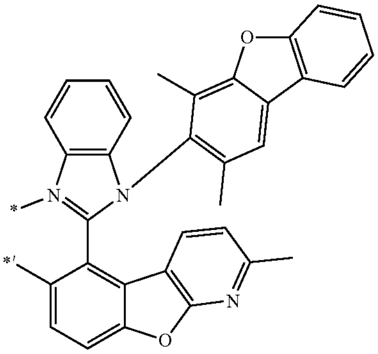
B272
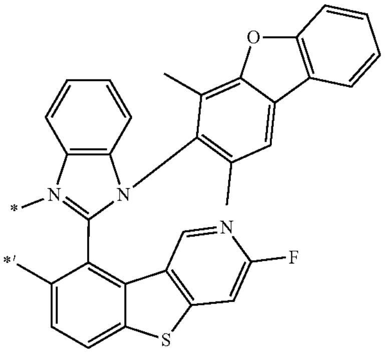
B273
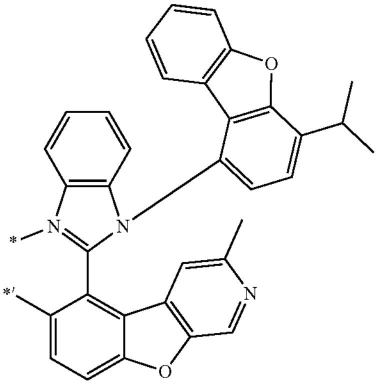
B274
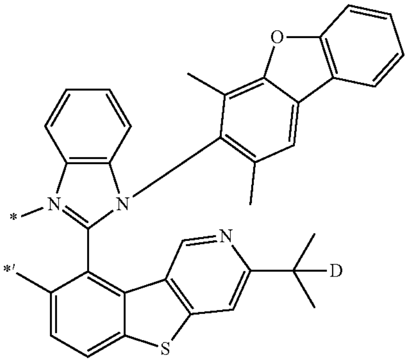

B275
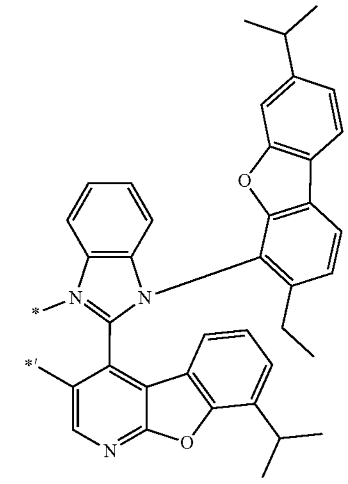
B276
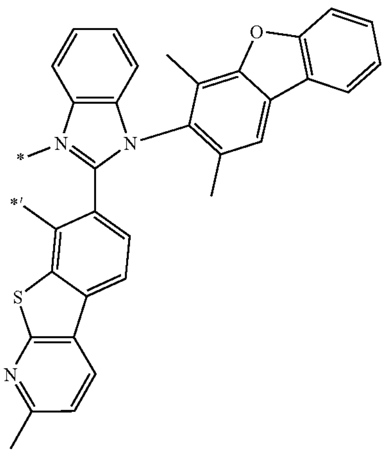
B277
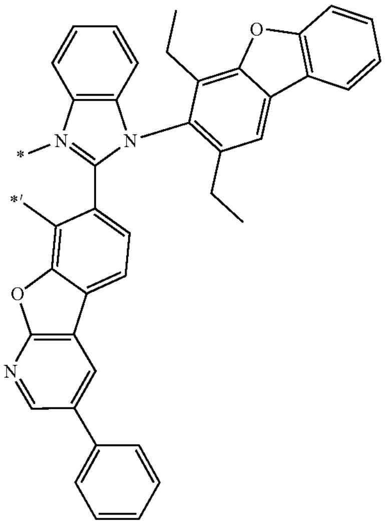
B278
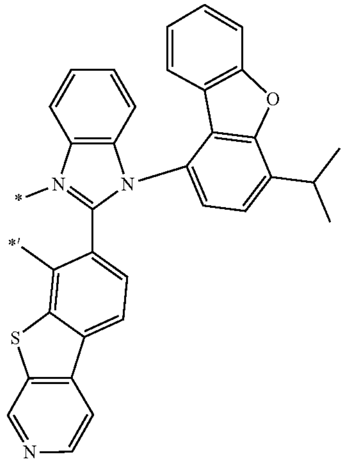
B279
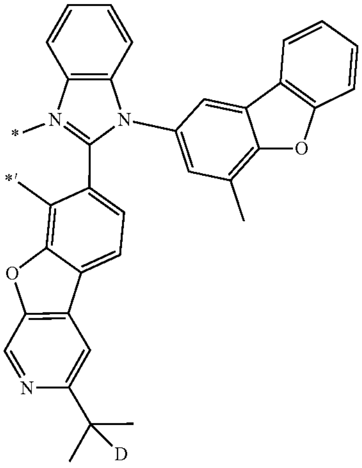
B280
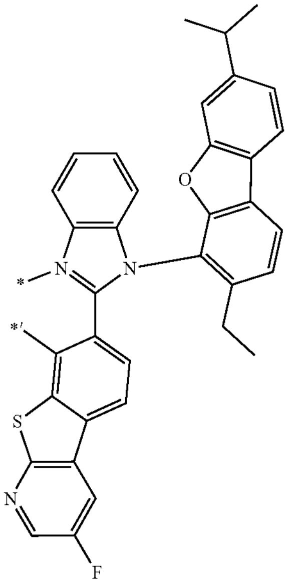

-continued
B281
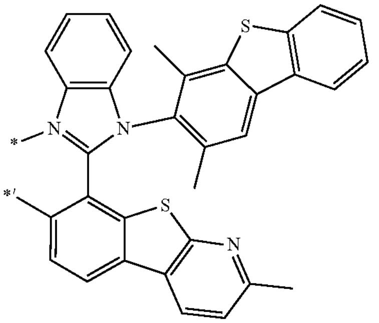
B282
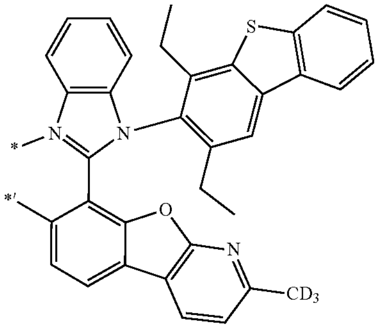
B283
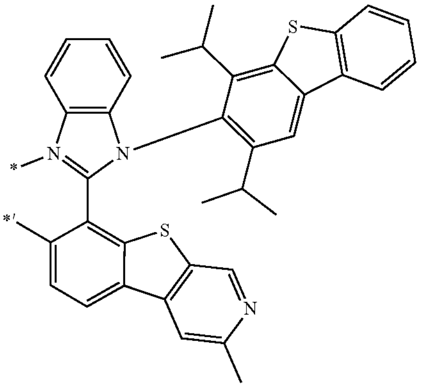
B284
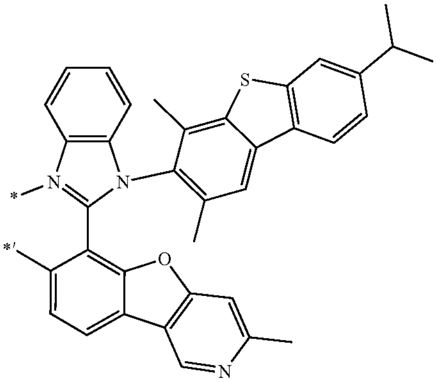
-continued
B285
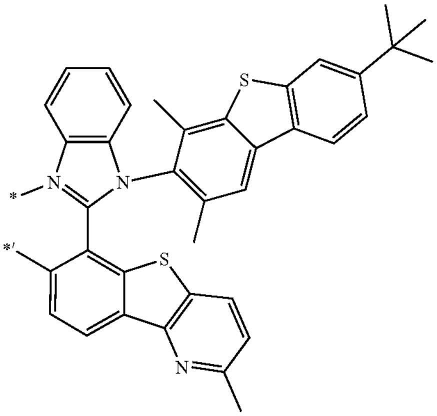
B286
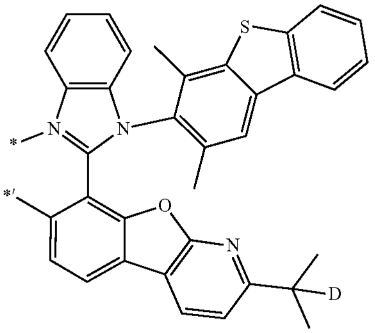
B287
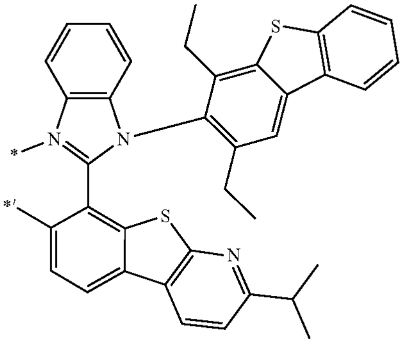
B288
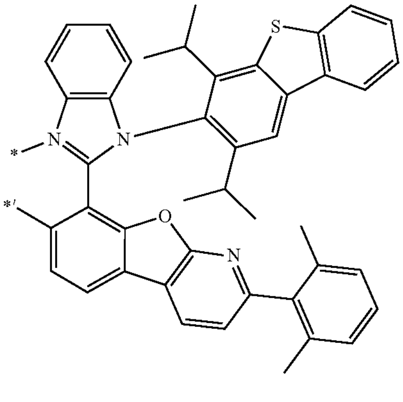

-continued
B289
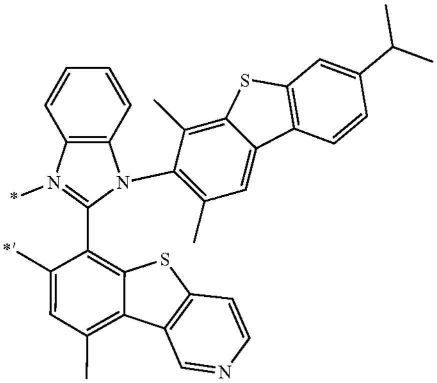
B290
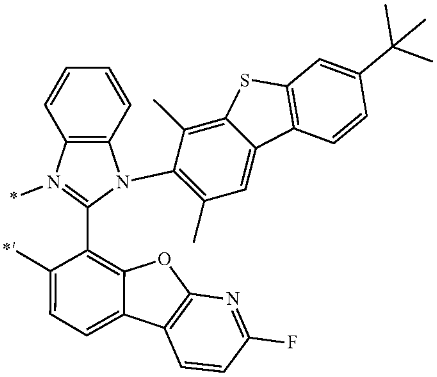
B291
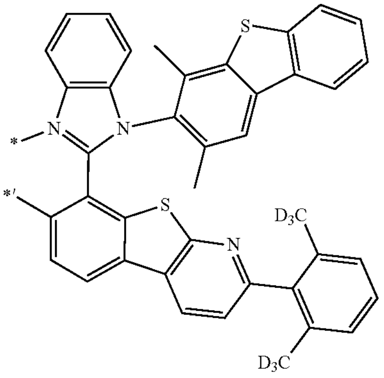
B292
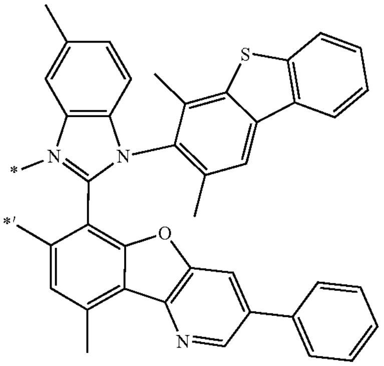
-continued
B293
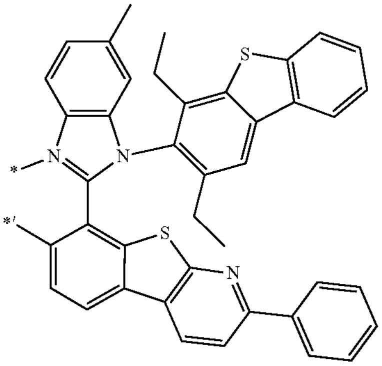
B294
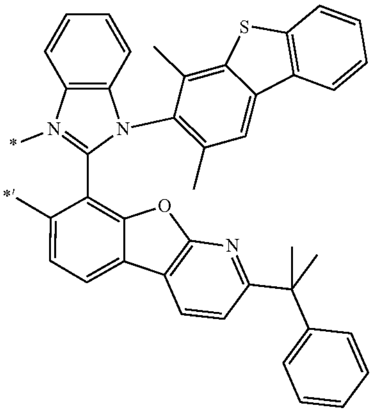
B295
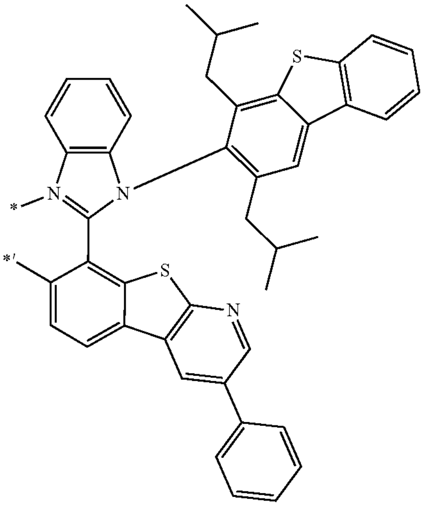

-continued
B296
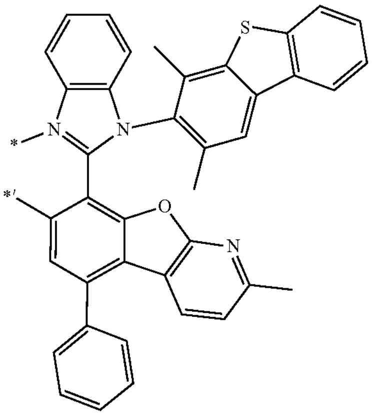
B297
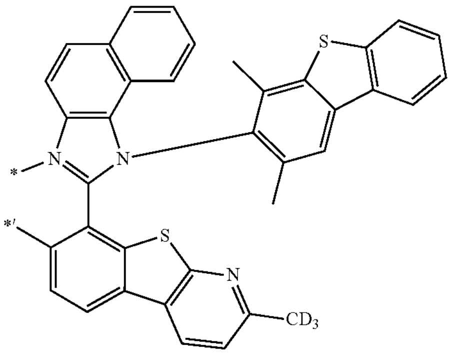
B298
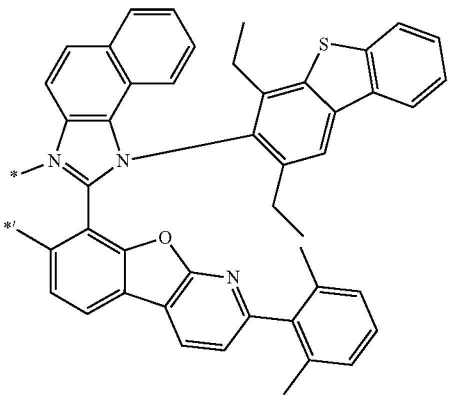
B299
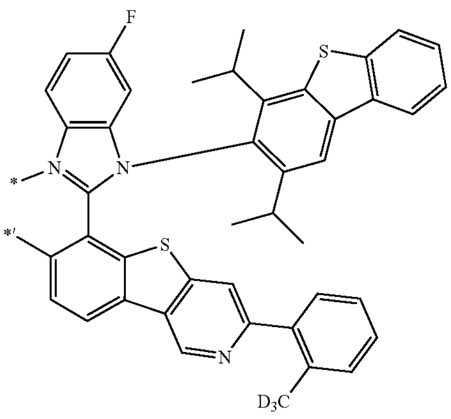
-continued
B300
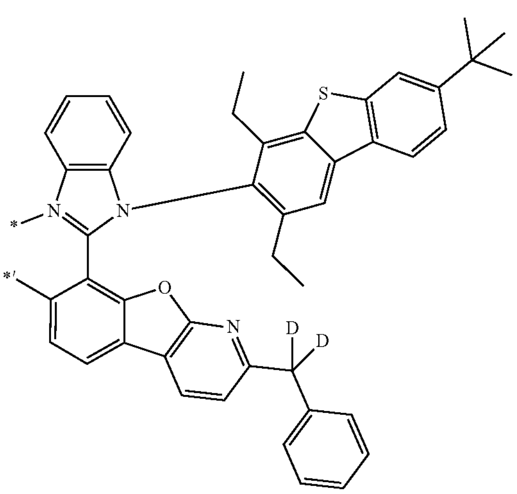
B301
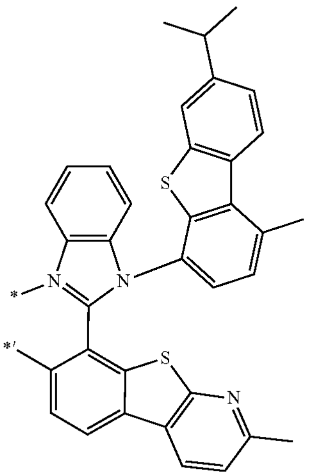
B302
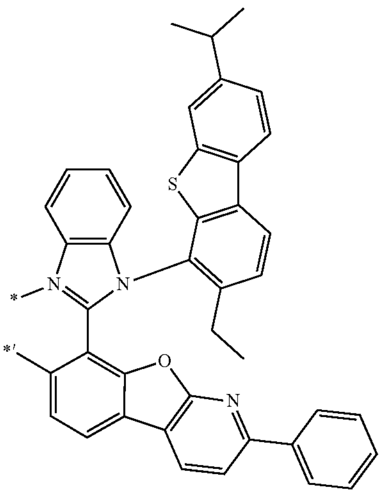

-continued
B303
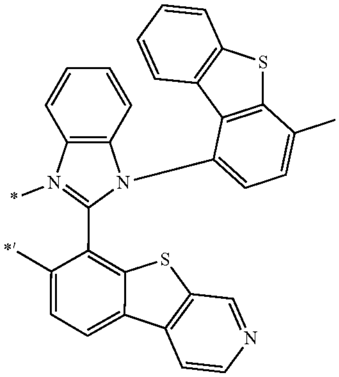
B304
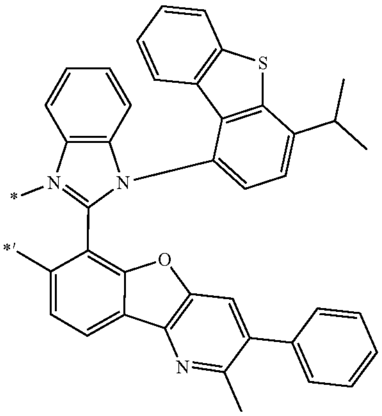
B305
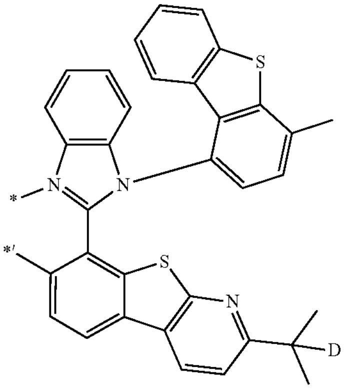
-continued
B306
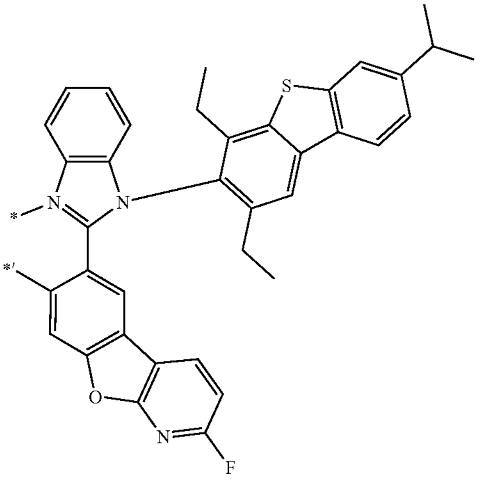
B307
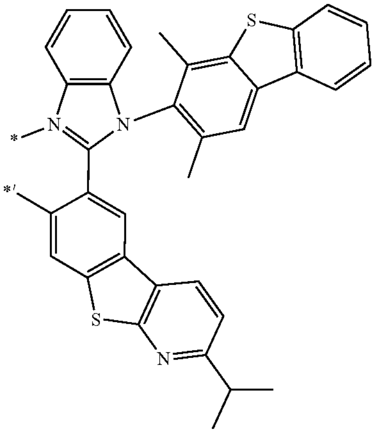
B308
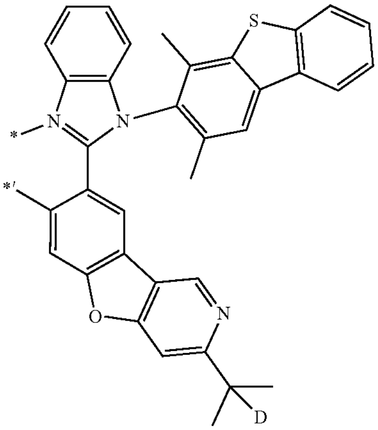

-continued
B309
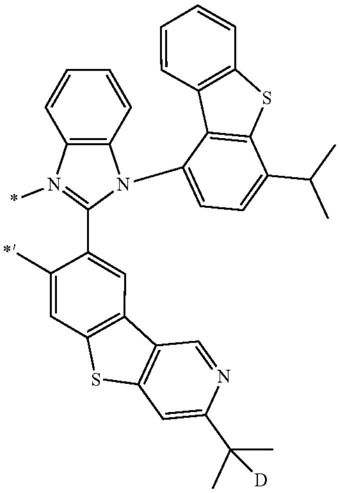
B310
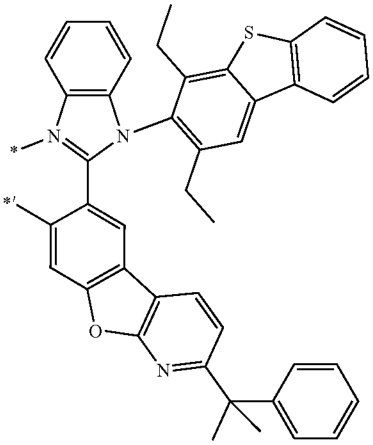
B311
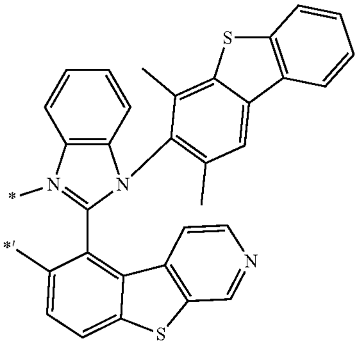
B312
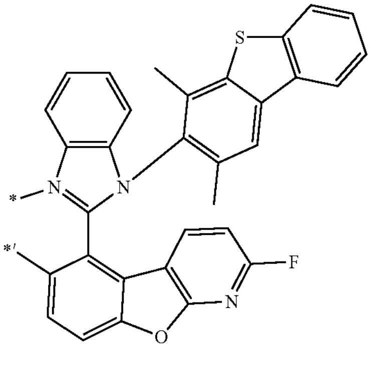
-continued
B313
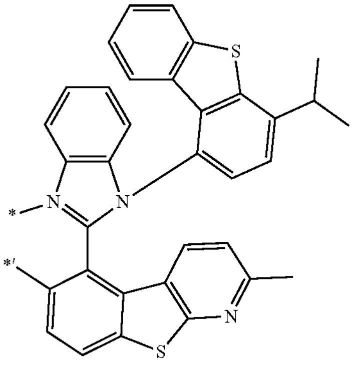
B314
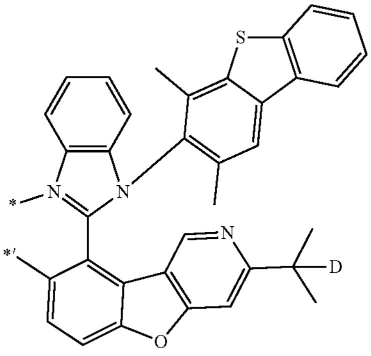
B315
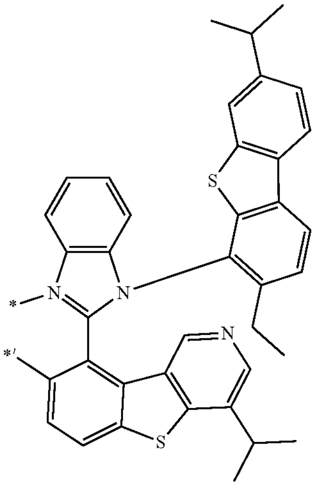
B316
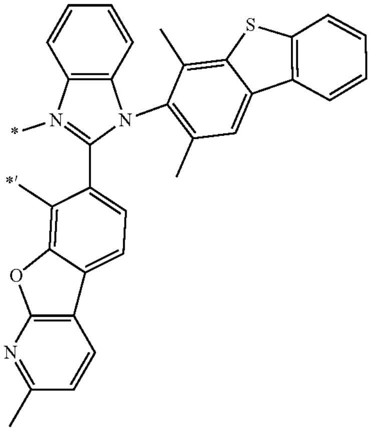

-continued
B317
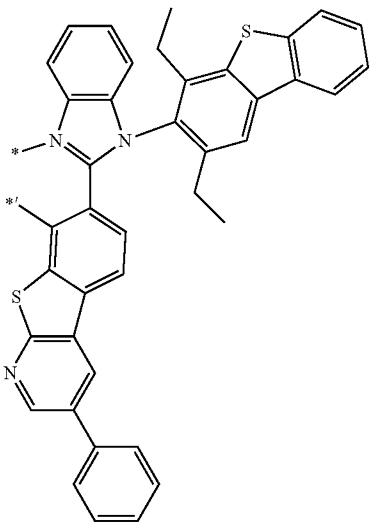
B318
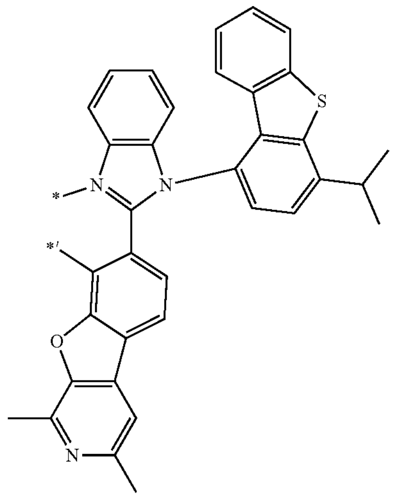
B319
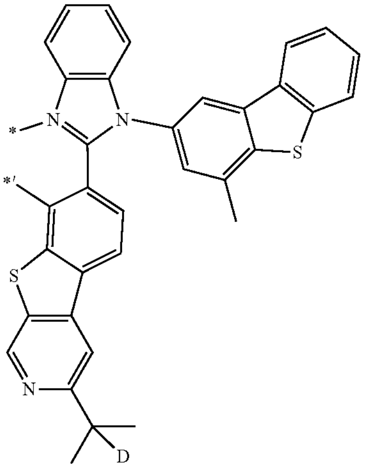
-continued
B320
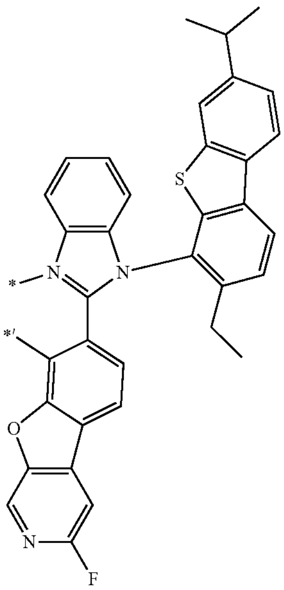
B321
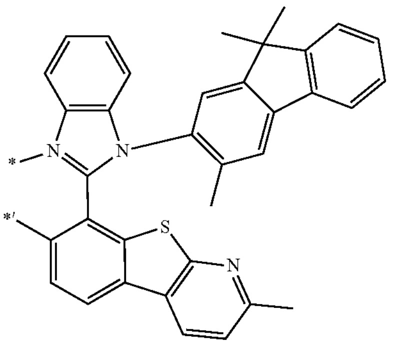
B322
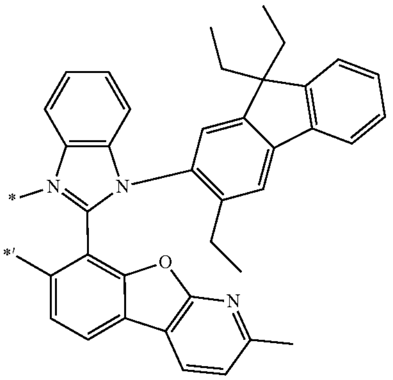

-continued
B323
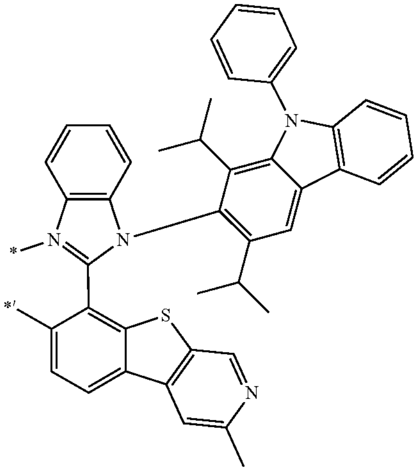
B324
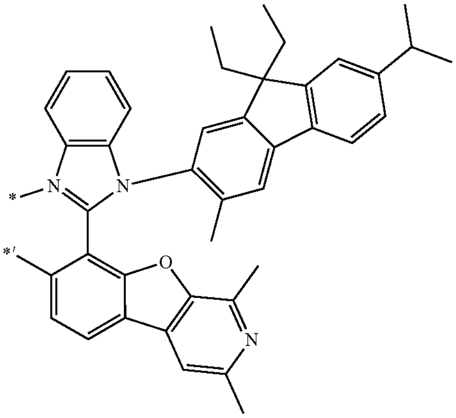
B325
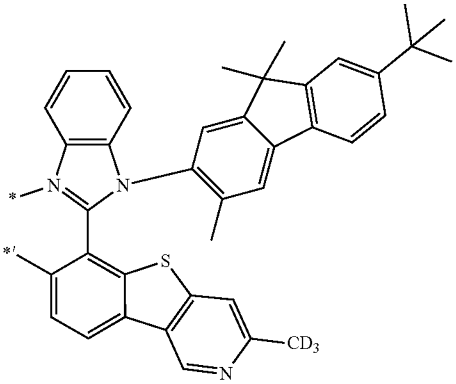
B326
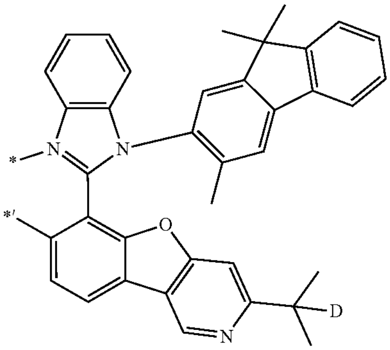
-continued
B327
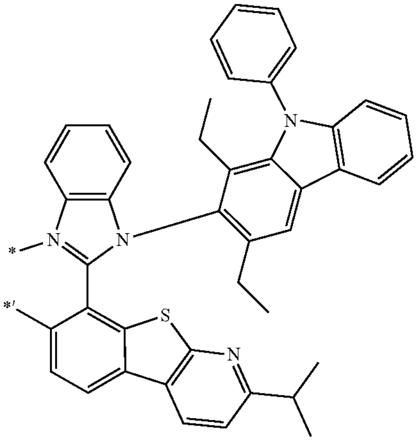
B328
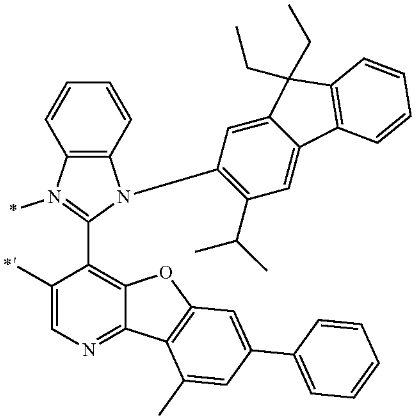
B329
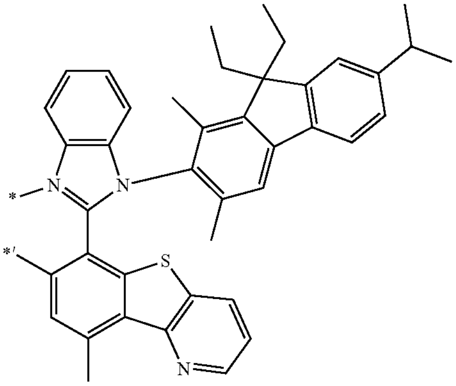
B330
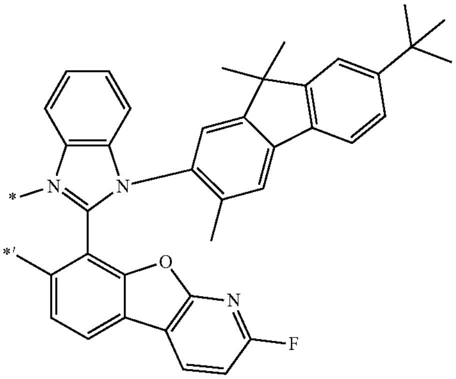

-continued
B331
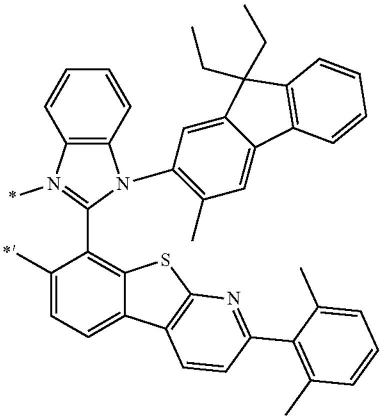
B332
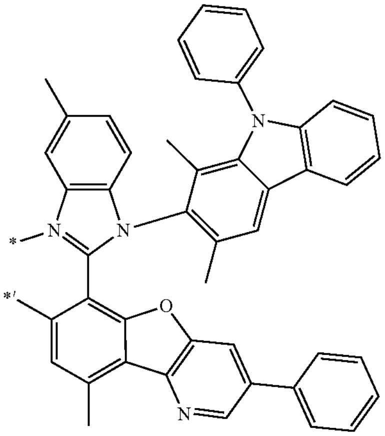
B333
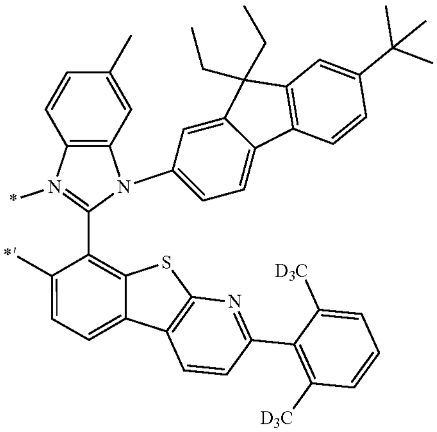
-continued
B334
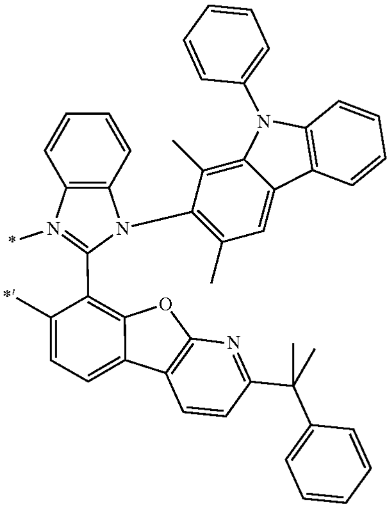
B335
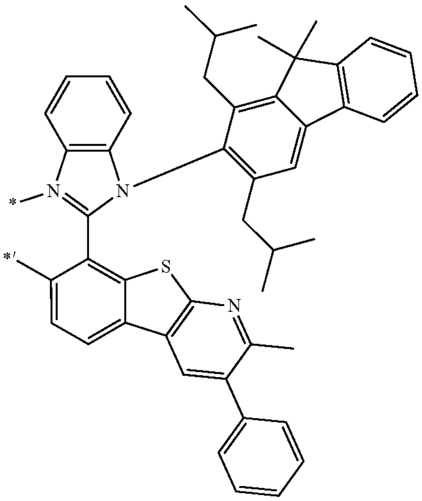
B336
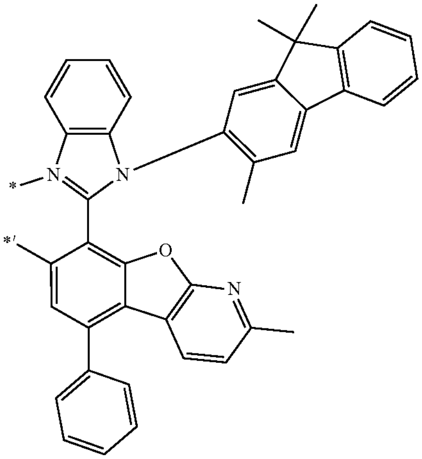

-continued
B337
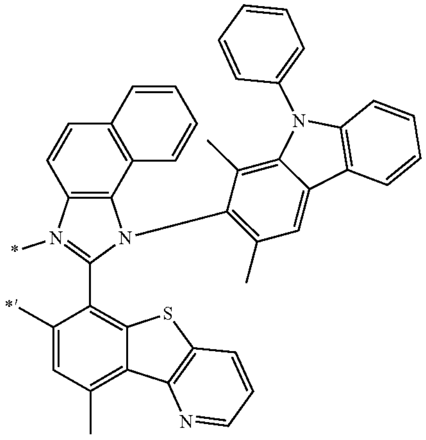
B338
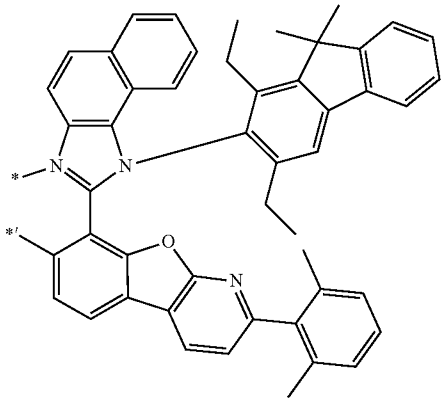
B339
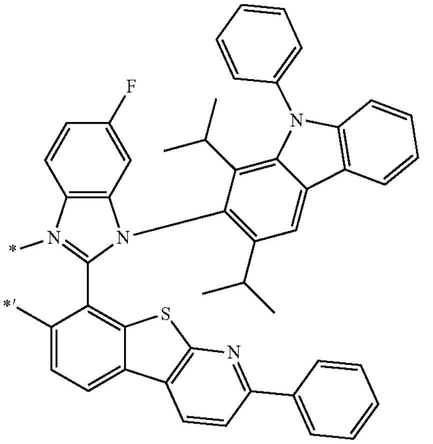
-continued
B340
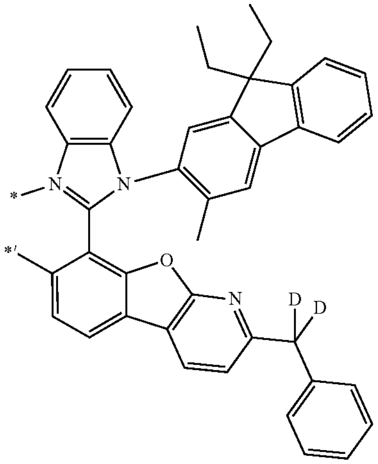
B341
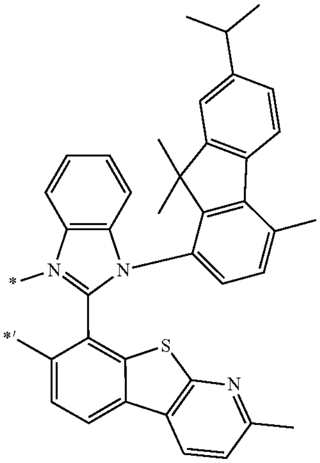
B342
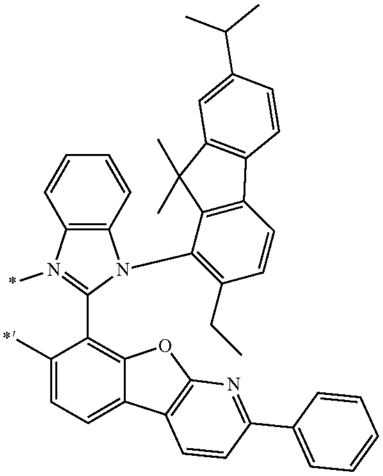

-continued
B343
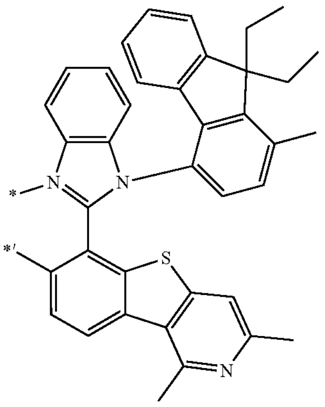
B344
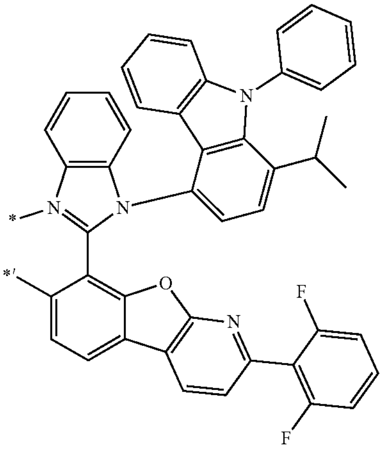
B345
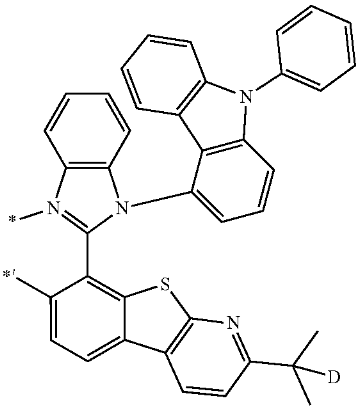
-continued
B346
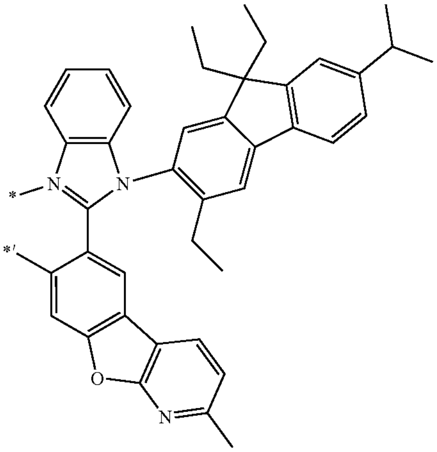
B347
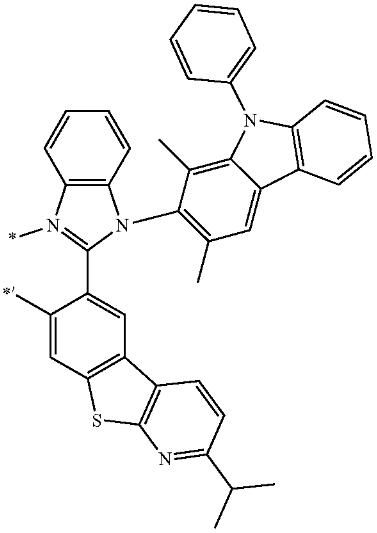
B348
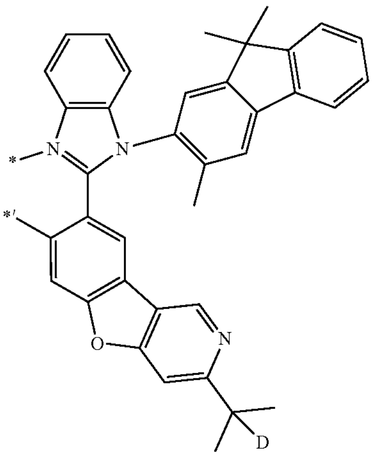

-continued
B349
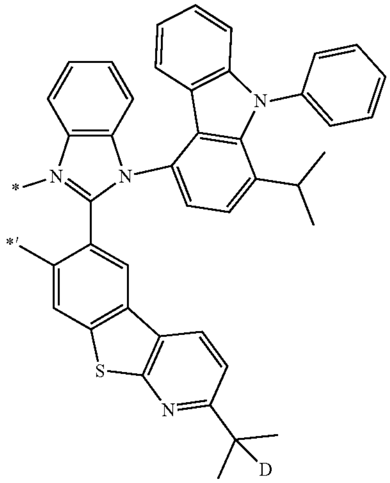
B350
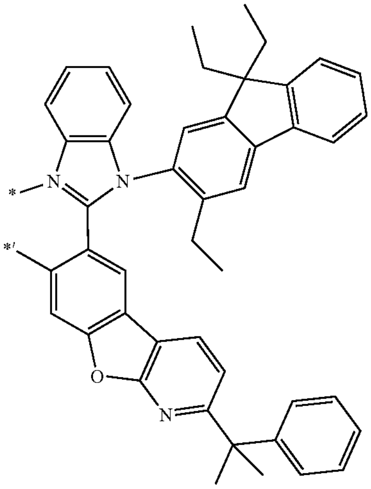
B351
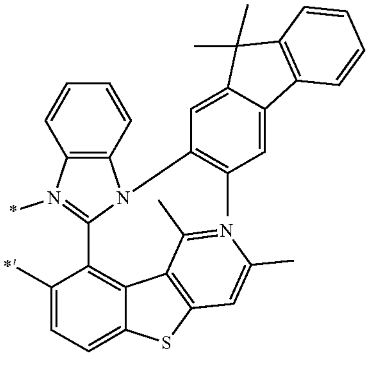
-continued
B352
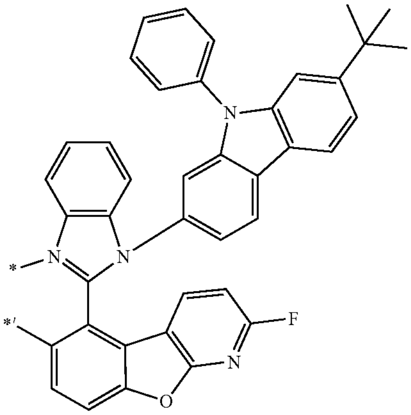
B353
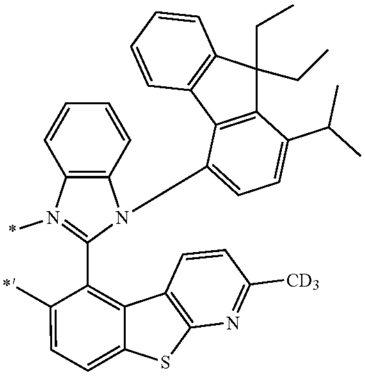
B354
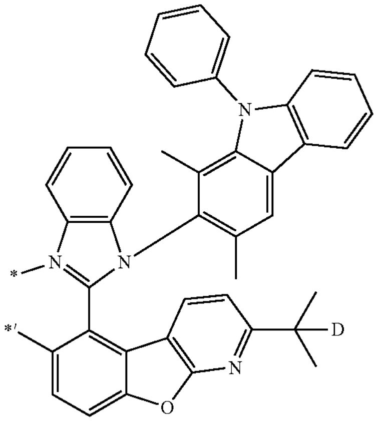
B355
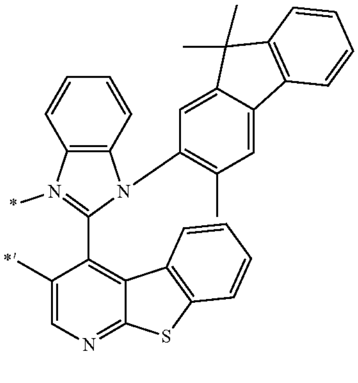

-continued
B356
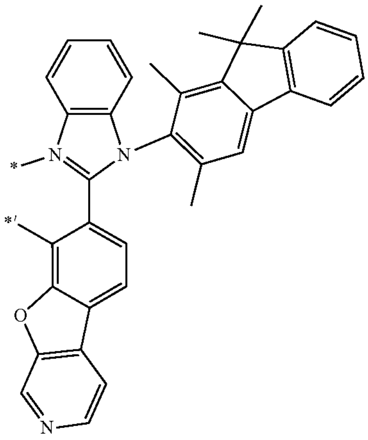
B357
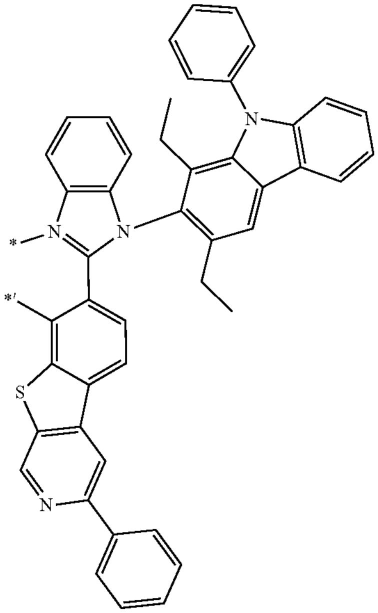
B358
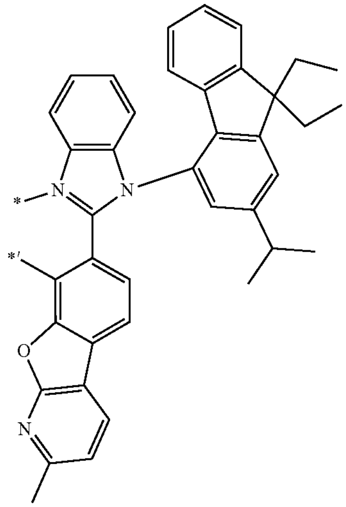
-continued
B359
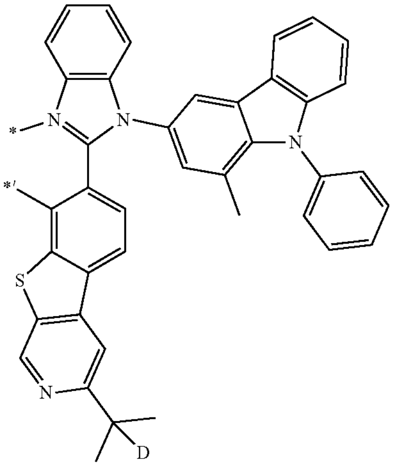
B360
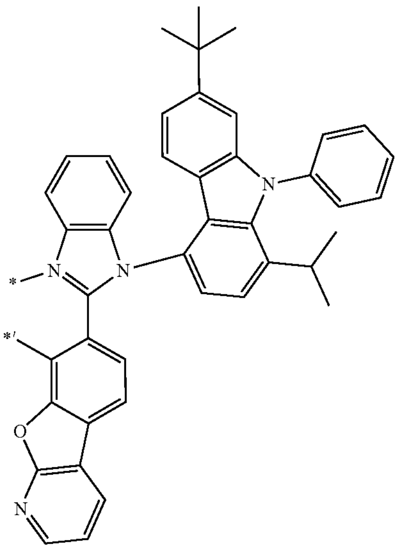
Each of * and *' in Formulae B1 to B360 may be a binding site to M in Formula 1. In one or more embodiments, $L_2$ in Formula 1 may be a ligand represented by one of Formulae A1 to A300:
A1
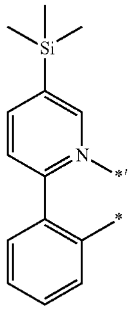

-continued
A2
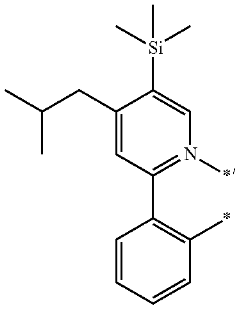
A3
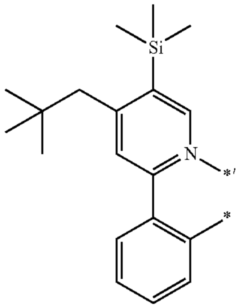
A4
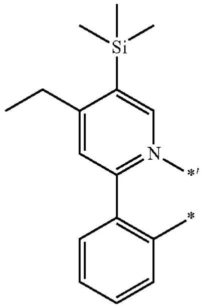
A5
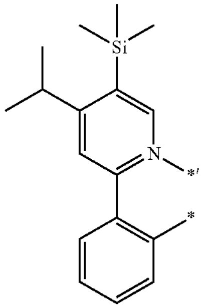
A6
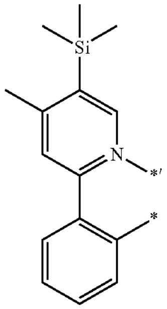
-continued
A7
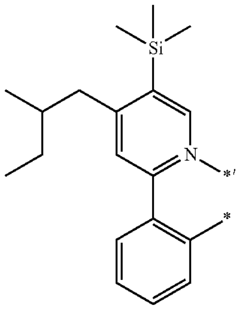
A8
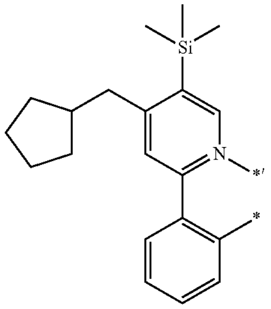
A9
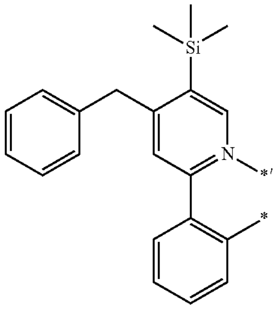
A10
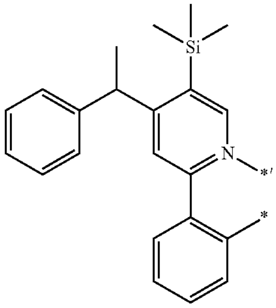
A11
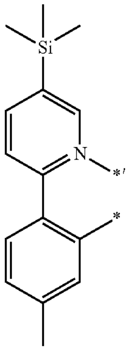

-continued
A12
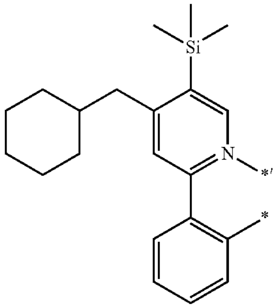
A13
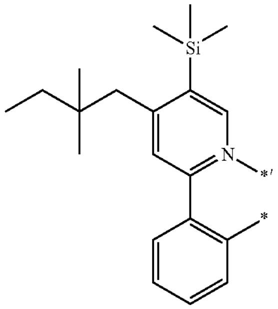
A14
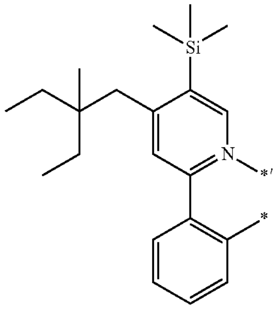
A15
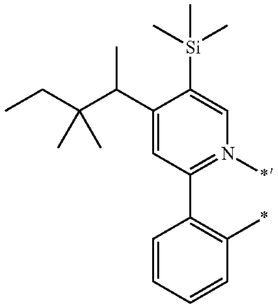
A16
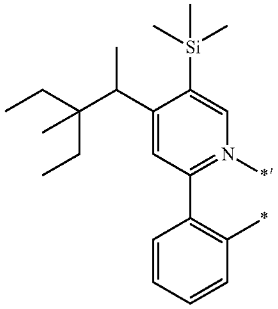
-continued
A17
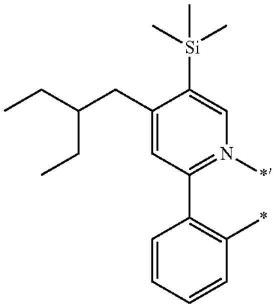
A18
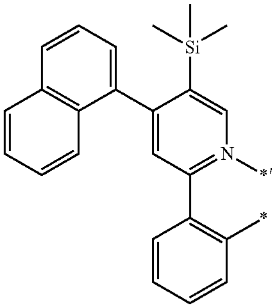
A19
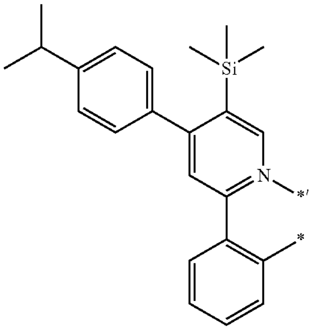
A20
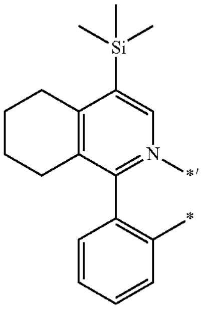
A21
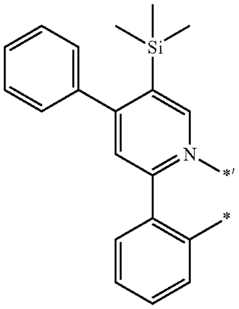

-continued
A22
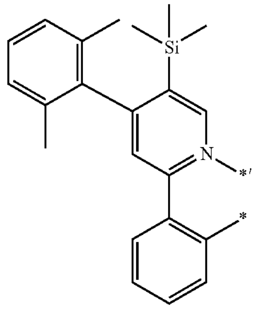
A23
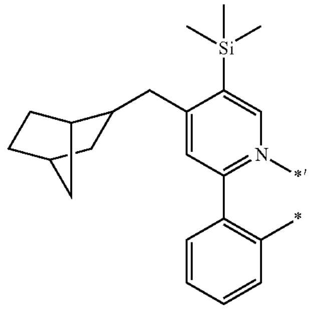
A24
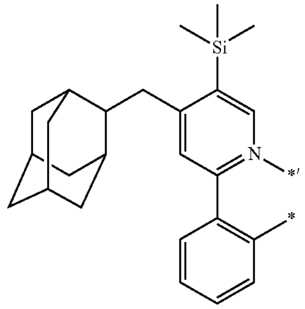
A25
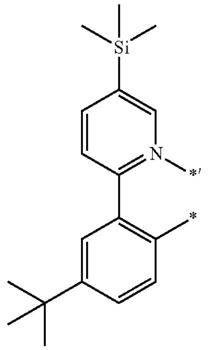
-continued
A26
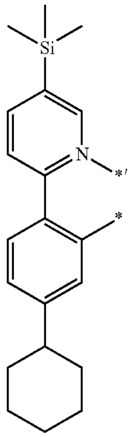
A27
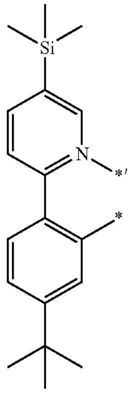
A28
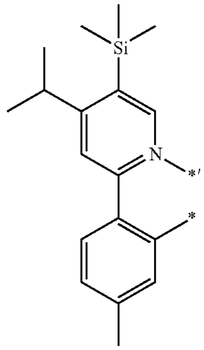
A29
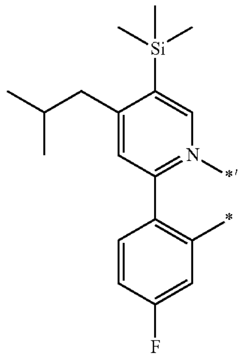

-continued
A30
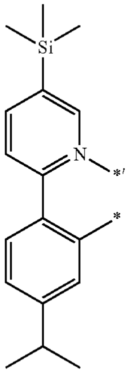
A31
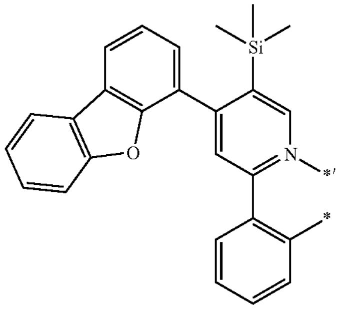
A32
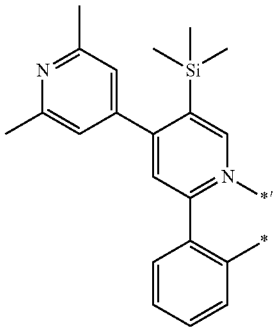
A33
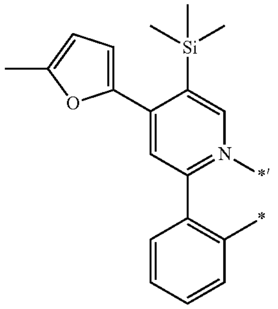
A34
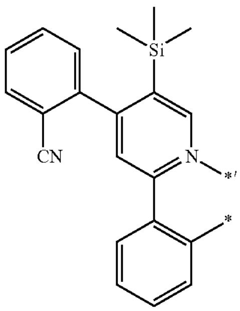
-continued
A35
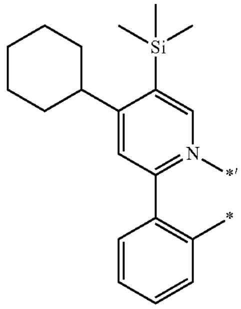
A36
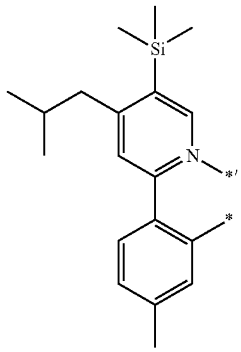
A37
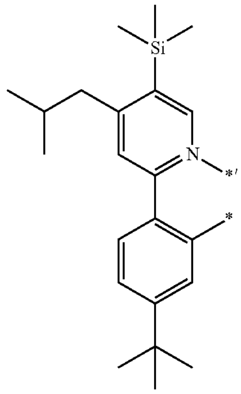
A38
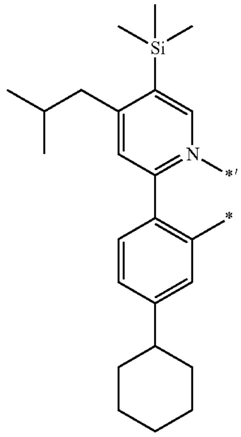

-continued
A39
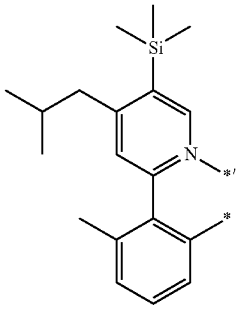
A40
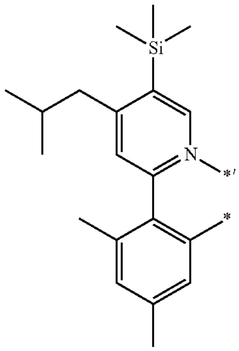
A41
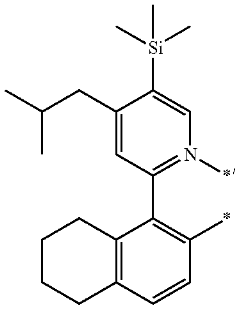
A42
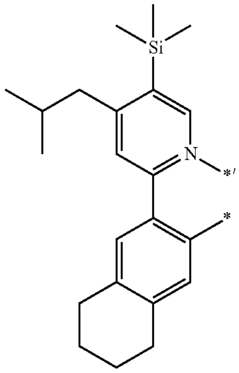
-continued
A43
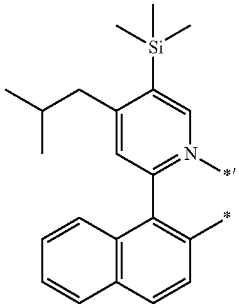
A44
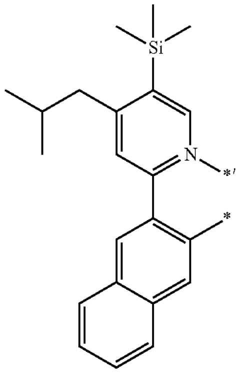
A45
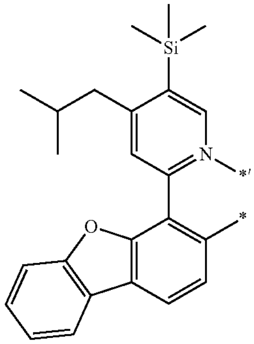
A46
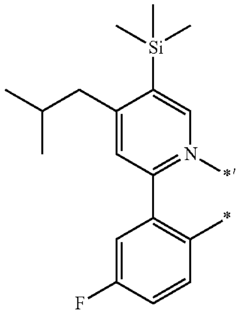

-continued
A47
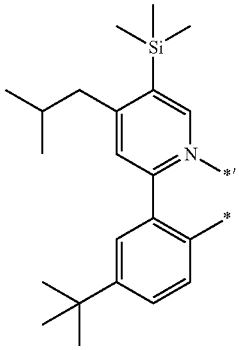
A48
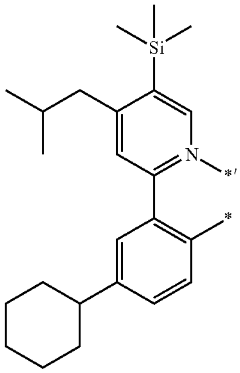
A49
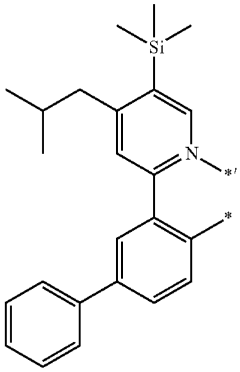
A50
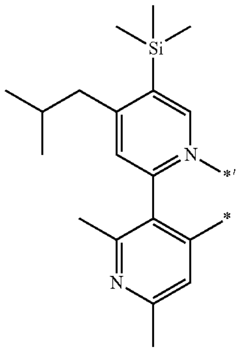
-continued
A51
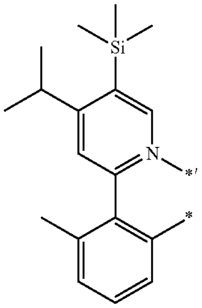
A52
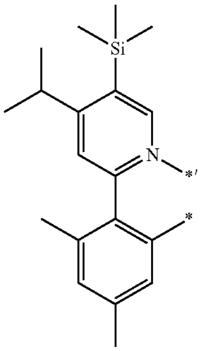
A53
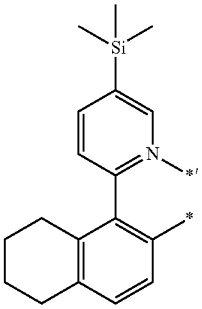
A54
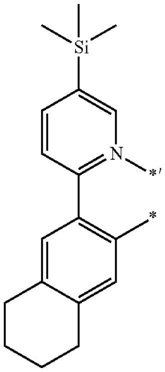

-continued
A55
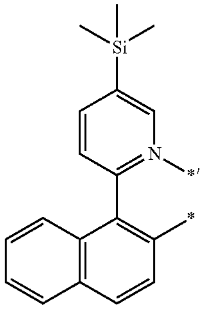
A56
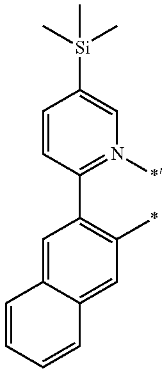
A57
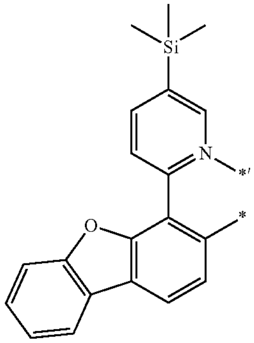
A58
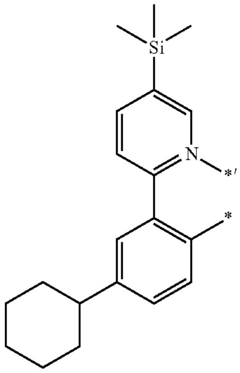
-continued
A59
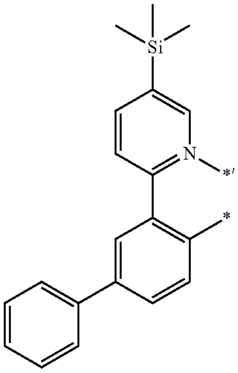
A60
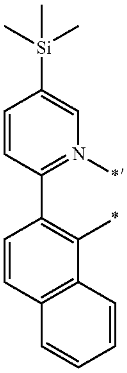
A61
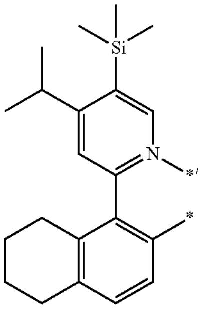
A62
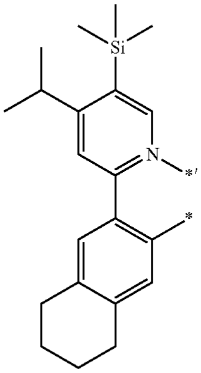

-continued
A63
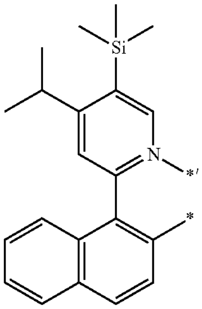
A64
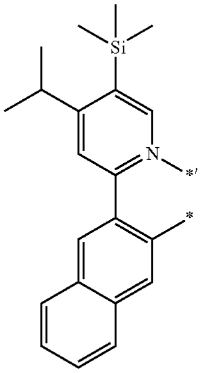
A65
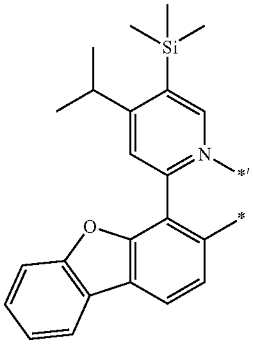
A66
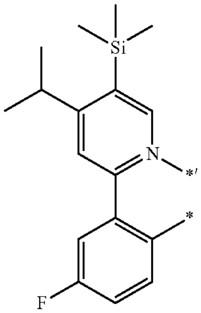
-continued
A67
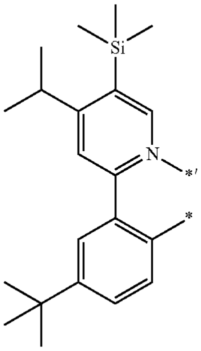
A68
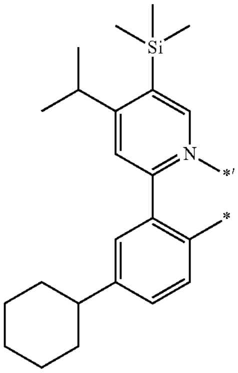
A69
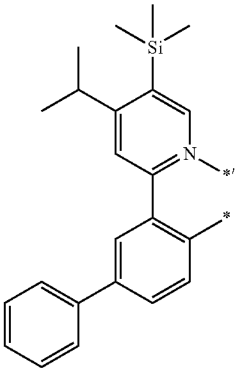
A70
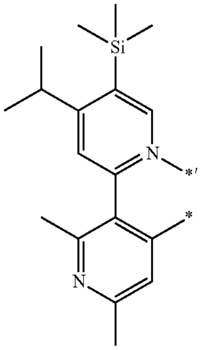

-continued
A71
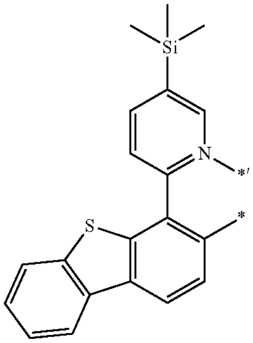
A72
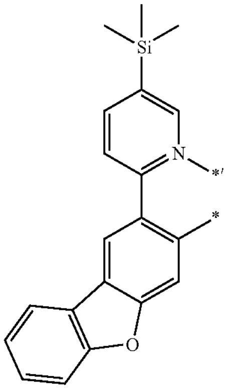
A73
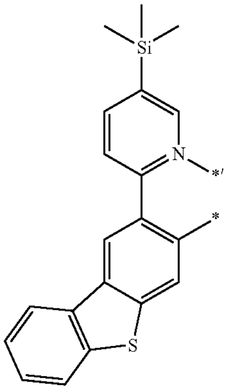
A74
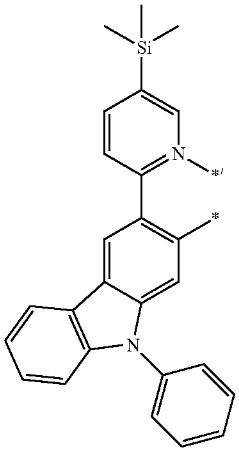
-continued
A75
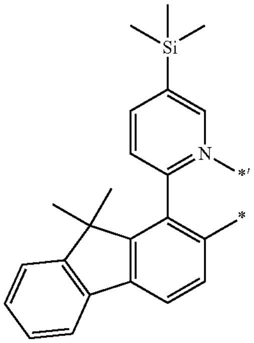
A76
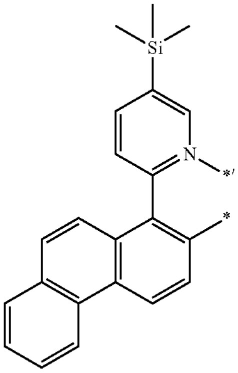
A77
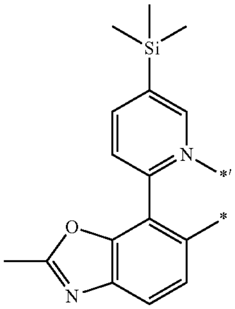
A78
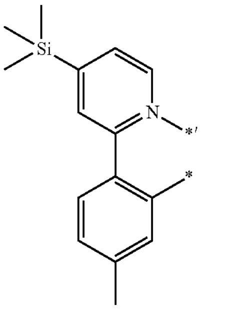

-continued
A79
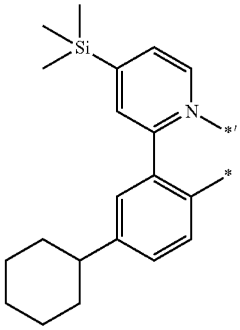
A80
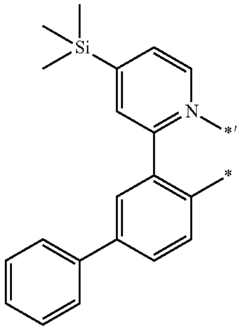
A81
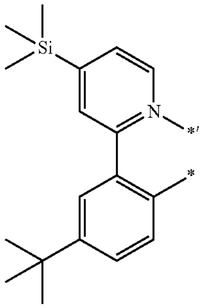
A82
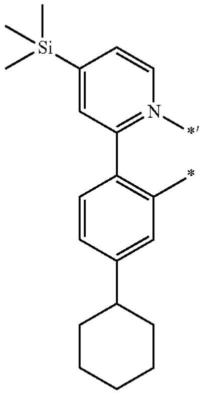
-continued
A83
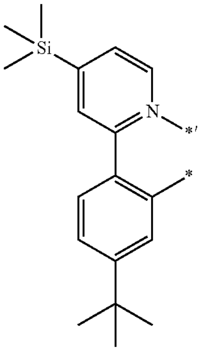
A84
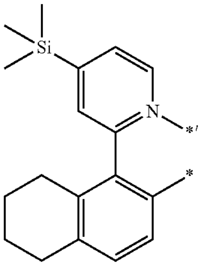
A85
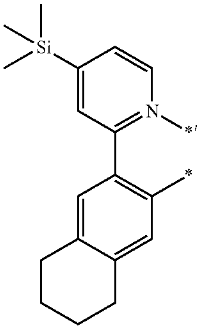
A86
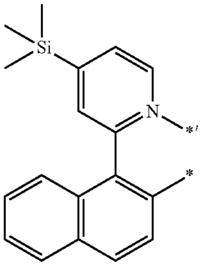
A87
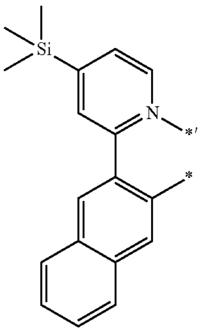

-continued
A88
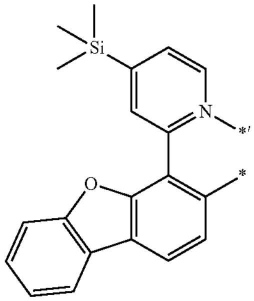
A89
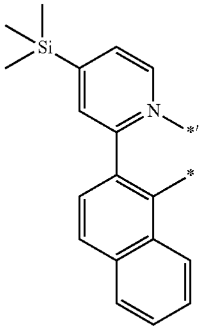
A90
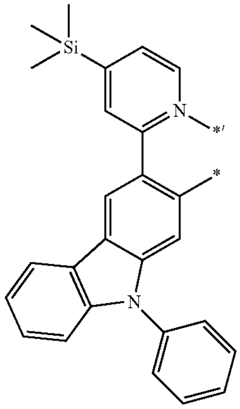
A91
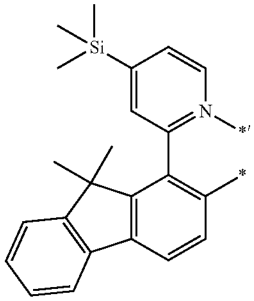
-continued
A92
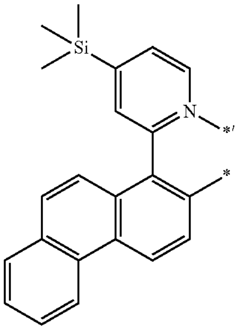
A93
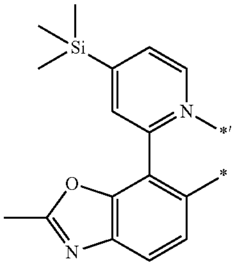
A94
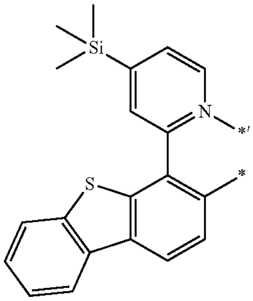
A95
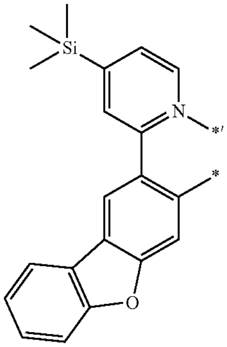
A96
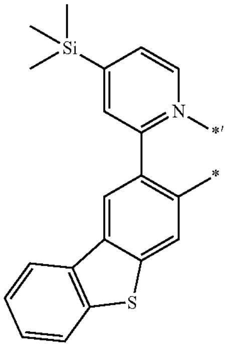

-continued
A97
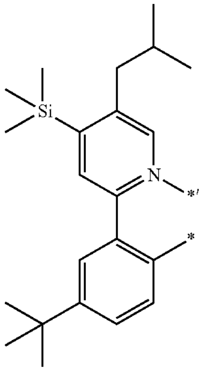
A98
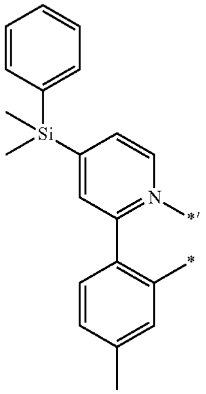
A99
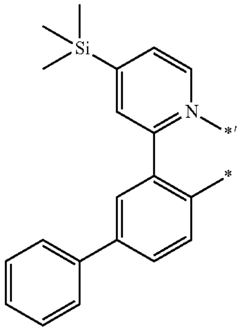
A100
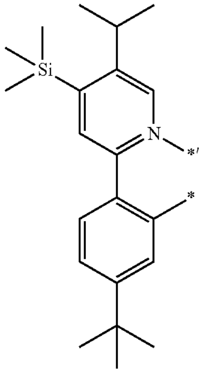
-continued
A101
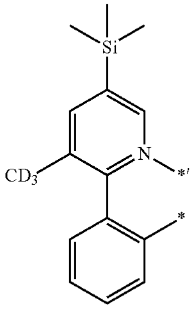
A102
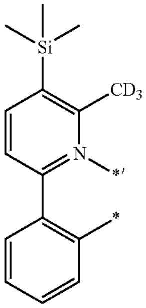
A103
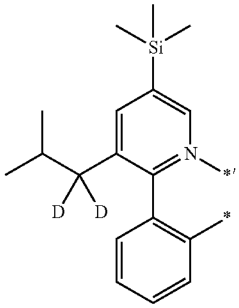
A104
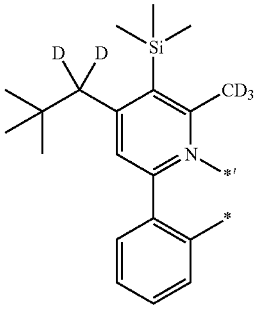
A105
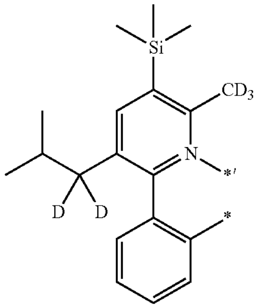

-continued
A106
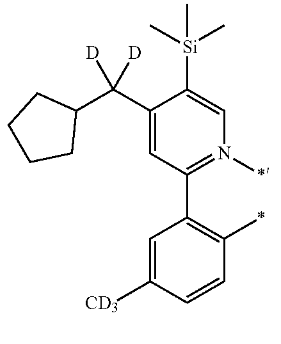
A107
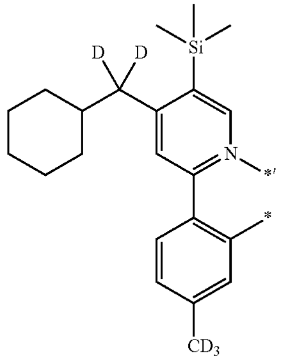
A108
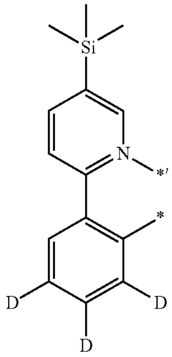
A109
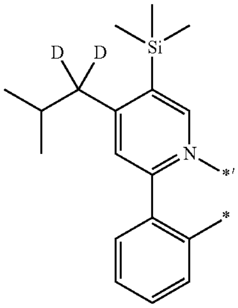
A110
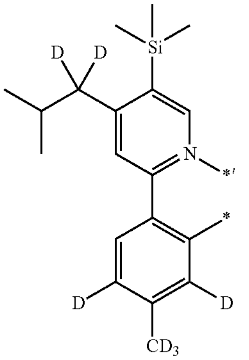
A111
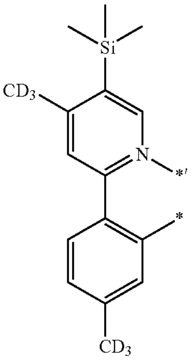
A112
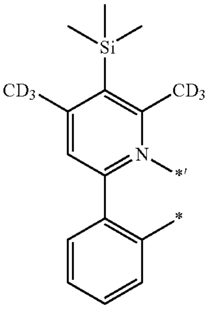
A113
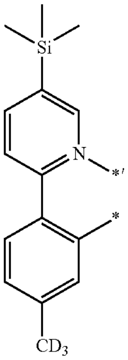

-continued
A114
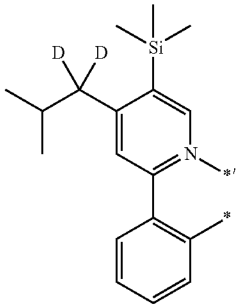
A115
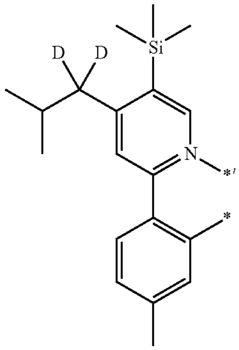
A116
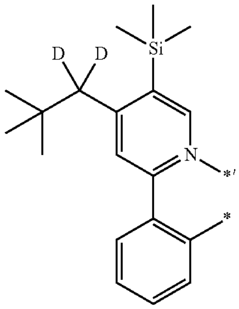
A117
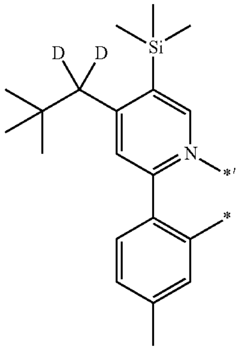
-continued
A118
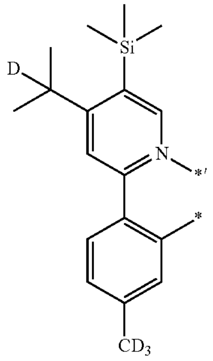
A119
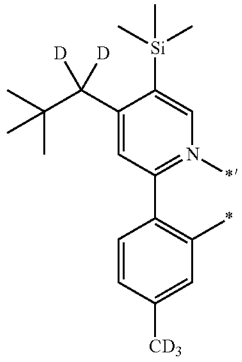
A120
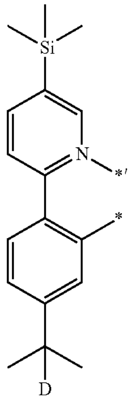
A121
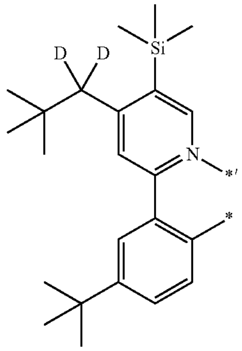

-continued
A122
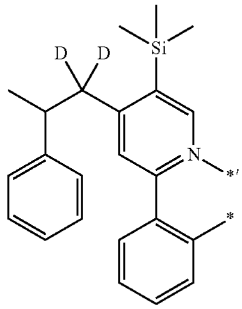
A123
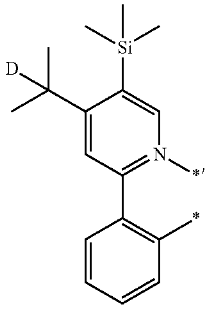
A124
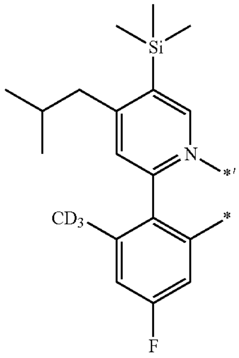
A125
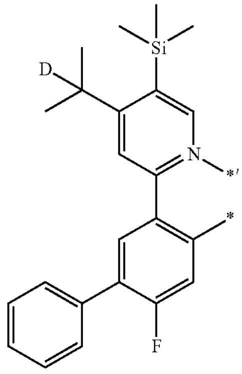
-continued
A126
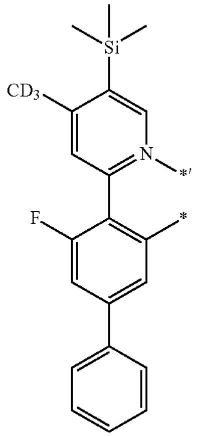
A127
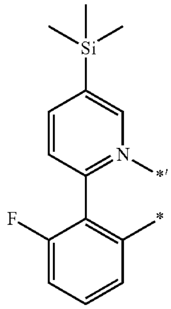
A128
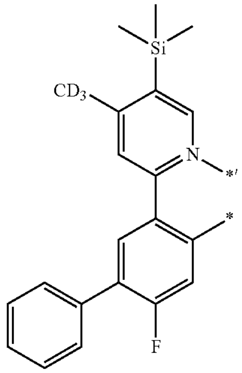
A129
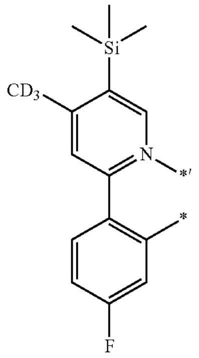

-continued
A130
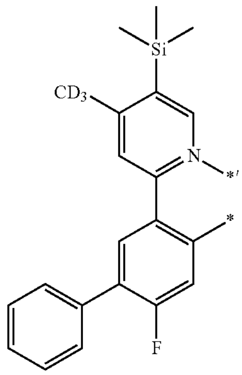
A131
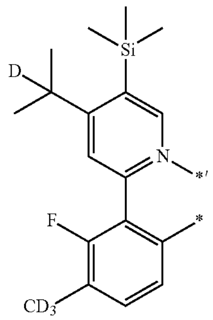
A132
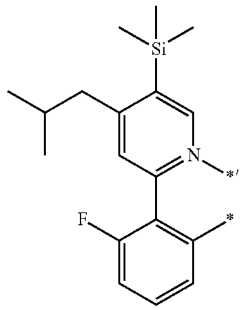
A133
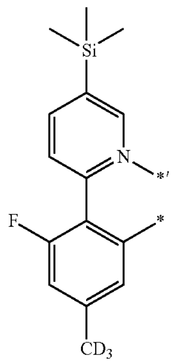
-continued
A134
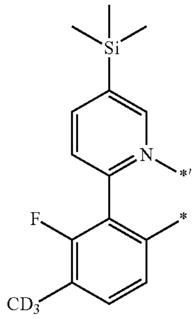
A135
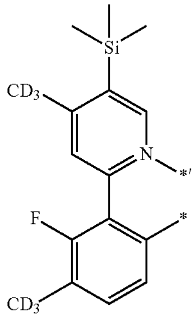
A136
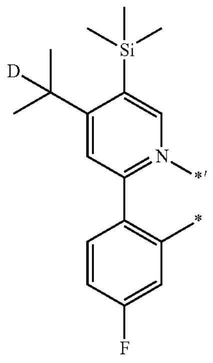
A137
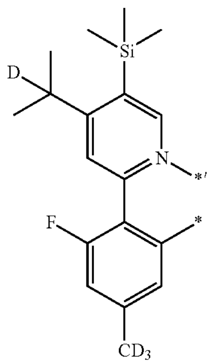

-continued
A138
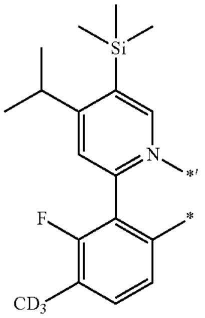
A139
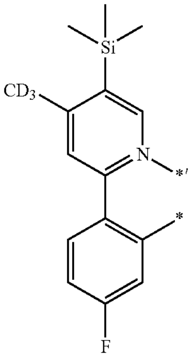
A140
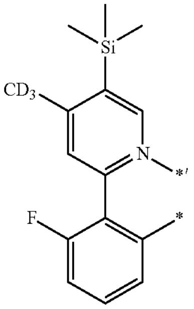
A141
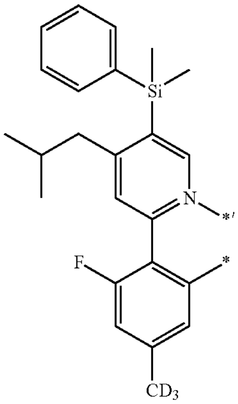
-continued
A142
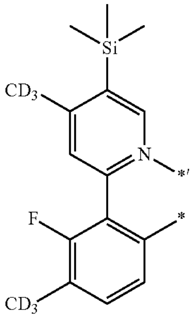
A143
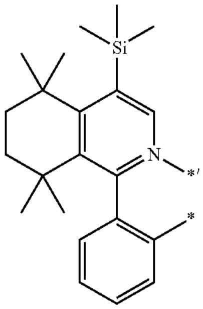
A144
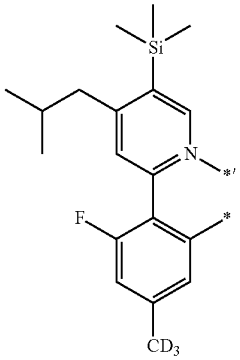
A145
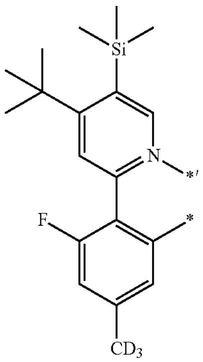

-continued
A146
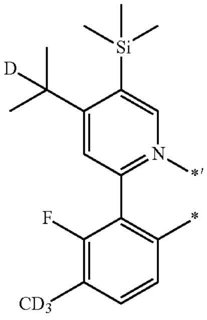
A147
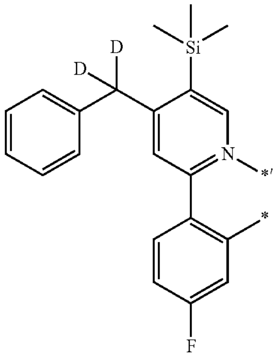
A148
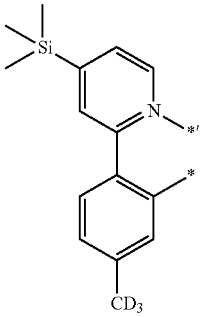
A149
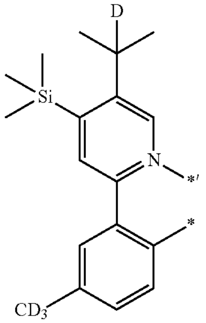
-continued
A150
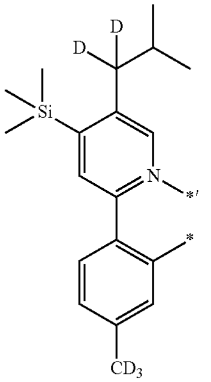
A151
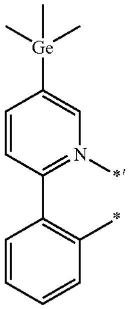
A152
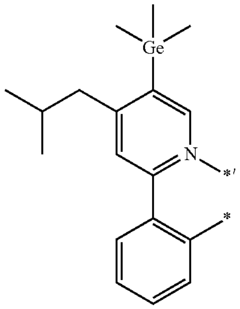
A153
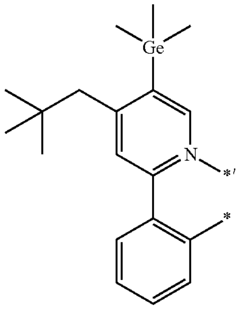
A154
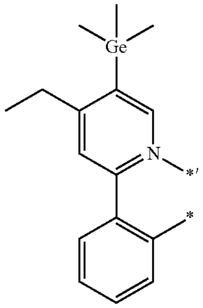

-continued
A155
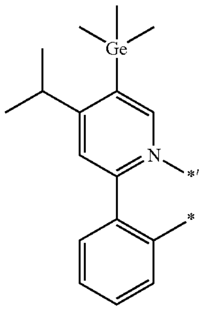
A156
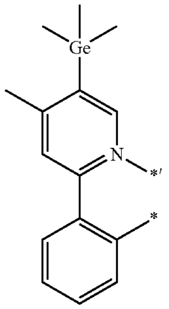
A157
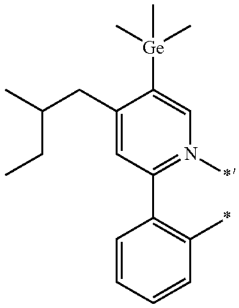
A158
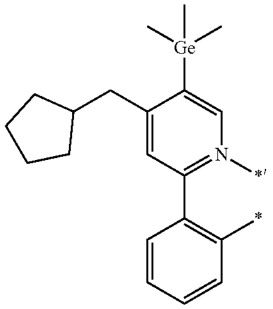
A159
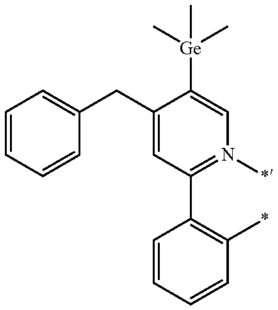
-continued
A160
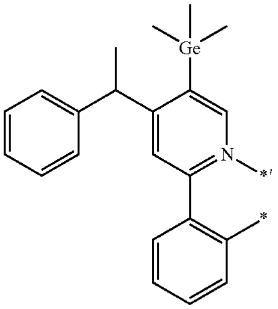
A161
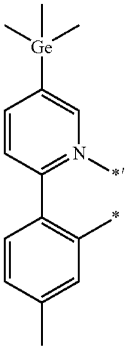
A162
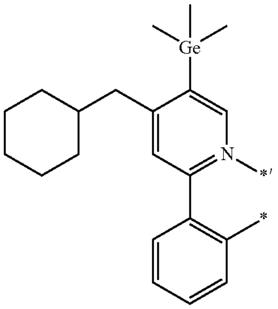
A163
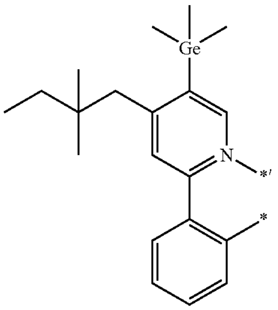
A164
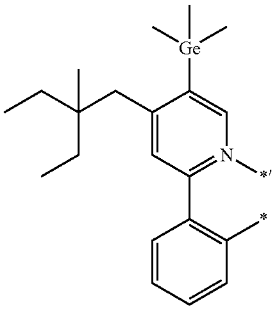

-continued
A165
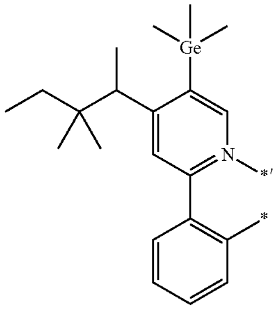
A166
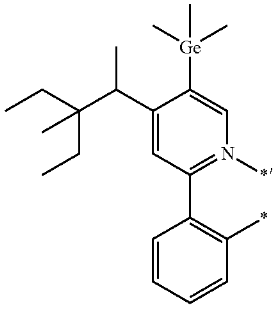
A167
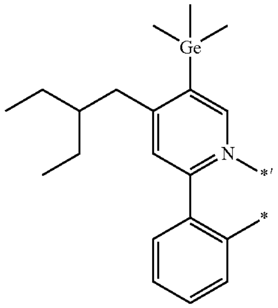
A168
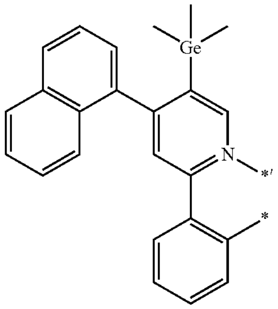
A169
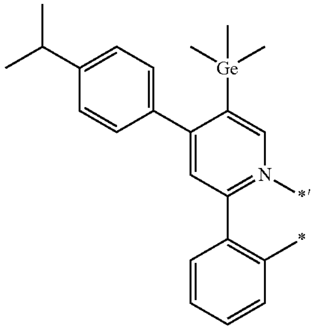
-continued
A170
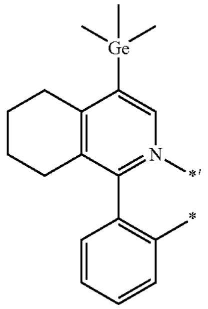
A171
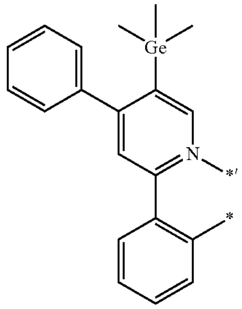
A172
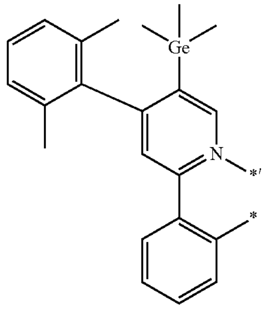
A173
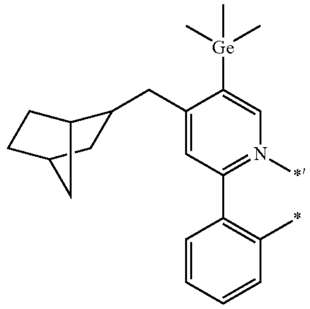
A174
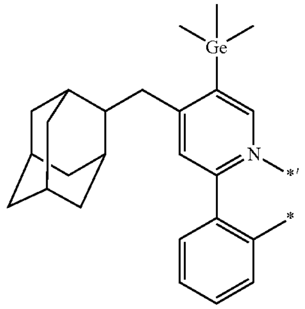

-continued
A175
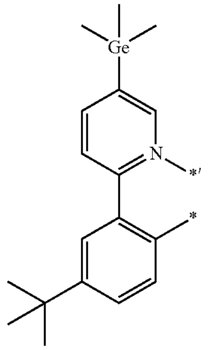
A176
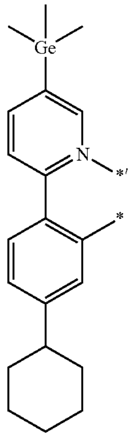
A177
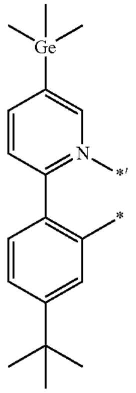
A178
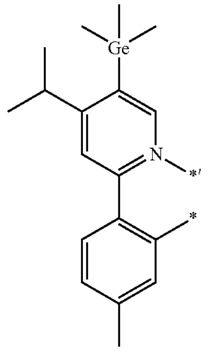
-continued
A179
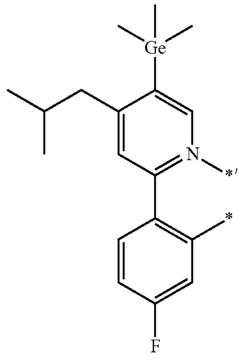
A180
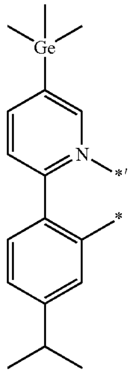
A181
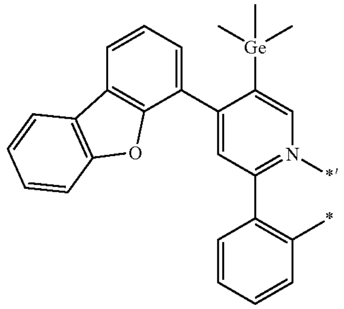
A182
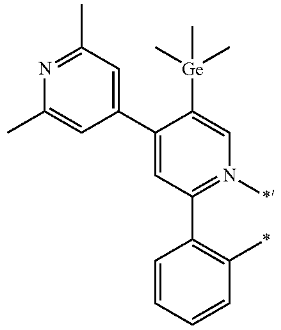

A183
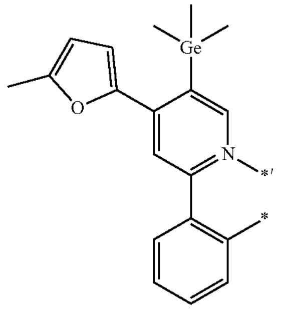
A184
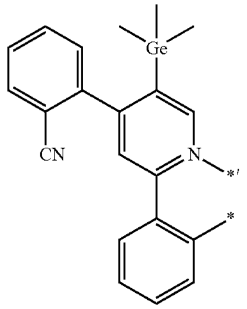
A185
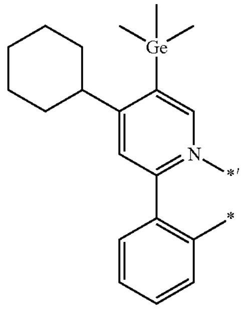
A186
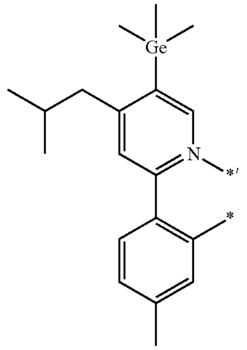
A187
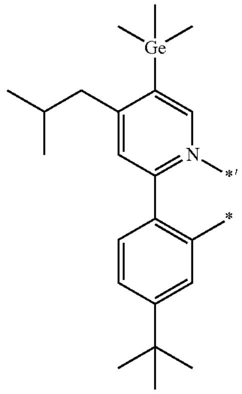
A188
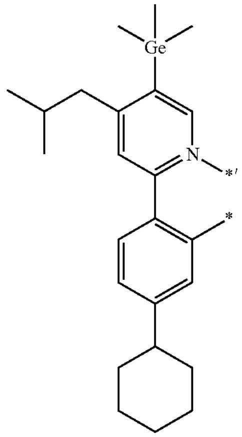
A189
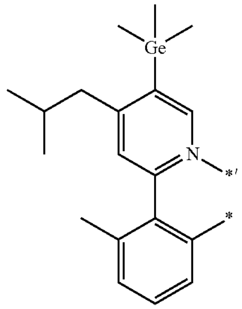
A190
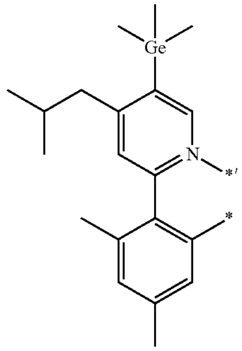

-continued
A191
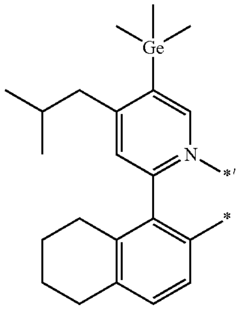
A192
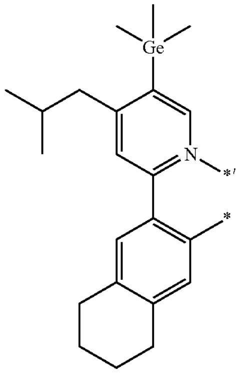
A193
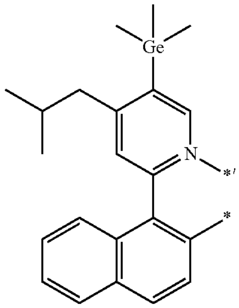
A194
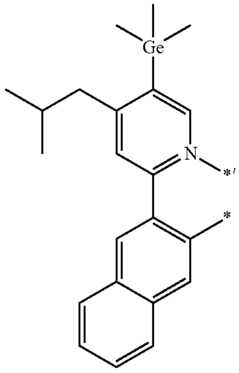
-continued
A195
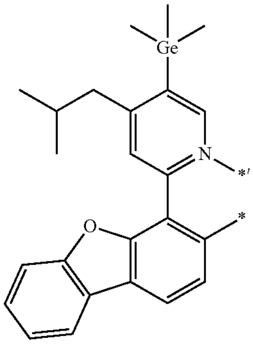
A196
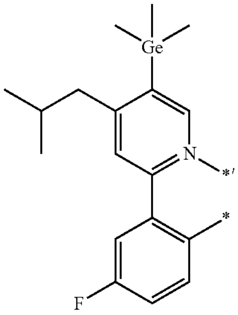
A197
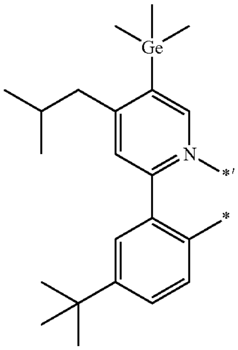
A198
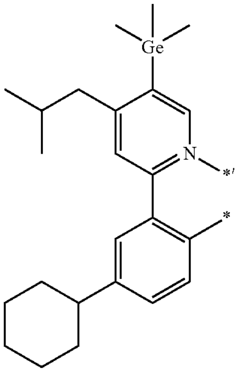

-continued
A199
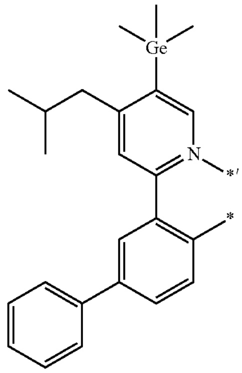
A200
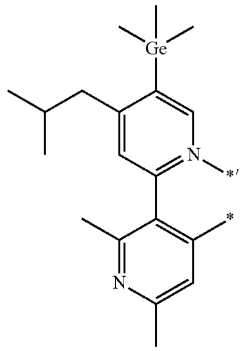
A201
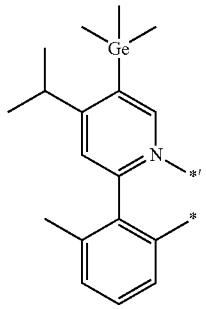
A202
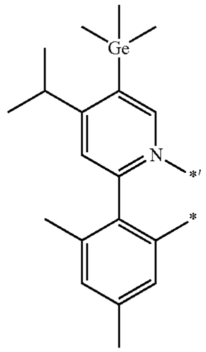
-continued
A203
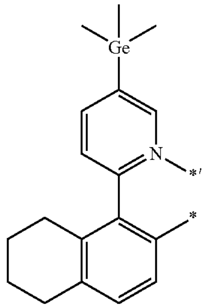
A204
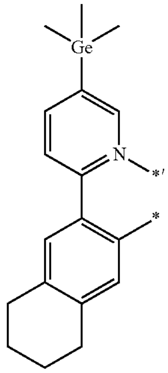
A205
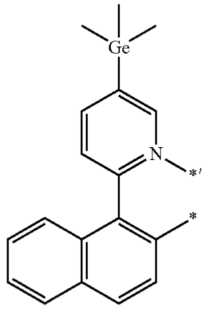
A206
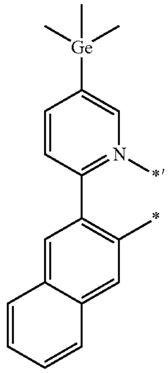

-continued
A207
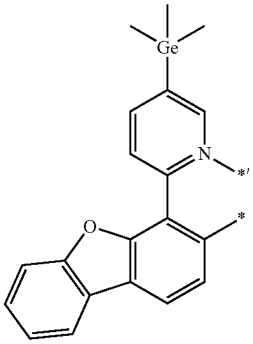
A208
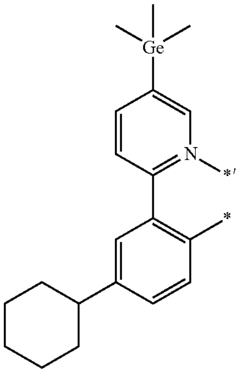
A209
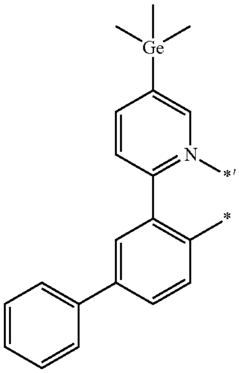
A210
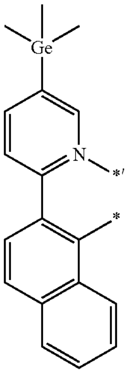
-continued
A211
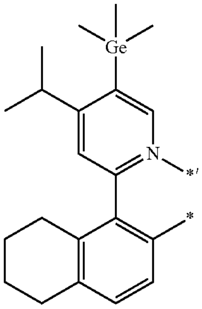
A212
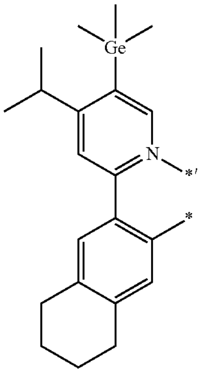
A213
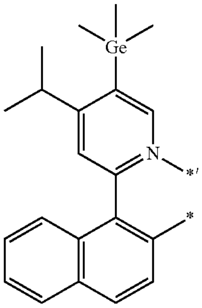
A214
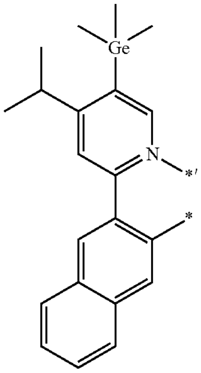

-continued
A215
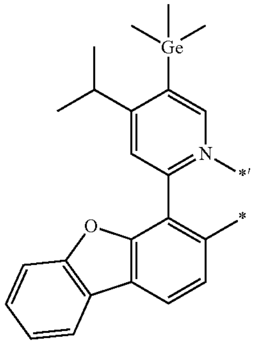
A216
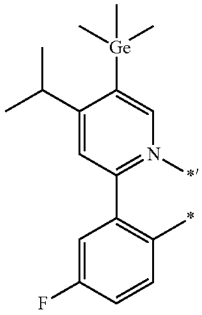
A217
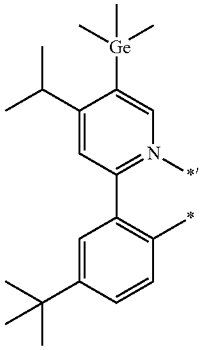
A218
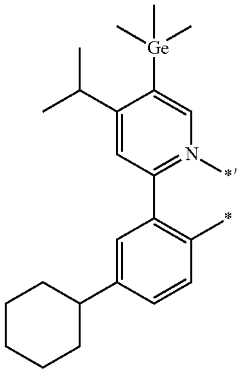
-continued
A219
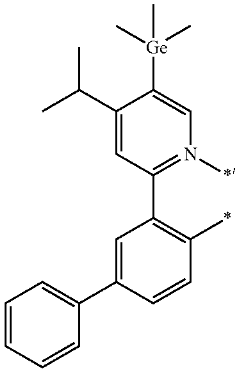
A220
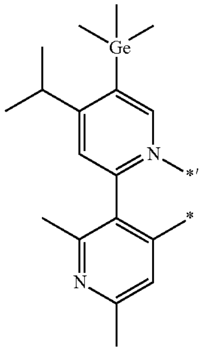
A221
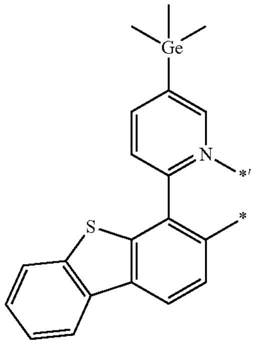
A222
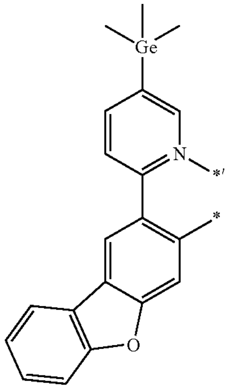

-continued
A223
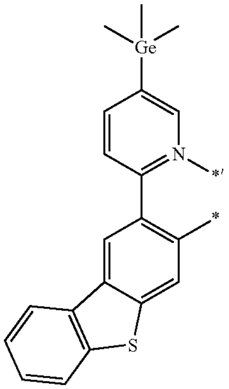
A224
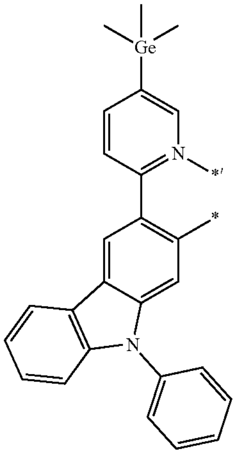
A225
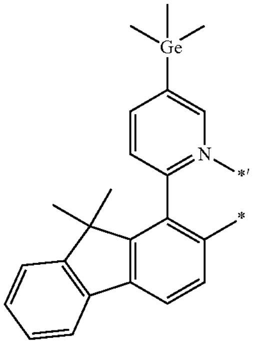
A226
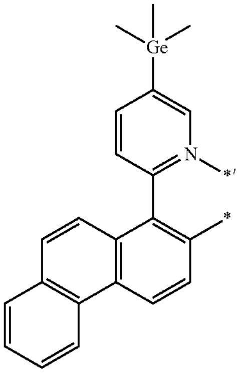
-continued
A227
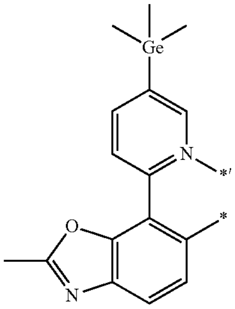
A228
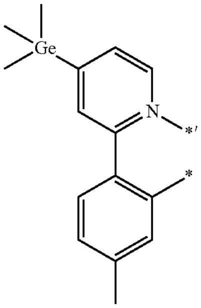
A229
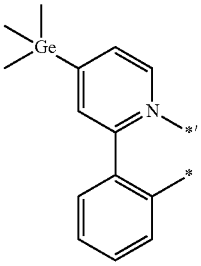
A230
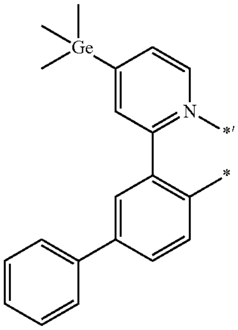
A231
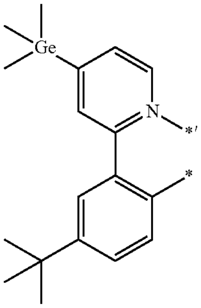

-continued
A232
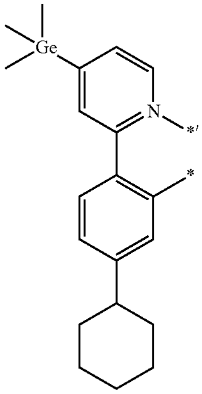
A233
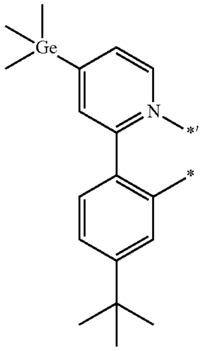
A234
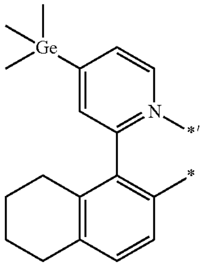
A235
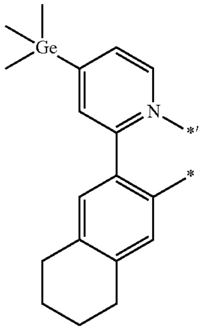
A236
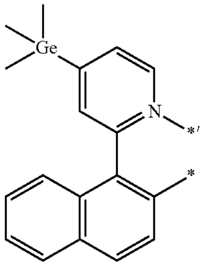
-continued
A237
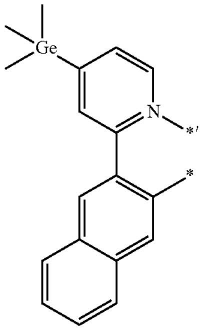
A238
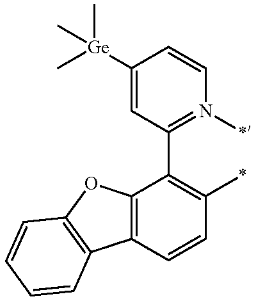
A239
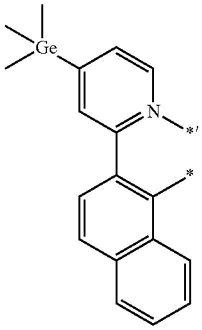
A240
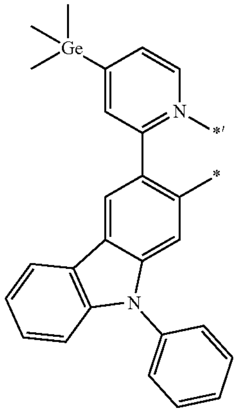

-continued
A241
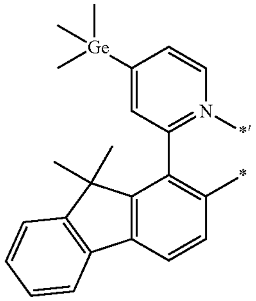
A242
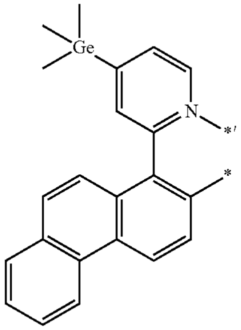
A243
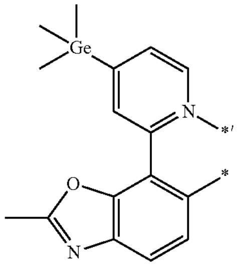
A244
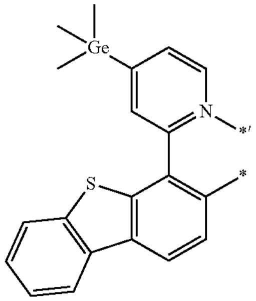
A245
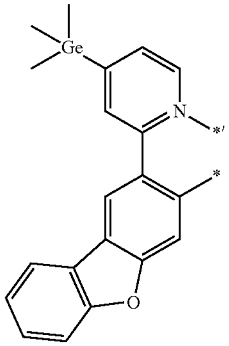
-continued
A246
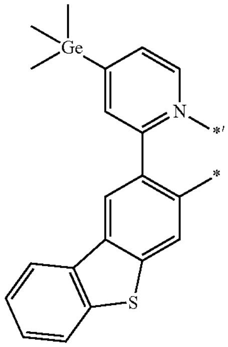
A247
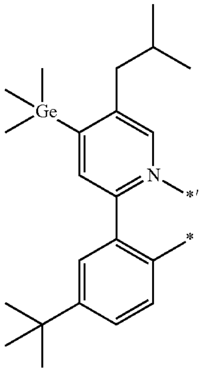
A248
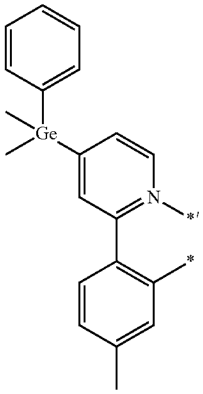
A249
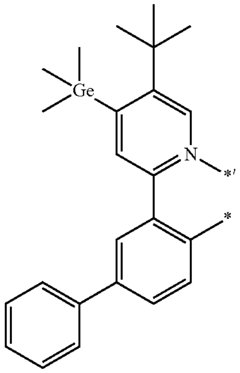

-continued
A250
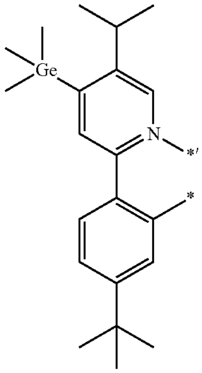
A251
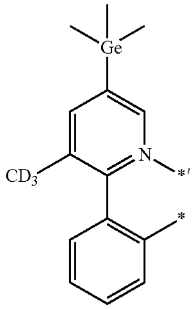
A252
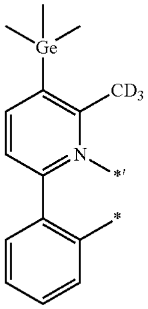
A253
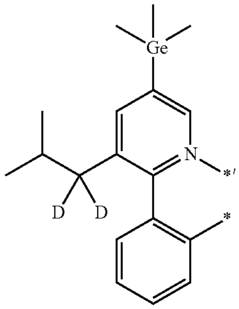
A254
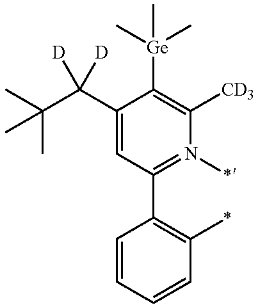
-continued
A255
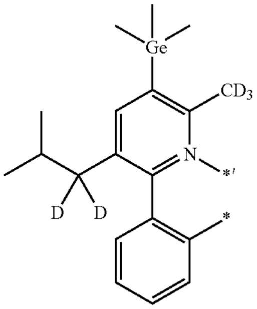
A256
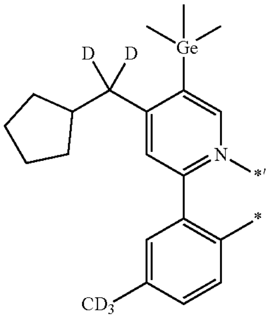
A257
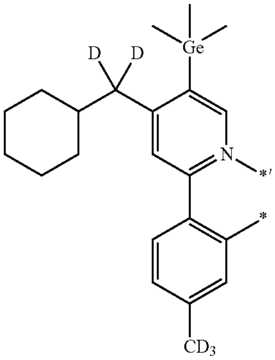
A258
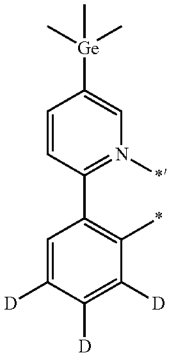

-continued
A259
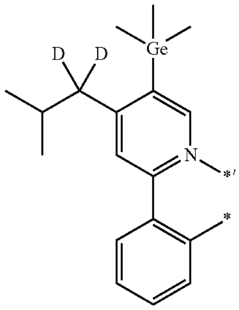
A260
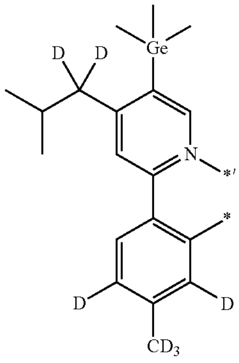
A261
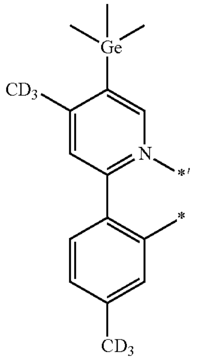
A262
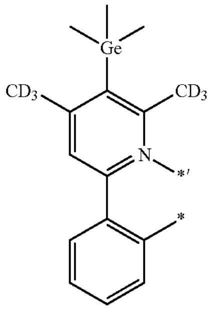
-continued
A263
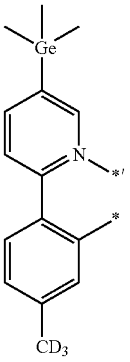
A264
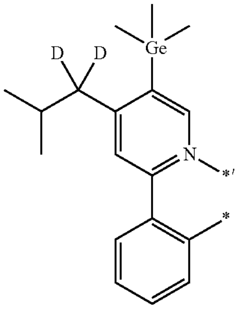
A265
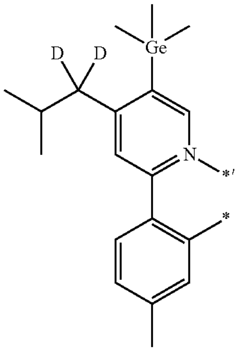
A266
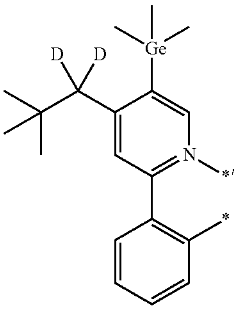

-continued
A267
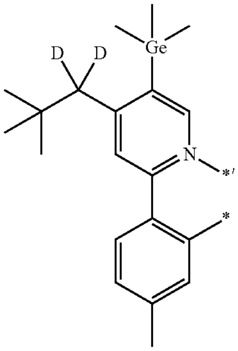
A268
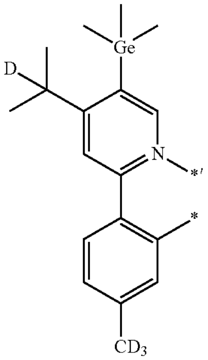
A269
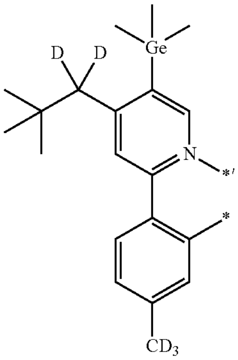
A270
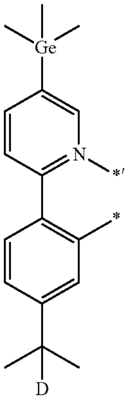
-continued
A271
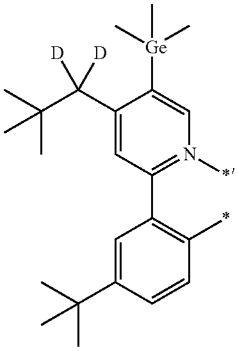
A272
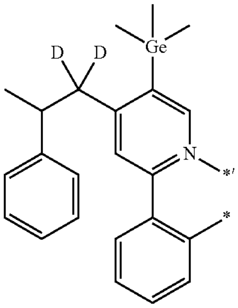
A273
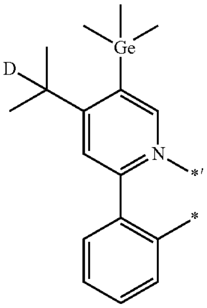
A274
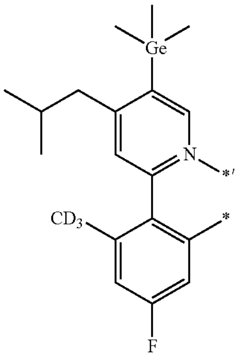

A275
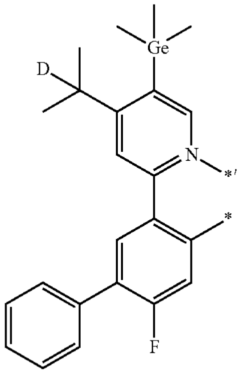
A276
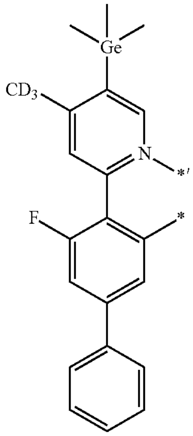
A277
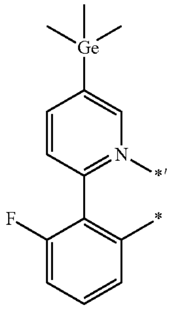
A278
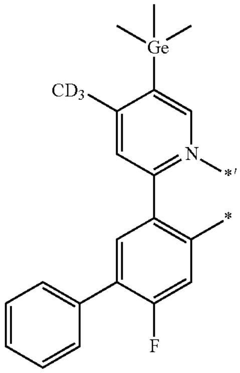
A279
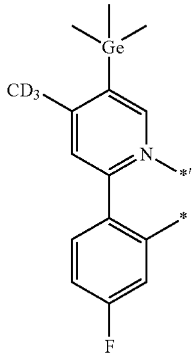
A280
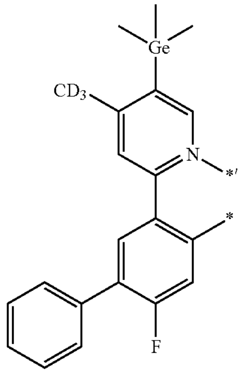
A281
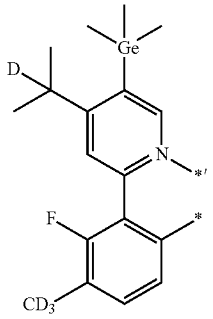
A282
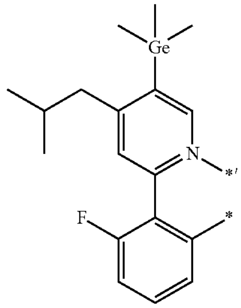

-continued
A283
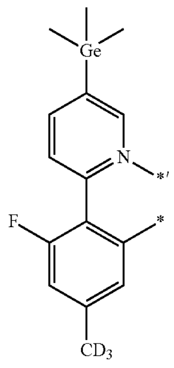
A284
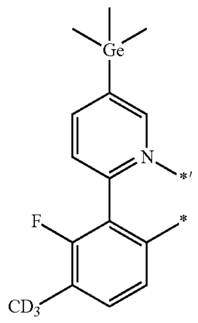
A285
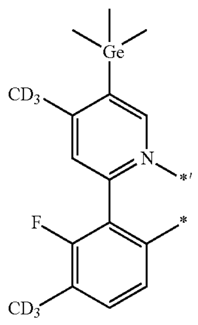
A286
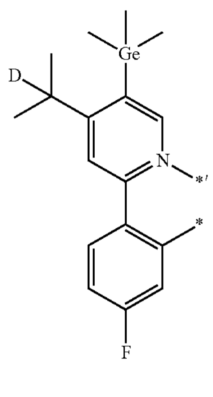
-continued
A287
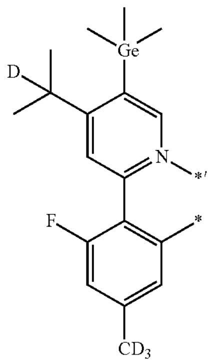
A288
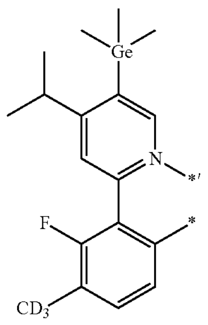
A289
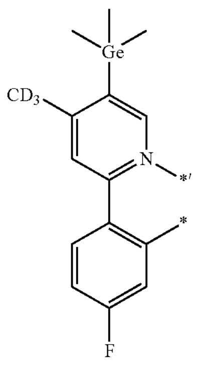
A290
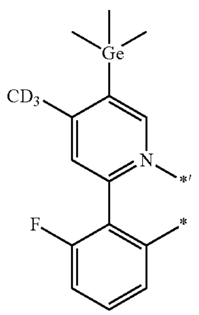

-continued
A291
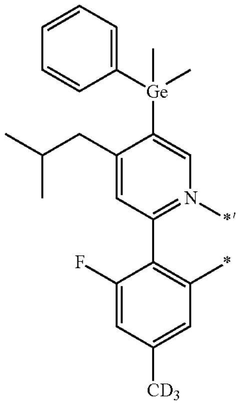
A292
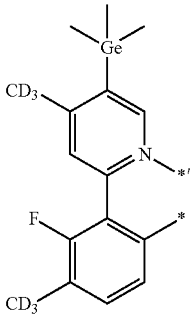
A293
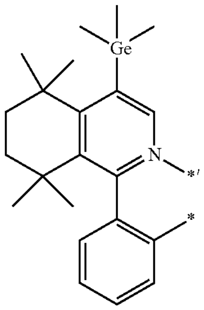
A294
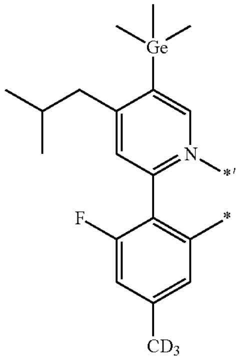
-continued
A295
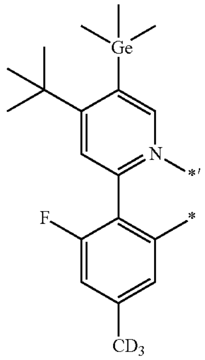
A296
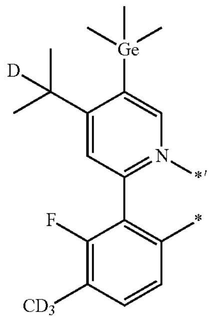
A297
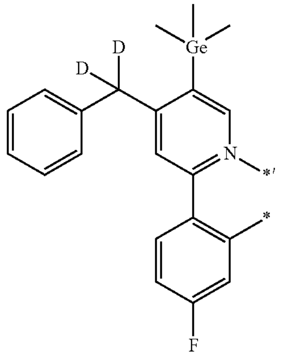
A298
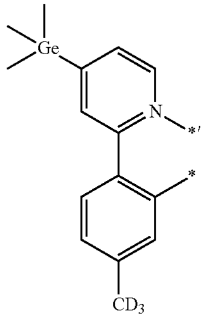

-continued

A299

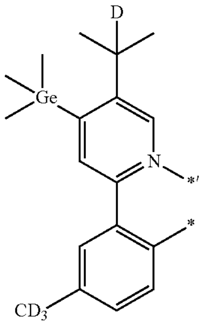

A300

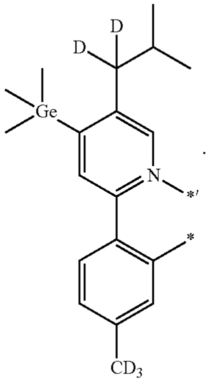

Each of * and *' in Formulae A1 to A300 may be a binding site to M in Formula 1.

In an embodiment, the organometallic compound may be one of the compounds listed in the table below:

TABLE 1

| Compound No. | $L_2$ | $L_1$ | n2 | n1 |
|---|---|---|---|---|
| 1-1 | A1 | B1 | 2 | 1 |
| 1-2 | A1 | B2 | 2 | 1 |
| 1-3 | A1 | B3 | 2 | 1 |
| 1-4 | A1 | B4 | 2 | 1 |
| 1-5 | A1 | B5 | 2 | 1 |
| 1-6 | A1 | B6 | 2 | 1 |
| 1-7 | A1 | B7 | 2 | 1 |
| 1-8 | A1 | B8 | 2 | 1 |
| 1-9 | A1 | B9 | 2 | 1 |
| 1-10 | A1 | B10 | 2 | 1 |
| 1-11 | A1 | B11 | 2 | 1 |
| 1-12 | A1 | B12 | 2 | 1 |
| 1-13 | A1 | B13 | 2 | 1 |
| 1-14 | A1 | B14 | 2 | 1 |
| 1-15 | A1 | B15 | 2 | 1 |
| 1-16 | A1 | B16 | 2 | 1 |
| 1-17 | A1 | B17 | 2 | 1 |
| 1-18 | A1 | B18 | 2 | 1 |
| 1-19 | A1 | B19 | 2 | 1 |
| 1-20 | A1 | B20 | 2 | 1 |
| 1-21 | A1 | B21 | 2 | 1 |
| 1-22 | A1 | B22 | 2 | 1 |
| 1-23 | A1 | B23 | 2 | 1 |
| 1-24 | A1 | B24 | 2 | 1 |
| 1-25 | A1 | B25 | 2 | 1 |
| 1-26 | A1 | B26 | 2 | 1 |
| 1-27 | A1 | B27 | 2 | 1 |
| 1-28 | A1 | B28 | 2 | 1 |
| 1-29 | A1 | B29 | 2 | 1 |
| 1-30 | A1 | B30 | 2 | 1 |

TABLE 2

| Compound No. | $L_2$ | $L_1$ | n2 | n1 |
|---|---|---|---|---|
| 1-31 | A1 | B31 | 2 | 1 |
| 1-32 | A1 | B32 | 2 | 1 |
| 1-33 | A1 | B33 | 2 | 1 |
| 1-34 | A1 | B34 | 2 | 1 |
| 1-35 | A1 | B35 | 2 | 1 |
| 1-36 | A1 | B36 | 2 | 1 |
| 1-37 | A1 | B37 | 2 | 1 |
| 1-38 | A1 | B38 | 2 | 1 |
| 1-39 | A1 | B39 | 2 | 1 |
| 1-40 | A1 | B40 | 2 | 1 |
| 1-41 | A1 | B41 | 2 | 1 |
| 1-42 | A1 | B42 | 2 | 1 |
| 1-43 | A1 | B43 | 2 | 1 |
| 1-44 | A1 | B44 | 2 | 1 |
| 1-45 | A1 | B45 | 2 | 1 |
| 1-46 | A1 | B46 | 2 | 1 |
| 1-47 | A1 | B47 | 2 | 1 |
| 1-48 | A1 | B48 | 2 | 1 |
| 1-49 | A1 | B49 | 2 | 1 |
| 1-50 | A1 | B50 | 2 | 1 |
| 1-51 | A1 | B51 | 2 | 1 |
| 1-52 | A1 | B52 | 2 | 1 |
| 1-53 | A1 | B53 | 2 | 1 |
| 1-54 | A1 | B54 | 2 | 1 |
| 1-55 | A1 | B55 | 2 | 1 |
| 1-56 | A1 | B56 | 2 | 1 |
| 1-57 | A1 | B57 | 2 | 1 |
| 1-58 | A1 | B58 | 2 | 1 |
| 1-59 | A1 | B59 | 2 | 1 |
| 1-60 | A1 | B60 | 2 | 1 |

TABLE 3

| Compound No. | $L_2$ | $L_1$ | n2 | n1 |
|---|---|---|---|---|
| 1-61 | A1 | B61 | 2 | 1 |
| 1-62 | A1 | B62 | 2 | 1 |
| 1-63 | A1 | B63 | 2 | 1 |
| 1-64 | A1 | B64 | 2 | 1 |
| 1-65 | A1 | B65 | 2 | 1 |
| 1-66 | A1 | B66 | 2 | 1 |
| 1-67 | A1 | B67 | 2 | 1 |
| 1-68 | A1 | B68 | 2 | 1 |
| 1-69 | A1 | B69 | 2 | 1 |
| 1-70 | A1 | B70 | 2 | 1 |
| 1-71 | A1 | B71 | 2 | 1 |
| 1-72 | A1 | B72 | 2 | 1 |
| 1-73 | A1 | B73 | 2 | 1 |
| 1-74 | A1 | B74 | 2 | 1 |
| 1-75 | A1 | B75 | 2 | 1 |
| 1-76 | A1 | B76 | 2 | 1 |
| 1-77 | A1 | B77 | 2 | 1 |
| 1-78 | A1 | B78 | 2 | 1 |
| 1-79 | A1 | B79 | 2 | 1 |
| 1-80 | A1 | B80 | 2 | 1 |
| 1-81 | A1 | B81 | 2 | 1 |
| 1-82 | A1 | B82 | 2 | 1 |
| 1-83 | A1 | B83 | 2 | 1 |
| 1-84 | A1 | B84 | 2 | 1 |
| 1-85 | A1 | B85 | 2 | 1 |
| 1-86 | A1 | B86 | 2 | 1 |
| 1-87 | A1 | B87 | 2 | 1 |
| 1-88 | A1 | B88 | 2 | 1 |
| 1-89 | A1 | B89 | 2 | 1 |
| 1-90 | A1 | B90 | 2 | 1 |

TABLE 4

| Compound No. | $L_2$ | $L_1$ | n2 | n1 |
|---|---|---|---|---|
| 1-91 | A1 | B91 | 2 | 1 |
| 1-92 | A1 | B92 | 2 | 1 |
| 1-93 | A1 | B93 | 2 | 1 |

TABLE 4-continued

| Compound No. | $L_2$ | $L_1$ | n2 | n1 |
|---|---|---|---|---|
| 1-94 | A1 | B94 | 2 | 1 |
| 1-95 | A1 | B95 | 2 | 1 |
| 1-96 | A1 | B96 | 2 | 1 |
| 1-97 | A1 | B97 | 2 | 1 |
| 1-98 | A1 | B98 | 2 | 1 |
| 1-99 | A1 | B99 | 2 | 1 |
| 1-100 | A1 | B100 | 2 | 1 |
| 1-101 | A1 | B101 | 2 | 1 |
| 1-102 | A1 | B102 | 2 | 1 |
| 1-103 | A1 | B103 | 2 | 1 |
| 1-104 | A1 | B104 | 2 | 1 |
| 1-105 | A1 | B105 | 2 | 1 |
| 1-106 | A1 | B106 | 2 | 1 |
| 1-107 | A1 | B107 | 2 | 1 |
| 1-108 | A1 | B108 | 2 | 1 |
| 1-109 | A1 | B109 | 2 | 1 |
| 1-110 | A1 | B110 | 2 | 1 |
| 1-111 | A1 | B111 | 2 | 1 |
| 1-112 | A1 | B112 | 2 | 1 |
| 1-113 | A1 | B113 | 2 | 1 |
| 1-114 | A1 | B114 | 2 | 1 |
| 1-115 | A1 | B115 | 2 | 1 |
| 1-116 | A1 | B116 | 2 | 1 |
| 1-117 | A1 | B117 | 2 | 1 |
| 1-118 | A1 | B118 | 2 | 1 |
| 1-119 | A1 | B119 | 2 | 1 |
| 1-120 | A1 | B120 | 2 | 1 |

TABLE 5

| Compound No. | $L_2$ | $L_1$ | n2 | n1 |
|---|---|---|---|---|
| 1-121 | A1 | B121 | 2 | 1 |
| 1-122 | A1 | B122 | 2 | 1 |
| 1-123 | A1 | B123 | 2 | 1 |
| 1-124 | A1 | B124 | 2 | 1 |
| 1-125 | A1 | B125 | 2 | 1 |
| 1-126 | A1 | B126 | 2 | 1 |
| 1-127 | A1 | B127 | 2 | 1 |
| 1-128 | A1 | B128 | 2 | 1 |
| 1-129 | A1 | B129 | 2 | 1 |
| 1-130 | A1 | B130 | 2 | 1 |
| 1-131 | A1 | B131 | 2 | 1 |
| 1-132 | A1 | B132 | 2 | 1 |
| 1-133 | A1 | B133 | 2 | 1 |
| 1-134 | A1 | B134 | 2 | 1 |
| 1-135 | A1 | B135 | 2 | 1 |
| 1-136 | A1 | B136 | 2 | 1 |
| 1-137 | A1 | B137 | 2 | 1 |
| 1-138 | A1 | B138 | 2 | 1 |
| 1-139 | A1 | B139 | 2 | 1 |
| 1-140 | A1 | B140 | 2 | 1 |
| 1-141 | A1 | B141 | 2 | 1 |
| 1-142 | A1 | B142 | 2 | 1 |
| 1-143 | A1 | B143 | 2 | 1 |
| 1-144 | A1 | B144 | 2 | 1 |
| 1-145 | A1 | B145 | 2 | 1 |
| 1-146 | A1 | B146 | 2 | 1 |
| 1-147 | A1 | B147 | 2 | 1 |
| 1-148 | A1 | B148 | 2 | 1 |
| 1-149 | A1 | B149 | 2 | 1 |
| 1-150 | A1 | B150 | 2 | 1 |

TABLE 6

| Compound No. | $L_2$ | $L_1$ | n2 | n1 |
|---|---|---|---|---|
| 1-151 | A1 | B151 | 2 | 1 |
| 1-152 | A1 | B152 | 2 | 1 |
| 1-153 | A1 | B153 | 2 | 1 |
| 1-154 | A1 | B154 | 2 | 1 |
| 1-155 | A1 | B155 | 2 | 1 |
| 1-156 | A1 | B156 | 2 | 1 |

TABLE 6-continued

| Compound No. | $L_2$ | $L_1$ | n2 | n1 |
|---|---|---|---|---|
| 1-157 | A1 | B157 | 2 | 1 |
| 1-158 | A1 | B158 | 2 | 1 |
| 1-159 | A1 | B159 | 2 | 1 |
| 1-160 | A1 | B160 | 2 | 1 |
| 1-161 | A1 | B161 | 2 | 1 |
| 1-162 | A1 | B162 | 2 | 1 |
| 1-163 | A1 | B163 | 2 | 1 |
| 1-164 | A1 | B164 | 2 | 1 |
| 1-165 | A1 | B165 | 2 | 1 |
| 1-166 | A1 | B166 | 2 | 1 |
| 1-167 | A1 | B167 | 2 | 1 |
| 1-168 | A1 | B168 | 2 | 1 |
| 1-169 | A1 | B169 | 2 | 1 |
| 1-170 | A1 | B170 | 2 | 1 |
| 1-171 | A1 | B171 | 2 | 1 |
| 1-172 | A1 | B172 | 2 | 1 |
| 1-173 | A1 | B173 | 2 | 1 |
| 1-174 | A1 | B174 | 2 | 1 |
| 1-175 | A1 | B175 | 2 | 1 |
| 1-176 | A1 | B176 | 2 | 1 |
| 1-177 | A1 | B177 | 2 | 1 |
| 1-178 | A1 | B178 | 2 | 1 |
| 1-179 | A1 | B179 | 2 | 1 |
| 1-180 | A1 | B180 | 2 | 1 |

TABLE 7

| Compound No. | $L_2$ | $L_1$ | n2 | n1 |
|---|---|---|---|---|
| 1-181 | A1 | B181 | 2 | 1 |
| 1-182 | A1 | B182 | 2 | 1 |
| 1-183 | A1 | B183 | 2 | 1 |
| 1-184 | A1 | B184 | 2 | 1 |
| 1-185 | A1 | B185 | 2 | 1 |
| 1-186 | A1 | B186 | 2 | 1 |
| 1-187 | A1 | B187 | 2 | 1 |
| 1-188 | A1 | B188 | 2 | 1 |
| 1-189 | A1 | B189 | 2 | 1 |
| 1-190 | A1 | B190 | 2 | 1 |
| 1-191 | A1 | B191 | 2 | 1 |
| 1-192 | A1 | B192 | 2 | 1 |
| 1-193 | A1 | B193 | 2 | 1 |
| 1-194 | A1 | B194 | 2 | 1 |
| 1-195 | A1 | B195 | 2 | 1 |
| 1-196 | A1 | B196 | 2 | 1 |
| 1-197 | A1 | B197 | 2 | 1 |
| 1-198 | A1 | B198 | 2 | 1 |
| 1-199 | A1 | B199 | 2 | 1 |
| 1-200 | A1 | B200 | 2 | 1 |
| 1-201 | A1 | B201 | 2 | 1 |
| 1-202 | A1 | B202 | 2 | 1 |
| 1-203 | A1 | B203 | 2 | 1 |
| 1-204 | A1 | B204 | 2 | 1 |
| 1-205 | A1 | B205 | 2 | 1 |
| 1-206 | A1 | B206 | 2 | 1 |
| 1-207 | A1 | B207 | 2 | 1 |
| 1-208 | A1 | B208 | 2 | 1 |
| 1-209 | A1 | B209 | 2 | 1 |
| 1-210 | A1 | B210 | 2 | 1 |

TABLE 8

| Compound No. | $L_2$ | $L_1$ | n2 | n1 |
|---|---|---|---|---|
| 1-211 | A1 | B211 | 2 | 1 |
| 1-212 | A1 | B212 | 2 | 1 |
| 1-213 | A1 | B213 | 2 | 1 |
| 1-214 | A1 | B214 | 2 | 1 |
| 1-215 | A1 | B215 | 2 | 1 |
| 1-216 | A1 | B216 | 2 | 1 |
| 1-217 | A1 | B217 | 2 | 1 |
| 1-218 | A1 | B218 | 2 | 1 |
| 1-219 | A1 | B219 | 2 | 1 |

TABLE 8-continued

| Compound No. | $L_2$ | $L_1$ | n2 | n1 |
|---|---|---|---|---|
| 1-220 | A1 | B220 | 2 | 1 |
| 1-221 | A1 | B221 | 2 | 1 |
| 1-222 | A1 | B222 | 2 | 1 |
| 1-223 | A1 | B223 | 2 | 1 |
| 1-224 | A1 | B224 | 2 | 1 |
| 1-225 | A1 | B225 | 2 | 1 |
| 1-226 | A1 | B226 | 2 | 1 |
| 1-227 | A1 | B227 | 2 | 1 |
| 1-228 | A1 | B228 | 2 | 1 |
| 1-229 | A1 | B229 | 2 | 1 |
| 1-230 | A1 | B230 | 2 | 1 |
| 1-231 | A1 | B231 | 2 | 1 |
| 1-232 | A1 | B232 | 2 | 1 |
| 1-233 | A1 | B233 | 2 | 1 |
| 1-234 | A1 | B234 | 2 | 1 |
| 1-235 | A1 | B235 | 2 | 1 |
| 1-236 | A1 | B236 | 2 | 1 |
| 1-237 | A1 | B237 | 2 | 1 |
| 1-238 | A1 | B238 | 2 | 1 |
| 1-239 | A1 | B239 | 2 | 1 |
| 1-240 | A1 | B240 | 2 | 1 |

TABLE 9

| Compound No. | $L_2$ | $L_1$ | n2 | n1 |
|---|---|---|---|---|
| 1-241 | A1 | B241 | 2 | 1 |
| 1-242 | A1 | B242 | 2 | 1 |
| 1-243 | A1 | B243 | 2 | 1 |
| 1-244 | A1 | B244 | 2 | 1 |
| 1-245 | A1 | B245 | 2 | 1 |
| 1-246 | A1 | B246 | 2 | 1 |
| 1-247 | A1 | B247 | 2 | 1 |
| 1-248 | A1 | B248 | 2 | 1 |
| 1-249 | A1 | B249 | 2 | 1 |
| 1-250 | A1 | B250 | 2 | 1 |
| 1-251 | A1 | B251 | 2 | 1 |
| 1-252 | A1 | B252 | 2 | 1 |
| 1-253 | A1 | B253 | 2 | 1 |
| 1-254 | A1 | B254 | 2 | 1 |
| 1-255 | A1 | B255 | 2 | 1 |
| 1-256 | A1 | B256 | 2 | 1 |
| 1-257 | A1 | B257 | 2 | 1 |
| 1-258 | A1 | B258 | 2 | 1 |
| 1-259 | A1 | B259 | 2 | 1 |
| 1-260 | A1 | B260 | 2 | 1 |
| 1-261 | A1 | B261 | 2 | 1 |
| 1-262 | A1 | B262 | 2 | 1 |
| 1-263 | A1 | B263 | 2 | 1 |
| 1-264 | A1 | B264 | 2 | 1 |
| 1-265 | A1 | B265 | 2 | 1 |
| 1-266 | A1 | B266 | 2 | 1 |
| 1-267 | A1 | B267 | 2 | 1 |
| 1-268 | A1 | B268 | 2 | 1 |
| 1-269 | A1 | B269 | 2 | 1 |
| 1-270 | A1 | B270 | 2 | 1 |

TABLE 10

| Compound No. | $L_2$ | $L_1$ | n2 | n1 |
|---|---|---|---|---|
| 1-271 | A1 | B271 | 2 | 1 |
| 1-272 | A1 | B272 | 2 | 1 |
| 1-273 | A1 | B273 | 2 | 1 |
| 1-274 | A1 | B274 | 2 | 1 |
| 1-275 | A1 | B275 | 2 | 1 |
| 1-276 | A1 | B276 | 2 | 1 |
| 1-277 | A1 | B277 | 2 | 1 |
| 1-278 | A1 | B278 | 2 | 1 |
| 1-279 | A1 | B279 | 2 | 1 |
| 1-280 | A1 | B280 | 2 | 1 |
| 1-281 | A1 | B281 | 2 | 1 |
| 1-282 | A1 | B282 | 2 | 1 |

TABLE 10-continued

| Compound No. | $L_2$ | $L_1$ | n2 | n1 |
|---|---|---|---|---|
| 1-283 | A1 | B283 | 2 | 1 |
| 1-284 | A1 | B284 | 2 | 1 |
| 1-285 | A1 | B285 | 2 | 1 |
| 1-286 | A1 | B286 | 2 | 1 |
| 1-287 | A1 | B287 | 2 | 1 |
| 1-288 | A1 | B288 | 2 | 1 |
| 1-289 | A1 | B289 | 2 | 1 |
| 1-290 | A1 | B290 | 2 | 1 |
| 1-291 | A1 | B291 | 2 | 1 |
| 1-292 | A1 | B292 | 2 | 1 |
| 1-293 | A1 | B293 | 2 | 1 |
| 1-294 | A1 | B294 | 2 | 1 |
| 1-295 | A1 | B295 | 2 | 1 |
| 1-296 | A1 | B296 | 2 | 1 |
| 1-297 | A1 | B297 | 2 | 1 |
| 1-298 | A1 | B298 | 2 | 1 |
| 1-299 | A1 | B299 | 2 | 1 |
| 1-300 | A1 | B300 | 2 | 1 |

TABLE 11

| Compound No. | $L_2$ | $L_1$ | n2 | n1 |
|---|---|---|---|---|
| 1-301 | A1 | B301 | 2 | 1 |
| 1-302 | A1 | B302 | 2 | 1 |
| 1-303 | A1 | B303 | 2 | 1 |
| 1-304 | A1 | B304 | 2 | 1 |
| 1-305 | A1 | B305 | 2 | 1 |
| 1-306 | A1 | B306 | 2 | 1 |
| 1-307 | A1 | B307 | 2 | 1 |
| 1-308 | A1 | B308 | 2 | 1 |
| 1-309 | A1 | B309 | 2 | 1 |
| 1-310 | A1 | B310 | 2 | 1 |
| 1-311 | A1 | B311 | 2 | 1 |
| 1-312 | A1 | B312 | 2 | 1 |
| 1-313 | A1 | B313 | 2 | 1 |
| 1-314 | A1 | B314 | 2 | 1 |
| 1-315 | A1 | B315 | 2 | 1 |
| 1-316 | A1 | B316 | 2 | 1 |
| 1-317 | A1 | B317 | 2 | 1 |
| 1-318 | A1 | B318 | 2 | 1 |
| 1-319 | A1 | B319 | 2 | 1 |
| 1-320 | A1 | B320 | 2 | 1 |
| 1-321 | A1 | B321 | 2 | 1 |
| 1-322 | A1 | B322 | 2 | 1 |
| 1-323 | A1 | B323 | 2 | 1 |
| 1-324 | A1 | B324 | 2 | 1 |
| 1-325 | A1 | B325 | 2 | 1 |
| 1-326 | A1 | B326 | 2 | 1 |
| 1-327 | A1 | B327 | 2 | 1 |
| 1-328 | A1 | B328 | 2 | 1 |
| 1-329 | A1 | B329 | 2 | 1 |
| 1-330 | A1 | B330 | 2 | 1 |

TABLE 12

| Compound No. | $L_2$ | $L_1$ | n2 | n1 |
|---|---|---|---|---|
| 1-331 | A1 | B331 | 2 | 1 |
| 1-332 | A1 | B332 | 2 | 1 |
| 1-333 | A1 | B333 | 2 | 1 |
| 1-334 | A1 | B334 | 2 | 1 |
| 1-335 | A1 | B335 | 2 | 1 |
| 1-336 | A1 | B336 | 2 | 1 |
| 1-337 | A1 | B337 | 2 | 1 |
| 1-338 | A1 | B338 | 2 | 1 |
| 1-339 | A1 | B339 | 2 | 1 |
| 1-340 | A1 | B340 | 2 | 1 |
| 1-341 | A1 | B341 | 2 | 1 |
| 1-342 | A1 | B342 | 2 | 1 |
| 1-343 | A1 | B343 | 2 | 1 |
| 1-344 | A1 | B344 | 2 | 1 |
| 1-345 | A1 | B345 | 2 | 1 |

TABLE 12-continued

| Compound No. | $L_2$ | $L_1$ | n2 | n1 |
|---|---|---|---|---|
| 1-346 | A1 | B346 | 2 | 1 |
| 1-347 | A1 | B347 | 2 | 1 |
| 1-348 | A1 | B348 | 2 | 1 |
| 1-349 | A1 | B349 | 2 | 1 |
| 1-350 | A1 | B350 | 2 | 1 |
| 1-351 | A1 | B351 | 2 | 1 |
| 1-352 | A1 | B352 | 2 | 1 |
| 1-353 | A1 | B353 | 2 | 1 |
| 1-354 | A1 | B354 | 2 | 1 |
| 1-355 | A1 | B355 | 2 | 1 |
| 1-356 | A1 | B356 | 2 | 1 |
| 1-357 | A1 | B357 | 2 | 1 |
| 1-358 | A1 | B358 | 2 | 1 |
| 1-359 | A1 | B359 | 2 | 1 |
| 1-360 | A1 | B360 | 2 | 1 |

TABLE 13

| Compound No. | $L_2$ | $L_1$ | n2 | n1 |
|---|---|---|---|---|
| 2-1 | A2 | B1 | 2 | 1 |
| 4-1 | A4 | B1 | 2 | 1 |
| 6-1 | A6 | B1 | 2 | 1 |
| 8-1 | A8 | B1 | 2 | 1 |
| 10-1 | A10 | B1 | 2 | 1 |
| 12-1 | A12 | B1 | 2 | 1 |
| 14-1 | A14 | B1 | 2 | 1 |
| 16-1 | A16 | B1 | 2 | 1 |
| 18-1 | A18 | B1 | 2 | 1 |
| 20-1 | A20 | B1 | 2 | 1 |
| 22-1 | A22 | B1 | 2 | 1 |
| 24-1 | A24 | B1 | 2 | 1 |
| 26-1 | A26 | B1 | 2 | 1 |
| 28-1 | A28 | B1 | 2 | 1 |
| 30-1 | A30 | B1 | 2 | 1 |
| 32-1 | A32 | B1 | 2 | 1 |
| 34-1 | A34 | B1 | 2 | 1 |
| 36-1 | A36 | B1 | 2 | 1 |
| 38-1 | A38 | B1 | 2 | 1 |
| 40-1 | A40 | B1 | 2 | 1 |
| 42-1 | A42 | B1 | 2 | 1 |
| 44-1 | A44 | B1 | 2 | 1 |
| 46-1 | A46 | B1 | 2 | 1 |
| 48-1 | A48 | B1 | 2 | 1 |
| 50-1 | A50 | B1 | 2 | 1 |
| 52-1 | A52 | B1 | 2 | 1 |
| 54-1 | A54 | B1 | 2 | 1 |
| 56-1 | A56 | B1 | 2 | 1 |
| 58-1 | A58 | B1 | 2 | 1 |
| 60-1 | A60 | B1 | 2 | 1 |

TABLE 14

| Compound No. | $L_2$ | $L_1$ | n2 | n1 |
|---|---|---|---|---|
| 62-1 | A62 | B1 | 2 | 1 |
| 64-1 | A64 | B1 | 2 | 1 |
| 66-1 | A66 | B1 | 2 | 1 |
| 68-1 | A68 | B1 | 2 | 1 |
| 70-1 | A70 | B1 | 2 | 1 |
| 73-1 | A73 | B1 | 2 | 1 |
| 76-1 | A76 | B1 | 2 | 1 |
| 80-1 | A80 | B1 | 2 | 1 |
| 84-1 | A84 | B1 | 2 | 1 |
| 87-1 | A87 | B1 | 2 | 1 |
| 90-1 | A90 | B1 | 2 | 1 |
| 93-1 | A93 | B1 | 2 | 1 |
| 96-1 | A96 | B1 | 2 | 1 |
| 99-1 | A99 | B1 | 2 | 1 |
| 102-1 | A102 | B1 | 2 | 1 |
| 105-1 | A105 | B1 | 2 | 1 |
| 108-1 | A108 | B1 | 2 | 1 |
| 120-1 | A120 | B1 | 2 | 1 |

TABLE 14-continued

| Compound No. | $L_2$ | $L_1$ | n2 | n1 |
|---|---|---|---|---|
| 125-1 | A125 | B1 | 2 | 1 |
| 129-1 | A129 | B1 | 2 | 1 |
| 130-1 | A130 | B1 | 2 | 1 |
| 133-1 | A133 | B1 | 2 | 1 |
| 137-1 | A137 | B1 | 2 | 1 |
| 140-1 | A140 | B1 | 2 | 1 |
| 143-1 | A143 | B1 | 2 | 1 |
| 146-1 | A146 | B1 | 2 | 1 |
| 149-1 | A149 | B1 | 2 | 1 |
| 151-1 | A151 | B1 | 2 | 1 |
| 152-1 | A152 | B1 | 2 | 1 |
| 153-1 | A153 | B1 | 2 | 1 |

TABLE 15

| Compound No. | $L_2$ | $L_1$ | n2 | n1 |
|---|---|---|---|---|
| 154-1 | A154 | B1 | 2 | 1 |
| 155-1 | A155 | B1 | 2 | 1 |
| 156-1 | A156 | B1 | 2 | 1 |
| 157-1 | A157 | B1 | 2 | 1 |
| 158-1 | A158 | B1 | 2 | 1 |
| 159-1 | A159 | B1 | 2 | 1 |
| 160-1 | A160 | B1 | 2 | 1 |
| 161-1 | A161 | B1 | 2 | 1 |
| 162-1 | A162 | B1 | 2 | 1 |
| 163-1 | A163 | B1 | 2 | 1 |
| 164-1 | A164 | B1 | 2 | 1 |
| 165-1 | A165 | B1 | 2 | 1 |
| 166-1 | A166 | B1 | 2 | 1 |
| 167-1 | A167 | B1 | 2 | 1 |
| 168-1 | A168 | B1 | 2 | 1 |
| 169-1 | A169 | B1 | 2 | 1 |
| 170-1 | A170 | B1 | 2 | 1 |
| 171-1 | A171 | B1 | 2 | 1 |
| 172-1 | A172 | B1 | 2 | 1 |
| 173-1 | A173 | B1 | 2 | 1 |
| 174-1 | A174 | B1 | 2 | 1 |
| 175-1 | A175 | B1 | 2 | 1 |
| 176-1 | A176 | B1 | 2 | 1 |
| 177-1 | A177 | B1 | 2 | 1 |
| 178-1 | A178 | B1 | 2 | 1 |
| 179-1 | A179 | B1 | 2 | 1 |
| 180-1 | A180 | B1 | 2 | 1 |
| 181-1 | A181 | B1 | 2 | 1 |
| 182-1 | A182 | B1 | 2 | 1 |
| 183-1 | A183 | B1 | 2 | 1 |

TABLE 16

| Compound No. | $L_2$ | $L_1$ | n2 | n1 |
|---|---|---|---|---|
| 184-1 | A184 | B1 | 2 | 1 |
| 185-1 | A185 | B1 | 2 | 1 |
| 186-1 | A186 | B1 | 2 | 1 |
| 187-1 | A187 | B1 | 2 | 1 |
| 188-1 | A188 | B1 | 2 | 1 |
| 189-1 | A189 | B1 | 2 | 1 |
| 190-1 | A190 | B1 | 2 | 1 |
| 191-1 | A191 | B1 | 2 | 1 |
| 192-1 | A192 | B1 | 2 | 1 |
| 193-1 | A193 | B1 | 2 | 1 |
| 194-1 | A194 | B1 | 2 | 1 |
| 195-1 | A195 | B1 | 2 | 1 |
| 196-1 | A196 | B1 | 2 | 1 |
| 197-1 | A197 | B1 | 2 | 1 |
| 198-1 | A198 | B1 | 2 | 1 |
| 199-1 | A199 | B1 | 2 | 1 |
| 200-1 | A200 | B1 | 2 | 1 |
| 201-1 | A201 | B1 | 2 | 1 |
| 202-1 | A202 | B1 | 2 | 1 |
| 203-1 | A203 | B1 | 2 | 1 |
| 204-1 | A204 | B1 | 2 | 1 |

TABLE 16-continued

| Compound No. | $L_2$ | $L_1$ | n2 | n1 |
|---|---|---|---|---|
| 205-1 | A205 | B1 | 2 | 1 |
| 206-1 | A206 | B1 | 2 | 1 |
| 207-1 | A207 | B1 | 2 | 1 |
| 208-1 | A208 | B1 | 2 | 1 |
| 209-1 | A209 | B1 | 2 | 1 |
| 210-1 | A210 | B1 | 2 | 1 |
| 211-1 | A211 | B1 | 2 | 1 |
| 212-1 | A212 | B1 | 2 | 1 |
| 213-1 | A213 | B1 | 2 | 1 |

TABLE 17

| Compound No. | $L_2$ | $L_1$ | n2 | n1 |
|---|---|---|---|---|
| 214-1 | A214 | B1 | 2 | 1 |
| 215-1 | A215 | B1 | 2 | 1 |
| 216-1 | A216 | B1 | 2 | 1 |
| 217-1 | A217 | B1 | 2 | 1 |
| 218-1 | A218 | B1 | 2 | 1 |
| 219-1 | A219 | B1 | 2 | 1 |
| 220-1 | A220 | B1 | 2 | 1 |
| 221-1 | A221 | B1 | 2 | 1 |
| 222-1 | A222 | B1 | 2 | 1 |
| 223-1 | A223 | B1 | 2 | 1 |
| 224-1 | A224 | B1 | 2 | 1 |
| 225-1 | A225 | B1 | 2 | 1 |
| 226-1 | A226 | B1 | 2 | 1 |
| 227-1 | A227 | B1 | 2 | 1 |
| 228-1 | A228 | B1 | 2 | 1 |
| 229-1 | A229 | B1 | 2 | 1 |
| 230-1 | A230 | B1 | 2 | 1 |
| 231-1 | A231 | B1 | 2 | 1 |
| 232-1 | A232 | B1 | 2 | 1 |
| 233-1 | A233 | B1 | 2 | 1 |
| 234-1 | A234 | B1 | 2 | 1 |
| 235-1 | A235 | B1 | 2 | 1 |
| 236-1 | A236 | B1 | 2 | 1 |
| 237-1 | A237 | B1 | 2 | 1 |
| 238-1 | A238 | B1 | 2 | 1 |
| 239-1 | A239 | B1 | 2 | 1 |
| 240-1 | A240 | B1 | 2 | 1 |
| 241-1 | A241 | B1 | 2 | 1 |
| 242-1 | A242 | B1 | 2 | 1 |
| 243-1 | A243 | B1 | 2 | 1 |

TABLE 18

| Compound No. | $L_2$ | $L_1$ | n2 | n1 |
|---|---|---|---|---|
| 244-1 | A244 | B1 | 2 | 1 |
| 245-1 | A245 | B1 | 2 | 1 |
| 246-1 | A246 | B1 | 2 | 1 |
| 247-1 | A247 | B1 | 2 | 1 |
| 248-1 | A248 | B1 | 2 | 1 |
| 249-1 | A249 | B1 | 2 | 1 |
| 250-1 | A250 | B1 | 2 | 1 |
| 251-1 | A251 | B1 | 2 | 1 |
| 252-1 | A252 | B1 | 2 | 1 |
| 253-1 | A253 | B1 | 2 | 1 |
| 254-1 | A254 | B1 | 2 | 1 |
| 255-1 | A255 | B1 | 2 | 1 |
| 256-1 | A256 | B1 | 2 | 1 |
| 257-1 | A257 | B1 | 2 | 1 |
| 258-1 | A258 | B1 | 2 | 1 |
| 259-1 | A259 | B1 | 2 | 1 |
| 260-1 | A260 | B1 | 2 | 1 |
| 261-1 | A261 | B1 | 2 | 1 |
| 262-1 | A262 | B1 | 2 | 1 |
| 263-1 | A263 | B1 | 2 | 1 |
| 264-1 | A264 | B1 | 2 | 1 |
| 265-1 | A265 | B1 | 2 | 1 |
| 266-1 | A266 | B1 | 2 | 1 |
| 267-1 | A267 | B1 | 2 | 1 |

TABLE 18-continued

| Compound No. | $L_2$ | $L_1$ | n2 | n1 |
|---|---|---|---|---|
| 268-1 | A268 | B1 | 2 | 1 |
| 269-1 | A269 | B1 | 2 | 1 |
| 270-1 | A270 | B1 | 2 | 1 |
| 271-1 | A271 | B1 | 2 | 1 |
| 272-1 | A272 | B1 | 2 | 1 |
| 273-1 | A273 | B1 | 2 | 1 |

TABLE 19

| Compound No. | $L_2$ | $L_1$ | n2 | n1 |
|---|---|---|---|---|
| 274-1 | A274 | B1 | 2 | 1 |
| 275-1 | A275 | B1 | 2 | 1 |
| 276-1 | A276 | B1 | 2 | 1 |
| 277-1 | A277 | B1 | 2 | 1 |
| 278-1 | A278 | B1 | 2 | 1 |
| 279-1 | A279 | B1 | 2 | 1 |
| 280-1 | A280 | B1 | 2 | 1 |
| 281-1 | A281 | B1 | 2 | 1 |
| 282-1 | A282 | B1 | 2 | 1 |
| 283-1 | A283 | B1 | 2 | 1 |
| 284-1 | A284 | B1 | 2 | 1 |
| 285-1 | A285 | B1 | 2 | 1 |
| 286-1 | A286 | B1 | 2 | 1 |
| 287-1 | A287 | B1 | 2 | 1 |
| 288-1 | A288 | B1 | 2 | 1 |
| 289-1 | A289 | B1 | 2 | 1 |
| 290-1 | A290 | B1 | 2 | 1 |
| 291-1 | A291 | B1 | 2 | 1 |
| 292-1 | A292 | B1 | 2 | 1 |
| 293-1 | A293 | B1 | 2 | 1 |
| 294-1 | A294 | B1 | 2 | 1 |
| 295-1 | A295 | B1 | 2 | 1 |
| 296-1 | A296 | B1 | 2 | 1 |
| 297-1 | A297 | B1 | 2 | 1 |
| 298-1 | A298 | B1 | 2 | 1 |
| 299-1 | A299 | B1 | 2 | 1 |
| 300-1 | A300 | B1 | 2 | 1 |

TABLE 20

| Compound No. | $L_2$ | $L_1$ | n2 | n1 |
|---|---|---|---|---|
| 2-4 | A2 | B4 | 2 | 1 |
| 2-8 | A2 | B8 | 2 | 1 |
| 2-10 | A2 | B10 | 2 | 1 |
| 2-13 | A2 | B13 | 2 | 1 |
| 2-20 | A2 | B20 | 2 | 1 |
| 2-24 | A2 | B24 | 2 | 1 |
| 2-27 | A2 | B27 | 2 | 1 |
| 2-48 | A2 | B48 | 2 | 1 |
| 2-62 | A2 | B62 | 2 | 1 |
| 2-63 | A2 | B63 | 2 | 1 |
| 2-81 | A2 | B81 | 2 | 1 |
| 2-91 | A2 | B91 | 2 | 1 |
| 2-108 | A2 | B108 | 2 | 1 |
| 2-116 | A2 | B116 | 2 | 1 |
| 2-137 | A2 | B137 | 2 | 1 |
| 2-144 | A2 | B144 | 2 | 1 |
| 2-152 | A2 | B152 | 2 | 1 |
| 2-162 | A2 | B162 | 2 | 1 |
| 2-169 | A2 | B169 | 2 | 1 |
| 2-176 | A2 | B176 | 2 | 1 |
| 2-187 | A2 | B187 | 2 | 1 |
| 2-201 | A2 | B201 | 2 | 1 |
| 2-213 | A2 | B213 | 2 | 1 |
| 2-249 | A2 | B249 | 2 | 1 |
| 2-272 | A2 | B272 | 2 | 1 |
| 2-281 | A2 | B281 | 2 | 1 |
| 2-306 | A2 | B306 | 2 | 1 |
| 2-340 | A2 | B340 | 2 | 1 |

TABLE 21

| Compound No. | $L_2$ | $L_1$ | n2 | n1 |
|---|---|---|---|---|
| 3-4 | A3 | B4 | 2 | 1 |
| 4-8 | A4 | B8 | 2 | 1 |
| 5-10 | A5 | B10 | 2 | 1 |
| 6-13 | A6 | B13 | 2 | 1 |
| 7-20 | A7 | B20 | 2 | 1 |
| 8-24 | A8 | B24 | 2 | 1 |
| 9-27 | A9 | B27 | 2 | 1 |
| 10-48 | A10 | B48 | 2 | 1 |
| 11-366 | A11 | B366 | 2 | 1 |
| 12-63 | A12 | B63 | 2 | 1 |
| 13-85 | A13 | B85 | 2 | 1 |
| 14-91 | A14 | B91 | 2 | 1 |
| 15-108 | A15 | B108 | 2 | 1 |
| 16-116 | A16 | B116 | 2 | 1 |
| 17-137 | A17 | B137 | 2 | 1 |
| 18-144 | A18 | B144 | 2 | 1 |
| 19-152 | A19 | B152 | 2 | 1 |
| 20-162 | A20 | B162 | 2 | 1 |
| 21-169 | A21 | B169 | 2 | 1 |
| 22-176 | A22 | B176 | 2 | 1 |
| 23-187 | A23 | B187 | 2 | 1 |
| 24-201 | A24 | B201 | 2 | 1 |
| 25-202 | A25 | B202 | 2 | 1 |
| 26-213 | A26 | B213 | 2 | 1 |
| 27-249 | A27 | B249 | 2 | 1 |
| 28-272 | A28 | B272 | 2 | 1 |
| 29-281 | A29 | B281 | 2 | 1 |
| 30-306 | A30 | B306 | 2 | 1 |
| 31-62 | A31 | B62 | 2 | 1 |
| 34-4 | A34 | B4 | 2 | 1 |
| 35-8 | A35 | B8 | 2 | 1 |

TABLE 22

| Compound No. | $L_2$ | $L_1$ | n2 | n1 |
|---|---|---|---|---|
| 36-10 | A36 | B10 | 2 | 1 |
| 37-13 | A37 | B13 | 2 | 1 |
| 38-20 | A38 | B20 | 2 | 1 |
| 39-24 | A39 | B24 | 2 | 1 |
| 40-27 | A40 | B27 | 2 | 1 |
| 41-48 | A41 | B48 | 2 | 1 |
| 42-62 | A42 | B62 | 2 | 1 |
| 43-63 | A43 | B63 | 2 | 1 |
| 44-85 | A44 | B85 | 2 | 1 |
| 45-91 | A45 | B91 | 2 | 1 |
| 46-108 | A46 | B108 | 2 | 1 |
| 47-116 | A47 | B116 | 2 | 1 |
| 48-137 | A48 | B137 | 2 | 1 |
| 49-144 | A49 | B144 | 2 | 1 |
| 50-152 | A50 | B152 | 2 | 1 |
| 51-162 | A51 | B162 | 2 | 1 |
| 52-169 | A52 | B169 | 2 | 1 |
| 53-176 | A53 | B176 | 2 | 1 |
| 54-187 | A54 | B187 | 2 | 1 |
| 55-201 | A55 | B201 | 2 | 1 |
| 56-202 | A56 | B202 | 2 | 1 |
| 57-213 | A57 | B213 | 2 | 1 |
| 58-249 | A58 | B249 | 2 | 1 |
| 59-272 | A59 | B272 | 2 | 1 |
| 60-281 | A60 | B281 | 2 | 1 |
| 61-306 | A61 | B306 | 2 | 1 |
| 62-340 | A62 | B340 | 2 | 1 |

TABLE 23

| Compound No. | $L_2$ | $L_1$ | n2 | n1 |
|---|---|---|---|---|
| 65-4 | A65 | B4 | 2 | 1 |
| 66-8 | A66 | B8 | 2 | 1 |
| 67-10 | A67 | B10 | 2 | 1 |
| 68-13 | A68 | B13 | 2 | 1 |
| 69-20 | A69 | B20 | 2 | 1 |

TABLE 23-continued

| Compound No. | $L_2$ | $L_1$ | n2 | n1 |
|---|---|---|---|---|
| 70-24 | A70 | B24 | 2 | 1 |
| 71-27 | A71 | B27 | 2 | 1 |
| 72-48 | A72 | B48 | 2 | 1 |
| 73-62 | A73 | B62 | 2 | 1 |
| 74-63 | A74 | B63 | 2 | 1 |
| 75-85 | A75 | B85 | 2 | 1 |
| 76-91 | A76 | B91 | 2 | 1 |
| 77-108 | A77 | B108 | 2 | 1 |
| 78-116 | A78 | B116 | 2 | 1 |
| 79-137 | A79 | B137 | 2 | 1 |
| 80-144 | A80 | B144 | 2 | 1 |
| 81-152 | A81 | B152 | 2 | 1 |
| 82-162 | A82 | B162 | 2 | 1 |
| 83-169 | A83 | B169 | 2 | 1 |
| 84-176 | A84 | B176 | 2 | 1 |
| 85-187 | A85 | B187 | 2 | 1 |
| 86-201 | A86 | B201 | 2 | 1 |
| 87-202 | A87 | B202 | 2 | 1 |
| 88-213 | A88 | B213 | 2 | 1 |
| 89-249 | A89 | B249 | 2 | 1 |
| 90-272 | A90 | B272 | 2 | 1 |
| 91-281 | A91 | B281 | 2 | 1 |
| 92-306 | A92 | B306 | 2 | 1 |
| 93-340 | A93 | B340 | 2 | 1 |

TABLE 24

| Compound No. | $L_2$ | $L_1$ | n2 | n1 |
|---|---|---|---|---|
| 96-4 | A96 | B4 | 2 | 1 |
| 97-8 | A97 | B8 | 2 | 1 |
| 98-10 | A98 | B10 | 2 | 1 |
| 99-13 | A99 | B13 | 2 | 1 |
| 100-20 | A100 | B20 | 2 | 1 |
| 101-24 | A101 | B24 | 2 | 1 |
| 102-27 | A102 | B27 | 2 | 1 |
| 103-48 | A103 | B48 | 2 | 1 |
| 104-62 | A104 | B62 | 2 | 1 |
| 105-63 | A105 | B63 | 2 | 1 |
| 106-85 | A106 | B85 | 2 | 1 |
| 107-91 | A107 | B91 | 2 | 1 |
| 108-206 | A108 | B206 | 2 | 1 |
| 109-116 | A109 | B116 | 2 | 1 |
| 110-137 | A110 | B137 | 2 | 1 |
| 111-144 | A111 | B144 | 2 | 1 |
| 112-152 | A112 | B152 | 2 | 1 |
| 113-162 | A113 | B162 | 2 | 1 |
| 114-169 | A114 | B169 | 2 | 1 |
| 115-176 | A115 | B176 | 2 | 1 |
| 116-48 | A116 | B48 | 2 | 1 |
| 117-201 | A117 | B201 | 2 | 1 |
| 118-24 | A118 | B24 | 2 | 1 |
| 119-213 | A119 | B213 | 2 | 1 |
| 120-249 | A120 | B249 | 2 | 1 |
| 121-272 | A121 | B272 | 2 | 1 |
| 122-281 | A122 | B281 | 2 | 1 |
| 123-306 | A123 | B306 | 2 | 1 |
| 124-340 | A124 | B340 | 2 | 1 |

TABLE 25

| Compound No. | $L_2$ | $L_1$ | n2 | n1 |
|---|---|---|---|---|
| 127-4 | A127 | B4 | 2 | 1 |
| 128-8 | A128 | B8 | 2 | 1 |
| 129-10 | A129 | B10 | 2 | 1 |
| 130-13 | A130 | B13 | 2 | 1 |
| 131-20 | A131 | B20 | 2 | 1 |
| 132-24 | A132 | B24 | 2 | 1 |
| 133-27 | A133 | B27 | 2 | 1 |
| 134-48 | A134 | B48 | 2 | 1 |
| 135-62 | A135 | B62 | 2 | 1 |
| 136-309 | A136 | B309 | 2 | 1 |

TABLE 25-continued

| Compound No. | $L_2$ | $L_1$ | n2 | n1 |
|---|---|---|---|---|
| 137-85 | A137 | B85 | 2 | 1 |
| 138-91 | A138 | B91 | 2 | 1 |
| 139-108 | A139 | B108 | 2 | 1 |
| 140-116 | A140 | B116 | 2 | 1 |
| 141-137 | A141 | B137 | 2 | 1 |
| 142-144 | A142 | B144 | 2 | 1 |
| 143-152 | A143 | B152 | 2 | 1 |
| 144-162 | A144 | B162 | 2 | 1 |
| 145-169 | A145 | B169 | 2 | 1 |
| 146-6 | A146 | B6 | 2 | 1 |
| 147-187 | A147 | B187 | 2 | 1 |
| 148-201 | A148 | B201 | 2 | 1 |
| 149-202 | A149 | B202 | 2 | 1 |
| 150-213 | A150 | B213 | 2 | 1 |
| 152-272 | A152 | B272 | 2 | 1 |
| 153-281 | A153 | B281 | 2 | 1 |
| 154-306 | A154 | B306 | 2 | 1 |
| 155-340 | A155 | B340 | 2 | 1 |

TABLE 26

| Compound No. | $L_2$ | $L_1$ | n2 | n1 |
|---|---|---|---|---|
| 158-4 | A158 | B4 | 2 | 1 |
| 159-8 | A159 | B8 | 2 | 1 |
| 160-10 | A160 | B10 | 2 | 1 |
| 161-13 | A161 | B13 | 2 | 1 |
| 162-20 | A162 | B20 | 2 | 1 |
| 163-24 | A163 | B24 | 2 | 1 |
| 164-27 | A164 | B27 | 2 | 1 |
| 165-48 | A165 | B48 | 2 | 1 |
| 166-62 | A166 | B62 | 2 | 1 |
| 167-63 | A167 | B63 | 2 | 1 |
| 168-85 | A168 | B85 | 2 | 1 |
| 169-91 | A169 | B91 | 2 | 1 |
| 170-108 | A170 | B108 | 2 | 1 |
| 171-116 | A171 | B116 | 2 | 1 |
| 172-137 | A172 | B137 | 2 | 1 |
| 173-144 | A173 | B144 | 2 | 1 |
| 174-152 | A174 | B152 | 2 | 1 |
| 175-162 | A175 | B162 | 2 | 1 |
| 176-169 | A176 | B169 | 2 | 1 |
| 177-176 | A177 | B176 | 2 | 1 |
| 178-187 | A178 | B187 | 2 | 1 |
| 179-201 | A179 | B201 | 2 | 1 |
| 180-202 | A180 | B202 | 2 | 1 |
| 181-213 | A181 | B213 | 2 | 1 |
| 182-249 | A182 | B249 | 2 | 1 |
| 183-272 | A183 | B272 | 2 | 1 |
| 184-281 | A184 | B281 | 2 | 1 |
| 185-306 | A185 | B306 | 2 | 1 |
| 186-340 | A186 | B340 | 2 | 1 |

TABLE 27

| Compound No. | $L_2$ | $L_1$ | n2 | n1 |
|---|---|---|---|---|
| 189-4 | A189 | B4 | 2 | 1 |
| 190-8 | A190 | B8 | 2 | 1 |
| 191-10 | A191 | B10 | 2 | 1 |
| 192-13 | A192 | B13 | 2 | 1 |
| 193-20 | A193 | B20 | 2 | 1 |
| 194-24 | A194 | B24 | 2 | 1 |
| 195-27 | A195 | B27 | 2 | 1 |
| 196-48 | A196 | B48 | 2 | 1 |
| 197-62 | A197 | B62 | 2 | 1 |
| 198-63 | A198 | B63 | 2 | 1 |
| 199-85 | A199 | B85 | 2 | 1 |
| 200-91 | A200 | B91 | 2 | 1 |
| 201-108 | A201 | B108 | 2 | 1 |
| 202-116 | A202 | B116 | 2 | 1 |
| 203-137 | A203 | B137 | 2 | 1 |
| 204-144 | A204 | B144 | 2 | 1 |

TABLE 27-continued

| Compound No. | $L_2$ | $L_1$ | n2 | n1 |
|---|---|---|---|---|
| 205-152 | A205 | B152 | 2 | 1 |
| 206-162 | A206 | B162 | 2 | 1 |
| 207-169 | A207 | B169 | 2 | 1 |
| 208-176 | A208 | B176 | 2 | 1 |
| 210-187 | A210 | B187 | 2 | 1 |
| 211-201 | A211 | B201 | 2 | 1 |
| 212-202 | A212 | B202 | 2 | 1 |
| 213-213 | A213 | B213 | 2 | 1 |
| 214-249 | A214 | B249 | 2 | 1 |
| 215-272 | A215 | B272 | 2 | 1 |
| 216-281 | A216 | B281 | 2 | 1 |
| 217-306 | A217 | B306 | 2 | 1 |
| 218-340 | A218 | B340 | 2 | 1 |
| 219-399 | A219 | B399 | 2 | 1 |
| 220-445 | A220 | B445 | 2 | 1 |

TABLE 28

| Compound No. | $L_2$ | $L_1$ | n2 | n1 |
|---|---|---|---|---|
| 221-4 | A221 | B4 | 2 | 1 |
| 222-8 | A222 | B8 | 2 | 1 |
| 223-10 | A223 | B10 | 2 | 1 |
| 224-13 | A224 | B13 | 2 | 1 |
| 225-20 | A225 | B20 | 2 | 1 |
| 226-24 | A226 | B24 | 2 | 1 |
| 227-27 | A227 | B27 | 2 | 1 |
| 228-48 | A228 | B48 | 2 | 1 |
| 235-62 | A235 | B62 | 2 | 1 |
| 230-63 | A230 | B63 | 2 | 1 |
| 231-85 | A231 | B85 | 2 | 1 |
| 232-91 | A232 | B91 | 2 | 1 |
| 233-108 | A233 | B108 | 2 | 1 |
| 234-116 | A234 | B116 | 2 | 1 |
| 229-135 | A229 | B135 | 2 | 1 |
| 236-144 | A236 | B144 | 2 | 1 |
| 237-152 | A237 | B152 | 2 | 1 |
| 238-162 | A238 | B162 | 2 | 1 |
| 239-169 | A239 | B169 | 2 | 1 |
| 240-176 | A240 | B176 | 2 | 1 |
| 241-187 | A241 | B187 | 2 | 1 |
| 242-201 | A242 | B201 | 2 | 1 |
| 243-202 | A243 | B202 | 2 | 1 |
| 244-213 | A244 | B213 | 2 | 1 |
| 245-249 | A245 | B249 | 2 | 1 |
| 246-272 | A246 | B272 | 2 | 1 |
| 247-281 | A247 | B281 | 2 | 1 |
| 248-306 | A248 | B306 | 2 | 1 |
| 249-340 | A249 | B340 | 2 | 1 |

TABLE 29

| Compound No. | $L_2$ | $L_1$ | n2 | n1 |
|---|---|---|---|---|
| 252-4 | A252 | B4 | 2 | 1 |
| 253-8 | A253 | B8 | 2 | 1 |
| 254-10 | A254 | B10 | 2 | 1 |
| 255-13 | A255 | B13 | 2 | 1 |
| 256-20 | A256 | B20 | 2 | 1 |
| 257-24 | A257 | B24 | 2 | 1 |
| 258-27 | A258 | B27 | 2 | 1 |
| 259-48 | A259 | B48v | 2 | 1 |
| 260-62 | A260 | B62 | 2 | 1 |
| 261-63 | A261 | B63 | 2 | 1 |
| 262-85 | A262 | B85 | 2 | 1 |
| 263-91 | A263 | B91 | 2 | 1 |
| 264-108 | A264 | B108 | 2 | 1 |
| 265-116 | A265 | B116 | 2 | 1 |
| 266-66 | A266 | B66 | 2 | 1 |
| 267-144 | A267 | B144 | 2 | 1 |
| 268-152 | A268 | B152 | 2 | 1 |
| 269-162 | A269 | B162 | 2 | 1 |
| 270-169 | A270 | B169 | 2 | 1 |

TABLE 29-continued

| Compound No. | $L_2$ | $L_1$ | n2 | n1 |
|---|---|---|---|---|
| 271-176 | A271 | B176 | 2 | 1 |
| 272-187 | A272 | B187 | 2 | 1 |
| 274-201 | A274 | B201 | 2 | 1 |
| 275-202 | A275 | B202 | 2 | 1 |
| 276-213 | A276 | B213 | 2 | 1 |
| 277-249 | A277 | B249 | 2 | 1 |
| 278-272 | A278 | B272 | 2 | 1 |
| 279-281 | A279 | B281 | 2 | 1 |
| 280-306 | A280 | B306 | 2 | 1 |
| 281-340 | A281 | B340 | 2 | 1 |

TABLE 30

| Compound No. | $L_2$ | $L_1$ | n2 | n1 |
|---|---|---|---|---|
| 284-4 | A284 | B4 | 2 | 1 |
| 285-8 | A285 | B8 | 2 | 1 |
| 286-10 | A286 | B10 | 2 | 1 |
| 287-13 | A287 | B13 | 2 | 1 |
| 288-20 | A288 | B20 | 2 | 1 |
| 289-24 | A289 | B24 | 2 | 1 |
| 290-27 | A290 | B27 | 2 | 1 |
| 291-48 | A291 | B48 | 2 | 1 |
| 292-62 | A292 | B62 | 2 | 1 |
| 293-63 | A293 | B63 | 2 | 1 |
| 294-85 | A294 | B85 | 2 | 1 |
| 295-91 | A295 | B91 | 2 | 1 |
| 296-108 | A296 | B108 | 2 | 1 |
| 297-116 | A297 | B116 | 2 | 1 |
| 298-137 | A298 | B137 | 2 | 1 |
| 299-144 | A299 | B144 | 2 | 1 |
| 300-152 | A300 | B152 | 2 | 1 |

TABLE 31

| Compound No. | $L_2$ | $L_1$ | n2 | n1 |
|---|---|---|---|---|
| 151-1 | A151 | B1 | 2 | 1 |
| 151-2 | A151 | B2 | 2 | 1 |
| 151-3 | A151 | B3 | 2 | 1 |
| 151-4 | A151 | B4 | 2 | 1 |
| 151-5 | A151 | B5 | 2 | 1 |
| 151-6 | A151 | B6 | 2 | 1 |
| 151-7 | A151 | B7 | 2 | 1 |
| 151-8 | A151 | B8 | 2 | 1 |
| 151-9 | A151 | B9 | 2 | 1 |
| 151-10 | A151 | B10 | 2 | 1 |
| 151-11 | A151 | B11 | 2 | 1 |
| 151-12 | A151 | B12 | 2 | 1 |
| 151-13 | A151 | B13 | 2 | 1 |
| 151-14 | A151 | B14 | 2 | 1 |
| 151-15 | A151 | B15 | 2 | 1 |
| 151-16 | A151 | B16 | 2 | 1 |
| 151-17 | A151 | B17 | 2 | 1 |
| 151-18 | A151 | B18 | 2 | 1 |
| 151-19 | A151 | B19 | 2 | 1 |
| 151-20 | A151 | B20 | 2 | 1 |
| 151-21 | A151 | B21 | 2 | 1 |
| 151-22 | A151 | B22 | 2 | 1 |
| 151-23 | A151 | B23 | 2 | 1 |
| 151-24 | A151 | B24 | 2 | 1 |
| 151-25 | A151 | B25 | 2 | 1 |
| 151-26 | A151 | B26 | 2 | 1 |
| 151-27 | A151 | B27 | 2 | 1 |
| 151-28 | A151 | B28 | 2 | 1 |
| 151-29 | A151 | B29 | 2 | 1 |
| 151-30 | A151 | B30 | 2 | 1 |

TABLE 32

| Compound No. | $L_2$ | $L_1$ | n2 | n1 |
|---|---|---|---|---|
| 151-31 | A151 | B31 | 2 | 1 |
| 151-32 | A151 | B32 | 2 | 1 |
| 151-33 | A151 | B33 | 2 | 1 |
| 151-34 | A151 | B34 | 2 | 1 |
| 151-35 | A151 | B35 | 2 | 1 |
| 151-36 | A151 | B36 | 2 | 1 |
| 151-37 | A151 | B37 | 2 | 1 |
| 151-38 | A151 | B38 | 2 | 1 |
| 151-39 | A151 | B39 | 2 | 1 |
| 151-40 | A151 | B40 | 2 | 1 |
| 151-41 | A151 | B41 | 2 | 1 |
| 151-42 | A151 | B42 | 2 | 1 |
| 151-43 | A151 | B43 | 2 | 1 |
| 151-44 | A151 | B44 | 2 | 1 |
| 151-45 | A151 | B45 | 2 | 1 |
| 151-46 | A151 | B46 | 2 | 1 |
| 151-47 | A151 | B47 | 2 | 1 |
| 151-48 | A151 | B48 | 2 | 1 |
| 151-49 | A151 | B49 | 2 | 1 |
| 151-50 | A151 | B50 | 2 | 1 |
| 151-51 | A151 | B51 | 2 | 1 |
| 151-52 | A151 | B52 | 2 | 1 |
| 151-53 | A151 | B53 | 2 | 1 |
| 151-54 | A151 | B54 | 2 | 1 |
| 151-55 | A151 | B55 | 2 | 1 |
| 151-56 | A151 | B56 | 2 | 1 |
| 151-57 | A151 | B57 | 2 | 1 |
| 151-58 | A151 | B58 | 2 | 1 |
| 151-59 | A151 | B59 | 2 | 1 |
| 151-60 | A151 | B60 | 2 | 1 |

TABLE 33

| Compound No. | $L_2$ | $L_1$ | n2 | n1 |
|---|---|---|---|---|
| 151-61 | A151 | B61 | 2 | 1 |
| 151-62 | A151 | B62 | 2 | 1 |
| 151-63 | A151 | B63 | 2 | 1 |
| 151-64 | A151 | B64 | 2 | 1 |
| 151-65 | A151 | B65 | 2 | 1 |
| 151-66 | A151 | B66 | 2 | 1 |
| 151-67 | A151 | B67 | 2 | 1 |
| 151-68 | A151 | B68 | 2 | 1 |
| 151-69 | A151 | B69 | 2 | 1 |
| 151-70 | A151 | B70 | 2 | 1 |
| 151-71 | A151 | B71 | 2 | 1 |
| 151-72 | A151 | B72 | 2 | 1 |
| 151-73 | A151 | B73 | 2 | 1 |
| 151-74 | A151 | B74 | 2 | 1 |
| 151-75 | A151 | B75 | 2 | 1 |
| 151-76 | A151 | B76 | 2 | 1 |
| 151-77 | A151 | B77 | 2 | 1 |
| 151-78 | A151 | B78 | 2 | 1 |
| 151-79 | A151 | B79 | 2 | 1 |
| 151-80 | A151 | B80 | 2 | 1 |
| 151-81 | A151 | B81 | 2 | 1 |
| 151-82 | A151 | B82 | 2 | 1 |
| 151-83 | A151 | B83 | 2 | 1 |
| 151-84 | A151 | B84 | 2 | 1 |
| 151-85 | A151 | B85 | 2 | 1 |
| 151-86 | A151 | B86 | 2 | 1 |
| 151-87 | A151 | B87 | 2 | 1 |
| 151-88 | A151 | B88 | 2 | 1 |
| 151-89 | A151 | B89 | 2 | 1 |
| 151-90 | A151 | B90 | 2 | 1 |

TABLE 34

| Compound No. | $L_2$ | $L_1$ | n2 | n1 |
|---|---|---|---|---|
| 151-91 | A151 | B91 | 2 | 1 |
| 151-92 | A151 | B92 | 2 | 1 |
| 151-93 | A151 | B93 | 2 | 1 |

TABLE 34-continued

| Compound No. | $L_2$ | $L_1$ | n2 | n1 |
|---|---|---|---|---|
| 151-94 | A151 | B94 | 2 | 1 |
| 151-95 | A151 | B95 | 2 | 1 |
| 151-96 | A151 | B96 | 2 | 1 |
| 151-97 | A151 | B97 | 2 | 1 |
| 151-98 | A151 | B98 | 2 | 1 |
| 151-99 | A151 | B99 | 2 | 1 |
| 151-100 | A151 | B100 | 2 | 1 |
| 151-101 | A151 | B101 | 2 | 1 |
| 151-102 | A151 | B102 | 2 | 1 |
| 151-103 | A151 | B103 | 2 | 1 |
| 151-104 | A151 | B104 | 2 | 1 |
| 151-105 | A151 | B105 | 2 | 1 |
| 151-106 | A151 | B106 | 2 | 1 |
| 151-107 | A151 | B107 | 2 | 1 |
| 151-108 | A151 | B108 | 2 | 1 |
| 151-109 | A151 | B109 | 2 | 1 |
| 151-110 | A151 | B110 | 2 | 1 |
| 151-111 | A151 | B111 | 2 | 1 |
| 151-112 | A151 | B112 | 2 | 1 |
| 151-113 | A151 | B113 | 2 | 1 |
| 151-114 | A151 | B114 | 2 | 1 |
| 151-115 | A151 | B115 | 2 | 1 |
| 151-116 | A151 | B116 | 2 | 1 |
| 151-117 | A151 | B117 | 2 | 1 |
| 151-118 | A151 | B118 | 2 | 1 |
| 151-119 | A151 | B119 | 2 | 1 |
| 151-120 | A151 | B120 | 2 | 1 |

TABLE 35

| Compound No. | $L_2$ | $L_1$ | n2 | n1 |
|---|---|---|---|---|
| 151-121 | A151 | B121 | 2 | 1 |
| 151-122 | A151 | B122 | 2 | 1 |
| 151-123 | A151 | B123 | 2 | 1 |
| 151-124 | A151 | B124 | 2 | 1 |
| 151-125 | A151 | B125 | 2 | 1 |
| 151-126 | A151 | B126 | 2 | 1 |
| 151-127 | A151 | B127 | 2 | 1 |
| 151-128 | A151 | B128 | 2 | 1 |
| 151-129 | A151 | B129 | 2 | 1 |
| 151-130 | A151 | B130 | 2 | 1 |
| 151-131 | A151 | B131 | 2 | 1 |
| 151-132 | A151 | B132 | 2 | 1 |
| 151-133 | A151 | B133 | 2 | 1 |
| 151-134 | A151 | B134 | 2 | 1 |
| 151-135 | A151 | B135 | 2 | 1 |
| 151-136 | A151 | B136 | 2 | 1 |
| 151-137 | A151 | B137 | 2 | 1 |
| 151-138 | A151 | B138 | 2 | 1 |
| 151-139 | A151 | B139 | 2 | 1 |
| 151-140 | A151 | B140 | 2 | 1 |
| 151-141 | A151 | B141 | 2 | 1 |
| 151-142 | A151 | B142 | 2 | 1 |
| 151-143 | A151 | B143 | 2 | 1 |
| 151-144 | A151 | B144 | 2 | 1 |
| 151-145 | A151 | B145 | 2 | 1 |
| 151-146 | A151 | B146 | 2 | 1 |
| 151-147 | A151 | B147 | 2 | 1 |
| 151-148 | A151 | B148 | 2 | 1 |
| 151-149 | A151 | B149 | 2 | 1 |
| 151-150 | A151 | B150 | 2 | 1 |

TABLE 36

| Compound No. | $L_2$ | $L_1$ | n2 | n1 |
|---|---|---|---|---|
| 151-151 | A151 | B151 | 2 | 1 |
| 151-152 | A151 | B152 | 2 | 1 |
| 151-153 | A151 | B153 | 2 | 1 |
| 151-154 | A151 | B154 | 2 | 1 |
| 151-155 | A151 | B155 | 2 | 1 |
| 151-156 | A151 | B156 | 2 | 1 |

TABLE 36-continued

| Compound No. | $L_2$ | $L_1$ | n2 | n1 |
|---|---|---|---|---|
| 151-157 | A151 | B157 | 2 | 1 |
| 151-158 | A151 | B158 | 2 | 1 |
| 151-159 | A151 | B159 | 2 | 1 |
| 151-160 | A151 | B160 | 2 | 1 |
| 151-161 | A151 | B161 | 2 | 1 |
| 151-162 | A151 | B162 | 2 | 1 |
| 151-163 | A151 | B163 | 2 | 1 |
| 151-164 | A151 | B164 | 2 | 1 |
| 151-165 | A151 | B165 | 2 | 1 |
| 151-166 | A151 | B166 | 2 | 1 |
| 151-167 | A151 | B167 | 2 | 1 |
| 151-168 | A151 | B168 | 2 | 1 |
| 151-169 | A151 | B169 | 2 | 1 |
| 151-170 | A151 | B170 | 2 | 1 |
| 151-171 | A151 | B171 | 2 | 1 |
| 151-172 | A151 | B172 | 2 | 1 |
| 151-173 | A151 | B173 | 2 | 1 |
| 151-174 | A151 | B174 | 2 | 1 |
| 151-175 | A151 | B175 | 2 | 1 |
| 151-176 | A151 | B176 | 2 | 1 |
| 151-177 | A151 | B177 | 2 | 1 |
| 151-178 | A151 | B178 | 2 | 1 |
| 151-179 | A151 | B179 | 2 | 1 |
| 151-180 | A151 | B180 | 2 | 1 |

TABLE 37

| Compound No. | $L_2$ | $L_1$ | n2 | n1 |
|---|---|---|---|---|
| 151-181 | A151 | B181 | 2 | 1 |
| 151-182 | A151 | B182 | 2 | 1 |
| 151-183 | A151 | B183 | 2 | 1 |
| 151-184 | A151 | B184 | 2 | 1 |
| 151-185 | A151 | B185 | 2 | 1 |
| 151-186 | A151 | B186 | 2 | 1 |
| 151-187 | A151 | B187 | 2 | 1 |
| 151-188 | A151 | B188 | 2 | 1 |
| 151-189 | A151 | B189 | 2 | 1 |
| 151-190 | A151 | B190 | 2 | 1 |
| 151-191 | A151 | B191 | 2 | 1 |
| 151-192 | A151 | B192 | 2 | 1 |
| 151-193 | A151 | B193 | 2 | 1 |
| 151-194 | A151 | B194 | 2 | 1 |
| 151-195 | A151 | B195 | 2 | 1 |
| 151-196 | A151 | B196 | 2 | 1 |
| 151-197 | A151 | B197 | 2 | 1 |
| 151-198 | A151 | B198 | 2 | 1 |
| 151-199 | A151 | B199 | 2 | 1 |
| 151-200 | A151 | B200 | 2 | 1 |
| 151-201 | A151 | B201 | 2 | 1 |
| 151-202 | A151 | B202 | 2 | 1 |
| 151-203 | A151 | B203 | 2 | 1 |
| 151-204 | A151 | B204 | 2 | 1 |
| 151-205 | A151 | B205 | 2 | 1 |
| 151-206 | A151 | B206 | 2 | 1 |
| 151-207 | A151 | B207 | 2 | 1 |
| 151-208 | A151 | B208 | 2 | 1 |
| 151-209 | A151 | B209 | 2 | 1 |
| 151-210 | A151 | B210 | 2 | 1 |

TABLE 38

| Compound No. | $L_2$ | $L_1$ | n2 | n1 |
|---|---|---|---|---|
| 151-211 | A151 | B211 | 2 | 1 |
| 151-212 | A151 | B212 | 2 | 1 |
| 151-213 | A151 | B213 | 2 | 1 |
| 151-214 | A151 | B214 | 2 | 1 |
| 151-215 | A151 | B215 | 2 | 1 |
| 151-216 | A151 | B216 | 2 | 1 |
| 151-217 | A151 | B217 | 2 | 1 |
| 151-218 | A151 | B218 | 2 | 1 |
| 151-219 | A151 | B219 | 2 | 1 |

TABLE 38-continued

| Compound No. | $L_2$ | $L_1$ | n2 | n1 |
|---|---|---|---|---|
| 151-220 | A151 | B220 | 2 | 1 |
| 151-221 | A151 | B221 | 2 | 1 |
| 151-222 | A151 | B222 | 2 | 1 |
| 151-223 | A151 | B223 | 2 | 1 |
| 151-224 | A151 | B224 | 2 | 1 |
| 151-225 | A151 | B225 | 2 | 1 |
| 151-226 | A151 | B226 | 2 | 1 |
| 151-227 | A151 | B227 | 2 | 1 |
| 151-228 | A151 | B228 | 2 | 1 |
| 151-229 | A151 | B229 | 2 | 1 |
| 151-230 | A151 | B230 | 2 | 1 |
| 151-231 | A151 | B231 | 2 | 1 |
| 151-232 | A151 | B232 | 2 | 1 |
| 151-233 | A151 | B233 | 2 | 1 |
| 151-234 | A151 | B234 | 2 | 1 |
| 151-235 | A151 | B235 | 2 | 1 |
| 151-236 | A151 | B236 | 2 | 1 |
| 151-237 | A151 | B237 | 2 | 1 |
| 151-238 | A151 | B238 | 2 | 1 |
| 151-239 | A151 | B239 | 2 | 1 |
| 151-240 | A151 | B240 | 2 | 1 |

TABLE 39

| Compound No. | $L_2$ | $L_1$ | n2 | n1 |
|---|---|---|---|---|
| 151-241 | A151 | B241 | 2 | 1 |
| 151-242 | A151 | B242 | 2 | 1 |
| 151-243 | A151 | B243 | 2 | 1 |
| 151-244 | A151 | B244 | 2 | 1 |
| 151-245 | A151 | B245 | 2 | 1 |
| 151-246 | A151 | B246 | 2 | 1 |
| 151-247 | A151 | B247 | 2 | 1 |
| 151-248 | A151 | B248 | 2 | 1 |
| 151-249 | A151 | B249 | 2 | 1 |
| 151-250 | A151 | B250 | 2 | 1 |
| 151-251 | A151 | B251 | 2 | 1 |
| 151-252 | A151 | B252 | 2 | 1 |
| 151-253 | A151 | B253 | 2 | 1 |
| 151-254 | A151 | B254 | 2 | 1 |
| 151-255 | A151 | B255 | 2 | 1 |
| 151-256 | A151 | B256 | 2 | 1 |
| 151-257 | A151 | B257 | 2 | 1 |
| 151-258 | A151 | B258 | 2 | 1 |
| 151-259 | A151 | B259 | 2 | 1 |
| 151-260 | A151 | B260 | 2 | 1 |
| 151-261 | A151 | B261 | 2 | 1 |
| 151-262 | A151 | B262 | 2 | 1 |
| 151-263 | A151 | B263 | 2 | 1 |
| 151-264 | A151 | B264 | 2 | 1 |
| 151-265 | A151 | B265 | 2 | 1 |
| 151-266 | A151 | B266 | 2 | 1 |
| 151-267 | A151 | B267 | 2 | 1 |
| 151-268 | A151 | B268 | 2 | 1 |
| 151-269 | A151 | B269 | 2 | 1 |
| 151-270 | A151 | B270 | 2 | 1 |

TABLE 40

| Compound No. | $L_2$ | $L_1$ | n2 | n1 |
|---|---|---|---|---|
| 151-271 | A151 | B271 | 2 | 1 |
| 151-272 | A151 | B272 | 2 | 1 |
| 151-273 | A151 | B273 | 2 | 1 |
| 151-274 | A151 | B274 | 2 | 1 |
| 151-275 | A151 | B275 | 2 | 1 |
| 151-276 | A151 | B276 | 2 | 1 |
| 151-277 | A151 | B277 | 2 | 1 |
| 151-278 | A151 | B278 | 2 | 1 |
| 151-279 | A151 | B279 | 2 | 1 |
| 151-280 | A151 | B280 | 2 | 1 |
| 151-281 | A151 | B281 | 2 | 1 |
| 151-282 | A151 | B282 | 2 | 1 |

TABLE 40-continued

| Compound No. | $L_2$ | $L_1$ | n2 | n1 |
|---|---|---|---|---|
| 151-283 | A151 | B283 | 2 | 1 |
| 151-284 | A151 | B284 | 2 | 1 |
| 151-285 | A151 | B285 | 2 | 1 |
| 151-286 | A151 | B286 | 2 | 1 |
| 151-287 | A151 | B287 | 2 | 1 |
| 151-288 | A151 | B288 | 2 | 1 |
| 151-289 | A151 | B289 | 2 | 1 |
| 151-290 | A151 | B290 | 2 | 1 |
| 151-291 | A151 | B291 | 2 | 1 |
| 151-292 | A151 | B292 | 2 | 1 |
| 151-293 | A151 | B293 | 2 | 1 |
| 151-294 | A151 | B294 | 2 | 1 |
| 151-295 | A151 | B295 | 2 | 1 |
| 151-296 | A151 | B296 | 2 | 1 |
| 151-297 | A151 | B297 | 2 | 1 |
| 151-298 | A151 | B298 | 2 | 1 |
| 151-299 | A151 | B299 | 2 | 1 |
| 151-300 | A151 | B300 | 2 | 1 |

TABLE 41

| Compound No. | $L_2$ | $L_1$ | n2 | n1 |
|---|---|---|---|---|
| 151-301 | A151 | B301 | 2 | 1 |
| 151-302 | A151 | B302 | 2 | 1 |
| 151-303 | A151 | B303 | 2 | 1 |
| 151-304 | A151 | B304 | 2 | 1 |
| 151-305 | A151 | B305 | 2 | 1 |
| 151-306 | A151 | B306 | 2 | 1 |
| 151-307 | A151 | B307 | 2 | 1 |
| 151-308 | A151 | B308 | 2 | 1 |
| 151-309 | A151 | B309 | 2 | 1 |
| 151-310 | A151 | B310 | 2 | 1 |
| 151-311 | A151 | B311 | 2 | 1 |
| 151-312 | A151 | B312 | 2 | 1 |
| 151-313 | A151 | B313 | 2 | 1 |
| 151-314 | A151 | B314 | 2 | 1 |
| 151-315 | A151 | B315 | 2 | 1 |
| 151-316 | A151 | B316 | 2 | 1 |
| 151-317 | A151 | B317 | 2 | 1 |
| 151-318 | A151 | B318 | 2 | 1 |
| 151-319 | A151 | B319 | 2 | 1 |
| 151-320 | A151 | B320 | 2 | 1 |
| 151-321 | A151 | B321 | 2 | 1 |
| 151-322 | A151 | B322 | 2 | 1 |
| 151-323 | A151 | B323 | 2 | 1 |
| 151-324 | A151 | B324 | 2 | 1 |
| 151-325 | A151 | B325 | 2 | 1 |
| 151-326 | A151 | B326 | 2 | 1 |
| 151-327 | A151 | B327 | 2 | 1 |
| 151-328 | A151 | B328 | 2 | 1 |
| 151-329 | A151 | B329 | 2 | 1 |
| 151-330 | A151 | B330 | 2 | 1 |

TABLE 42

| Compound No. | $L_2$ | $L_1$ | n2 | n1 |
|---|---|---|---|---|
| 151-331 | A151 | B331 | 2 | 1 |
| 151-332 | A151 | B332 | 2 | 1 |
| 151-333 | A151 | B333 | 2 | 1 |
| 151-334 | A151 | B334 | 2 | 1 |
| 151-335 | A151 | B335 | 2 | 1 |
| 151-336 | A151 | B336 | 2 | 1 |
| 151-337 | A151 | B337 | 2 | 1 |
| 151-338 | A151 | B338 | 2 | 1 |
| 151-339 | A151 | B339 | 2 | 1 |
| 151-340 | A151 | B340 | 2 | 1 |
| 151-341 | A151 | B341 | 2 | 1 |
| 151-342 | A151 | B342 | 2 | 1 |
| 151-343 | A151 | B343 | 2 | 1 |
| 151-344 | A151 | B344 | 2 | 1 |
| 151-345 | A151 | B345 | 2 | 1 |

TABLE 42-continued

| Compound No. | $L_2$ | $L_1$ | n2 | n1 |
|---|---|---|---|---|
| 151-346 | A151 | B346 | 2 | 1 |
| 151-347 | A151 | B347 | 2 | 1 |
| 151-348 | A151 | B348 | 2 | 1 |
| 151-349 | A151 | B349 | 2 | 1 |
| 151-350 | A151 | B350 | 2 | 1 |
| 151-351 | A151 | B351 | 2 | 1 |
| 151-352 | A151 | B352 | 2 | 1 |
| 151-353 | A151 | B353 | 2 | 1 |
| 151-354 | A151 | B354 | 2 | 1 |
| 151-355 | A151 | B355 | 2 | 1 |
| 151-356 | A151 | B356 | 2 | 1 |
| 151-357 | A151 | B357 | 2 | 1 |
| 151-358 | A151 | B358 | 2 | 1 |
| 151-359 | A151 | B359 | 2 | 1 |
| 151-360 | A151 | B360 | 2 | 1 |

TABLE 43

| Compound No. | $L_2$ | $L_1$ | n2 | n1 |
|---|---|---|---|---|
| 152-4 | A152 | B4 | 2 | 1 |
| 152-8 | A152 | B8 | 2 | 1 |
| 152-10 | A152 | B10 | 2 | 1 |
| 152-13 | A152 | B13 | 2 | 1 |
| 152-20 | A152 | B20 | 2 | 1 |
| 152-24 | A152 | B24 | 2 | 1 |
| 152-27 | A152 | B27 | 2 | 1 |
| 152-48 | A152 | B48 | 2 | 1 |
| 152-62 | A152 | B62 | 2 | 1 |
| 152-63 | A152 | B63 | 2 | 1 |
| 152-85 | A152 | B85 | 2 | 1 |
| 152-91 | A152 | B91 | 2 | 1 |
| 152-108 | A152 | B108 | 2 | 1 |
| 152-116 | A152 | B116 | 2 | 1 |
| 152-137 | A152 | B137 | 2 | 1 |
| 152-144 | A152 | B144 | 2 | 1 |
| 152-152 | A152 | B152 | 2 | 1 |
| 152-162 | A152 | B162 | 2 | 1 |
| 152-169 | A152 | B169 | 2 | 1 |
| 152-176 | A152 | B176 | 2 | 1 |
| 152-187 | A152 | B187 | 2 | 1 |
| 152-201 | A152 | B201 | 2 | 1 |
| 152-202 | A152 | B202 | 2 | 1 |
| 152-213 | A152 | B213 | 2 | 1 |
| 152-249 | A152 | B249 | 2 | 1 |
| 152-272 | A152 | B272 | 2 | 1 |
| 152-281 | A152 | B281 | 2 | 1 |
| 152-306 | A152 | B306 | 2 | 1 |
| 152-340 | A152 | B340 | 2 | 1 |

TABLE 44

| Compound No. | $L_2$ | $L_1$ | n2 | n1 |
|---|---|---|---|---|
| 155-7 | A155 | B7 | 2 | 1 |
| 155-9 | A155 | B9 | 2 | 1 |
| 155-10 | A155 | B10 | 2 | 1 |
| 155-13 | A155 | B13 | 2 | 1 |
| 155-22 | A155 | B22 | 2 | 1 |
| 155-26 | A155 | B26 | 2 | 1 |
| 155-29 | A155 | B29 | 2 | 1 |
| 155-50 | A155 | B50 | 2 | 1 |
| 155-64 | A155 | B64 | 2 | 1 |
| 155-65 | A155 | B65 | 2 | 1 |
| 155-87 | A155 | B87 | 2 | 1 |
| 155-93 | A155 | B93 | 2 | 1 |
| 155-110 | A155 | B110 | 2 | 1 |
| 155-118 | A155 | B118 | 2 | 1 |
| 155-139 | A155 | B139 | 2 | 1 |
| 155-146 | A155 | B146 | 2 | 1 |
| 155-154 | A155 | B154 | 2 | 1 |
| 155-163 | A155 | B163 | 2 | 1 |
| 155-167 | A155 | B167 | 2 | 1 |

TABLE 44-continued

| Compound No. | $L_2$ | $L_1$ | n2 | n1 |
|---|---|---|---|---|
| 155-178 | A155 | B178 | 2 | 1 |
| 155-189 | A155 | B189 | 2 | 1 |
| 155-203 | A155 | B203 | 2 | 1 |
| 155-205 | A155 | B205 | 2 | 1 |
| 155-215 | A155 | B215 | 2 | 1 |
| 155-251 | A155 | B251 | 2 | 1 |
| 155-274 | A155 | B274 | 2 | 1 |
| 155-283 | A155 | B283 | 2 | 1 |
| 155-308 | A155 | B308 | 2 | 1 |
| 155-341 | A155 | B341 | 2 | 1 |
| 156-7 | A156 | B7 | 2 | 1 |
| 157-9 | A157 | B9 | 2 | 1 |
| 158-10 | A158 | B10 | 2 | 1 |

TABLE 45

| Compound No. | $L_2$ | $L_1$ | n2 | n1 |
|---|---|---|---|---|
| 159-13 | A159 | B13 | 2 | 1 |
| 160-22 | A160 | B22 | 2 | 1 |
| 161-4 | A161 | B4 | 2 | 1 |
| 161-8 | A161 | B8 | 2 | 1 |
| 161-10 | A161 | B10 | 2 | 1 |
| 161-13 | A161 | B13 | 2 | 1 |
| 161-20 | A161 | B20 | 2 | 1 |
| 161-24 | A161 | B24 | 2 | 1 |
| 161-27 | A161 | B27 | 2 | 1 |
| 161-48 | A161 | B48 | 2 | 1 |
| 161-62 | A161 | B62 | 2 | 1 |
| 161-63 | A161 | B63 | 2 | 1 |
| 161-85 | A161 | B85 | 2 | 1 |
| 161-91 | A161 | B91 | 2 | 1 |
| 161-108 | A161 | B108 | 2 | 1 |
| 161-116 | A161 | B116 | 2 | 1 |
| 161-137 | A161 | B137 | 2 | 1 |
| 161-144 | A161 | B144 | 2 | 1 |
| 161-152 | A161 | B152 | 2 | 1 |
| 161-162 | A161 | B162 | 2 | 1 |
| 161-169 | A161 | B169 | 2 | 1 |
| 161-176 | A161 | B176 | 2 | 1 |
| 161-187 | A161 | B187 | 2 | 1 |
| 161-201 | A161 | B201 | 2 | 1 |
| 161-202 | A161 | B202 | 2 | 1 |
| 161-213 | A161 | B213 | 2 | 1 |
| 161-249 | A161 | B249 | 2 | 1 |
| 161-272 | A161 | B272 | 2 | 1 |
| 161-281 | A161 | B281 | 2 | 1 |
| 161-306 | A161 | B306 | 2 | 1 |
| 161-340 | A161 | B340 | 2 | 1 |

TABLE 46

| Compound No. | $L_2$ | $L_1$ | n2 | n1 |
|---|---|---|---|---|
| 162-4 | A162 | B4 | 2 | 1 |
| 163-8 | A163 | B8 | 2 | 1 |
| 164-10 | A164 | B10 | 2 | 1 |
| 165-13 | A165 | B13 | 2 | 1 |
| 166-20 | A166 | B20 | 2 | 1 |
| 167-24 | A167 | B24 | 2 | 1 |
| 168-27 | A168 | B27 | 2 | 1 |
| 169-48 | A169 | B48 | 2 | 1 |
| 170-62 | A170 | B62 | 2 | 1 |
| 171-340 | A171 | B340 | 2 | 1 |

TABLE 47

| Compound No. | $L_2$ | $L_1$ | n2 | n1 |
|---|---|---|---|---|
| 171-65 | A171 | B65 | 2 | 1 |
| 172-87 | A172 | B87 | 2 | 1 |

TABLE 47-continued

| Compound No. | $L_2$ | $L_1$ | n2 | n1 |
|---|---|---|---|---|
| 173-93 | A173 | B93 | 2 | 1 |
| 174-110 | A174 | B110 | 2 | 1 |
| 175-118 | A175 | B118 | 2 | 1 |
| 176-139 | A176 | B139 | 2 | 1 |
| 177-146 | A177 | B146 | 2 | 1 |
| 178-154 | A178 | B154 | 2 | 1 |
| 178-163 | A178 | B163 | 2 | 1 |
| 178-167 | A178 | B167 | 2 | 1 |
| 178-178 | A178 | B178 | 2 | 1 |
| 178-189 | A178 | B189 | 2 | 1 |
| 178-203 | A178 | B203 | 2 | 1 |
| 178-205 | A178 | B205 | 2 | 1 |
| 178-215 | A178 | B215 | 2 | 1 |
| 178-251 | A178 | B251 | 2 | 1 |
| 178-274 | A178 | B274 | 2 | 1 |
| 178-283 | A178 | B283 | 2 | 1 |

TABLE 48

| Compound No. | $L_2$ | $L_1$ | n2 | n1 |
|---|---|---|---|---|
| 178-308 | A178 | B308 | 2 | 1 |
| 178-4 | A178 | B4 | 2 | 1 |
| 178-8 | A178 | B8 | 2 | 1 |
| 178-10 | A178 | B10 | 2 | 1 |
| 178-13 | A178 | B13 | 2 | 1 |
| 178-20 | A178 | B20 | 2 | 1 |
| 178-24 | A178 | B24 | 2 | 1 |
| 178-27 | A178 | B27 | 2 | 1 |
| 178-48 | A178 | B48 | 2 | 1 |
| 178-62 | A178 | B62 | 2 | 1 |
| 178-63 | A178 | B63 | 2 | 1 |
| 178-85 | A178 | B85 | 2 | 1 |
| 178-91 | A178 | B91 | 2 | 1 |
| 178-108 | A178 | B108 | 2 | 1 |
| 178-116 | A178 | B116 | 2 | 1 |
| 178-137 | A178 | B137 | 2 | 1 |
| 178-144 | A178 | B144 | 2 | 1 |
| 178-152 | A178 | B152 | 2 | 1 |
| 179-162 | A179 | B162 | 2 | 1 |
| 180-169 | A180 | B169 | 2 | 1 |
| 181-176 | A181 | B176 | 2 | 1 |
| 182-187 | A182 | B187 | 2 | 1 |
| 183-201 | A183 | B201 | 2 | 1 |
| 184-202 | A184 | B202 | 2 | 1 |
| 185-213 | A185 | B213 | 2 | 1 |
| 186-249 | A186 | B249 | 2 | 1 |
| 187-272 | A187 | B272 | 2 | 1 |
| 188-281 | A188 | B281 | 2 | 1 |
| 189-306 | A189 | B306 | 2 | 1 |
| 190-340 | A190 | B340 | 2 | 1 |

TABLE 49

| Compound No. | $L_2$ | $L_1$ | n2 | n1 |
|---|---|---|---|---|
| 193-4 | A193 | B4 | 2 | 1 |
| 194-8 | A194 | B8 | 2 | 1 |
| 195-10 | A195 | B10 | 2 | 1 |
| 196-13 | A196 | B13 | 2 | 1 |
| 197-20 | A197 | B20 | 2 | 1 |
| 198-24 | A198 | B24 | 2 | 1 |
| 199-27 | A199 | B27 | 2 | 1 |
| 200-48 | A200 | B48 | 2 | 1 |
| 201-62 | A201 | B62 | 2 | 1 |
| 202-63 | A202 | B63 | 2 | 1 |
| 203-85 | A203 | B85 | 2 | 1 |
| 204-91 | A204 | B91 | 2 | 1 |
| 205-108 | A205 | B108 | 2 | 1 |
| 206-116 | A206 | B116 | 2 | 1 |
| 207-137 | A207 | B137 | 2 | 1 |
| 208-144 | A208 | B144 | 2 | 1 |
| 209-152 | A209 | B152 | 2 | 1 |

TABLE 49-continued

| Compound No. | $L_2$ | $L_1$ | n2 | n1 |
|---|---|---|---|---|
| 210-162 | A210 | B162 | 2 | 1 |
| 211-169 | A211 | B169 | 2 | 1 |
| 212-176 | A212 | B176 | 2 | 1 |
| 213-187 | A213 | B187 | 2 | 1 |
| 214-201 | A214 | B201 | 2 | 1 |
| 215-202 | A215 | B202 | 2 | 1 |
| 216-213 | A216 | B213 | 2 | 1 |
| 217-249 | A217 | B249 | 2 | 1 |
| 218-272 | A218 | B272 | 2 | 1 |
| 219-281 | A219 | B281 | 2 | 1 |
| 220-306 | A220 | B306 | 2 | 1 |
| 221-340 | A221 | B340 | 2 | 1 |

TABLE 50

| Compound No. | $L_2$ | $L_1$ | n2 | n1 |
|---|---|---|---|---|
| 223-4 | A223 | B4 | 2 | 1 |
| 224-8 | A224 | B8 | 2 | 1 |
| 225-10 | A225 | B10 | 2 | 1 |
| 226-13 | A226 | B13 | 2 | 1 |
| 227-20 | A227 | B20 | 2 | 1 |
| 228-24 | A228 | B24 | 2 | 1 |
| 229-27 | A229 | B27 | 2 | 1 |
| 230-48 | A230 | B48 | 2 | 1 |
| 231-62 | A231 | B62 | 2 | 1 |
| 232-63 | A232 | B63 | 2 | 1 |
| 233-85 | A233 | B85 | 2 | 1 |
| 234-91 | A234 | B91 | 2 | 1 |
| 235-108 | A235 | B108 | 2 | 1 |
| 236-116 | A236 | B116 | 2 | 1 |
| 237-137 | A237 | B137 | 2 | 1 |
| 238-144 | A238 | B144 | 2 | 1 |
| 239-152 | A239 | B152 | 2 | 1 |
| 240-162 | A240 | B162 | 2 | 1 |
| 241-169 | A241 | B169 | 2 | 1 |
| 242-176 | A242 | B176 | 2 | 1 |
| 243-187 | A243 | B187 | 2 | 1 |
| 244-201 | A244 | B201 | 2 | 1 |
| 245-202 | A245 | B202 | 2 | 1 |
| 246-213 | A246 | B213 | 2 | 1 |
| 247-249 | A247 | B249 | 2 | 1 |
| 248-272 | A248 | B272 | 2 | 1 |
| 249-281 | A249 | B281 | 2 | 1 |
| 250-306 | A250 | B306 | 2 | 1 |
| 251-340 | A251 | B340 | 2 | 1 |

TABLE 51

| Compound No. | $L_2$ | $L_1$ | n2 | n1 |
|---|---|---|---|---|
| 253-1 | A253 | B1 | 2 | 1 |
| 253-2 | A253 | B2 | 2 | 1 |
| 253-3 | A253 | B3 | 2 | 1 |
| 253-4 | A253 | B4 | 2 | 1 |
| 253-5 | A253 | B5 | 2 | 1 |
| 253-6 | A253 | B6 | 2 | 1 |
| 253-7 | A253 | B7 | 2 | 1 |
| 253-8 | A253 | B8 | 2 | 1 |
| 253-9 | A253 | B9 | 2 | 1 |
| 253-10 | A253 | B10 | 2 | 1 |
| 253-11 | A253 | B11 | 2 | 1 |
| 253-12 | A253 | B12 | 2 | 1 |
| 253-13 | A253 | B13 | 2 | 1 |
| 253-14 | A253 | B14 | 2 | 1 |
| 253-15 | A253 | B15 | 2 | 1 |
| 253-16 | A253 | B16 | 2 | 1 |
| 253-17 | A253 | B17 | 2 | 1 |
| 253-18 | A253 | B18 | 2 | 1 |
| 253-19 | A253 | B19 | 2 | 1 |
| 253-20 | A253 | B20 | 2 | 1 |
| 253-21 | A253 | B21 | 2 | 1 |
| 253-22 | A253 | B22 | 2 | 1 |

TABLE 51-continued

| Compound No. | $L_2$ | $L_1$ | n2 | n1 |
|---|---|---|---|---|
| 253-23 | A253 | B23 | 2 | 1 |
| 253-24 | A253 | B24 | 2 | 1 |
| 253-25 | A253 | B25 | 2 | 1 |
| 253-26 | A253 | B26 | 2 | 1 |
| 253-27 | A253 | B27 | 2 | 1 |
| 253-28 | A253 | B28 | 2 | 1 |
| 253-29 | A253 | B29 | 2 | 1 |
| 253-30 | A253 | B30 | 2 | 1 |

TABLE 52

| Compound No. | $L_2$ | $L_1$ | n2 | n1 |
|---|---|---|---|---|
| 253-31 | A253 | B31 | 2 | 1 |
| 253-32 | A253 | B32 | 2 | 1 |
| 253-33 | A253 | B33 | 2 | 1 |
| 253-34 | A253 | B34 | 2 | 1 |
| 253-35 | A253 | B35 | 2 | 1 |
| 253-36 | A253 | B36 | 2 | 1 |
| 253-37 | A253 | B37 | 2 | 1 |
| 253-38 | A253 | B38 | 2 | 1 |
| 253-39 | A253 | B39 | 2 | 1 |
| 253-40 | A253 | B40 | 2 | 1 |
| 253-41 | A253 | B41 | 2 | 1 |
| 253-42 | A253 | B42 | 2 | 1 |
| 253-43 | A253 | B43 | 2 | 1 |
| 253-44 | A253 | B44 | 2 | 1 |
| 253-45 | A253 | B45 | 2 | 1 |
| 253-46 | A253 | B46 | 2 | 1 |
| 253-47 | A253 | B47 | 2 | 1 |
| 253-48 | A253 | B48 | 2 | 1 |
| 253-49 | A253 | B49 | 2 | 1 |
| 253-50 | A253 | B50 | 2 | 1 |
| 253-51 | A253 | B51 | 2 | 1 |
| 253-52 | A253 | B52 | 2 | 1 |
| 253-53 | A253 | B53 | 2 | 1 |
| 253-74 | A253 | B74 | 2 | 1 |
| 253-136 | A253 | B136 | 2 | 1 |
| 257-178 | A257 | B178 | 2 | 1 |
| 258-179 | A258 | B179 | 2 | 1 |
| 259-180 | A259 | B180 | 2 | 1 |
| 260-181 | A260 | B181 | 2 | 1 |
| 261-182 | A261 | B182 | 2 | 1 |

TABLE 53

| Compound No. | $L_2$ | $L_1$ | n2 | n1 |
|---|---|---|---|---|
| 262-183 | A262 | B183 | 2 | 1 |
| 263-184 | A263 | B184 | 2 | 1 |
| 264-185 | A264 | B185 | 2 | 1 |
| 265-186 | A265 | B186 | 2 | 1 |
| 266-187 | A266 | B187 | 2 | 1 |
| 266-188 | A266 | B188 | 2 | 1 |
| 267-189 | A267 | B189 | 2 | 1 |
| 267-190 | A267 | B190 | 2 | 1 |
| 268-191 | A268 | B191 | 2 | 1 |
| 269-192 | A269 | B192 | 2 | 1 |
| 270-193 | A270 | B193 | 2 | 1 |
| 271-194 | A271 | B194 | 2 | 1 |
| 272-195 | A272 | B195 | 2 | 1 |
| 274-196 | A274 | B196 | 2 | 1 |
| 275-197 | A275 | B197 | 2 | 1 |
| 276-198 | A276 | B198 | 2 | 1 |
| 277-199 | A277 | B199 | 2 | 1 |
| 278-200 | A278 | B200 | 2 | 1 |
| 279-201 | A279 | B201 | 2 | 1 |
| 280-202 | A280 | B202 | 2 | 1 |
| 281-203 | A281 | B203 | 2 | 1 |
| 282-204 | A282 | B204 | 2 | 1 |
| 283-205 | A283 | B205 | 2 | 1 |
| 284-209 | A284 | B209 | 2 | 1 |

TABLE 53-continued

| Compound No. | $L_2$ | $L_1$ | n2 | n1 |
|---|---|---|---|---|
| 285-231 | A285 | B231 | 2 | 1 |
| 286-340 | A286 | B340 | 2 | 1 |

TABLE 54

| Compound No. | $L_2$ | $L_1$ | n2 | n1 |
|---|---|---|---|---|
| 273-1 | A273 | B1 | 2 | 1 |
| 273-2 | A273 | B2 | 2 | 1 |
| 273-3 | A273 | B3 | 2 | 1 |
| 273-4 | A273 | B4 | 2 | 1 |
| 273-5 | A273 | B5 | 2 | 1 |
| 273-6 | A273 | B6 | 2 | 1 |
| 273-7 | A273 | B7 | 2 | 1 |
| 273-8 | A273 | B8 | 2 | 1 |
| 273-9 | A273 | B9 | 2 | 1 |
| 273-10 | A273 | B10 | 2 | 1 |
| 273-11 | A273 | B11 | 2 | 1 |
| 273-12 | A273 | B12 | 2 | 1 |
| 273-13 | A273 | B13 | 2 | 1 |
| 273-14 | A273 | B14 | 2 | 1 |
| 273-15 | A273 | B15 | 2 | 1 |
| 273-16 | A273 | B16 | 2 | 1 |
| 273-17 | A273 | B17 | 2 | 1 |
| 273-18 | A273 | B18 | 2 | 1 |
| 273-19 | A273 | B19 | 2 | 1 |
| 273-20 | A273 | B20 | 2 | 1 |
| 273-21 | A273 | B21 | 2 | 1 |
| 273-22 | A273 | B22 | 2 | 1 |
| 273-23 | A273 | B23 | 2 | 1 |
| 273-24 | A273 | B24 | 2 | 1 |
| 273-25 | A273 | B25 | 2 | 1 |
| 273-26 | A273 | B26 | 2 | 1 |
| 273-27 | A273 | B27 | 2 | 1 |
| 273-28 | A273 | B28 | 2 | 1 |
| 273-29 | A273 | B29 | 2 | 1 |
| 273-30 | A273 | B30 | 2 | 1 |

TABLE 55

| Compound No. | $L_2$ | $L_1$ | n2 | n1 |
|---|---|---|---|---|
| 273-31 | A273 | B31 | 2 | 1 |
| 273-32 | A273 | B32 | 2 | 1 |
| 273-33 | A273 | B33 | 2 | 1 |
| 273-34 | A273 | B34 | 2 | 1 |
| 273-35 | A273 | B35 | 2 | 1 |
| 273-36 | A273 | B36 | 2 | 1 |
| 273-37 | A273 | B37 | 2 | 1 |
| 273-38 | A273 | B38 | 2 | 1 |
| 273-39 | A273 | B39 | 2 | 1 |
| 273-40 | A273 | B40 | 2 | 1 |
| 273-41 | A273 | B41 | 2 | 1 |
| 273-42 | A273 | B42 | 2 | 1 |
| 273-43 | A273 | B43 | 2 | 1 |
| 273-44 | A273 | B44 | 2 | 1 |
| 273-45 | A273 | B45 | 2 | 1 |
| 273-46 | A273 | B46 | 2 | 1 |
| 273-47 | A273 | B47 | 2 | 1 |
| 273-48 | A273 | B48 | 2 | 1 |
| 273-49 | A273 | B49 | 2 | 1 |
| 273-50 | A273 | B50 | 2 | 1 |
| 273-51 | A273 | B51 | 2 | 1 |
| 273-52 | A273 | B52 | 2 | 1 |
| 273-53 | A273 | B53 | 2 | 1 |
| 273-74 | A273 | B74 | 2 | 1 |
| 257-136 | A273 | B136 | 2 | 1 |
| 257-137 | A273 | B137 | 2 | 1 |
| 257-138 | A273 | B138 | 2 | 1 |
| 257-139 | A273 | B139 | 2 | 1 |
| 257-140 | A273 | B140 | 2 | 1 |
| 257-141 | A273 | B141 | 2 | 1 |

TABLE 56

| Compound No. | $L_2$ | $L_1$ | n2 | n1 |
|---|---|---|---|---|
| 273-156 | A273 | B156 | 2 | 1 |
| 273-157 | A273 | B157 | 2 | 1 |
| 273-158 | A273 | B158 | 2 | 1 |
| 273-159 | A273 | B159 | 2 | 1 |
| 273-160 | A273 | B160 | 2 | 1 |
| 273-161 | A273 | B161 | 2 | 1 |
| 273-162 | A273 | B162 | 2 | 1 |
| 273-163 | A273 | B163 | 2 | 1 |
| 273-164 | A273 | B164 | 2 | 1 |
| 273-165 | A273 | B165 | 2 | 1 |
| 273-166 | A273 | B166 | 2 | 1 |
| 273-167 | A273 | B167 | 2 | 1 |
| 273-168 | A273 | B168 | 2 | 1 |
| 273-169 | A273 | B169 | 2 | 1 |
| 273-170 | A273 | B170 | 2 | 1 |
| 273-171 | A273 | B171 | 2 | 1 |
| 273-172 | A273 | B172 | 2 | 1 |
| 273-173 | A273 | B173 | 2 | 1 |
| 273-174 | A273 | B174 | 2 | 1 |
| 273-175 | A273 | B175 | 2 | 1 |
| 273-176 | A273 | B176 | 2 | 1 |
| 273-177 | A273 | B177 | 2 | 1 |
| 273-178 | A273 | B178 | 2 | 1 |
| 273-179 | A273 | B179 | 2 | 1 |
| 273-180 | A273 | B180 | 2 | 1 |
| 273-181 | A273 | B181 | 2 | 1 |
| 273-182 | A273 | B182 | 2 | 1 |
| 273-183 | A273 | B183 | 2 | 1 |
| 273-184 | A273 | B184 | 2 | 1 |
| 273-185 | A273 | B185 | 2 | 1 |

TABLE 57

| Compound No. | $L_2$ | $L_1$ | n2 | n1 |
|---|---|---|---|---|
| 273-186 | A273 | B186 | 2 | 1 |
| 273-187 | A273 | B187 | 2 | 1 |
| 273-188 | A273 | B188 | 2 | 1 |
| 273-189 | A273 | B189 | 2 | 1 |
| 273-190 | A273 | B190 | 2 | 1 |
| 273-191 | A273 | B191 | 2 | 1 |
| 273-192 | A273 | B192 | 2 | 1 |
| 273-193 | A273 | B193 | 2 | 1 |
| 273-194 | A273 | B194 | 2 | 1 |
| 273-195 | A273 | B195 | 2 | 1 |
| 273-196 | A273 | B196 | 2 | 1 |
| 273-197 | A273 | B197 | 2 | 1 |
| 273-198 | A273 | B198 | 2 | 1 |
| 273-199 | A273 | B199 | 2 | 1 |
| 273-200 | A273 | B200 | 2 | 1 |
| 273-201 | A273 | B201 | 2 | 1 |
| 273-202 | A273 | B202 | 2 | 1 |
| 273-203 | A273 | B203 | 2 | 1 |
| 273-204 | A273 | B204 | 2 | 1 |
| 273-205 | A273 | B205 | 2 | 1 |
| 273-209 | A273 | B209 | 2 | 1 |
| 273-231 | A273 | B231 | 2 | 1 |
| 273-340 | A273 | B340 | 2 | 1 |
| 277-1 | A277 | B1 | 2 | 1 |
| 278-4 | A278 | B4 | 2 | 1 |
| 279-8 | A279 | B8 | 2 | 1 |
| 280-10 | A280 | B10 | 2 | 1 |
| 281-13 | A281 | B13 | 2 | 1 |
| 282-20 | A282 | B20 | 2 | 1 |
| 283-24 | A283 | B24 | 2 | 1 |
| 284-27 | A284 | B27 | 2 | 1 |

TABLE 58

| Compound No. | $L_2$ | $L_1$ | n2 | n1 |
|---|---|---|---|---|
| 285-48 | A285 | B48 | 2 | 1 |
| 286-62 | A286 | B62 | 2 | 1 |

TABLE 58-continued

| Compound No. | $L_2$ | $L_1$ | n2 | n1 |
|---|---|---|---|---|
| 287-63 | A287 | B63 | 2 | 1 |
| 288-85 | A288 | B85 | 2 | 1 |
| 289-1 | A289 | B1 | 2 | 1 |
| 290-4 | A290 | B4 | 2 | 1 |
| 291-8 | A291 | B8 | 2 | 1 |
| 292-10 | A292 | B10 | 2 | 1 |
| 293-13 | A293 | B13 | 2 | 1 |
| 294-20 | A294 | B20 | 2 | 1 |
| 295-24 | A295 | B24 | 2 | 1 |
| 296-27 | A296 | B27 | 2 | 1 |
| 297-48 | A297 | B48 | 2 | 1 |
| 298-62 | A298 | B62 | 2 | 1 |
| 299-63 | A299 | B63 | 2 | 1 |
| 300-85 | A300 | B85 | 2 | 1 |
| 300-360 | A300 | B360 | 2 | 1 |

TABLE 59

| Compound No. | $L_2$ | $L_1$ | n2 | n1 |
|---|---|---|---|---|
| 1-1N | A1 | B1 | 1 | 2 |
| 2-2N | A2 | B2 | 1 | 2 |
| 5-7N | A5 | B7 | 1 | 2 |
| 11-9N | A11 | B9 | 1 | 2 |
| 13-11N | A15 | B11 | 1 | 2 |
| 27-20N | A27 | B20 | 1 | 2 |
| 28-22N | A28 | B22 | 1 | 2 |
| 66-24N | A66 | B24 | 1 | 2 |
| 109-29N | A109 | B29 | 1 | 2 |
| 113-35N | A113 | B35 | 1 | 2 |
| 116-47 N | A116 | B47 | 1 | 2 |
| 118-49N | A118 | B49 | 1 | 2 |
| 136-137N | A136 | B137 | 1 | 2 |
| 137-162N | A137 | B162 | 1 | 2 |
| 1-187N | A1 | B187 | 1 | 2 |
| 2-200N | A2 | B200 | 1 | 2 |
| 5-201N | A5 | B201 | 1 | 2 |
| 11-202N | A11 | B202 | 1 | 2 |
| 15-1N | A15 | B1 | 1 | 2 |
| 27-22N | A27 | B22 | 1 | 2 |
| 28-7N | A28 | B7 | 1 | 2 |
| 66-9N | A66 | B9 | 1 | 2 |
| 109-11N | A109 | B11 | 1 | 2 |
| 113-20N | A113 | B20 | 1 | 2 |
| 116-22N | A116 | B22 | 1 | 2 |
| 118-24N | A118 | B24 | 1 | 2 |
| 136-29N | A136 | B29 | 1 | 2 |
| 137-35N | A137 | B35 | 1 | 2 |

TABLE 60

| Compound No. | $L_2$ | $L_1$ | n2 | n1 |
|---|---|---|---|---|
| 151-201N | A151 | B201 | 1 | 2 |
| 152-202N | A152 | B202 | 1 | 2 |
| 155-1N | A155 | B1 | 1 | 2 |
| 180-2N | A180 | B2 | 1 | 2 |
| 201-7N | A201 | B7 | 1 | 2 |
| 202-9N | A202 | B9 | 1 | 2 |
| 228-11N | A228 | B11 | 1 | 2 |
| 258-20N | A258 | B20 | 1 | 2 |
| 263-22N | A263 | B22 | 1 | 2 |
| 264-24N | A264 | B24 | 1 | 2 |
| 265-29N | A265 | B29 | 1 | 2 |
| 266-35N | A266 | B35 | 1 | 2 |
| 267-47N | A267 | B47 | 1 | 2 |
| 268-49N | A268 | B49 | 1 | 2 |
| 269-137N | A269 | B137 | 1 | 2 |
| 270-162N | A270 | B162 | 1 | 2 |
| 271-187N | A271 | B187 | 1 | 2 |
| 273-200N | A273 | B200 | 1 | 2 |
| 174-201N | A274 | B201 | 1 | 2 |
| 282-202N | A282 | B202 | 1 | 2 |

TABLE 60-continued

| Compound No. | $L_2$ | $L_1$ | n2 | n1 |
|---|---|---|---|---|
| 151-2N | A151 | B2 | 1 | 2 |
| 152-7N | A152 | B7 | 1 | 2 |
| 155-9N | A155 | B9 | 1 | 2 |
| 180-11N | A180 | B11 | 1 | 2 |
| 201-20N | A201 | B20 | 1 | 2 |
| 202-22N | A202 | B22 | 1 | 2 |
| 228-24N | A228 | B24 | 1 | 2 |
| 258-29N | A258 | B29 | 1 | 2 |
| 263-35N | A263 | B35 | 1 | 2 |

$L_1$ in the organometallic compound represented by Formula 1 may be a ligand represented by Formula 2-1, n1, which is the number of $L_1$(s) may be 1, 2, or 3. That is, the organometallic compound represented by Formula 1 essentially includes $L_1$, which is a ligand represented by Formula 2-1, and in Formula 2-1, i) a lowest unoccupied molecular orbital (LUMO) ring is an imidazole-based ring which is substituted with $Ar_1$ (which is a polycyclic group unsubstituted or substituted with at least one $Z_0$, wherein the polycyclic group is a condensed cyclic group in which three or more cyclic groups are condensed with each other, and each of the cyclic groups is a $C_5$-$C_{30}$ carbocyclic group or a $C_1$-$C_{30}$ heterocyclic group), and which is condensed with ring $CY_1$, ii) a highest occupied molecular orbital (HOMO) ring is a polycyclic group in which a 6-membered ring, a 5-membered ring, and a 6-membered ring are condensed with each other, as can be seen in Formula 2-1'. Thereby, the steric hindrance between $Ar_1$ of the LUMO ring of Formula 2-1 and the HOMO ring of Formula 2-1 is increased, so that the rigidity of the organometallic compound represented by Formula 1 can be improved, and thus, when the organometallic compound molecule represented by Formula 1 changes from a ground state to an excited state, the molecular distortion may occur less, and accordingly, the decrease in efficiency due to the non-luminescent transition can be prevented, and the formation of a metal-centered transition state in the metal may be prevented.

Formula 2-1′

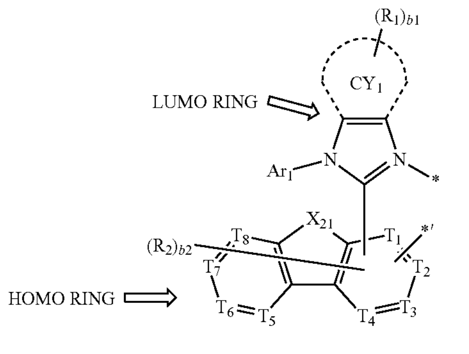

Accordingly, an electronic device using the organometallic compound represented by Formula 1, for example, an organic light-emitting device using the organometallic compound represented by Formula 1 may have excellent luminescent efficiency and/or long lifespan characteristics.

The highest occupied molecular orbital (HOMO) energy level, lowest unoccupied molecular orbital (LUMO) energy level, $S_1$ energy level, and $T_1$ energy level of some compounds of the organometallic compound represented by Formula 1 were evaluated using the Gaussian 09 program with the molecular structure optimization obtained by B3LYP-based density functional theory (DFT), and results thereof are shown in Table 61.

TABLE 61

| Compound No. | HOMO (eV) | LUMO (eV) | $S_1$(eV) | T1(eV) |
|---|---|---|---|---|
| 2-81 | −4.657 | −1.160 | 2.856 | 2.518 |
| 118-206 | −4.720 | −1.151 | 2.483 | 2.840 |
| 144-6 | −4.792 | −1.273 | 2.538 | 2.831 |
| 151-340 | −4.766 | −1.202 | 2.529 | 2.857 |
| 229-131 | −4.716 | −1.191 | 2.484 | 2.840 |
| 266-66 | −4.676 | −1.193 | 2.627 | 2.888 |
| 273-11 | −4.688 | −1.173 | 2.484 | 2.864 |

Referring to the results of Table 61, the organometallic compound represented by Formula 1 was found to have suitable electrical characteristics for use as a dopant in an electronic device, e.g., an organic light-emitting device.

Synthesis methods of the organometallic compound represented by Formula 1 may be understood by one of ordinary skill in the art by referring to Synthesis Examples provided below.

Accordingly, the organometallic compound represented by Formula 1 is suitable for use as a material for an organic layer of organic light-emitting device, for example, a dopant in an emission layer of the organic layer. Thus, another aspect provides an organic light-emitting device including: a first electrode; a second electrode; and an organic layer located between the first electrode and the second electrode and including an emission layer, and the organic layer includes at least one of the organometallic compounds represented by Formula 1.

Due to the inclusion of an organic layer including the organometallic compound represented by Formula 1, the organic light-emitting device may have high external quantum efficiency and long lifespan characteristics.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host). The emission layer may emit, for example, green light or blue light.

The expression “(an organic layer) includes at least one of organometallic compounds” used herein may include a case in which “(an organic layer) includes identical organometallic compounds represented by Formula 1” and a case in which “(an organic layer) includes two or more different organometallic compounds represented by Formula 1.”

For example, the organic layer may include, as the organometallic compound, only Compound 1. In this embodiment, Compound 1 may be included in the emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer may further include a hole transport region located between the first electrode and the emission layer and an electron transport region located between the emission layer and the second electrode, and the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" used herein refers to a single layer and/or a plurality of layers between the first electrode and the second electrode of the organic light-emitting device. The "organic layer" may include, in addition to an organic compound, an organometallic complex including metal.

FIG. 1s a schematic cross-sectional view of an organic light-emitting device 10 according to an embodiment. Hereinafter, the structure and manufacturing method of the organic light-emitting device 10 according to an embodiment of the present disclosure will be described in connection with FIGURE. The organic light-emitting device 10 includes a first electrode 11, an organic layer 15, and a second electrode 19, which are sequentially stacked.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and water repellency.

The first electrode 11 may be produced by depositing or sputtering, onto the substrate, a material for forming the first electrode 11. The first electrode 11 may be an anode. The material for forming the first electrode 11 may include materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode may include metal, such as magnesium (Mg), aluminum (Al), aluminum-lithium (Al—Li), calcium (Ca), magnesium-indium (Mg—In), magnesium-silver (Mg—Ag), or a combination thereof.

The first electrode 11 may have a single-layered structure or a multi-layered structure including a plurality of layers. For example, the first electrode 11 may have a three-layered structure of ITO/Ag/ITO.

The organic layer 15 is located on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or any combination thereof.

The hole transport region may include either a hole injection layer by itself or a hole transport layer by itself. In one or more embodiments, the hole transport region may have a hole injection layer/hole transport layer structure or a hole injection layer/hole transport layer/electron blocking layer structure, wherein, for each structure, respective layers are sequentially stacked in this stated order from the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary depending on a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec.

When the hole injection layer is formed by spin coating, the coating conditions may vary depending on a material for forming the hole injection layer, and the structure and thermal characteristics of the hole injection layer. For example, the coating conditions may include a coating speed in a range of about 2,000 rpm to about 5,000 rpm and a heat treatment temperature in a range of about 80° C. to about 200° C. for removing a solvent after coating.

The conditions for forming the hole transport layer and the electron blocking layer may be the same as the conditions for forming the hole injection layer.

The hole transport region may be m-MTDATA, TDATA, 2-TNATA, NPB, β-NPB, TPD, Spiro-TPD, Spiro-NPB, methylated NPB, TAPC, HMTPD, 4,4',4"-tris(N-carbazolyl) triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

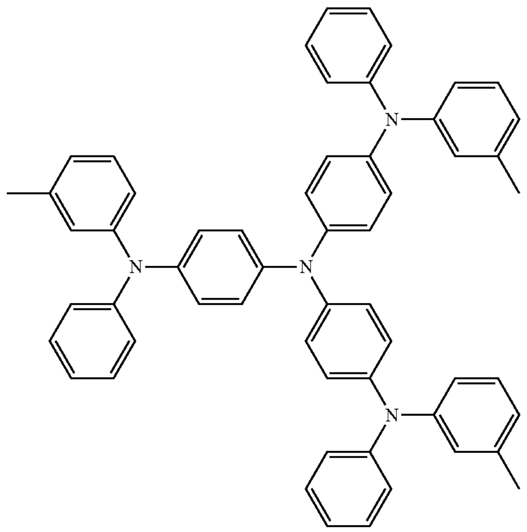

m-MTDATA

-continued
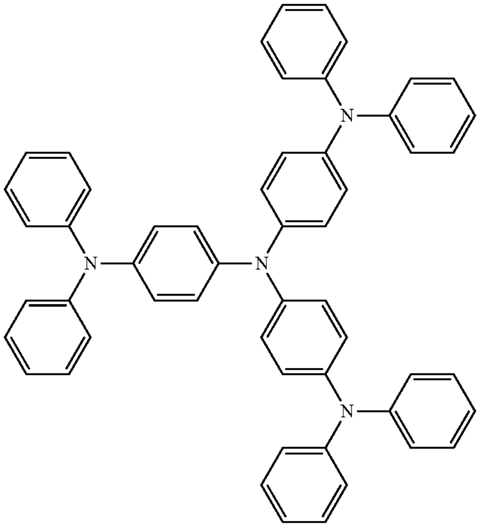
TDATA
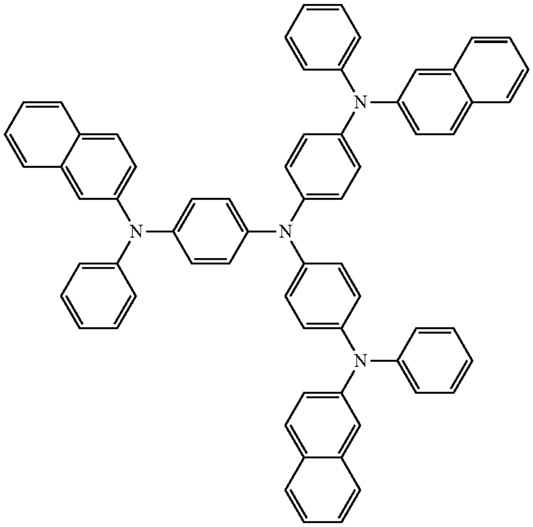
2-TNATA
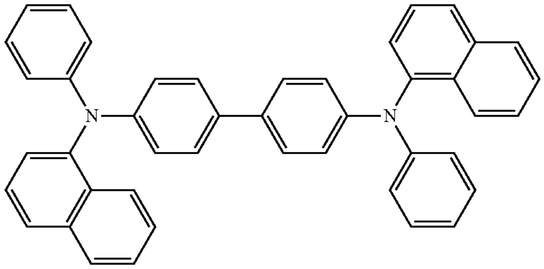
NPB
-continued
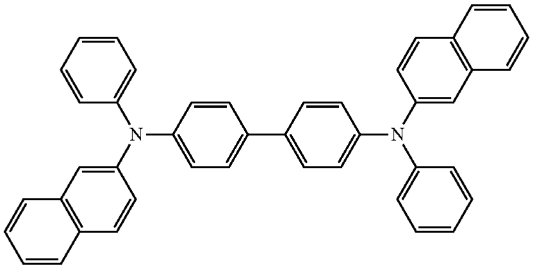
β-NPB
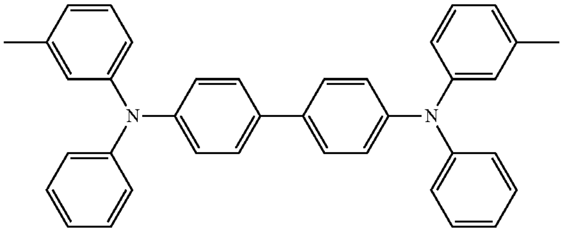
TPD
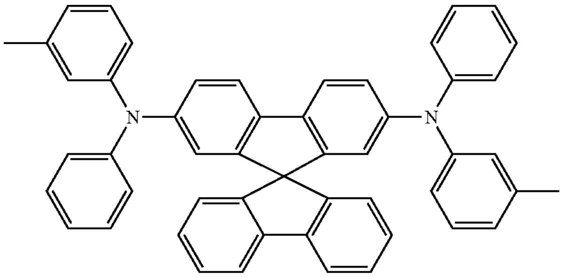
Spiro-TPD
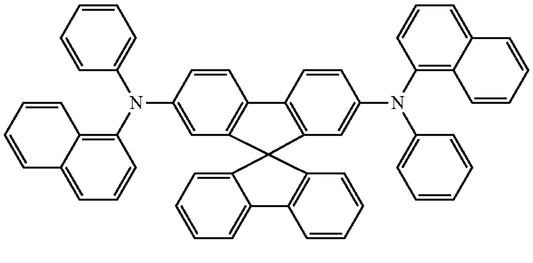
Spiro-NPD
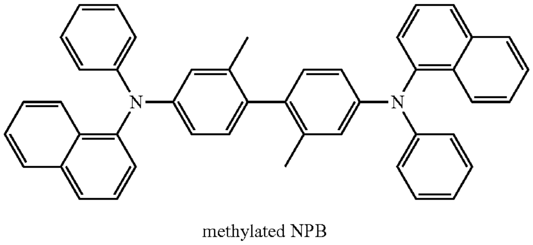
methylated NPB -continued

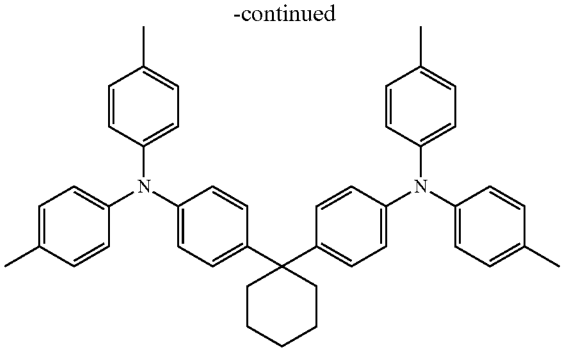

TAPC

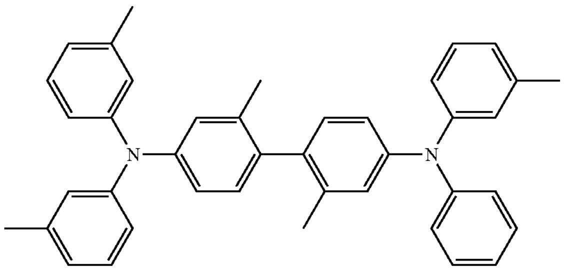

HMTPD

Formula 201

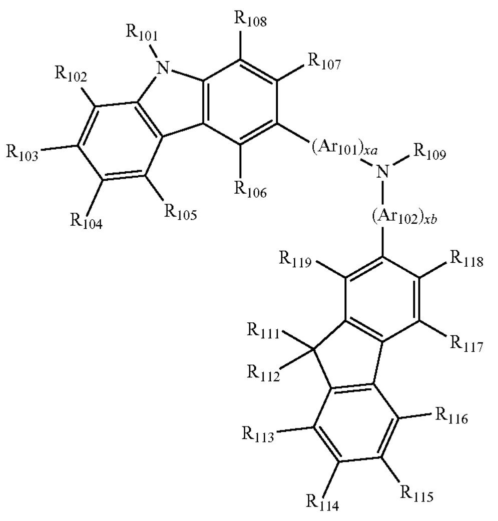

Formula 202

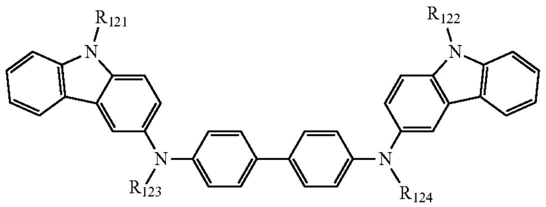

$Ar_{101}$ and $Ar_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

xa and xb in Formula 201 may each independently be an integer from 0 to 5, or 0, 1, or 2. For example, xa may be 1 and xb may be 0.

$R_{101}$ to $R_{108}$, $R_{111}$ to $R_{119}$ and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, etc.), or a $C_1$-$C_{10}$ alkoxy group (for example, a methoxy group, an ethoxy group, a propoxy group, a butoxy group, a pentoxy group, etc.);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof.

$R_{109}$ in Formula 201 may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In one embodiment, the compound represented by Formula 201 may be represented by Formula 201A:
Formula 201A
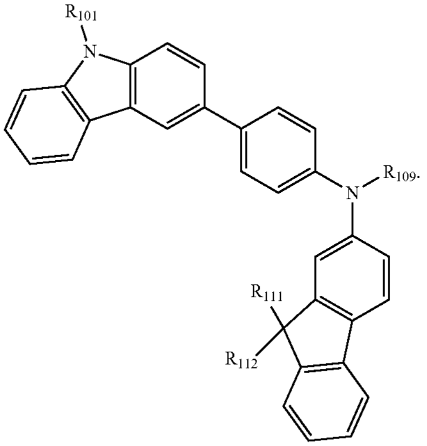
$R_{101}$, $R_{111}$, $R_{112}$, and $R_{109}$ in Formula 201A are each the same as described in the present specification.
For example, the hole transport region may include one of Compounds HT1 to HT20 or any combination thereof:
HT1
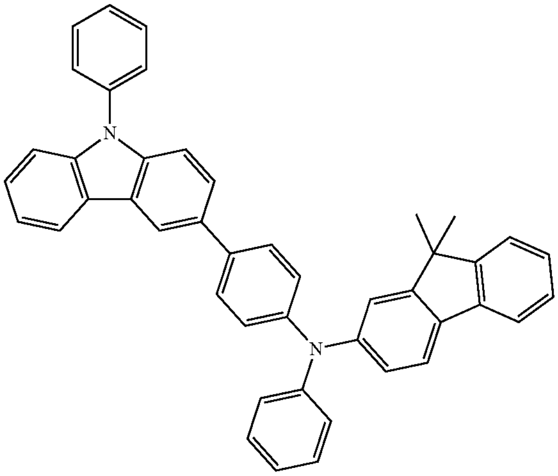
-continued
HT2
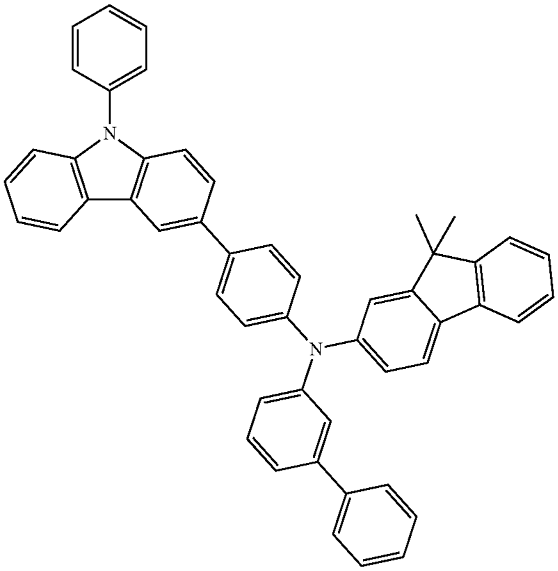
HT3
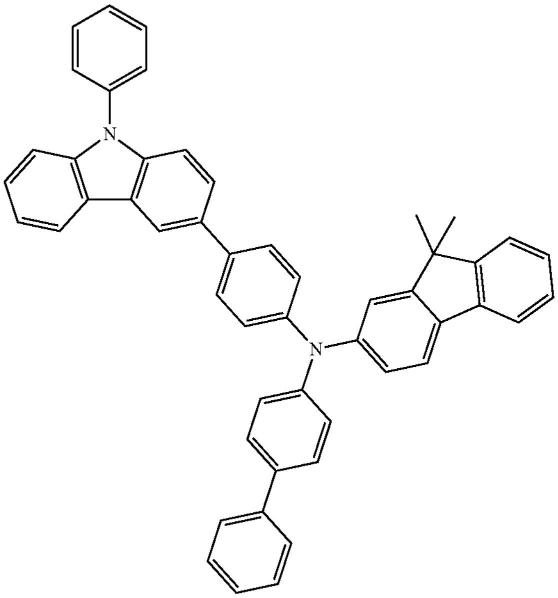

-continued
HT4
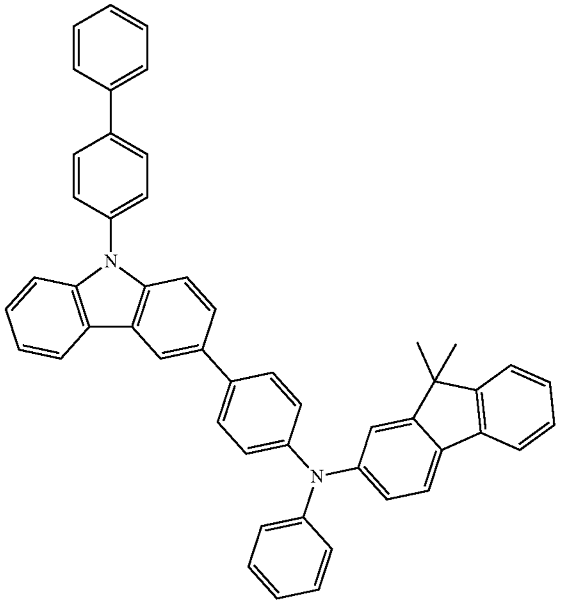
HT5
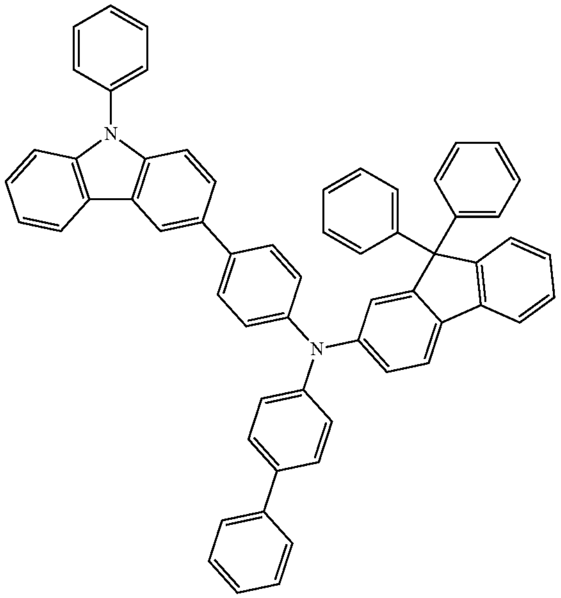
-continued
HT6
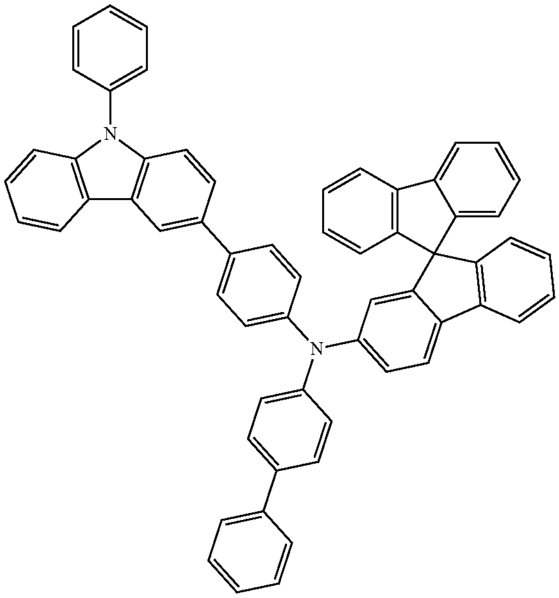
HT7
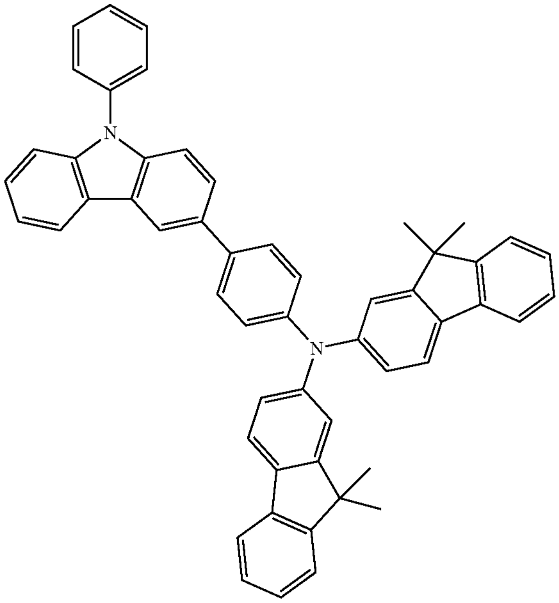

-continued
HT8
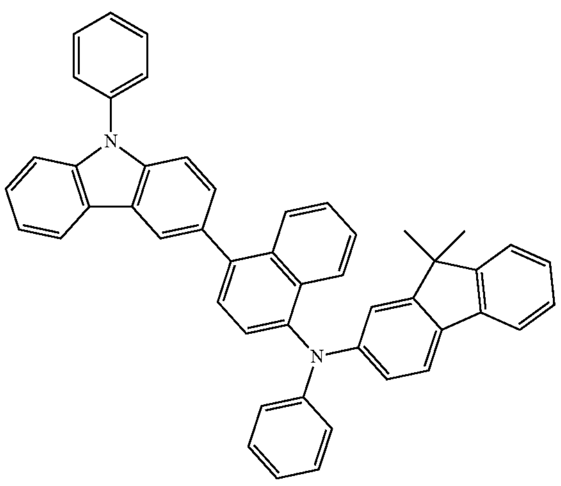
HT9
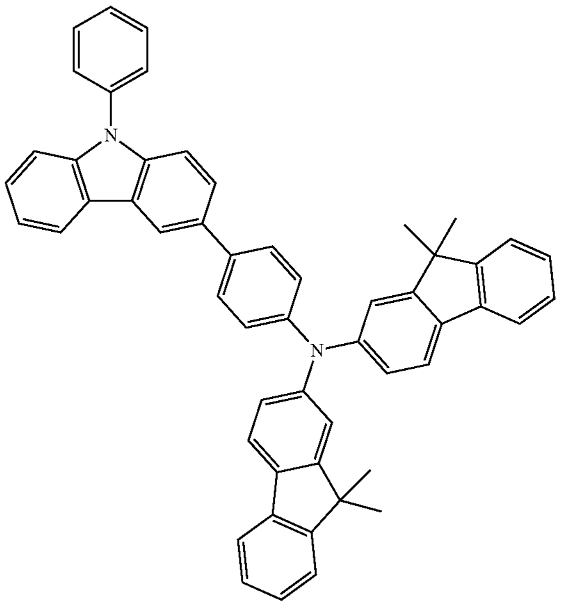
-continued
HT10
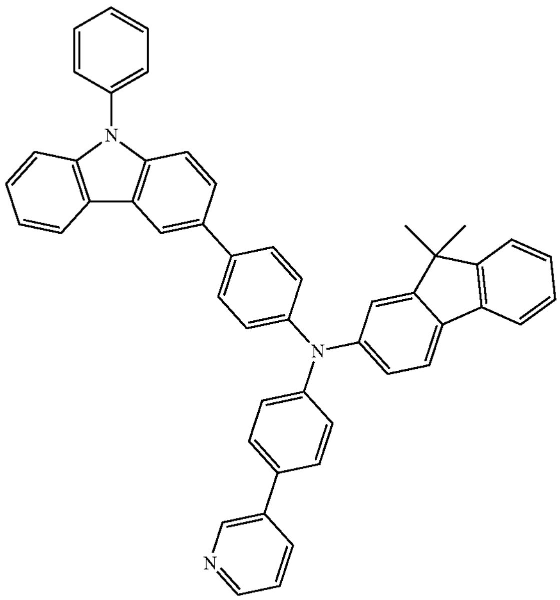
HT11
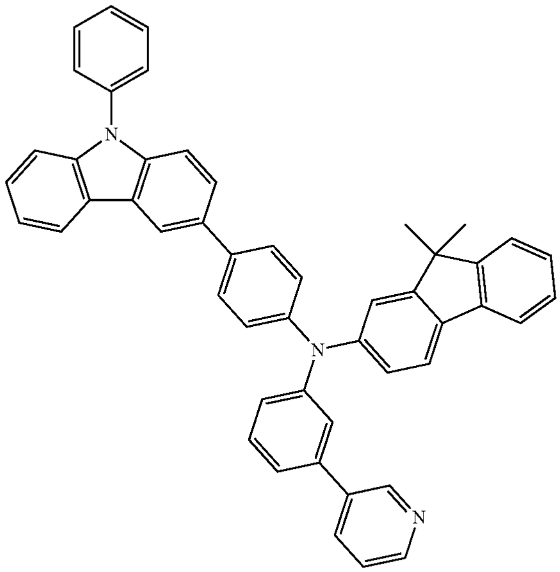

HT12
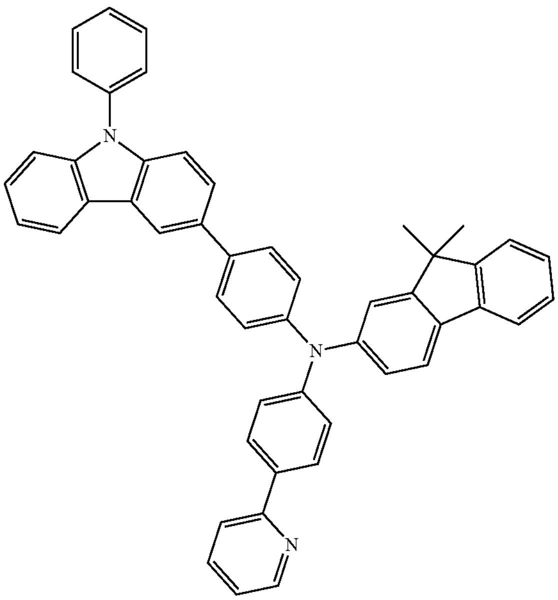
HT13
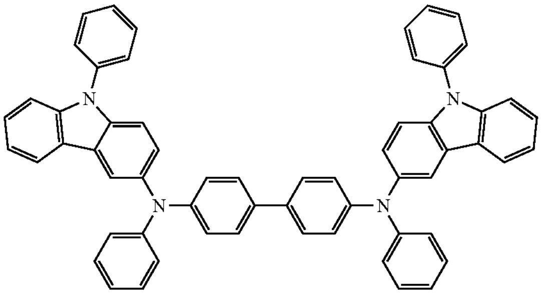
HT14
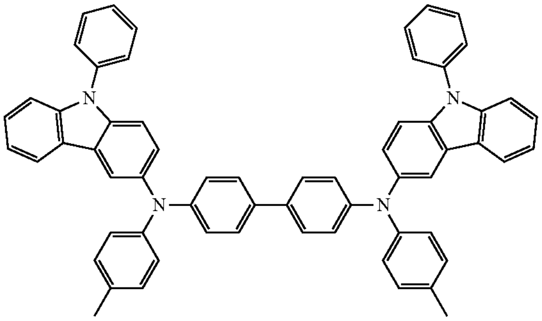
HT15
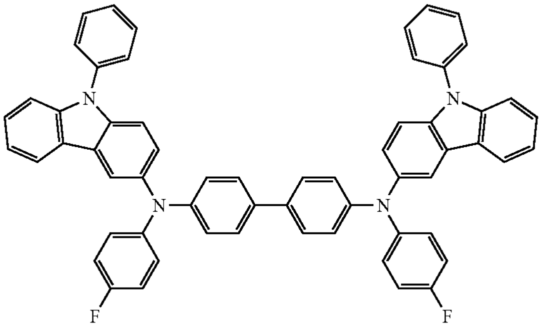
HT16
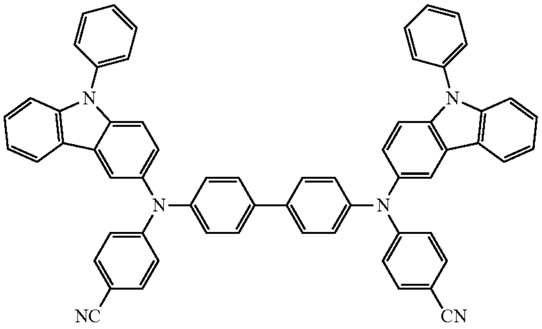
HT17
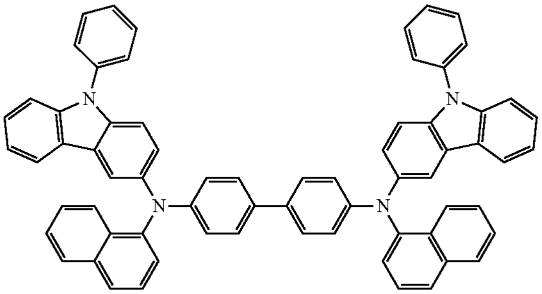
HT18
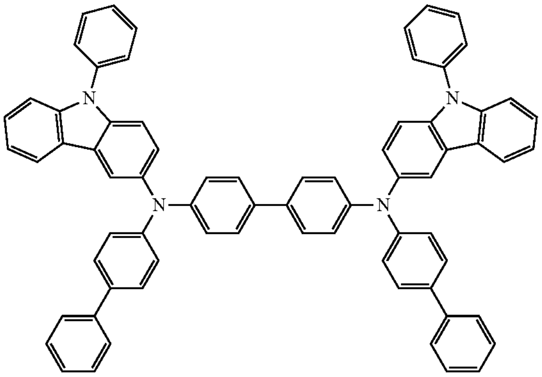
HT19
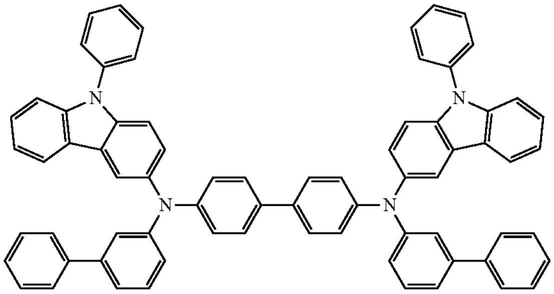

-continued

HT20

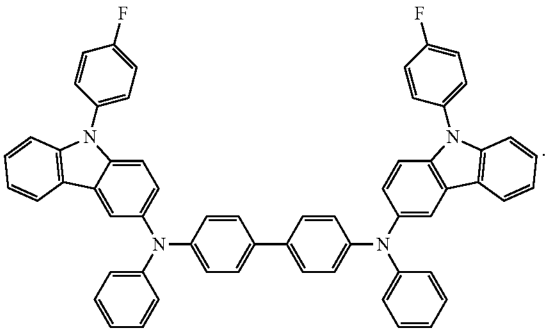

A thickness of the hole transport region may be in the range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, a cyano group-containing compound, or any combination thereof. For example, the p-dopant may be: a quinone derivative such as tetracyanoquinonedimethane (TCNQ), 2,3,5,6-tetrafluoro-tetracyano-1,4-benzoquinonedimethane (F4-TCNQ), or F6-TCNNQ; metal oxide, such as tungsten oxide and molybdenum oxide; a cyano group-containing compound, such as Compound HT-D1; or any combination thereof.

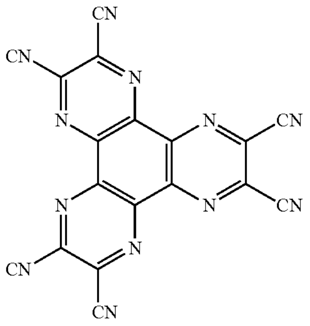

HT-D1

-continued

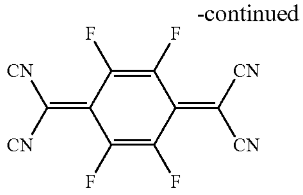

F4-TCNQ

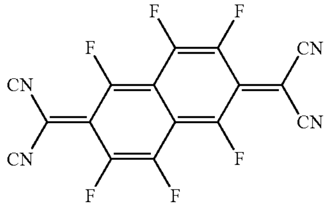

F6-TCNNQ

The hole transport region may include a buffer layer.

Also, the buffer layer may compensate for an optical resonance distance according to a wavelength of light emitted from the emission layer, and thus, efficiency of a formed organic light-emitting device may be improved.

Meanwhile, when the hole transport region includes an electron blocking layer, a material for forming the electron blocking layer may include a material that is used in the hole transport region as described above, a host material described below, or any combination thereof. In some embodiments, when the hole transport region includes an electron blocking layer, mCP or the like described herein may be used for forming the electron blocking layer.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the emission layer.

The emission layer may include a host and a dopant, and the dopant may include the organometallic compound represented by Formula 1 as described herein.

The host may include TPBi, TBADN, ADN(also referred to as "DNA"), CBP, CDBP, TCP, mCP, Compound H50, Compound H51, Compound H52, H-H1(see Example 1), Compound H-E43 (see Example 1), or any combination thereof:

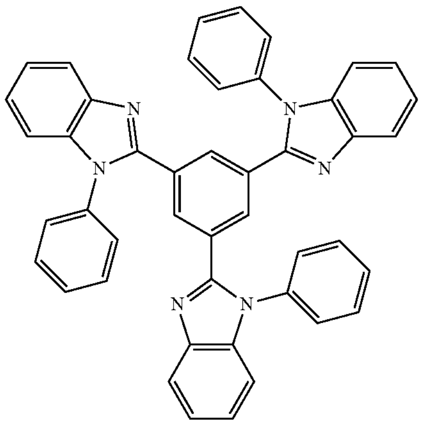

TPBi

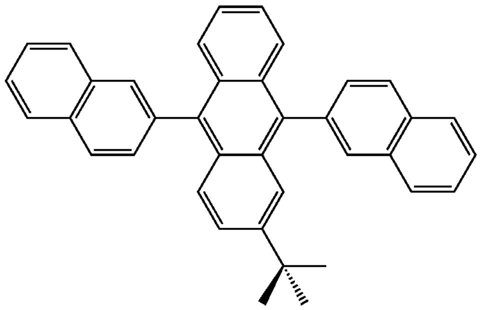

TBADN

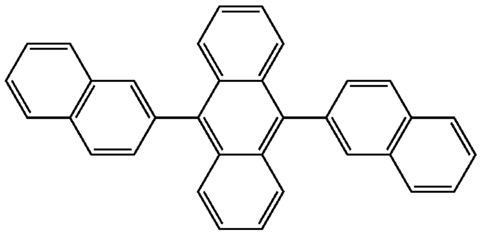

ADN

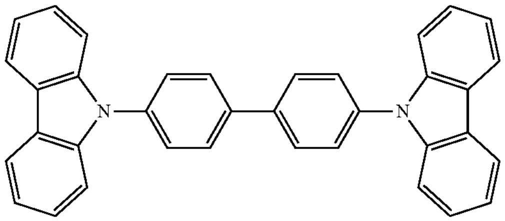

CBP

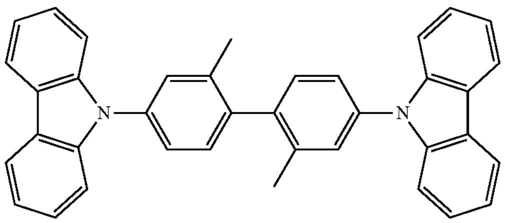

CDBP

-continued

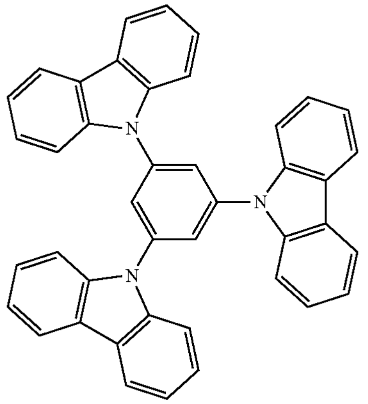

TCP

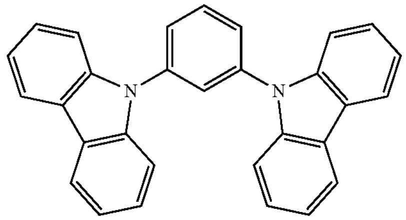

mCP

H50

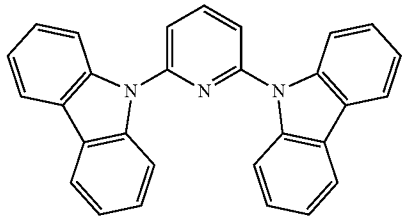

H51

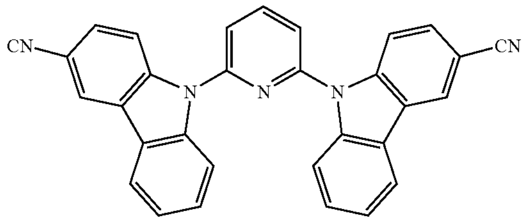

H52

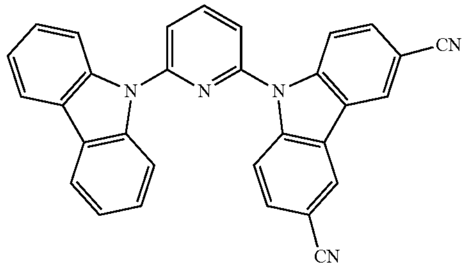

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 part by weight to about 15 parts by weight based on 100 parts by weight of the host.

A thickness of the emission layer may be in a range of about 100 Å to about 1,000 Å, for example, about 200 Å to about 600 Å. When the thickness of the emission layer is within these ranges, excellent light-emission characteristics may be obtained without a substantial increase in driving voltage.

An electron transport region may be located on the emission layer.

The electron transport region may include a hole blocking layer, an electron transport layer, an electron injection layer, or a combination thereof.

For example, the electron transport region may have a hole blocking layer/electron transport layer/electron injection layer structure or an electron transport layer/electron injection layer structure. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, Bphen, BAlq, or any combination thereof:

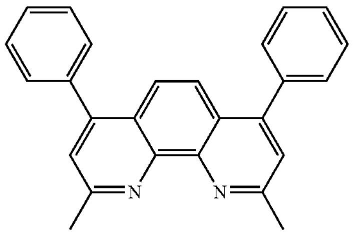

BCP

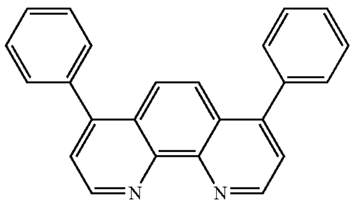

Bphen

A thickness of the hole blocking layer may be in a range of about 20 Å to about 1,000 Å, for example, about 30 Å to about 600 Å. When the thickness of the hole blocking layer is within these ranges, excellent hole blocking characteristics may be obtained without a substantial increase in driving voltage.

The electron transport layer may include BCP, Bphen, TPBi, $Alq_3$, Balq, TAZ, NTAZ, or any combination thereof:

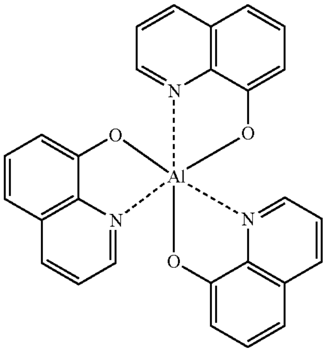

$Alq_3$

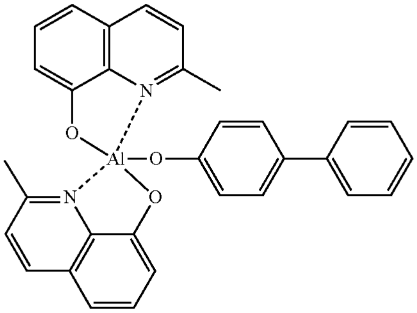

BAlq

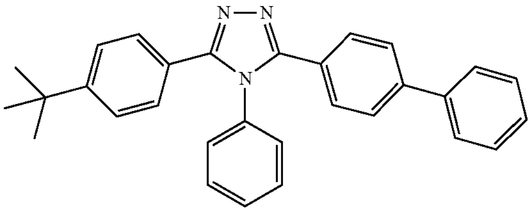

TAZ

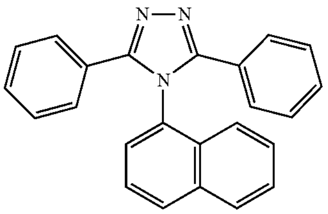

NTAZ

In one or more embodiments, the electron transport layer may include one of Compounds ET1 to ET25 or any combination thereof:
ET1
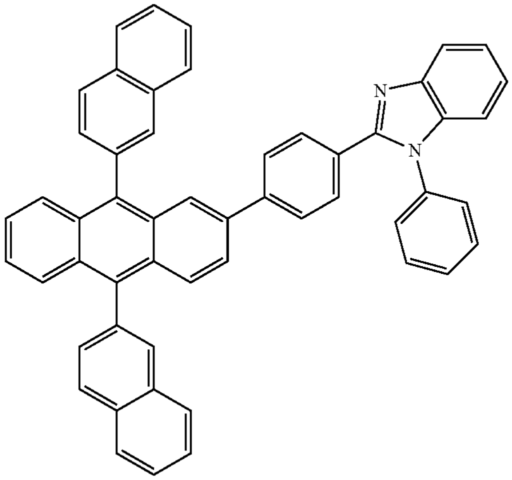
ET2
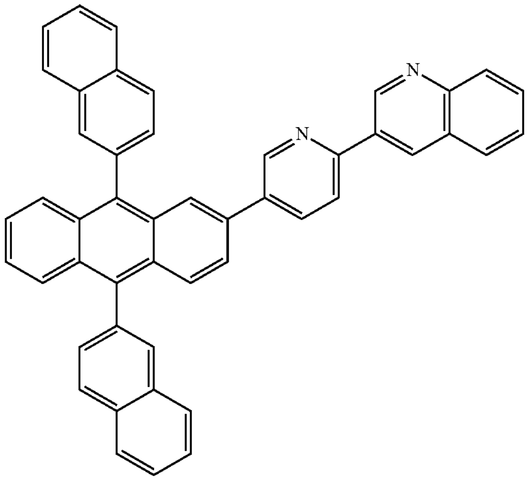
ET3
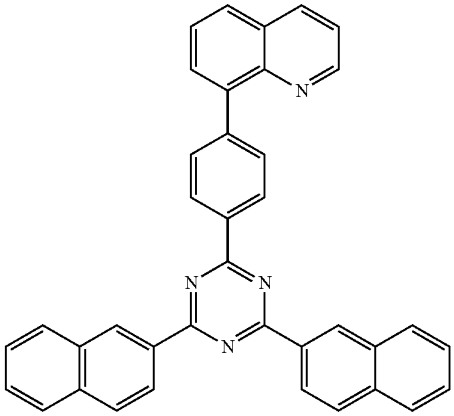
-continued
ET4
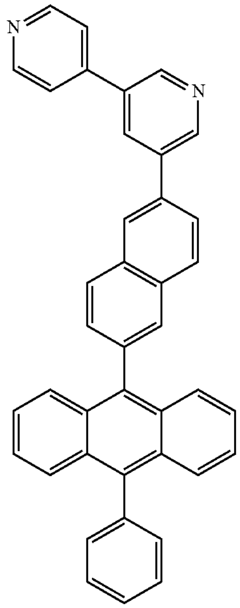
ET5
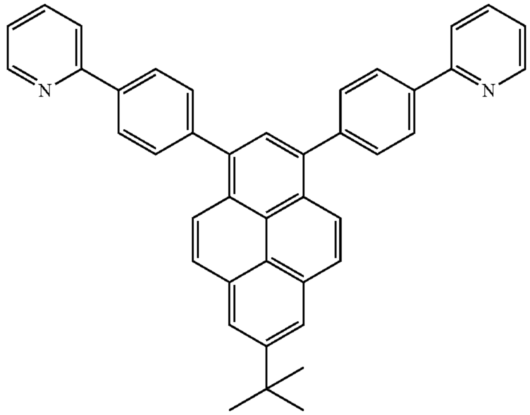
ET6
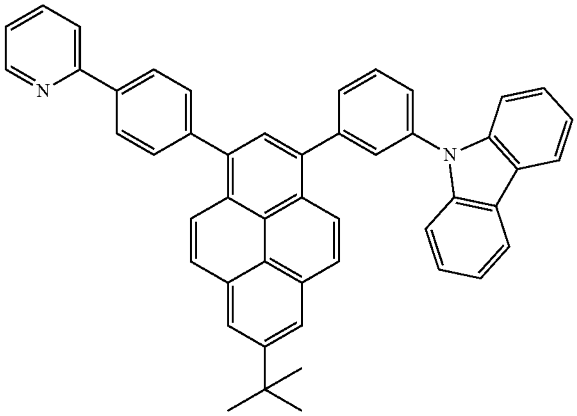

-continued
ET7
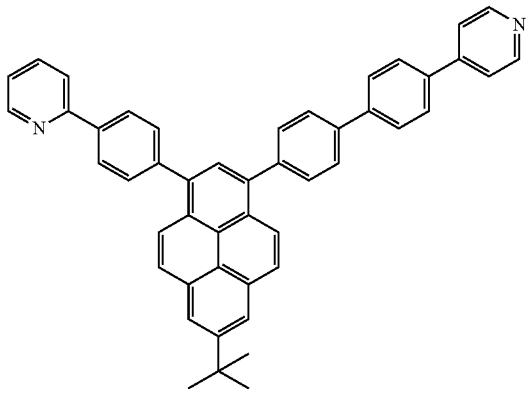
ET8
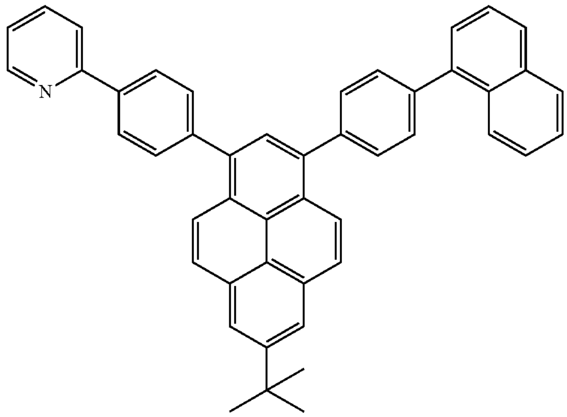
ET9
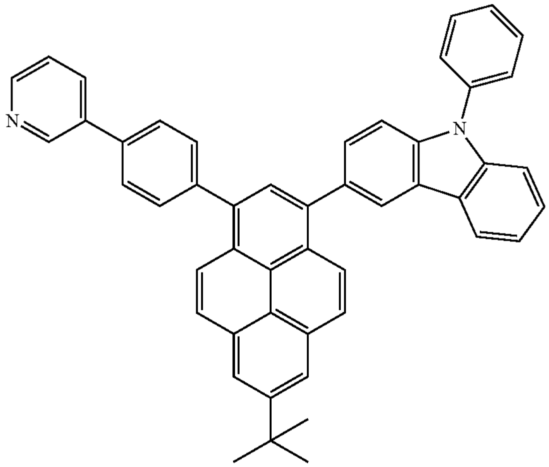
-continued
ET10
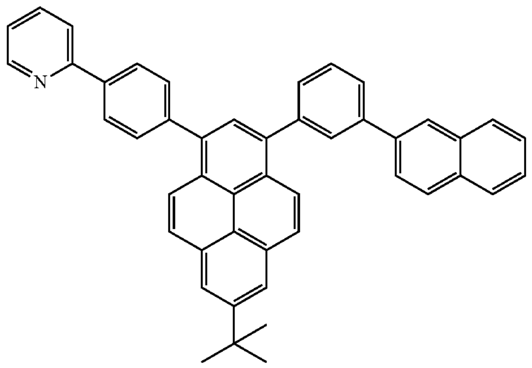
ET11
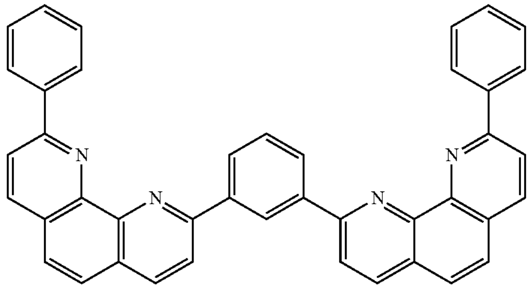
ET12
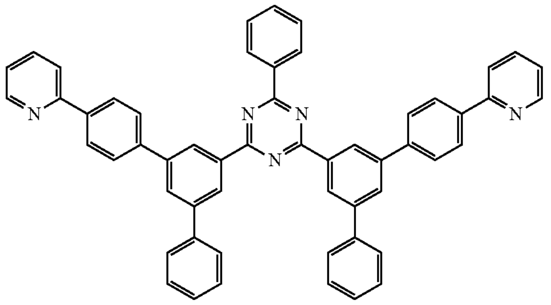
ET13
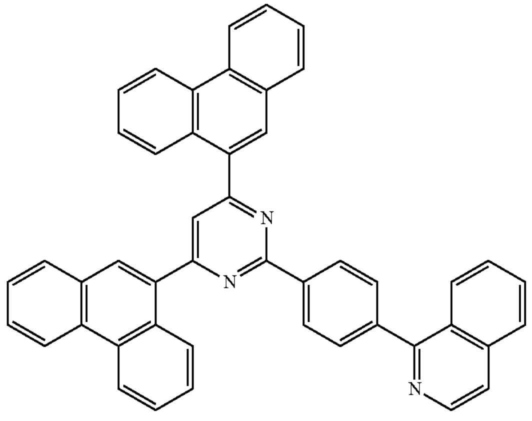

-continued
ET14
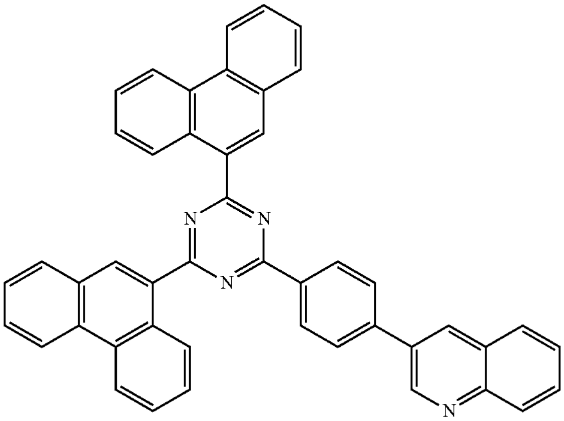
ET15
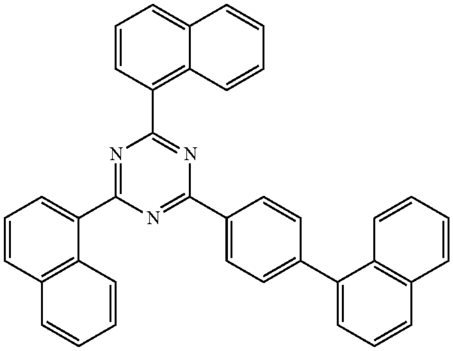
ET16
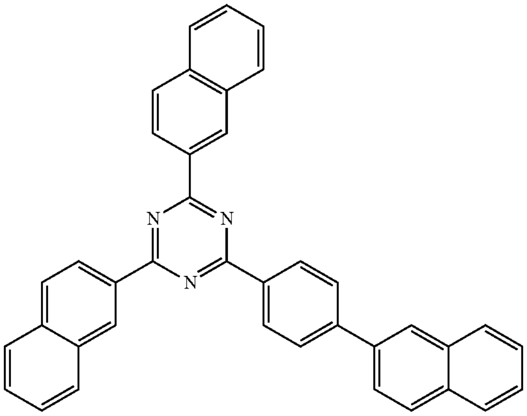
-continued
ET17
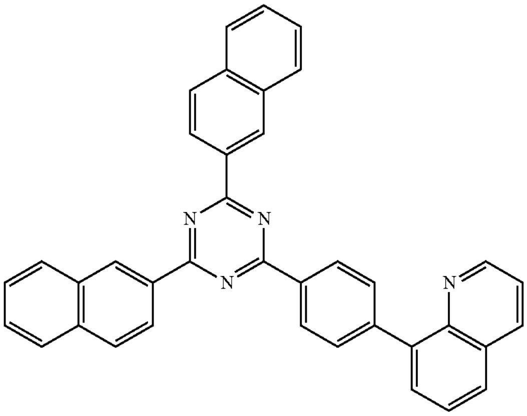
ET18
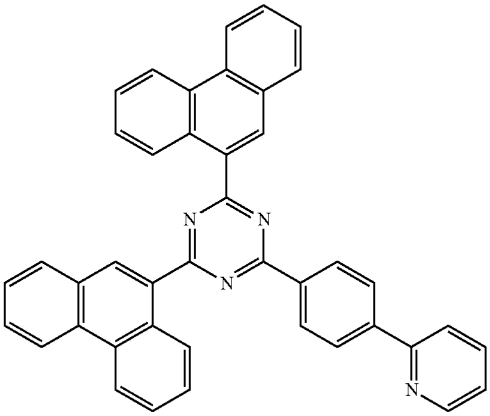
ET19
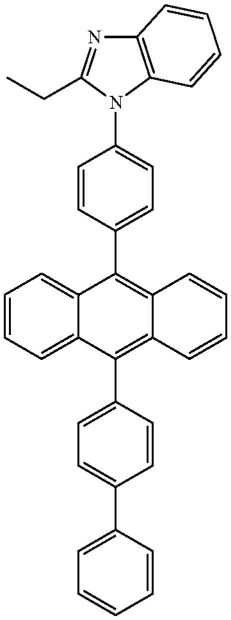

-continued
ET20
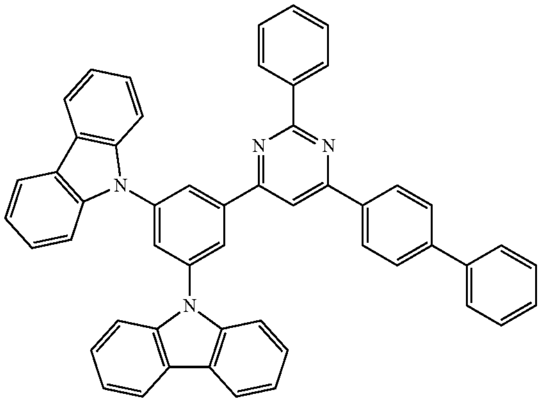
ET21
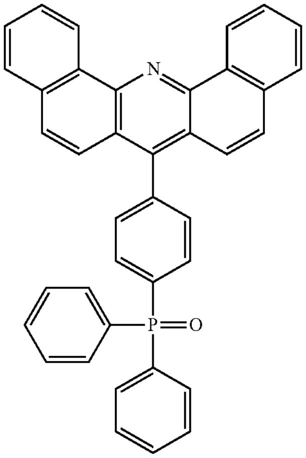
ET22
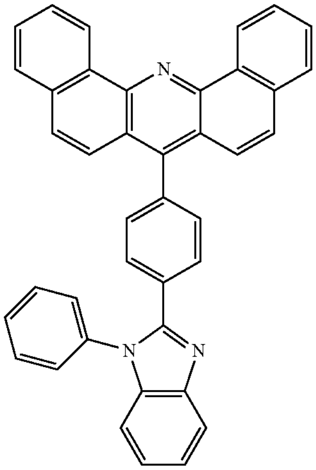
-continued
ET23
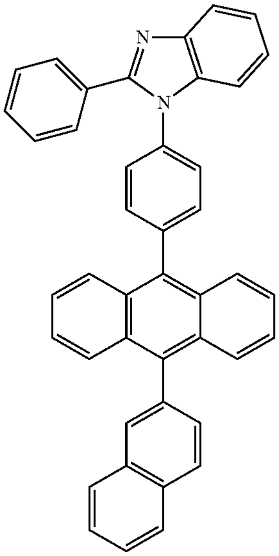
ET24
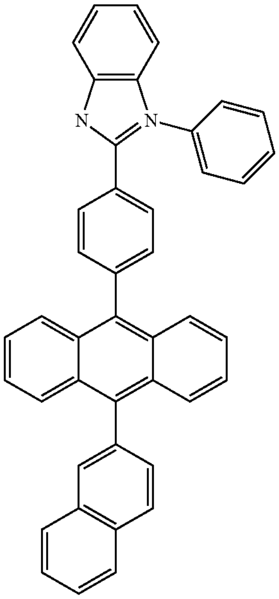
ET25
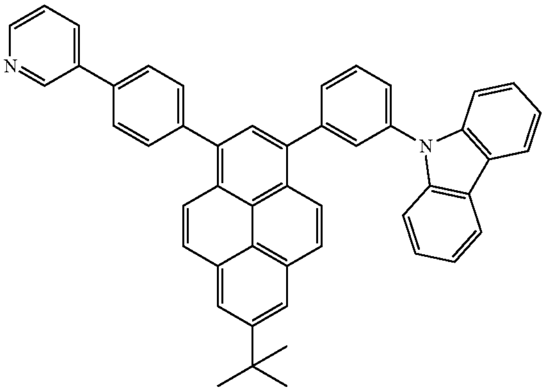
A thickness of the electron transport layer may be in the range of about 100 Å to about 1,000 Å, for example, about 150 Å to about 500 Å. When the thickness of the electron transport layer is within the range described above, the electron transport layer may have satisfactory electron transporting characteristics without a substantial increase in driving voltage.

The electron transport layer may include a metal-containing material in addition to the material as described above.

The metal-containing material may include a Li complex. The Li complex may include, for example, Compound ET-D1 or ET-D2:

ET-D1

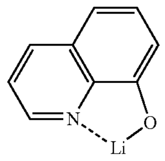

ET-D2

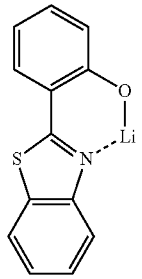

The electron transport region may include an electron injection layer that promotes the flow of electrons from the second electrode 19 thereinto.

The electron injection layer may include LiF, NaCl, CsF, $Li_2O$, BaO, or any combination thereof.

A thickness of the electron injection layer may be in a range of about 1 Å to about 100 Å, and, for example, about 3 Å to about 90 Å. When the thickness of the electron injection layer is within the ranges described above, satisfactory electron injection characteristics may be obtained without a substantial increase in driving voltage.

The second electrode 19 may be located on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIGURE, but embodiments of the present disclosure are not limited thereto.

According to another aspect, the organic light-emitting device may be included in an electronic apparatus. Thus, an electronic apparatus including the organic light-emitting device is provided. The electronic apparatus may include, for example, a display, an illumination, a sensor, and the like.

Another aspect provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group, as used here refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof. For example, Formula 9-33 is a branched $C_6$ alkyl group, for example, a tert-butyl group that is substituted with two methyl groups.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof are a methoxy group, an ethoxy group, a propoxy group, a butoxy group, and a pentoxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the $C_3$-$C_{10}$ cycloalkylene group is a divalent group having the same structure as the $C_3$-$C_{10}$ cycloalkyl group.

Examples of the $C_3$-$C_{10}$ cycloalkyl group are a cyclopropyl group, a cyclobutyl group, a cyclopentyl, cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group.

The term "$C_1$-$C_{10}$ heterocycloalkyl group" as used herein refers to a cyclic group that includes at least one hetero atom selected from N, O, P, Si, S, Se, Ge, and B as a ring-forming atom and 1 to 10 carbon atoms, and the $C_1$-$C_{10}$ heterocycloalkylene group refers to a divalent group having the same structure as the $C_1$-$C_{10}$ heterocycloalkyl group.

Examples of the $C_1$-$C_{10}$ heterocycloalkyl group are a silolanyl group, a silinanyl group, a tetrahydrofuranyl group, a tetrahydro-2H-pyranyl group, and a tetrahydrothiophenyl group.

The term "$C_3$-$C_{10}$ cycloalkenyl group" as used herein refers to a monovalent cyclic group that includes 3 to 10 carbon atoms and at least one carbon-carbon double bond in the ring thereof and has no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that includes at least one heteroatom selected from N, O, P, Si, S, Se, Ge, and B as a ring-forming atom, 1 to 10 carbon atoms, and at least one carbon-carbon double bond in the ring thereof. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The $C_7$-$C_{60}$ alkylaryl group used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having at least one heteroatom selected from N, O, P, Si, S, Se, Ge, and B as a ring-forming atom and a cyclic aromatic system having 1 to 60 carbon atoms, and the term "$C_1$-$C_{60}$ heteroarylene group" as used herein refers to a divalent group having at least one heteroatom selected from N, O, P, Si, S, Se, Ge, and B as a ring-forming atom and a carbocyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The $C_2$-$C_{60}$ alkylheteroaryl group used herein refers to a $C_1$-$C_{60}$ heteroaryl group substituted with at least one $C_1$-$C_{60}$ alkyl group.

The term "$C_6$-$C_{60}$ aryloxy group" as used herein indicates —$OA_{102}$ (wherein $A_{102}$ indicates the $C_6$-$C_{60}$ aryl group), the $C_6$-$C_{60}$ arylthio group indicates —$SA_{103}$ (wherein $A_{103}$ indicates the $C_6$-$C_{60}$ aryl group), and the $C_1$-$C_{60}$ alkylthio group indicates —$SA_{104}$ (wherein $A_{104}$ indicates the $C_1$-$C_{60}$ alkyl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group described above.

The term "monovalent non-aromatic condensed heteropolycyclic group" as used herein refers to a monovalent group (for example, having 1 to 60 carbon atoms) having two or more rings condensed to each other, a heteroatom selected from N, O, P, Si, S, Se, Ge, and B, other than carbon atoms, as a ring-forming atom, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group described above.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. Examples of the "$C_5$-$C_{30}$ carbocyclic group (unsubstituted or substituted with at least one $R_{10a}$)" used herein are an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, and a fluorene group (each unsubstituted or substituted with at least one $R_{10a}$).

The term "$C_1$-$C_{30}$ heterocyclic group" as used herein refers to a saturated or unsaturated cyclic group having, as a ring-forming atom, at least one heteroatom selected from N, O, P, Si, S, Se, Ge, and B other than 1 to 30 carbon atoms. The $C_1$-$C_{30}$ heterocyclic group may be a monocyclic group or a polycyclic group. The "$C_1$-$C_{30}$ heterocyclic group (unsubstituted or substituted with at least one $R_{10a}$)" may be, for example, a thiophene group, a furan group, a pyrrole group, a silole group, borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluoren-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group (, each unsubstituted or substituted with at least one $R_{10a}$).

Examples of the "$C_5$-$C_{30}$ carbocyclic group" and "$C_1$-$C_{30}$ heterocyclic group" as used herein are i) a first ring, ii) a second ring, iii) a condensed ring in which two or more first rings are condensed with each other, iv) a condensed ring in which two or more second rings are condensed with each other, or v) a condensed ring in which at least one first ring is condensed with at least one second ring, wherein the first ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group," and "fluorinated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the term "fluorinated $C_1$ alkyl group (that is, a fluorinated methyl group)" includes —$CF_3$, —$CF_2H$, and —$CFH_2$. The "fluorinated $C_1$-$C_{60}$ alkyl group (or, a fluorinated $C_1$-$C_{20}$ alkyl group, or the like)", "the fluorinated $C_3$-$C_{10}$ cycloalkyl group", "the fluorinated $C_1$-$C_{10}$ heterocycloalkyl group", or "the fluorinated a phenyl group" may be i) a fully fluorinated $C_1$-$C_{60}$ alkyl group (or, a fully fluorinated $C_1$-$C_{20}$ alkyl group, or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogen included therein is substituted with a fluoro group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, a partially fluorinated $C_1$-$C_{10}$ heterocycloalkyl group, or partially fluorinated phenyl group, wherein, in each group, not all hydrogen included therein is substituted with a fluoro group.

The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated $C_1$-$C_{10}$ heterocycloalkyl group," and "deuterated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, the deuterated methyl group)" may include —$CD_3$, —$CD_2H$, and —$CDH_2$, and examples of the "deuterated $C_3$-$C_{10}$ cycloalkyl group" are, for example, Formula 10-501 and the like. The "deuterated $C_1$-$C_{60}$ alkyl group (or, the deuterated $C_1$-$C_{20}$ alkyl group or the like)", "the deuterated $C_3$-$C_{10}$ cycloalkyl group", "the deuterated $C_1$-$C_{10}$ heterocycloalkyl group", or "the deuterated phenyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, a fully deuterated $C_1$-$C_{10}$ heterocycloalkyl group, or a fully deuterated phenyl group, in which, in each group, all hydrogen included therein are substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated $C_1$-$C_{10}$ heterocycloalkyl group, or a partially deuterated phenyl group, in which, in each group, not all hydrogen included therein are substituted with deuterium.

The term "($C_1$-$C_{20}$ alkyl) 'X' group" as used herein refers to a 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of a ($C_1$ alkyl) phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, and a dibenzothiophene 5,5-dioxide group," in which, in each group, at least one carbon selected from ring-forming carbons is substituted with nitrogen.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group; a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, $—P(=O)(Q_{18})(Q_{19})$, $—P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, $—P(=O)(Q_{28})(Q_{29})$, $—P(Q_{28})(Q_{29})$, or any combination thereof;

$—N(Q_{31})(Q_{32})$, $—Si(Q_{33})(Q_{34})(Q_{35})$, $—B(Q_{36})(Q_{37})$, $—P(=O)(Q_{38})(Q_{39})$, or $—P(Q_{38})(Q_{39})$;

or any combination thereof, $Q_1$ to $Q_9$, $Q_{11}$ to $Q_{19}$, $Q_{21}$ to $Q_{29}$ and $Q_{31}$ to $Q_{39}$ described herein may each independently be: hydrogen; deuterium; —F; —Cl; —Br; —I; a hydroxyl group; a cyano group; a nitro group; an amidino group; a hydrazine group; a hydrazone group; a carboxylic acid or a salt thereof; a sulfonic acid or a salt thereof; a phosphoric acid or a salt thereof; a $C_1$-$C_{60}$ alkyl group which is unsubstituted or substituted with deuterium, —F, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, —F, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

For example, $Q_1$ to $Q_9$, $Q_{11}$ to $Q_{19}$, $Q_{21}$ to $Q_{29}$ and $Q_{31}$ to $Q_{39}$ described herein may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 2-81)

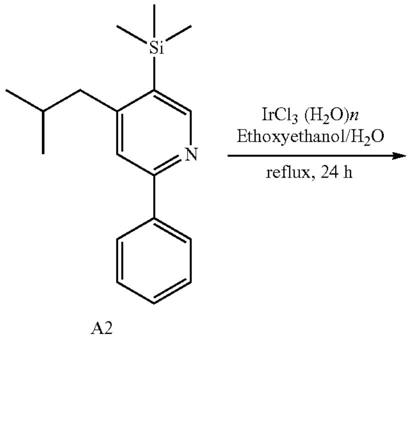

A2

-continued
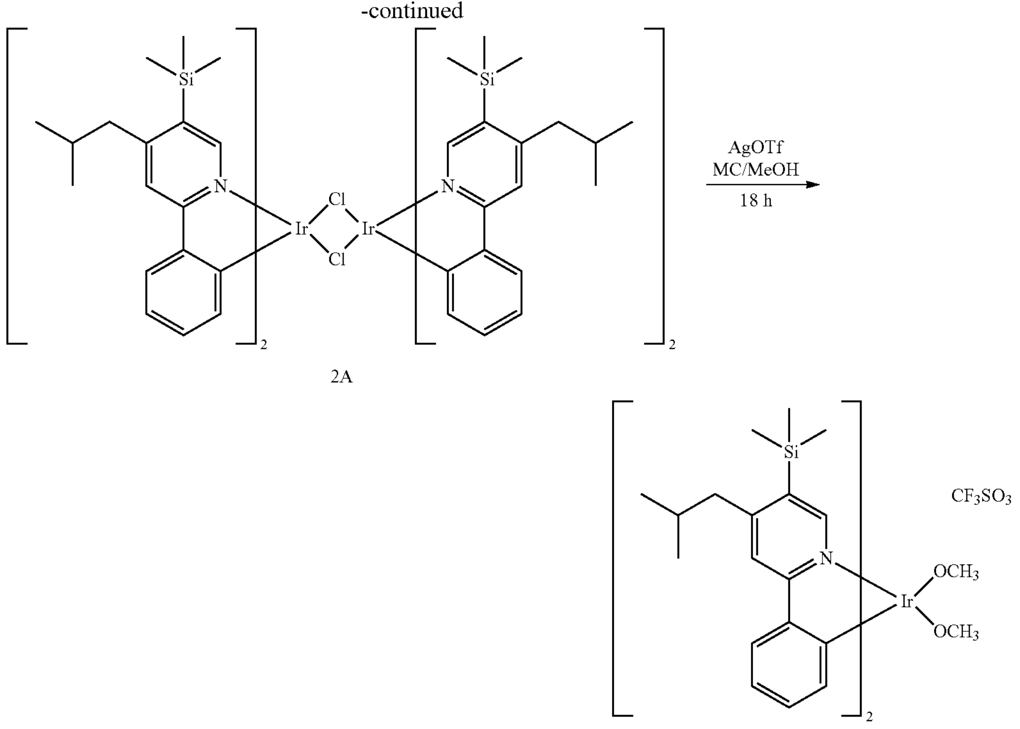
2A
2B
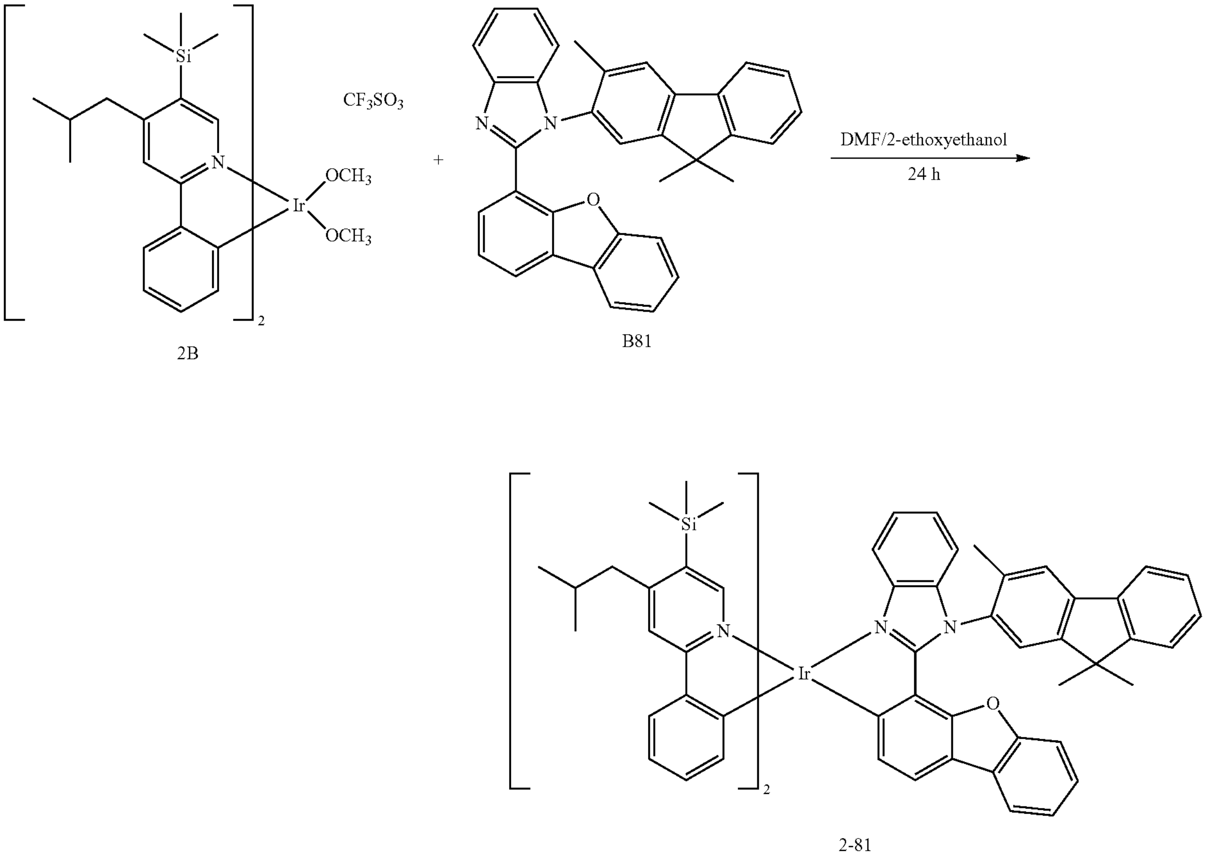
2B
B81
2-81

(1) Synthesis of Compound 2A 4-isobutyl-2-phenyl-5-(trimethylsilyl)pyridine) (4.41 g, 15.54 mmol) and iridium chloride (2.49 g, 7.07 mmol) were mixed with 27 mL of ethoxyethanol and 9 mL of distilled water, and then, stirred while refluxing for 24 hours, and then the temperature was lowered to room temperature. A solid formed therefrom was separated by filtration. The solid was washed sufficiently with water, methanol, and hexane in the stated order and dried in a vacuum oven to thereby obtain 4.1 g (73% of yield) of Compound 2A.

(2) Synthesis of Compound 2B

Compound 2A (2.45 g, 1.55 mmol) was mixed with 60 mL of methylene chloride, and then, AgOTf (0.794 g, 3.09 mmol) mixed with 20 mL of methanol was added thereto. Thereafter, the mixture was stirred for 18 hours at room temperature while light was blocked with aluminum foil, and then filtered through Celite to remove the generated solid, and the filtrate was subjected to reduced pressure to obtain a solid (Compound 2B). Compound 2B was used in the next reaction without an additional purification process.

(3) Synthesis of Compound 2-81

Compound 2B (2.41 g, 2.49 mmol) and 2-(dibenzo[b,d]furan-4-yl)-1-(3,9,9-trimethyl-9H-fluoren-2-yl)-1H-benzo[d]imidazole (1.22 g, 2.49 mmol) were mixed with 25 mL of 2-ethoxyethanol and 25 mL of dimethylformamide, and the temperature was lowered after stirring under reflux at 130° C. for 24 hours. The obtained mixture was subjected to reduced pressure to obtain a solid, and column chromatography was performed thereon using ethyl acetate (EA) and a hexane for elution to obtain 1.32 g (yield of 43%) of Compound 2-81. The obtained compound was identified by Mass and HPLC analysis.

HRMS(MALDI) calcd for $C_{71}H_{73}IrN_4OSi_2$: m/z 1246.7790 Found: 1246.7791.

Synthesis Example 2 (Compound 118-206)

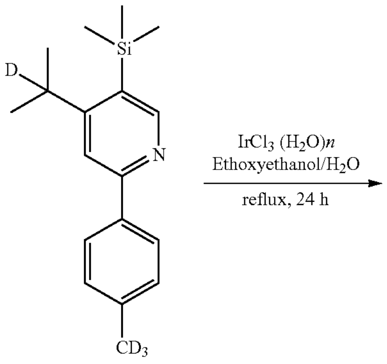

A118

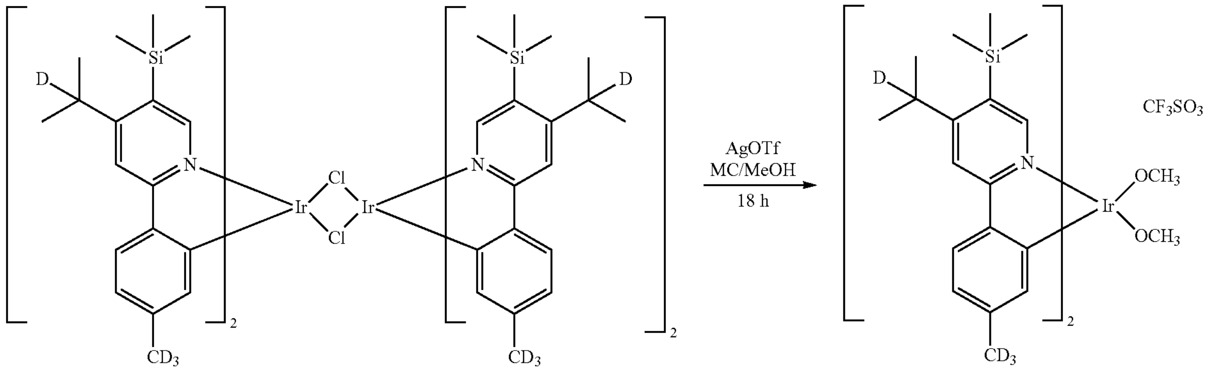

118A

118B

-continued

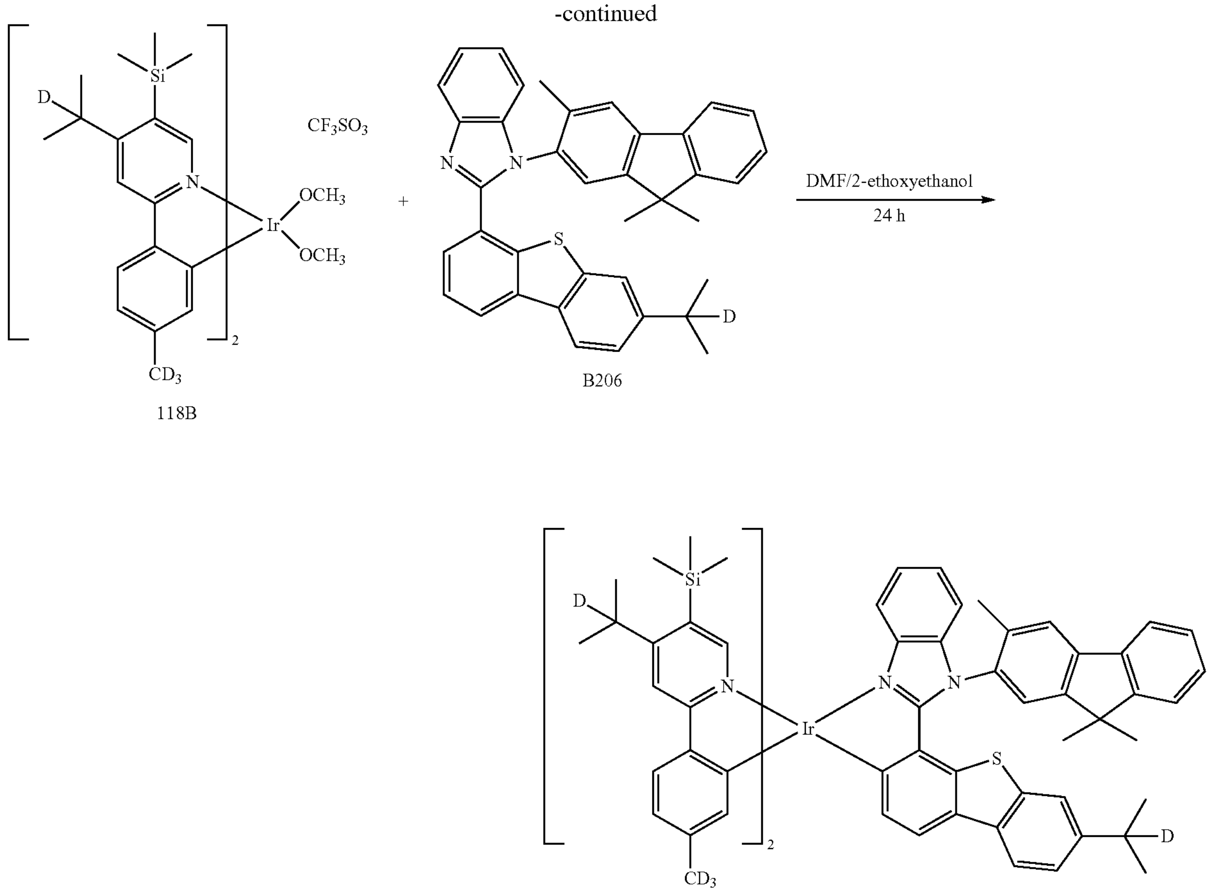

118B

B206

118-206

(1) Synthesis of Compound 118A 2-(4-(methyl-d3)phenyl)-4-(propan-2-yl-2-d)-5-(trimethylsilyl)pyridine (4.74 g, 16.49 mmol) and iridium chloride (2.64 g, 7.49 mmol) were mixed with 27 mL of ethoxyethanol and 9 mL of distilled water, and then, the resultant mixture was stirred under reflux for 24 hours, and then the temperature was lowered to room temperature. The solid thus obtained was separated by filtration, washed sufficiently with water, methanol, and hexane, in this stated order, and then, dried in a vacuum oven, so as to obtain 4.8 g of Compound 118A (yield of 80%).

(2) Synthesis of Compound 118B

Compound 118A (3.27 g, 2.04 mmol) was mixed with 90 mL of methylene chloride, and then, AgOTf (1.05 g, 4.09 mmol) mixed with 30 mL of methanol was added thereto. Thereafter, the mixture was stirred for 18 hours at room temperature while light was blocked with aluminum foil, and then filtered through Celite to remove the resulting solid, and the filtrate was subjected to reduced pressure to obtain a solid (Compound 118B). Compound 118B was used in the next reaction without an additional purification process.

(3) Synthesis of Compound 118-206

Compound 118B (3.5 g, 3.58 mmol) and 2-(7-(propan-2-yl-2-d)dibenzo[b,d]thiophen-4-yl)-1-(3,9,9-trimethyl-9H-fluoren-2-yl)-1H-benzo[d]imidazole (1.96 g, 3.58 mmol) were mixed with 35 mL of 2-ethoxyethanol and 35 mL of dimethylformamide, and after the resultant mixture was stirred under reflux at 130° C. for 24 hours, the temperature was lowered. The obtained mixture was subjected to reduced pressure to obtain a solid, and column chromatography was performed thereon using EA and hexane for elution to obtain 1.96 g (yield of 42%) of Compound 118-226. The obtained compound was identified by Mass and HPLC analysis.

HRMS(MALDI) calcd for $C_{74}H_{70}D_9IrN_4SSi_2$: m/z 1313.5758 Found: 1313.5756.

Synthesis Example 3 (Compound 144-6)

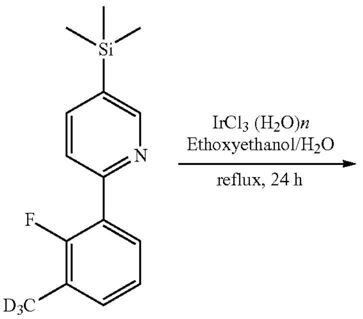

A144

-continued

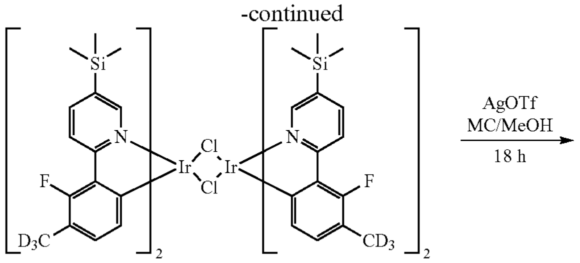

144A

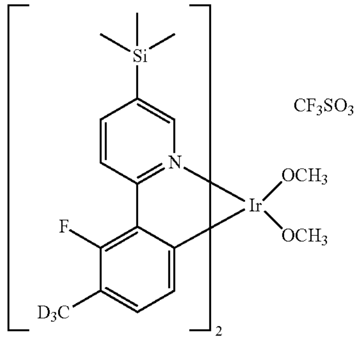

144B

-continued

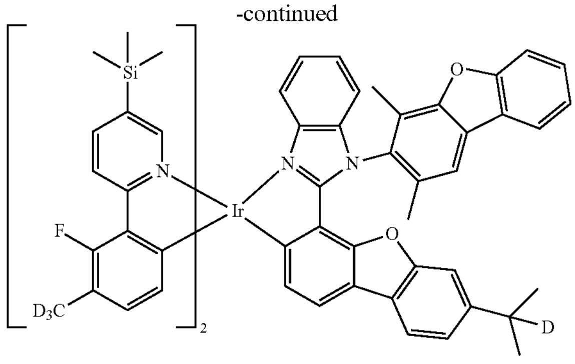

144-6

(1) Synthesis of Compound 144A 2-(2-fluoro-3-(methyl-d3)phenyl)-4-(trimethylsilyl)pyridine (4.62 g, 17.6 mmol) and iridium chloride (2.82 g, 7.99 mmol) were mixed with 30 mL of ethoxyethanol and 10 mL of distilled water, and after the resultant mixture was stirred under reflux for 24 hours, the temperature was lowered to room temperature. The solid thus obtained was separated by filtration, washed sufficiently with water, methanol, and hexane, in this stated order, and then, dried in a vacuum oven, so as to obtain 4.76 g (yield of 79%) of Compound 144A.

(2) Synthesis of Compound 144B

Compound 144A (3.23 g, 2.15 mmol) was mixed with 90 mL of methylene chloride, and then, AgOTf (1.11 g, 4.31 mmol) mixed with 30 mL of methanol was added thereto. Thereafter, the mixture was stirred for 18 hours at room temperature while light was blocked with aluminum foil, and then filtered through Celite to remove the resulting solid, and the filtrate was subjected to reduced pressure to obtain a solid (Compound 144B). Compound 144B was used in the next reaction without an additional purification process.

(3) Synthesis of Compound 144-6

Compound 144B (3.54 g, 3.80 mmol) and 1-(2,4-dimethyldibenzo[b,d]furan-3-yl)-2-(7-(propan-2-yl-2-d)dibenzo[b,d]furan-4-yl)-1H-benzo[d]imidazole (1.99 g, 3.80 mmol) were mixed with 35 mL of 2-ethoxyethanol and 35 mL of dimethylformamide, and the temperature was lowered after stirring under reflux at 130° C. for 24 hours. The obtained mixture was subjected to reduced pressure to obtain a solid, and column chromatography was performed thereon using EA and hexane for elution to obtain 2.11 g (yield of 45%) of Compound 144-6. The obtained compound was identified by Mass and HPLC analysis.

HRMS(MALDI) calcd for $C_{66}H_{54}D_7F_2IrN_4O_2Si_2$: m/z 1235.6665 Found: 1235.6664.

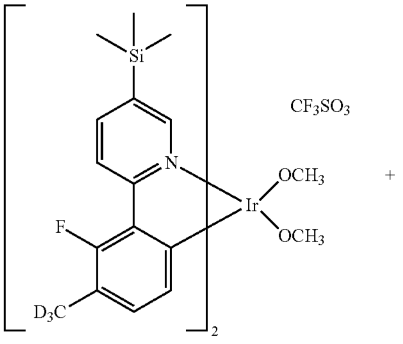

144B

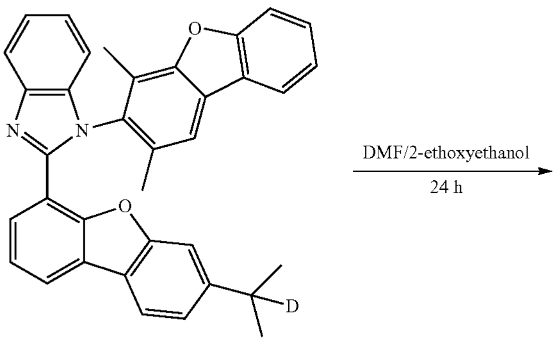

B6

Synthesis Example 4 (Compound 229-131)

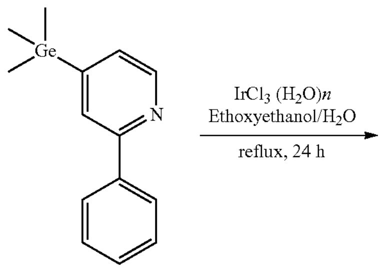

A229

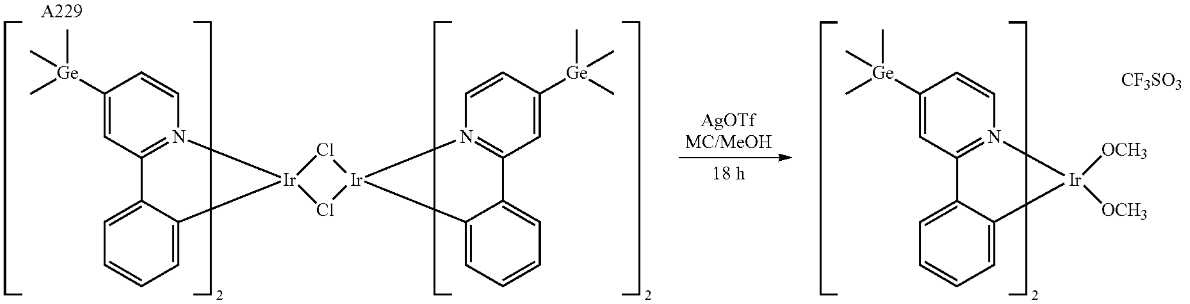

229A

229B

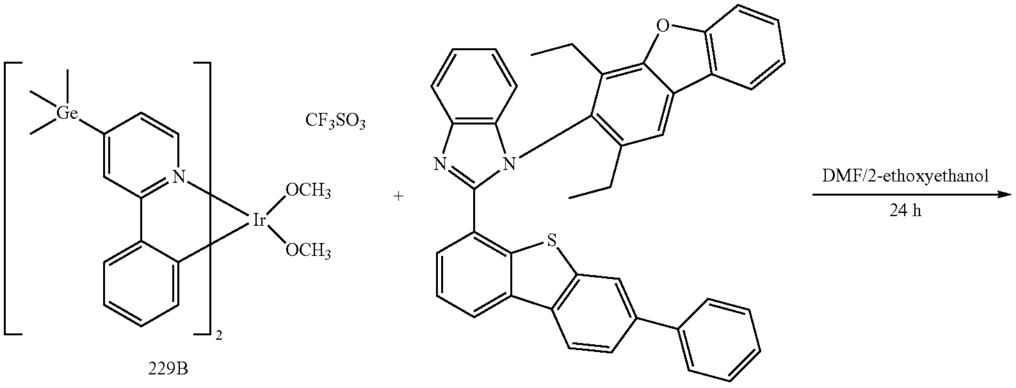

229B

B131

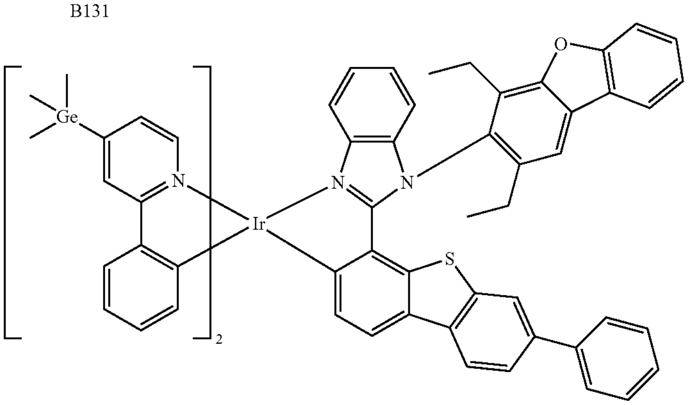

229-131

(1) Synthesis of Compound 229A 2-phenyl-4-(trimethylgermyl)pyridine (4.67 g, 17.2 mmol) and iridium chloride (2.75 g, 7.80 mmol) were mixed with 30 mL of ethoxyethanol and 10 mL of distilled water, and after the mixed solution was stirred under reflux for 24 hours, the temperature of the product was lowered to room temperature. A solid formed therefrom was separated by filtration. The solid was washed sufficiently with water, methanol, and hexane in the stated order and dried in a vacuum oven to thereby obtain 4.41 g (yield of 74%) of Compound 229A.

(2) Synthesis of Compound 229B

Compound 229A (3.25 g, 2.11 mmol) was mixed with 90 mL of methylene chloride, and then, AgOTf (1.09 g, 4.22 mmol) mixed with 30 mL of methanol was added thereto.

Thereafter, the mixture was stirred for 18 hours at room temperature while light was blocked with aluminum foil, and then filtered through Celite to remove the generated solid, and the filtrate was subjected to reduced pressure to obtain a solid (Compound 229B). Compound 229B was used in the next reaction without an additional purification process.

(3) Synthesis of Compound 229-131

Compound 229B (3.57 g, 3.75 mmol) and 1-(2,4-diethyldibenzo[b,d]furan-3-yl)-2-(7-phenyldibenzo[b,d]thiophen-4-yl)-1H-benzo[d]imidazole (2.25 g, 3.75 mmol) were mixed with 35 mL of 2-ethoxyethanol and 35 mL of dimethylformamide, and the temperature was lowered after stirring under reflux at 130° C. for 24 hours. The obtained mixture was subjected to reduced pressure to obtain a solid, and column chromatography was performed thereon using EA and hexane for elution to obtain 2.18 g (yield of 44%) of Compound 229-131. The obtained compound was identified by Mass and HPLC analysis.

HRMS(MALDI) calcd for $C_{69}H_{61}Ge_2IrN_4OS$: m/z 1334.2619 Found: 1334.2618.

Synthesis Example 5 (Compound 151-340)

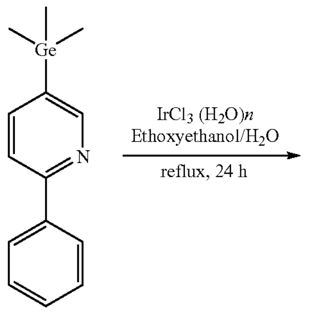

A151

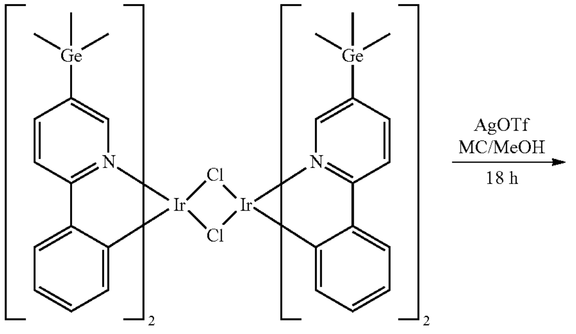

151A

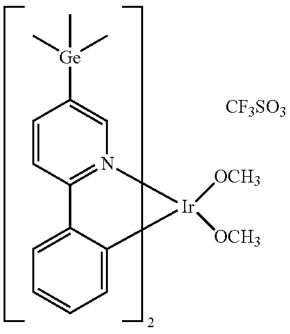

151B

-continued

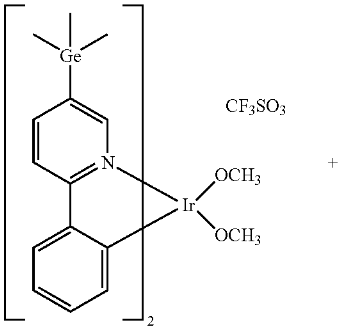

151B

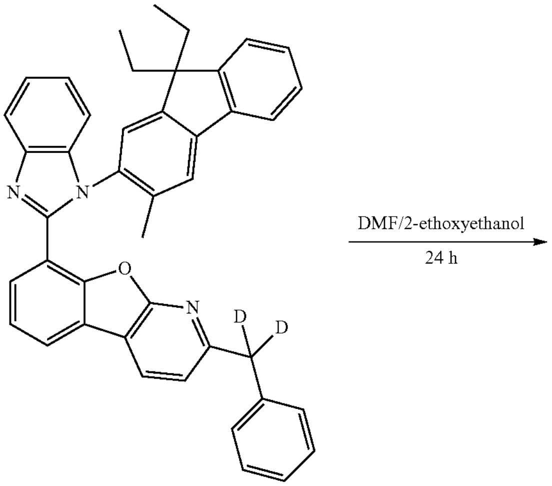

B340

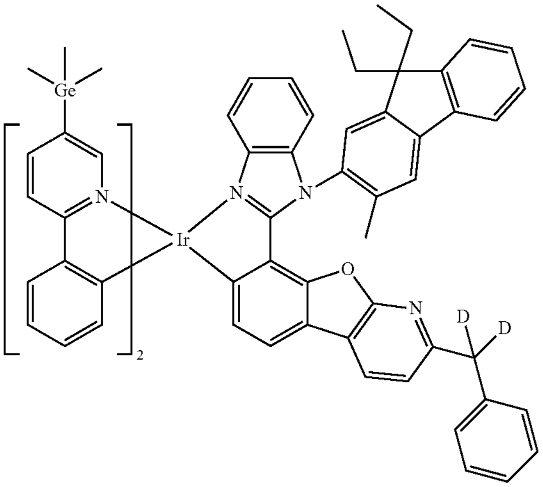

151-340

(1) Synthesis of Compound 151A 2-phenyl-4-(trimethylgermyl)pyridine (4.67 g, 17.2 mmol) and iridium chloride (2.75 g, 7.80 mmol) were mixed with 30 mL of ethoxyethanol and 10 mL of distilled water, and after the mixed solution was stirred under reflux for 24 hours, the temperature of the product was lowered to room temperature. The solid thus obtained was separated by filtration, washed sufficiently with water, methanol, and hexane, in this stated order, and then, dried in a vacuum oven, so as to obtain 4.58 g (yield of 76%) of Compound 151A.

(2) Synthesis of Compound 151B

Compound 151A (3.25 g, 2.11 mmol) was mixed with 90 mL of methylene chloride, and then, AgOTf (1.09 g, 4.22 mmol) mixed with 30 mL of methanol was added thereto. Thereafter, the mixture was stirred for 18 hours at room temperature while light was blocked with aluminum foil, and then filtered through Celite to remove the resulting solid, and the filtrate was subjected to reduced pressure to obtain a solid (Compound 151B). Compound 151B was used in the next reaction without an additional purification process.

(3) Synthesis of Compound 151-340

Compound 151B (3.59 g, 3.79 mmol) and 8-(1-(9,9-diethyl-3-methyl-9H-fluoren-2-yl)-1H-benzo[d]imidazol-2-yl)-2-(phenylmethyl-d2)benzofuro[2,3-b]pyridine (2.32 g, 3.79 mmol) were mixed with 35 mL of 2-ethoxyethanol and 35 mL of dimethylformamide, and the temperature was lowered after stirring under reflux at 130° C. for 24 hours. The obtained mixture was subjected to reduced pressure to obtain a solid, and column chromatography was performed thereon using ethyl acetate (EA) and a hexane for elution to obtain 2.34 g (yield of 46%) of Compound 151-340. The obtained compound was identified by Mass and HPLC analysis.

HRMS(MALDI) calcd for $C_{71}H_{64}D_2Ge_2IrN_5O$: m/z 1347.3446 Found: 1347.3445.

Synthesis Example 6 (Compound 273-11)

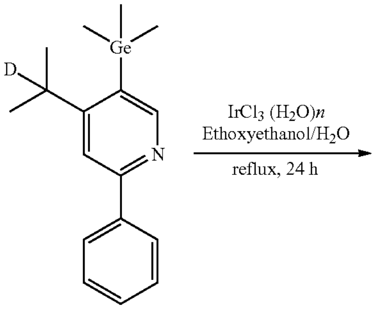

A273

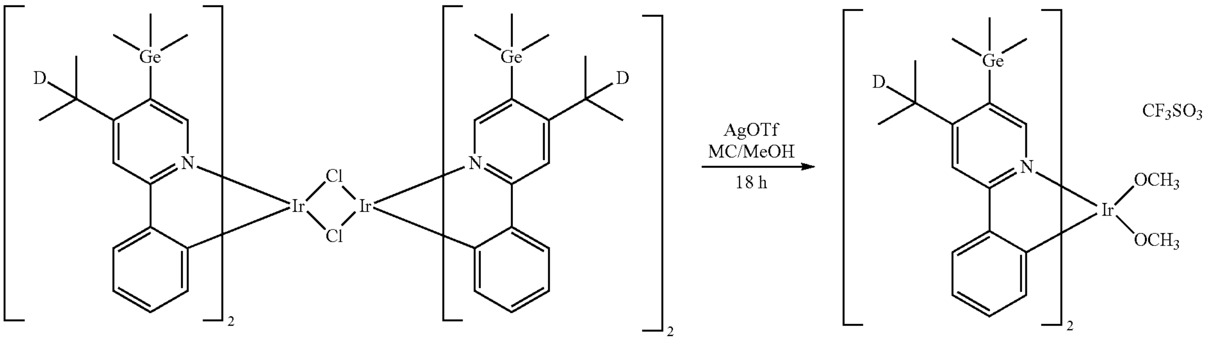

273A

273B

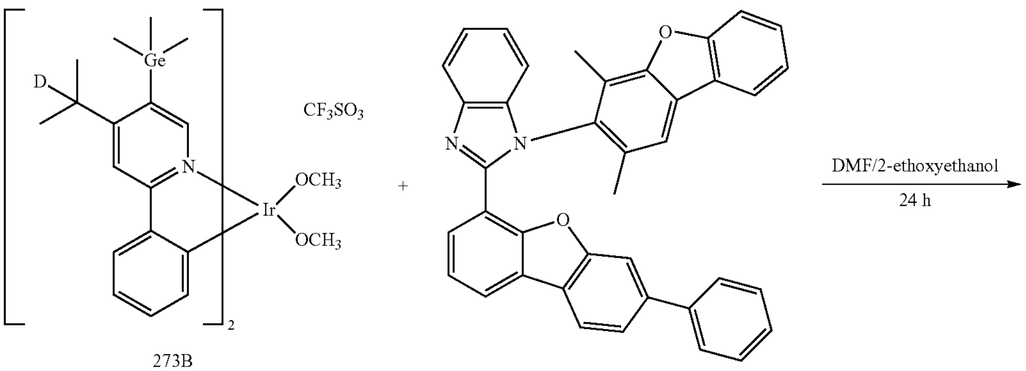

273B

B11

-continued

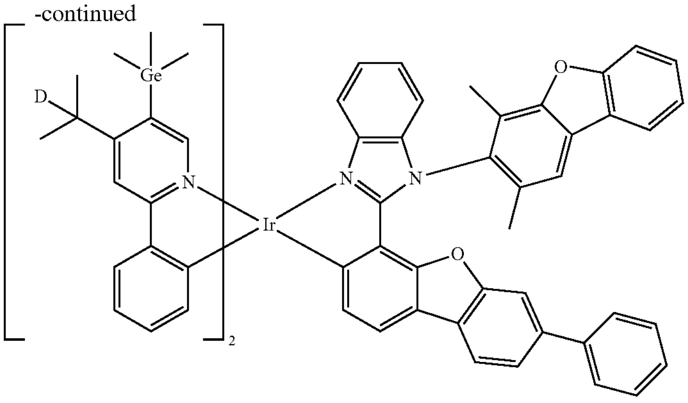

273-11

(1) Synthesis of Compound 273A 2-phenyl-4-(propan-2-yl-2-d)-5-(trimethylgermyl)pyridine (4.86 g, 15.4 mmol) and iridium chloride (2.47 g, 7.01 mmol) were mixed with 30 mL of ethoxyethanol and 10 mL of distilled water. Then, the resultant mixture was stirred under reflux for 24 hours and then, the temperature was lowered to room temperature. A solid formed therefrom was separated by filtration. The solid was washed sufficiently with water, methanol, and hexane in the stated order and dried in a vacuum oven to thereby obtain 4.64 g (yield of 77%) of Compound 273A.

(2) Synthesis of Compound 273B

Compound 273A (3.56 g, 2.089 mmol) was mixed with 90 mL of methylene chloride, and then, AgOTf (1.07 g, 4.16 mmol) mixed with 30 mL of methanol was added thereto. Thereafter, the mixture was stirred for 18 hours at room temperature while light was blocked with aluminum foil, and then filtered through Celite to remove the generated solid, and the filtrate was subjected to reduced pressure to obtain a solid (Compound 273B). Compound 273B was used in the next reaction without an additional purification process.

(3) Synthesis of Compound 273-11

Compound 273B (3.61 g, 3.49 mmol) and 1-(2,4-dimethyldibenzo[b,d]furan-3-yl)-2-(7-phenyldibenzo[b,d]furan-4-yl)-1H-benzo[d]imidazole (1.94 g, 3.49 mmol) were mixed with 35 mL of 2-ethoxyethanol and 35 mL of dimethylformamide, and then, the resultant mixture was stirred under reflux at a temperature of 130° C. for 24 hours and then, the temperature was lowered. The obtained mixture was subjected to reduced pressure to obtain a solid, and column chromatography was performed thereon using EA and hexane for elution to obtain 2.15 g (yield of 45%) of Compound 273-11. The obtained compound was identified by Mass and HPLC analysis.

HRMS(MALDI) calcd for $C_{73}H_{67}D_2Ge_2IrN_4O_2$: m/z 1376.3599 Found: 1376.3598.

Synthesis Example 7 (Compound 266-66)

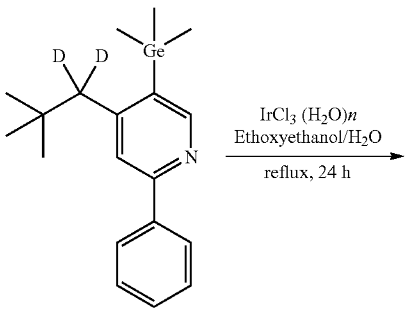

A266

-continued

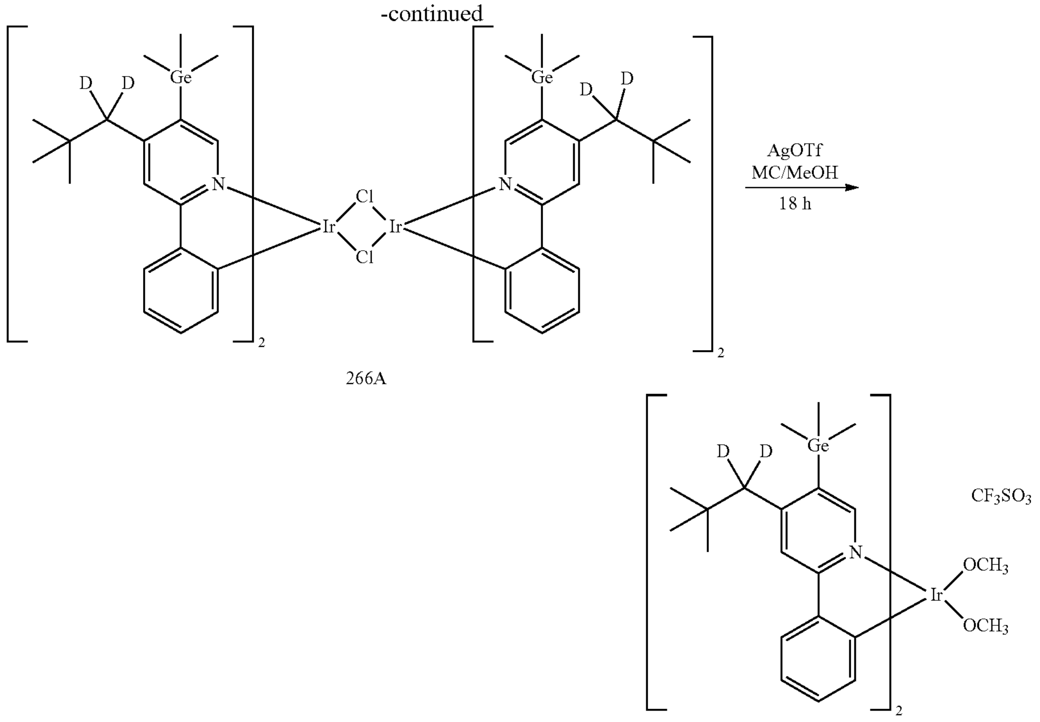

266A

266B

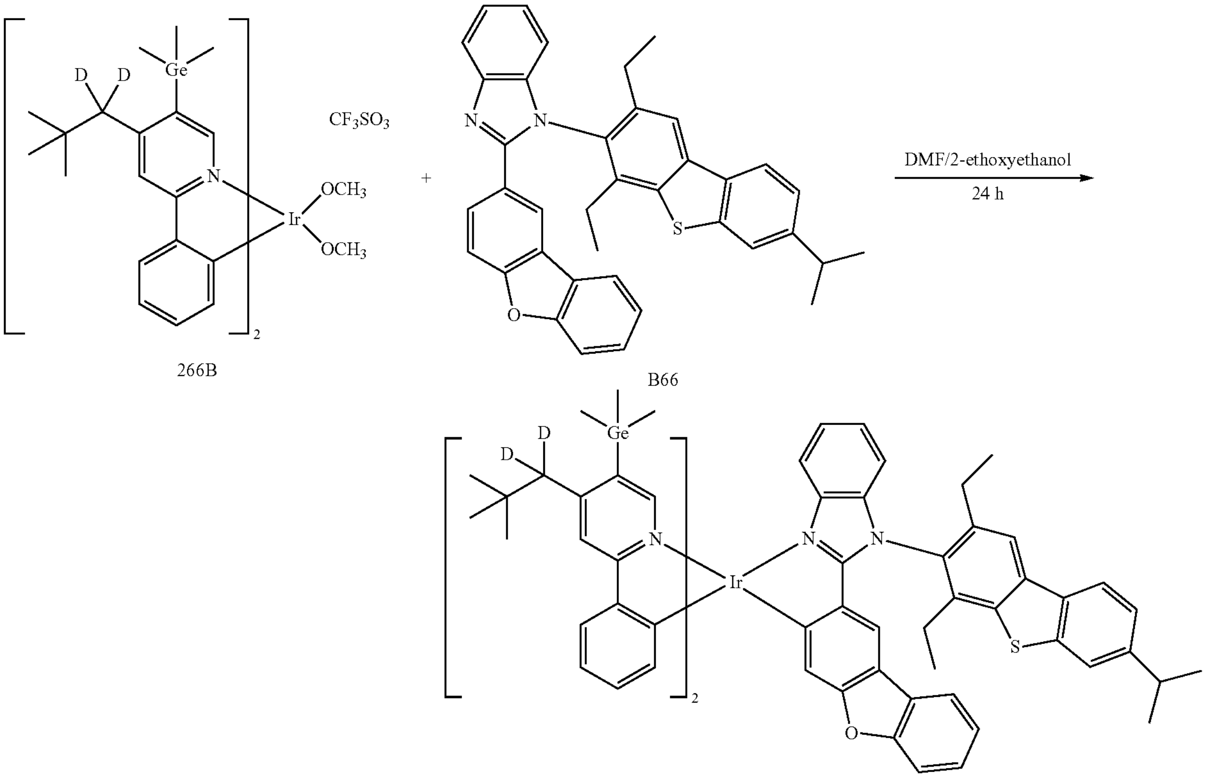

266B

B66

266-66

(1) Synthesis of Compound 266A 4-(2,2-dimethylpropyl-1,1-d2)-2-phenyl-5-(trimethylgermyl)pyridine (4.97 g, 14.5 mmol) and iridium chloride (2.32 g, 6.57 mmol) were mixed with 24 mL of ethoxyethanol and 8 mL of distilled water, and then, the resultant mixture was stirred under reflux for 24 hours and then, the temperature was lowered to room temperature. A solid formed therefrom was separated by filtration. The solid was washed sufficiently with water, methanol, and hexane in the stated order and dried in a vacuum oven to thereby obtain 4.52 g (yield of 75%) of Compound 266A.

(2) Synthesis of Compound 266B

Compound 266A (3.60 g, 1.97 mmol) was mixed with 60 mL of methylene chloride, and then, AgOTf (1.01 g, 3.94 mmol) mixed with 20 mL of methanol was added thereto. Thereafter, the mixture was stirred for 18 hours at room temperature while light was blocked with aluminum foil, and then filtered through Celite to remove the generated solid, and the filtrate was subjected to reduced pressure to obtain a solid (Compound 266B). Compound 266B was used in the next reaction without an additional purification process.

(3) Synthesis of Compound 266-66

Compound 266B (3.63 g, 3.33 mmol) and 2-(dibenzo[b,d]furan-2-yl)-1-(2,4-diethyl-7-isopropyldibenzo[b,d]thiophen-3-yl)-1H-benzo[d]imidazole (1.88 g, 3.33 mmol) were mixed with 35 mL of 2-ethoxyethanol and 35 mL of dimethylformamide, and the temperature was lowered after stirring under reflux at 130° C. for 24 hours. The obtained mixture was subjected to reduced pressure to obtain a solid, and column chromatography was performed thereon using EA and hexane for elution to obtain 1.98 g (yield of 41%) of Compound 266-66. The obtained compound was identified by Mass and HPLC analysis.

HRMS(MALDI) calcd for $C_{76}H_{79}D_4Ge_2IrN_4OS$: m/z 1444.4591 Found: 1444.4590.

Comparative Synthesis Example 1 (Compound A1)

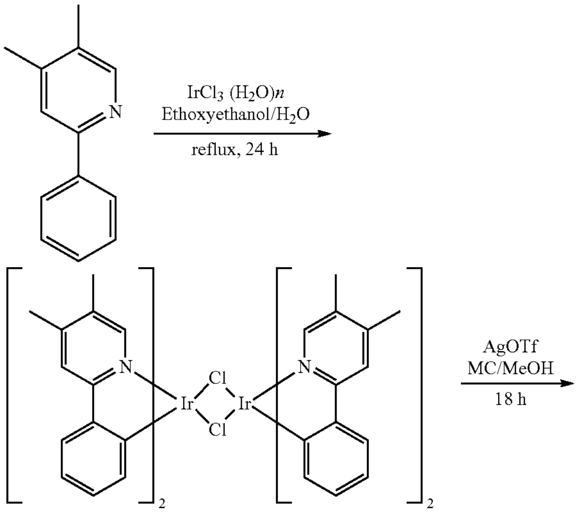

A1A

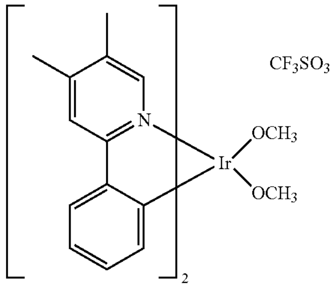

A1B

-continued

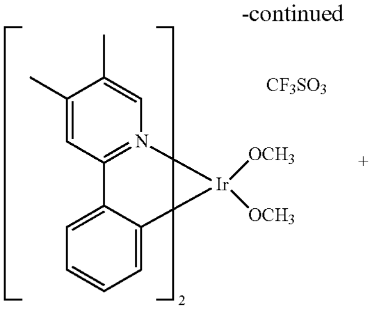

A1B

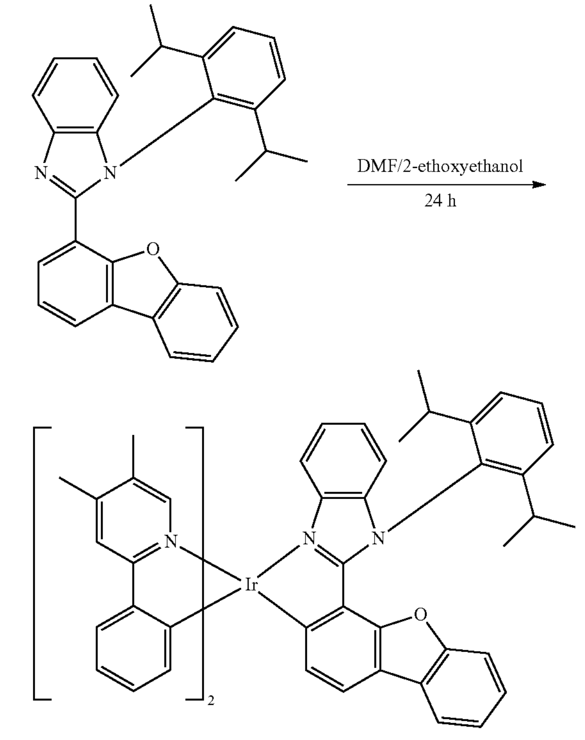

A1

Synthesis of Compound A1A 2.0 g (yield of 70%) of Compound A1A was obtained in the same manner as used to obtain Compound 151A of Synthesis Example 5, except that 4,5-dimethyl-2-phenylpyridine was used instead of 2-phenyl-5-(trimethylgermyl) a pyridine.

Synthesis of Compound A1B

Compound A1B was obtained in the same manner as used to obtain Compound 151B of Synthesis Example 5, except that Compound A1A was used instead of Compound 151A. The obtained Compound A1B was used in the next reaction without an additional purification process.

Synthesis of Compound A1

0.27 g (yield of 34%) of Compound A1 was obtained in the same manner as used to obtain Compound 151-340 of Synthesis Example 5, except that Compound A1B was used instead of Compound 151B, and 2-(dibenzo[b,d]furan-4-yl)-1-(2,6-diisopropylphenyl)-1H-benzo[d]imidazole) was used instead of 8-(1-(9,9-diethyl-3-methyl-9H-fluoren-2-yl)-1H- benzo[d]imidazol-2-yl)-2-(phenylmethyl-d2)benzofuro[2,3-b]pyridine. The obtained compound was identified by Mass and HPLC analysis.
HRMS(MALDI) calcd for $C_{57}H_{51}IrN_4O$: m/z 1000.3692 Found: 1000.3690.
Comparative Synthesis Example 2 (Compound C1)
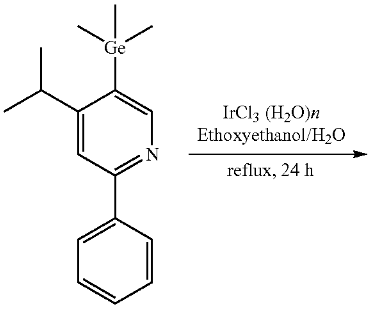
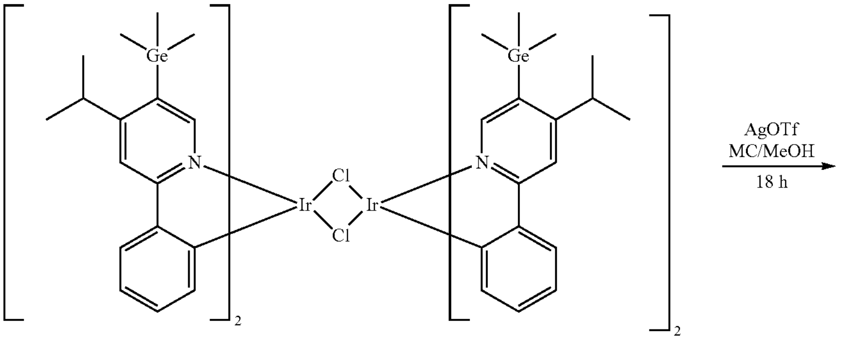
C1A
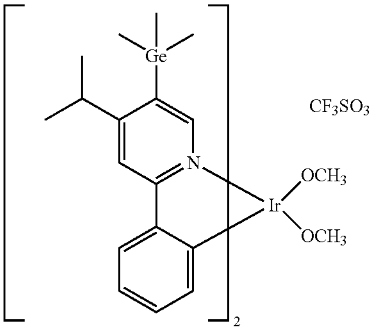
C1B
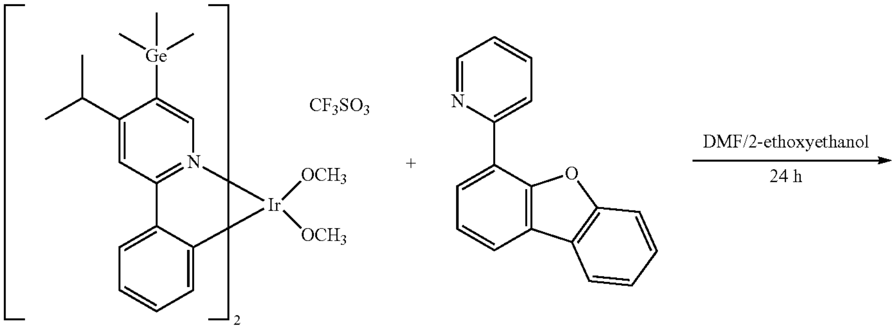
C1B -continued

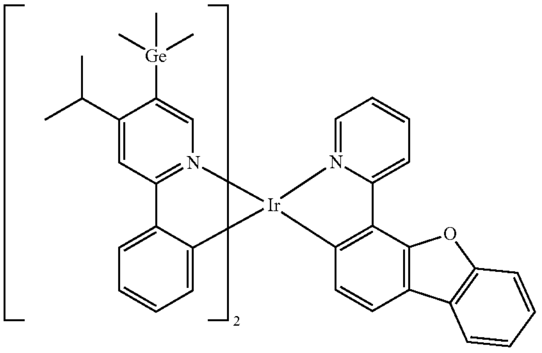

C1

Synthesis of Compound C1A 1.9 g (yield of 65%) of Compound C1A was obtained in the same manner as used to obtain Compound 151A of Synthesis Example 5, except that 4-isopropyl-2-phenyl-5-(trimethylgermyl)pyridine was used instead of 2-phenyl-5-(trimethylgermyl) pyridine.

Synthesis of Compound C1B

Compound C1B was obtained in the same manner as used to obtain Compound 151B of Synthesis Example 5, except that Compound C1A was used instead of Compound 151A. The obtained Compound C1B was used in the next reaction without an additional purification process.

Synthesis of Compound C1

0.29 g (yield of 31%) of Compound C1 was obtained in the same manner as used to obtain Compound 151-340 of Synthesis Example 5, except that Compound C1B was used instead of Compound 151B, and 2-(dibenzo[b,d]furan-4-yl) pyridine was used instead of 8-(1-(9,9-diethyl-3-methyl-9H-fluoren-2-yl)-1H-benzo[d]imidazol-2-yl)-2-(phenylmethyl-d2)benzofuro[2,3-b]pyridine. The obtained compound was identified by Mass and HPLC analysis.

HRMS(MALDI) calcd for $C_{51}H_{54}Ge_2IrN_3O$: m/z 1065.2320 Found: 1065.2312.

Example 1

As an anode, an ITO-patterned glass substrate was cut to a size of 50 mm×50 mm×0.5 mm, sonicated with isopropyl alcohol and pure water, each for 5 minutes, and then cleaned by exposure to ultraviolet rays and ozone for 30 minutes. The resultant glass substrate was loaded onto a vacuum deposition apparatus.

Compound HT3 and F6-TCNNQ were vacuum-codeposited on the anode at the weight ratio of 98:2 to form a hole injection layer having a thickness of 100 Å, and Compound HT3 was vacuum-deposited on the hole injection layer to form a hole transport layer having a thickness of 1350 Å, and then, Compound H-H1 was deposited on the hole transport layer to form an electron-blocking layer having a thickness of 300 Å.

Then, Compound H-H1, Compound H-E43, and Compound 2-81 (dopant) were co-deposited on the electron-blocking layer at the weight ratio of 57:38:5 to form an emission layer having a thickness of 400 Å.

Then, ET3 and ET-D1 were co-deposited at the volume ratio of 50:50 on the emission layer to form an electron-transporting layer having a thickness of 350 Å, and ET-D1 was vacuum-deposited on the electron-transporting layer to form an electron injection layer having a thickness of 10 Å, and Al was vacuum-deposited on the electron injection layer to form a cathode having a thickness of 1000 Å, thereby completing the manufacture of an organic light-emitting device.

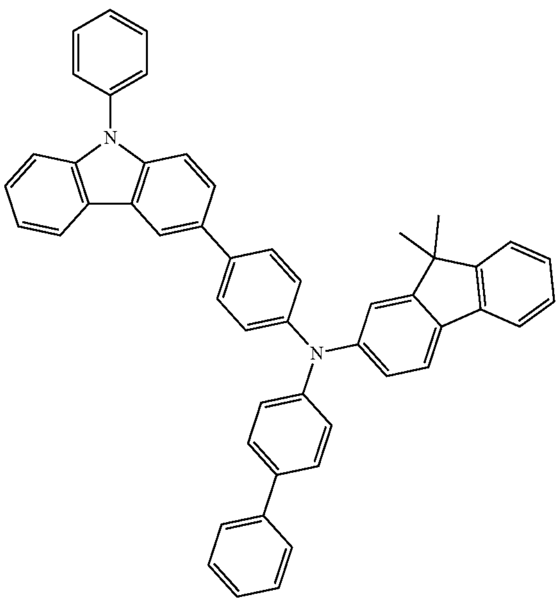

HT3

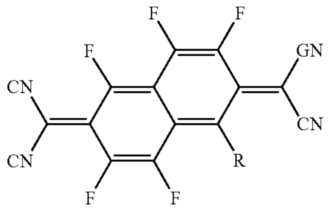

F6-TCNNQ

-continued

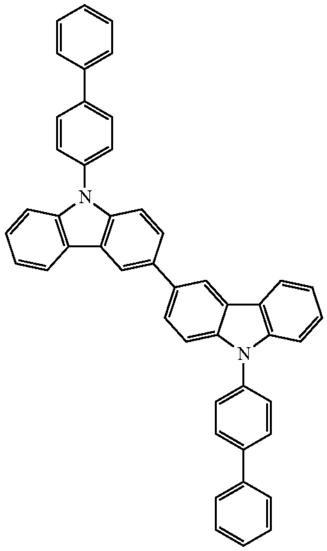

H-H1

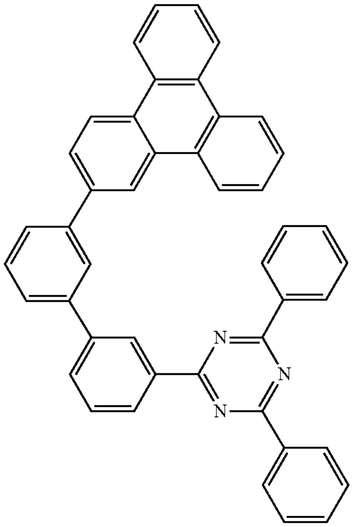

H-E43

-continued

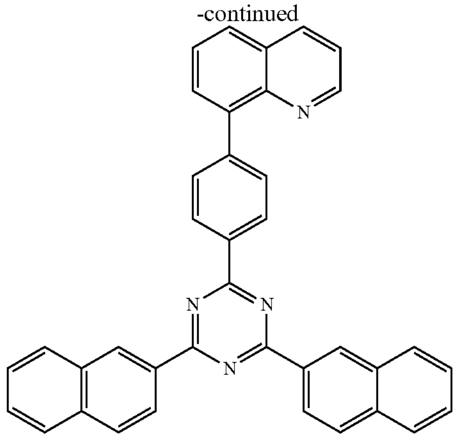

ET3

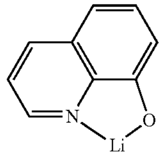

ET-D1

Examples 2 to 7 and Comparative Examples A1, B1, C1, A2, B2, C2 and D

Organic light-emitting devices were manufactured in the same manner as in Example 1, except that Compounds shown in Table 62 were each used instead of Compound 2-81 as a dopant in forming an emission layer.

Evaluation Example 1: Characterization of Organic Light-Emitting Device

The driving voltage, maximum value of external quantum efficiency (Max EQE)(%), and lifespan ($LT_{97}$)(hr) of each of Examples 1 to 7 and Comparative Examples A1, B1, C1, A2, B2, C2, and D were evaluated, and results thereof are shown in Table 62. A current-voltage meter (Keithley 2400) and a luminance meter (Minolta Cs-1000A) were used as an apparatus for evaluation, the lifespan ($LT_{97}$) (at 16,000 nit) was obtained by measuring the amount of time (hr) that elapsed until luminance was reduced to 97% of the initial brightness of 100%, and the results are expressed as a relative value (%).

TABLE 62

| | Compound No. of dopant in emission layer | Max EQE (Relative value, %) | $LT_{97}$ (relative value, %) (at 16,000 nit) |
|---|---|---|---|
| Example 1 | 2-81 | 97% | 67% |
| Example 2 | 118-206 | 98% | 82% |
| Example 3 | 144-6 | 92% | 52% |
| Example 4 | 229-131 | 93% | 100% |
| Example 5 | 151-340 | 93% | 57% |
| Example 6 | 273-11 | 100% | 75% |
| Example 7 | 266-66 | 92% | 50% |
| Comparative Example A1 | A1 | 88% | 41% |
| Comparative Example B1 | B1 | 86% | 34% |
| Comparative Example C1 | C1 | 86% | 29% |
| Comparative Example A2 | A2 | 89% | 19% |

TABLE 62-continued
| | Compound No. of dopant in emission layer | Max EQE (Relative value, %) | $LT_{97}$ (relative value, %) (at 16,000 nit) |
|---|---|---|---|
| Comparative Example B2 | B2 | 84% | 10% |
| Comparative Example C2 | C2 | 82% | 16% |
| Comparative Example D | D | 85% | 4% |
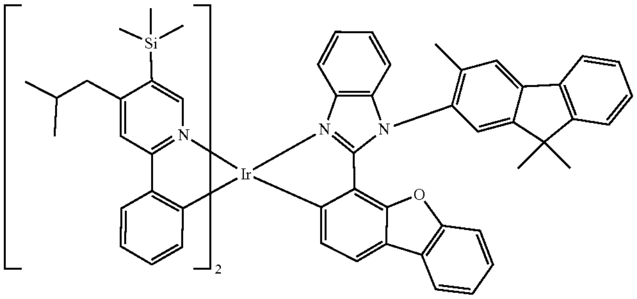
2-81
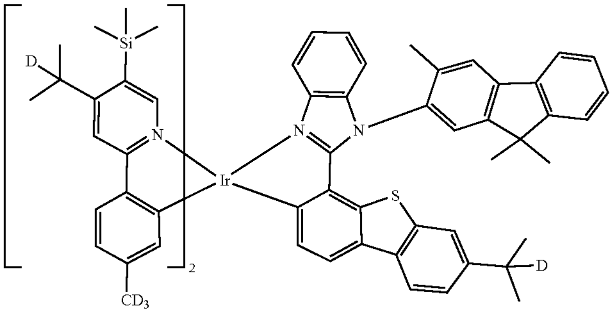
118-206
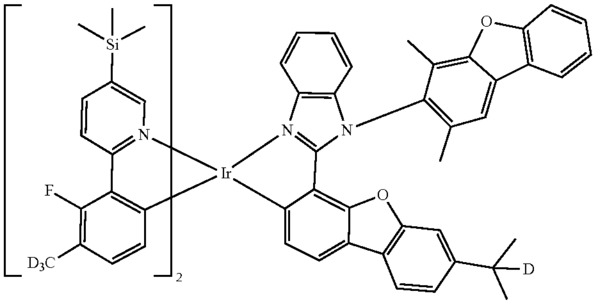
144-6
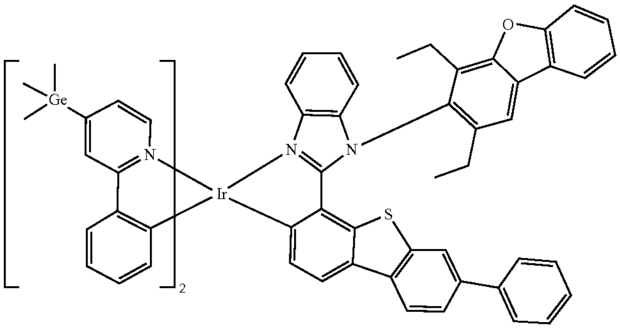
229-131

TABLE 62-continued
| Compound No. of dopant in emission layer | Max EQE (Relative value, %) | $LT_{97}$ (relative value, %) (at 16,000 nit) |
|---|---|---|
| 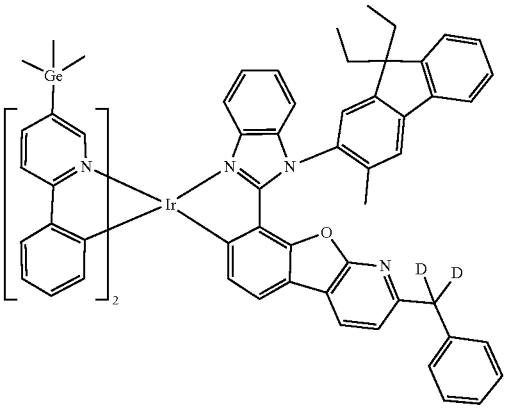 151-340 | | |
| 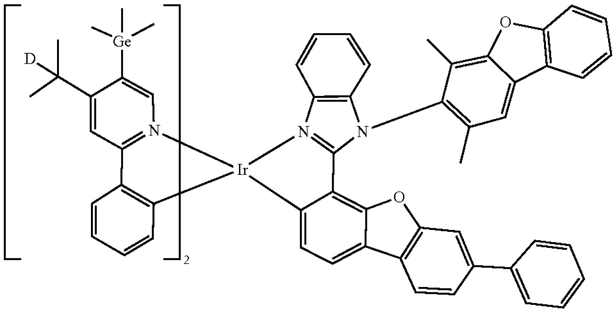 273-11 | | |
| 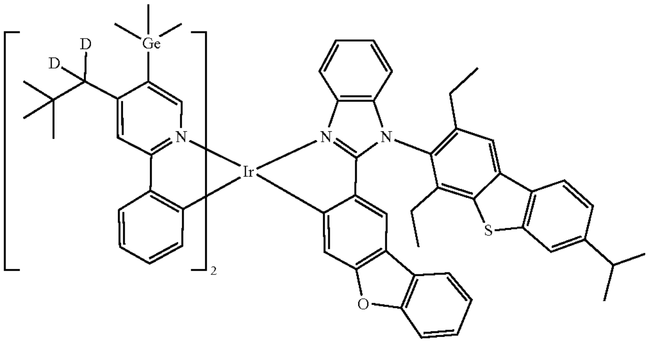 266-66 | | |
| 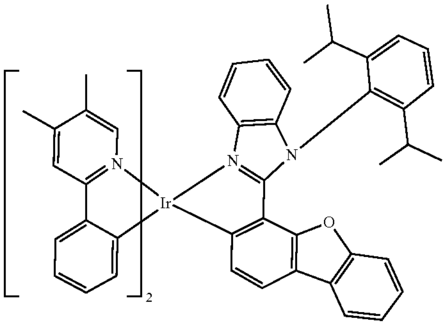 A1 | | |

TABLE 62-continued
| | Compound No. of dopant in emission layer | Max EQE (Relative value, %) | $LT_{97}$ (relative value, %) (at 16,000 nit) |
|---|---|---|---|
| 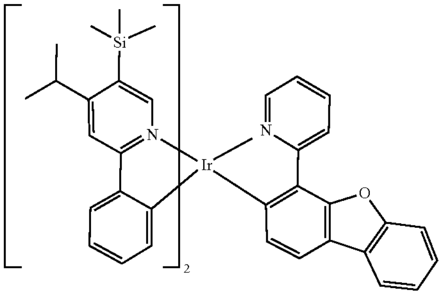 B1 | | | |
| 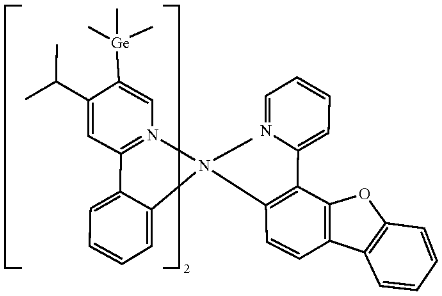 C1 | | | |
| 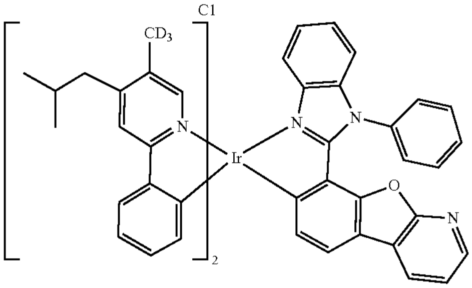 A2 | | | |
| 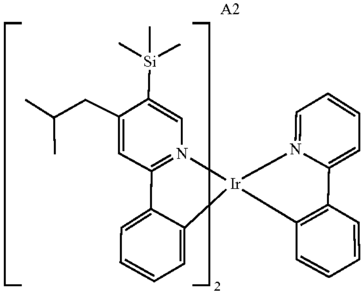 B2 | | | |
| 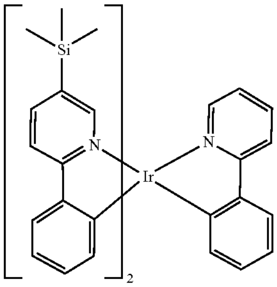 C2 | | | |

TABLE 62-continued

| Compound No. of dopant in emission layer | Max EQE (Relative value, %) | $LT_{97}$ (relative value, %) (at 16,000 nit) |
| --- | --- | --- |
| 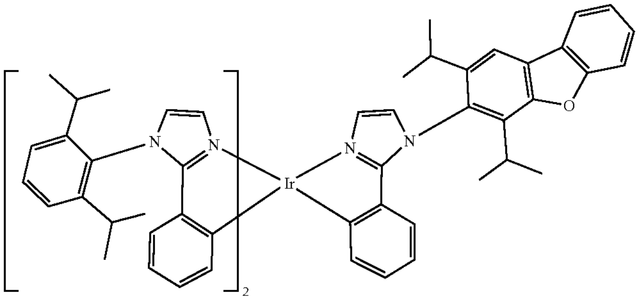 D | | |

From Table 62, it can be seen that the organic light-emitting devices of Examples 1 to 7 have improved external quantum efficiency and improved lifespan characteristics compared to the organic light-emitting devices of Comparative Examples A1, B1, C1, A2, B2, C2, and D.

Since the organometallic compound has excellent electrical characteristics and heat resistance, an electronic device, for example, an organic light-emitting device using the organometallic compound may have excellent external quantum efficiency (EQE) and excellent lifespan characteristics. Therefore, the use of the organometallic compound may enable the embodiment of a high-quality organic light-emitting device and an electronic apparatus including the same.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

$M(L_1)_{n1}(L_2)_{n2}$ Formula 1 wherein, in Formula 1,

M is a transition metal, $L_1$ is a ligand represented by Formula 2-1, $L_2$ is a ligand represented by Formula 2-2, $L_1$ and $L_2$ are different from each other, n1 is 1, or 2, wherein, when n1 is 2 or more, two or more $L_1$(s) are identical to or different from each other, n2 is 1, or 2, wherein, when n2 is 2 or more, two or more of $L_2$(s) are identical to or different from each other, the sum of n1 and n2 is 2 or 3, Formula 2-1

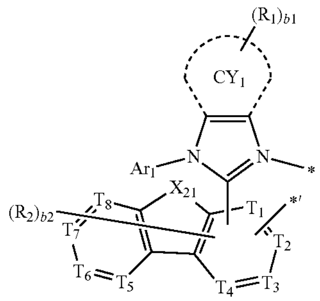

Formula 2-2

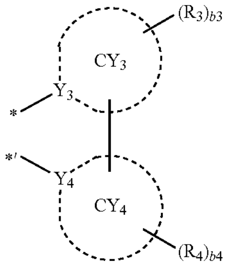

wherein, in Formulae 2-1 and 2-2, $Y_3$ is N and $Y_4$ is C, $X_{21}$ is O, S, Se, S(=O), $N(R_{29})$, $C(R_{29})(R_{30})$, or $Si(R_{29})(R_{30})$, $T_1$ to $T_4$ are each independently C, and one of $T_1$ to $T_4$ is carbon bonded to M in Formula 1, and the remaining $T_1$ to $T_4$ which are not bonded to M is bonded to a neighboring atom, $T_5$ to $T_8$ are each independently C, ring $CY_1$ and ring $CY_4$ are each independently a benzene group, a naphthalene group, or a pyridine group, ring $CY_3$ is a pyridine group, a quinoline group or an isoquinoline group, $Ar_1$ of Formula 2-1 is a group represented by Formula AR1(1),

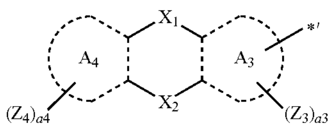

AR1(1)

wherein, in Formulae 2-1, 2-2, and AR1(1), ring $A_3$ and ring $A_4$ are each independently a benzene group, $X_1$ is O, S, or $C(Z_{11})(Z_{12})$, $X_2$ is a single bond, $R_1$ to $R_4$, $R_{29}$, $R_{30}$, $Z_{11}$, $Z_{12}$, $Z_{21}$, $Z_{22}$, $Z_3$, and $Z_4$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, $Z_3$ is a substituted or unsubstituted $C_1$-$C_{60}$ alkyl group, a3 is an integer from 1 to 3 and a4 is an integer from 1 to 4, b1, b3, and b4 are each independently an integer from 0 to 20, b2 is an integer from 0 to 6, two or more of a plurality of $R_1$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_2$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_3$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_4$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $Z_3$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $Z_4$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is understood by referring to the description of $R_1$,

* and *' in Formulae 2-1 and 2-2 each indicate a binding site to M in Formula 1,

* in Formula AR1(1) indicates a binding site to an adjacent atom, one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, -Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, unsubstituted or substituted with deuterium, —F, —Cl, —Br, —I, —$CD_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(═O)($Q_{28}$)($Q_{29}$), —P($Q_{28}$)($Q_{29}$), or any combination thereof; —N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(═O)($Q_{38}$)($Q_{39}$), or —P($Q_{38}$)($Q_{39}$); or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; -Cl; —Br; -I; a hydroxyl group; a cyano group; a nitro group; an amino group; an amidino group; a hydrazine group; a hydrazone group; a carboxylic acid or a salt thereof; a sulfonic acid or a salt thereof; a phosphoric acid or a salt thereof; a $C_1$-$C_{60}$ alkyl group which is unsubstituted or substituted with deuterium, —F, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, —F, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group, wherein at least one of i) or ii) is true:

i) $R_2$ is a substituted or unsubstituted $C_1$-$C_{60}$ alkyl group or a substituted or unsubstituted $C_6$-$C_{60}$ aryl group, or ii) b2 is an integer from 2 to 6, wherein $R_2$ is not hydrogen, and wherein a group represented by

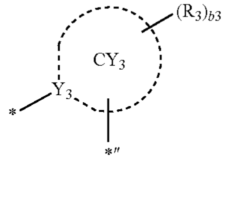

in Formula 2-2 is a group represented by Formula CY3(1):

CY3(1)

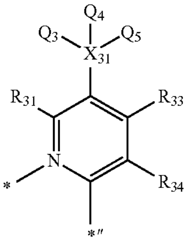

wherein, in Formula CY3(1), $X_{31}$ is Si or Ge, and $Q_3$ to $Q_5$ are each independently: hydrogen; deuterium; —F; —Cl; —Br; —I; a hydroxyl group; a cyano group; a nitro group; an amino group; an amidino group; a hydrazine group; a hydrazone group; a carboxylic acid or a salt thereof; a sulfonic acid or a salt thereof; a phosphoric acid or a salt thereof; a $C_1$-$C_{60}$ alkyl group which is unsubstituted or substituted with deuterium, —F, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, —F, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropoly cyclic group, $R_{31}$, $R_{33}$, and $R_{34}$ are each the same as described in connection with $R_3$ in Formula 2-2, $R_{33}$ and $R_{34}$ are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$,

* indicates a binding site to M in Formula 1, and

*" indicates a binding site to ring $CY_4$ in Formula 2-2.

2. The organometallic compound of claim 1, wherein $Ar_1$ of Formula 2-1 is a group represented by one of Formulae AR1-1 to AR1-4:

AR1-1

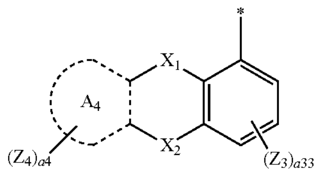

AR1-2

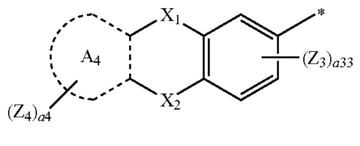

-continued

AR1-3

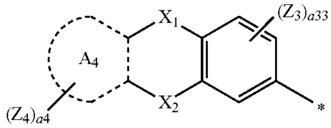

AR1-4

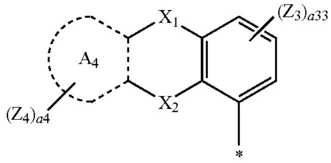

wherein, in Formulae AR1-1 to AR1-4, ring $A_4$ is a benzene group, $X_1$ is O, S, or $Si(Z_{11})(Z_{12})$, $X_2$ is a single bond, $Z_{11}$, $Z_{12}$, $Z_{21}$, $Z_{22}$, $Z_3$, and $Z_4$ are the same as described in claim 1, a33 is an integer from 1 to 3, and a4 is an integer from 1 to 4, two or more of a plurality of $Z_3$ (s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $Z_4$ (s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as described in connection with $R_1$ of claim 1, and

* indicates a binding site to an adjacent atom.

3. The organometallic compound of claim 1, wherein $R_1$ to $R_4$, $R_{29}$, and $R_{30}$ are each independently:

hydrogen, deuterium, —F, or a cyano group;

a $C_1$-$C_{20}$ alkyl group, unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl) $C_1$-$C_{10}$ heterocycloalkyl group, a phenyl group, a deuterated phenyl group, a fluorinated phenyl group, a ($C_1$-$C_{20}$ alkyl) a phenyl group, a biphenyl group, a deuterated biphenyl group, a fluorinated biphenyl group, a ($C_1$-$C_{20}$ alkyl) a biphenyl group, or any combination thereof;

a $C_3$-$C_{10}$ cycloalkyl group, a $C_1$-$C_{10}$ heterocycloalkyl group, a phenyl group, or a biphenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl) $C_1$-$C_{10}$ heterocycloalkyl group, a phenyl group, a deuterated phenyl group, a fluorinated phenyl group, a ($C_1$-$C_{20}$ alkyl) a phenyl group, a biphenyl group, a deuterated biphenyl group, a fluorinated biphenyl group, a ($C_1$-$C_{20}$ alkyl) biphenyl group, or any combination thereof; or —$Si(Q_3)(Q_4)(Q_5)$ or —$Ge(Q_3)(Q_4)(Q_5)$.

4. The organometallic compound of claim 1, wherein the organometallic compound comprises deuterium, —F, a group represented by —$Si(Q_3)(Q_4)(Q_5)$, a group represented by —$Ge(Q_3)(Q_4)(Q_5)$, or any combination thereof.

5. The organometallic compound of claim 1, wherein a group represented by

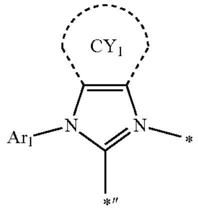

in Formula 2-1 is represented by one of Formulae CY(1) to CY(6), CY(13) and CY1(20):

CY(1)

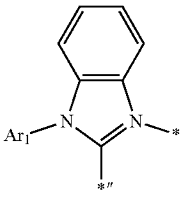

CY(2)

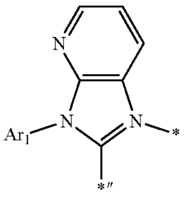

CY(3)

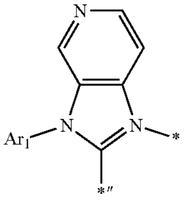

CY(4)

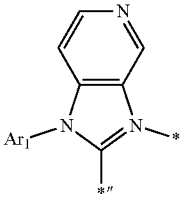

CY(5)

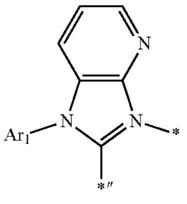

-continued
CY(6)
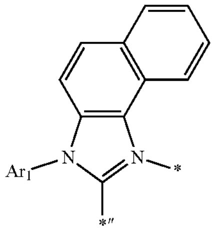
CY(7)
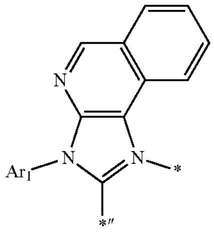
CY(8)
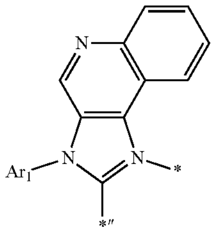
CY(9)
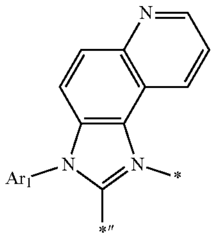
CY(10)
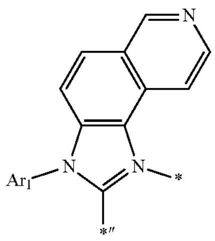
CY(11)
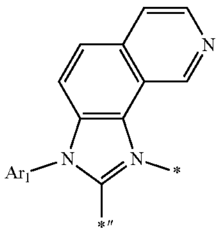
-continued
CY(12)
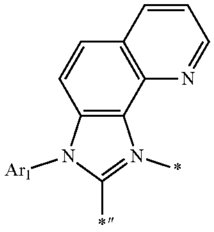
CY(13)
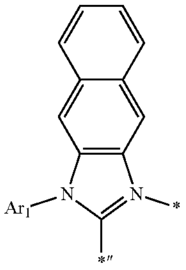
CY(14)
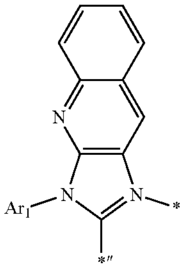
CY(15)
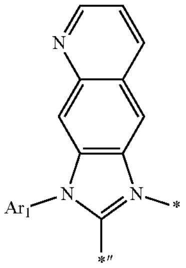
CY(16)
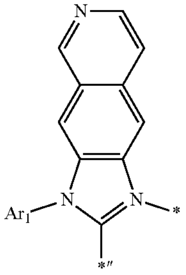
CY(17)
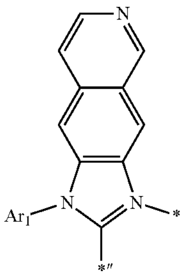

-continued

CY(18)

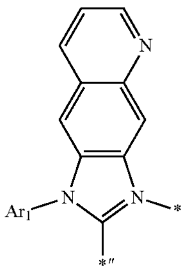

CY(20)

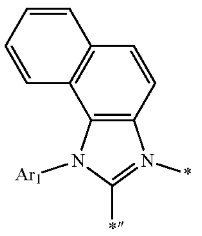

wherein, in Formulae CY(1) to CY(6), CY(13) and CY(20), * indicates a binding site to M in Formula 1, and *" indicates a binding site to a neighboring carbon atom in Formula 2-1.

6. The organometallic compound of claim 1, wherein a group represented by

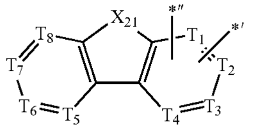

in Formula 2-1 is a group represented by one of Formulae CY2-1 to CY2-6:

CY2-1

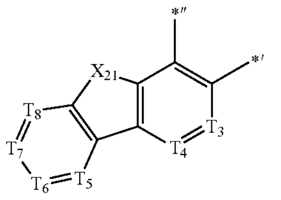

CY2-2

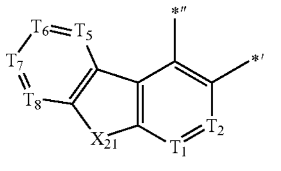

-continued

CY2-3

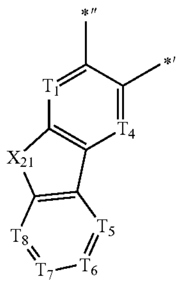

CY2-4

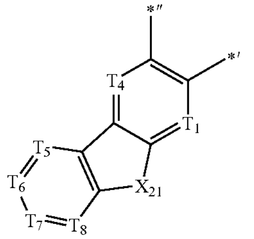

CY2-5

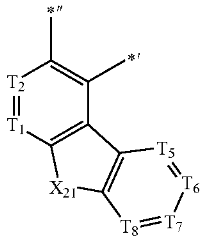

CY2-6

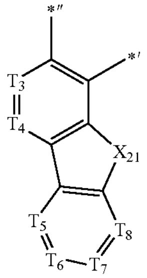

wherein, in Formulae CY2-1 to CY2-6, *' indicates a binding site to M in Formula 1, and *" indicates a binding site to a neighboring carbon atom in Formula 2-1.

7. The organometallic compound of claim 1, wherein a group represented by

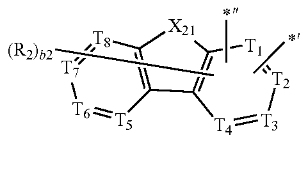

in Formula 2-1 is a group represented by one of Formulae CY2-1-2 to $CY_2$-1-22:
CY2-1-2
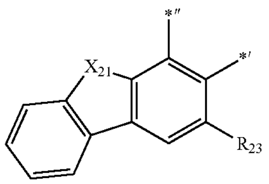
CY2-1-3
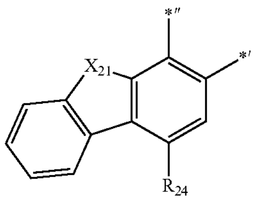
CY2-1-4
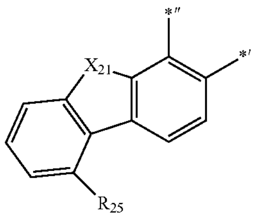
CY2-1-5
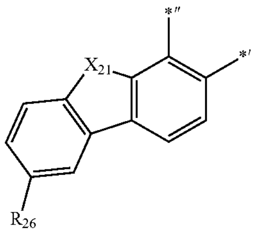
CY2-1-6
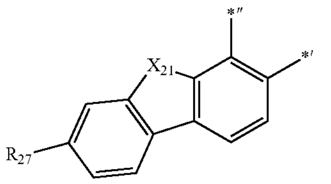
CY2-1-7
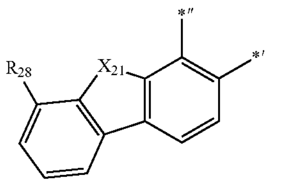
CY2-1-8
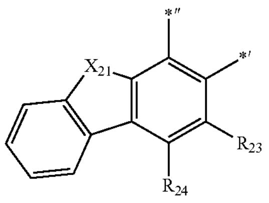
-continued
CY2-1-9
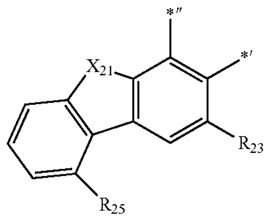
CY2-1-10
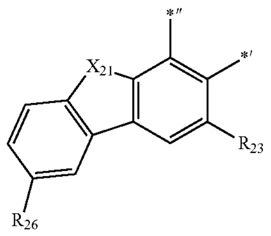
CY2-1-11
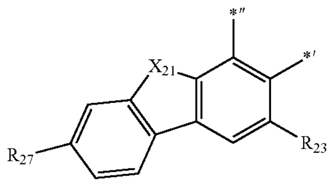
CY2-1-12
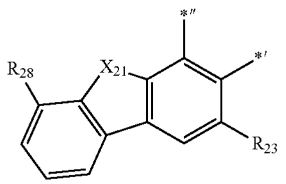
CY2-1-13
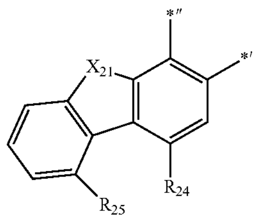
CY2-1-14
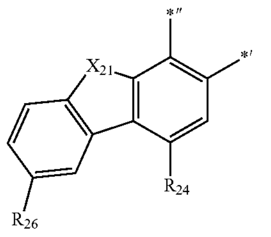
CY2-1-15
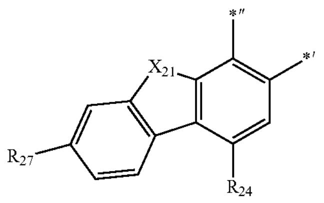

-continued

CY2-1-16

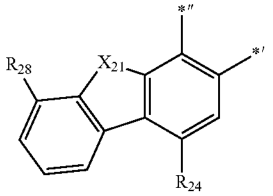

CY2-1-17

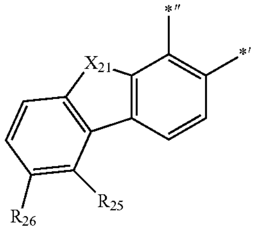

CY2-1-18

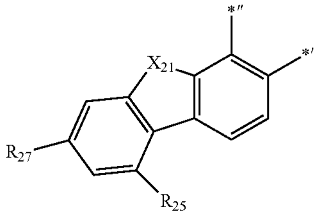

CY2-1-19

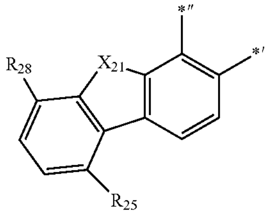

CY2-1-20

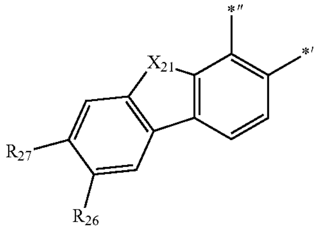

CY2-1-21

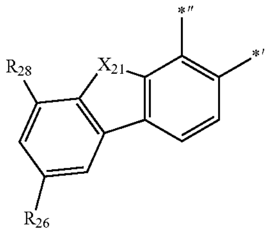

CY2-1-22

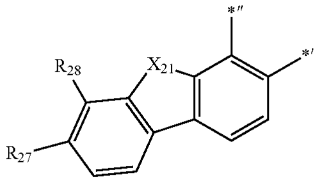

wherein, in Formulae $CY_2$-1-2 to $CY_2$-1-22, $R_{21}$ to $R_{28}$ are the same as described in connection with $R_2$ in claim 1, and each of $R_{21}$ to $R_{28}$ is not hydrogen,

*' indicates a binding site to M in Formula 1, and

*" indicates a binding site to a neighboring carbon atom in Formula 2-1.

8. The organometallic compound of claim 1, wherein $R_{33}$ in Formula CY3(1) comprises two or more carbons.

9. The organometallic compound of claim 1, wherein a group represented by

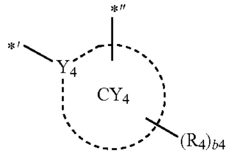

in Formula 2-2 is a group represented by one of Formulae $CY_4$-1 to $CY_4$-16:

CY4-1

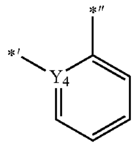

CY4-2

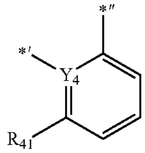

CY4-3

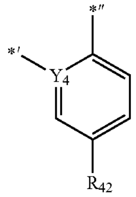

CY4-4

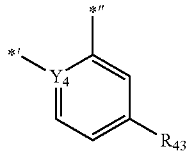

CY4-5

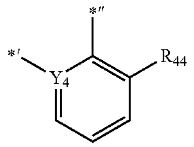

CY4-6

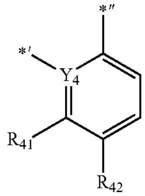

-continued

CY4-7

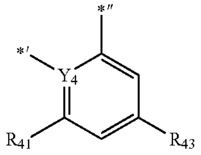

CY4-8

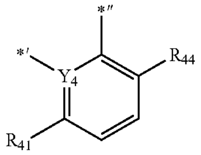

CY4-9

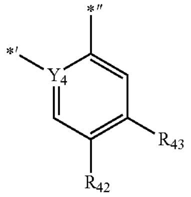

CY4-10

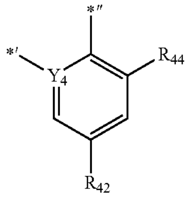

CY4-11

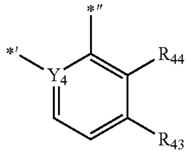

CY4-12

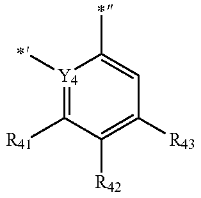

CY4-13

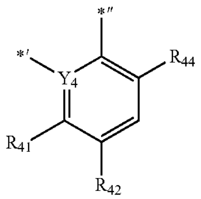

CY4-14

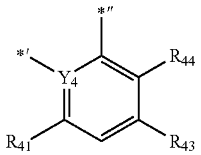

-continued

CY4-15

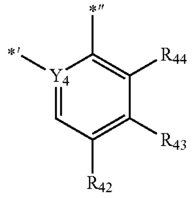

CY4-16

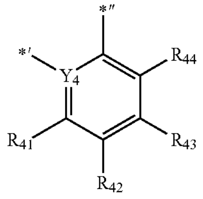

wherein, in Formulae $CY_4$-1 to $CY_4$-16, $R_{41}$ to $R_{44}$ are the same as described in connection with $R_4$ in claim 1, and each of $R_{41}$ to $R_{44}$ is not hydrogen,

*' indicates a binding site to M in Formula 1, and

*" indicates a binding site to ring $CY_3$ in Formula 2-2.

10. An organic light-emitting device comprising:

a first electrode, a second electrode, and an organic layer located between the first electrode and the second electrode and comprising an emission layer, wherein the organic layer comprises at least one of the organometallic compound of claim 1.

11. The organic light-emitting device of claim 10, wherein the first electrode is an anode, the second electrode is a cathode, the organic layer further comprises a hole transport region located between the first electrode and the emission layer and an electron transport region located between the emission layer and the second electrode, wherein the hole transport region comprises a hole injection layer, a hole transport layer, an electron blocking layer, a buffer layer, or a combination thereof, and the electron transport region comprises a hole blocking layer, an electron transport layer, an electron injection layer, or a combination thereof.

12. The organic light-emitting device of claim 10, wherein the organometallic compound is included in the emission layer.

13. The organic light-emitting device of claim 12, wherein the emission layer further comprises a host and the amount of the host is greater than the amount of the organometallic compound.

14. An electronic apparatus comprising the organic light-emitting device of claim 10.

* * * * *